(12) United States Patent
Suehiro et al.

(10) Patent No.: US 7,781,787 B2
(45) Date of Patent: Aug. 24, 2010

(54) LIGHT-EMITTING DIODE, LED LIGHT, AND LIGHT APPARATUS

(75) Inventors: Yoshinobu Suehiro, Aichi-ken (JP);
Akihiro Misawa, Aichi-ken (JP);
Toshinori Takahashi, Aichi-ken (JP);
Hisatoshi Ota, Aichi-ken (JP); Koichi Ota, Aichi-ken (JP); Junko Okano, Aichi-ken (JP)

(73) Assignee: Toyoda Gosei, Co., Ltd., Aichi-ken (JP)

( * ) Notice: Subject to any disclaimer, the term of this patent is extended or adjusted under 35 U.S.C. 154(b) by 1163 days.

(21) Appl. No.: 10/495,644

(22) PCT Filed: Nov. 15, 2002

(86) PCT No.: PCT/JP02/11968
§ 371 (c)(1),
(2), (4) Date: Nov. 15, 2004

(87) PCT Pub. No.: WO03/049207
PCT Pub. Date: Jun. 12, 2003

(65) Prior Publication Data
US 2006/0119250 A1   Jun. 8, 2006

(30) Foreign Application Priority Data

| Nov. 16, 2001 | (JP) | 2001-351743 |
| Nov. 21, 2001 | (JP) | 2001-355826 |
| May 14, 2002 | (JP) | 2002-139067 |
| May 14, 2002 | (JP) | 2002-139068 |
| Aug. 23, 2002 | (JP) | 2002-244302 |
| Aug. 29, 2002 | (JP) | 2002-249953 |
| Aug. 29, 2002 | (JP) | 2002-249954 |
| Nov. 15, 2002 | (JP) | 2002-331608 |
| Nov. 15, 2002 | (JP) | 2002-331811 |
| Nov. 15, 2002 | (JP) | 2002-332213 |

(51) Int. Cl.
*H01L 33/00* (2010.01)
(52) U.S. Cl. .......... 257/98; 257/99; 257/100; 257/E33.059; 257/E33.072
(58) Field of Classification Search .......... 257/98, 257/99, 100, E33.059, E33.061, E33.072, 257/E33.073
See application file for complete search history.

(56) References Cited

U.S. PATENT DOCUMENTS 3,774,021 A   11/1973   Johnson (Continued)

FOREIGN PATENT DOCUMENTS

DE   85 00 013 U1   4/1985

(Continued)

OTHER PUBLICATIONS

Japanese Office Action dated Apr. 18, 2006 and Partial English translation Thereof.

(Continued)

*Primary Examiner*—Minh-Loan T Tran
(74) *Attorney, Agent, or Firm*—McGinn IP Law Group PLLC

(57) ABSTRACT

An LED light comprising a light-emitting device provided to power supply means, encapsulating means for encapsulating the light-emitting device with a light-transmitting material, a reflective surface for reflecting the light emitted from the light-emitting device to a direction perpendicular to the center axis of the light-emitting device or at a large angle to the center axis, opposed to the light-emitting surface of the light-emitting device, a light-emitting diode having a side directing surface for directing sideways the light reflected from the reflective surface to a direction perpendicular to the center axis of the light-emitting device or at a large angle to the center axis, and a reflecting mirror disposed around the light-emitting diode.

40 Claims, 105 Drawing Sheets

U.S. PATENT DOCUMENTS

| | | | |
|---|---|---|---|
| 4,638,343 | A | 1/1987 | Althaus et al. |
| 5,485,317 | A | 1/1996 | Perissinotto et al. |
| 5,594,424 | A | 1/1997 | Louy et al. |
| 5,642,933 | A | 7/1997 | Hitora |
| 5,777,809 | A | 7/1998 | Yamamoto et al. |
| 6,376,902 | B1 | 4/2002 | Arndt |

FOREIGN PATENT DOCUMENTS

| | | | |
|---|---|---|---|
| EP | 0 531 184 | A1 | 8/1992 |
| EP | 0 635 744 | A2 | 10/1993 |
| FR | 2 680 859 | | 9/1991 |
| FR | 2 777 731 | A | 10/1999 |
| FR | 2 777 731 | A1 | 10/1999 |
| GB | 1 423 011 | A | 1/1976 |
| JP | 50-38262 | | 8/1948 |
| JP | 51-24866 | | 8/1949 |
| JP | 25-1612 | | 3/1950 |
| JP | 55-105968 | | 1/1954 |
| JP | 50-38262 | | 8/1973 |
| JP | 51-24866 | | 8/1974 |
| JP | 50038262 | U | 4/1975 |
| JP | 59-95651 | | 6/1984 |
| JP | 61-116702 | | 6/1986 |
| JP | 61-127186 | | 6/1986 |
| JP | 61-126502 | | 8/1986 |
| JP | 61-214000 | | 9/1986 |
| JP | 62-10803 | | 1/1987 |
| JP | 1-130578 | | 5/1989 |
| JP | 1-162261 | | 11/1989 |
| JP | 2-104325 | | 8/1990 |
| JP | 3-85669 | | 8/1991 |
| JP | 4-44171 | | 4/1992 |
| JP | 4-106043 | | 9/1992 |
| JP | 5-7537 | | 2/1993 |
| JP | 5-183194 | A | 7/1993 |
| JP | 05 183194 | A | 7/1993 |
| JP | 5-225805 | | 9/1993 |
| JP | 5-299701 | | 11/1993 |
| JP | 6-11365 | | 2/1994 |
| JP | 6-163993 | | 6/1994 |
| JP | 7-58362 | | 3/1995 |
| JP | 9-45115 | | 2/1997 |
| JP | 2000 133822 | | 5/2000 |
| JP | 2000-133822 | A | 5/2000 |
| JP | 2000-228110 | | 8/2000 |
| JP | 2001-177157 | | 6/2001 |
| JP | 2001-518692 | | 10/2001 |
| WO | WO 99/07023 | | 2/1999 |

OTHER PUBLICATIONS

Notification of Reasons for Refusal dated Apr. 18, 2006 with a partial English translation.
Japanese Office Action, Notification of Reasons of Refusal, dated Apr. 13, 2006.
European Search Report dated Nov. 4, 2008.
Japanese Office Action, Notification of Reasons of Refusal, dated Aug. 16, 2007.
Official Letter/Communication dated Mar. 1, 2010.
Japanese Office Action, Notification of Reasons of Refusal, dated Apr. 13, 2006.

FIG. 3
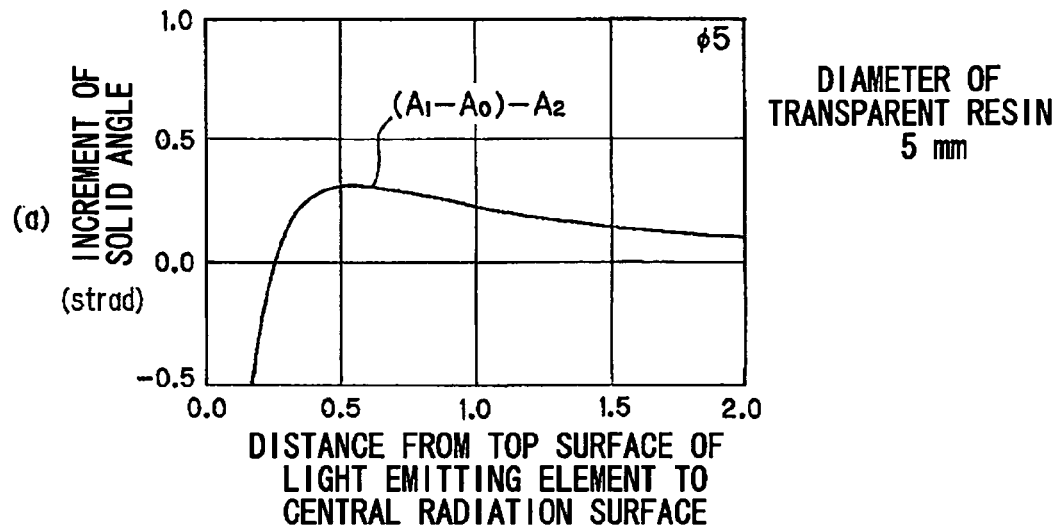
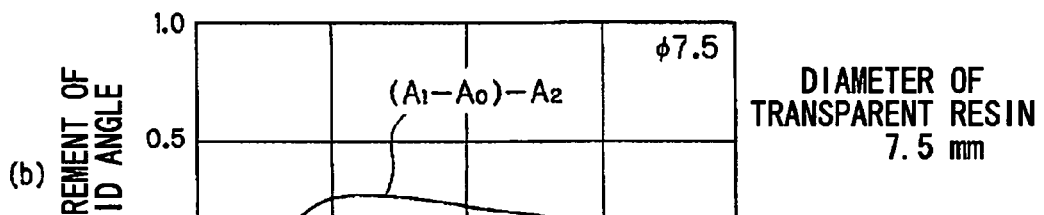
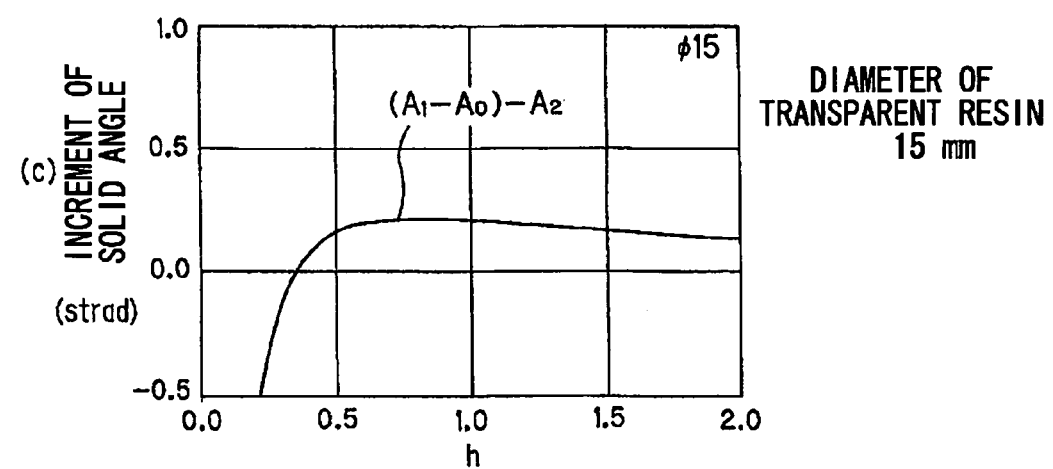

FIG. 11
(a)
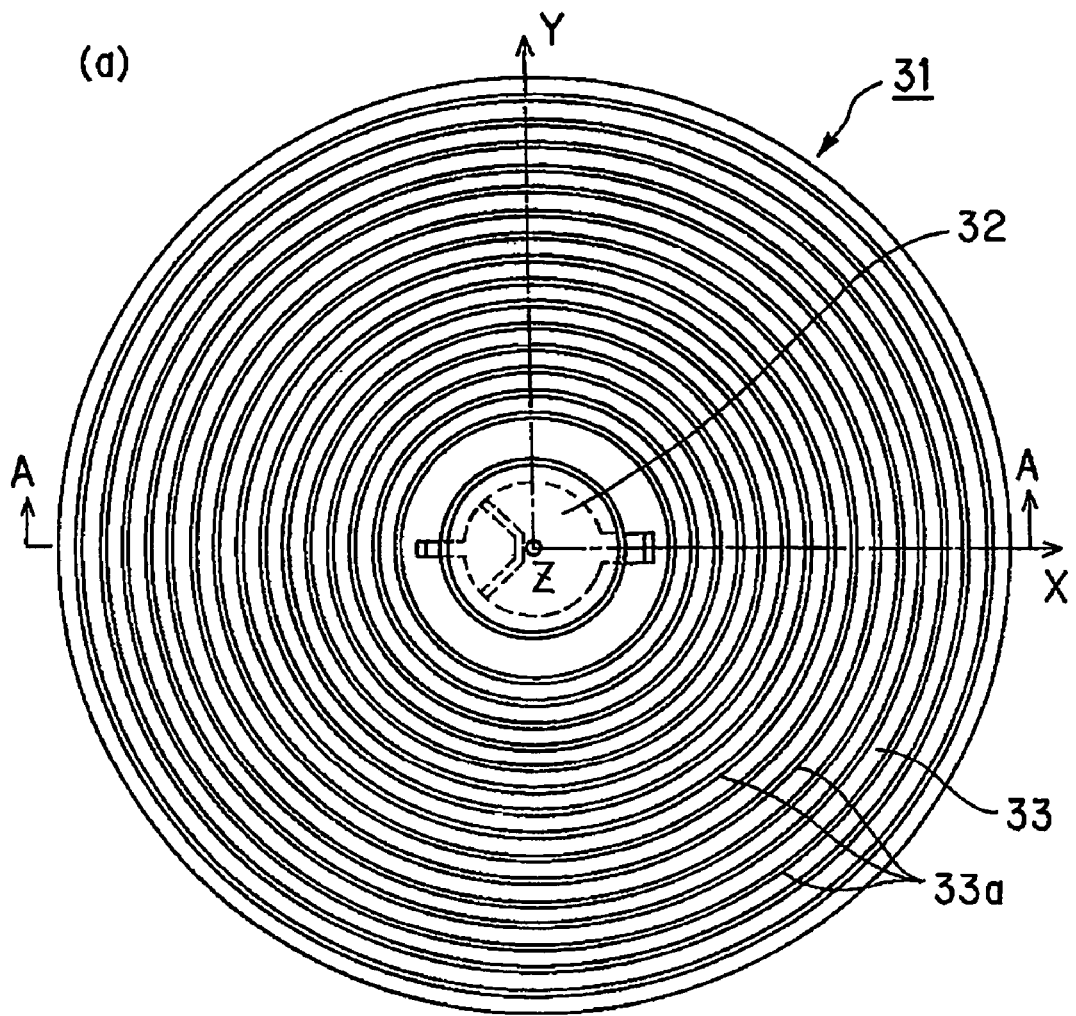
(b)
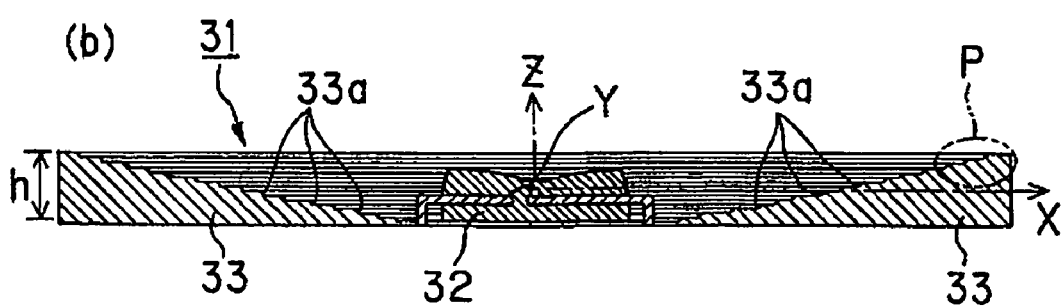
(c)
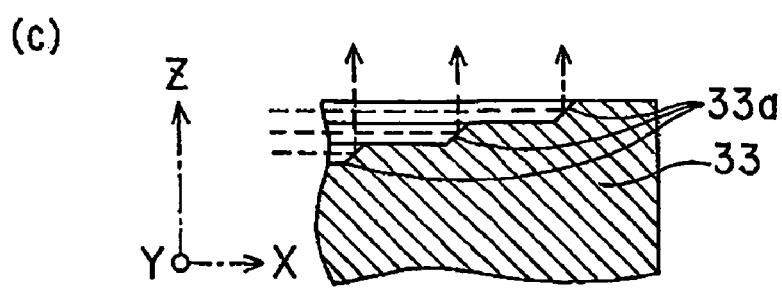

FIG. 19
(a)
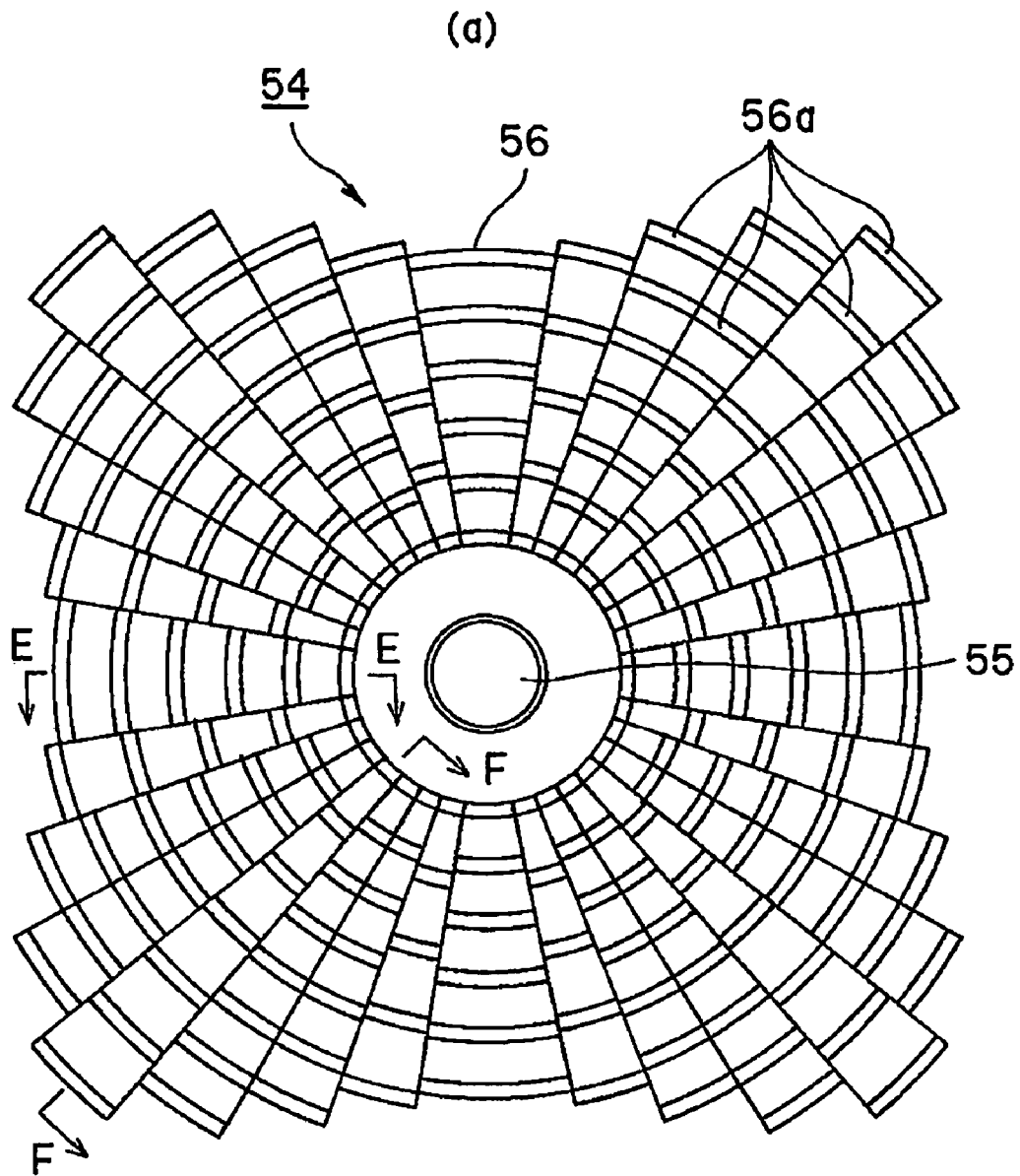
(b)
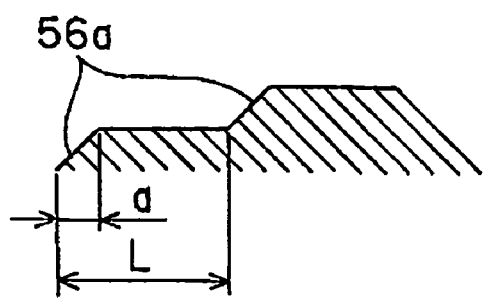
(c)
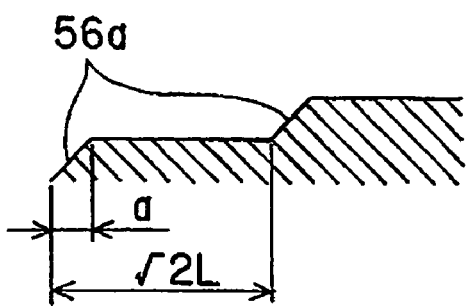

FIG. 31
(a)
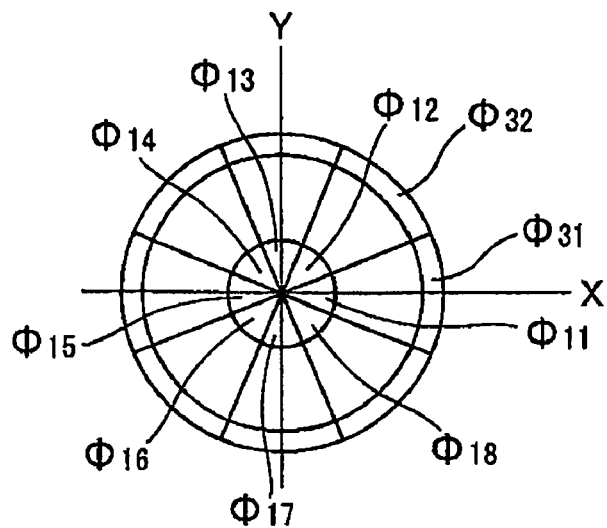
(b)
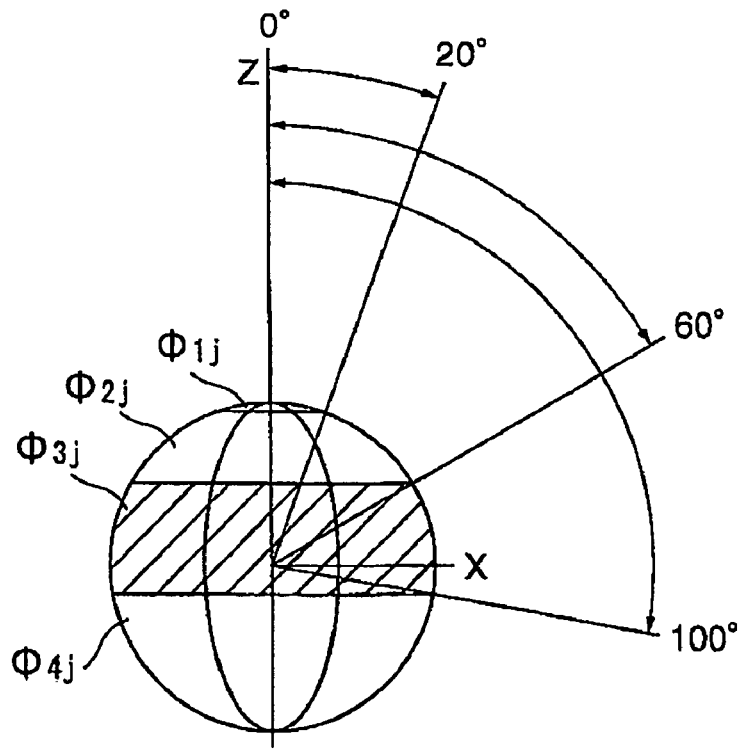

FIG. 33
(a)
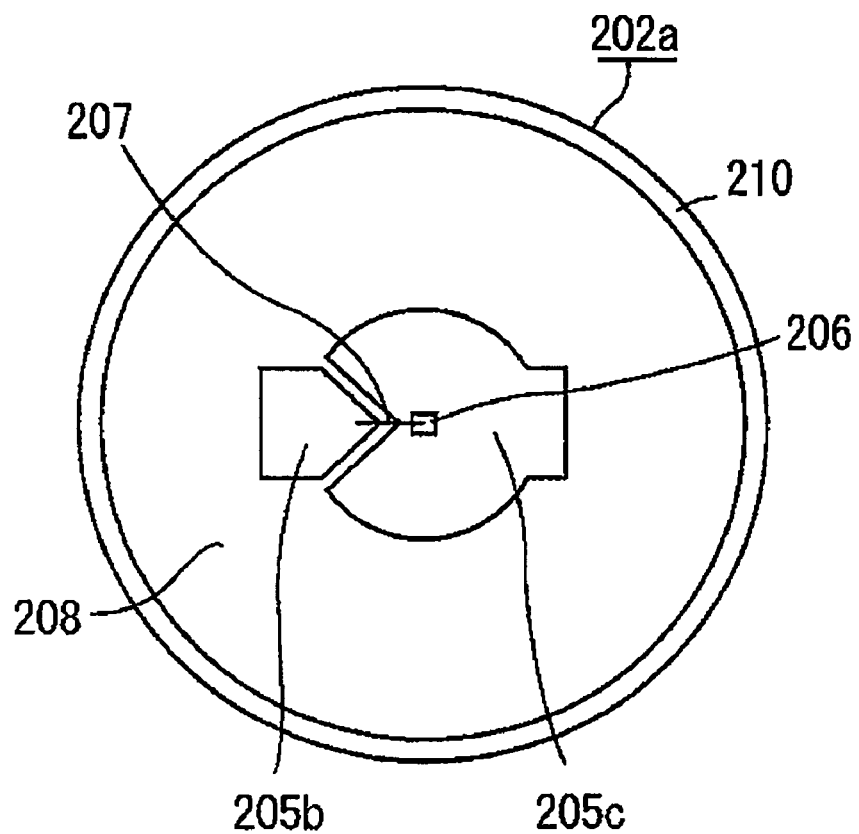
(b)
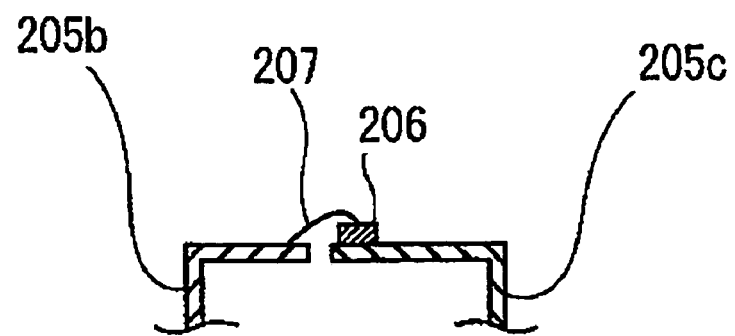

FIG. 35
(a)
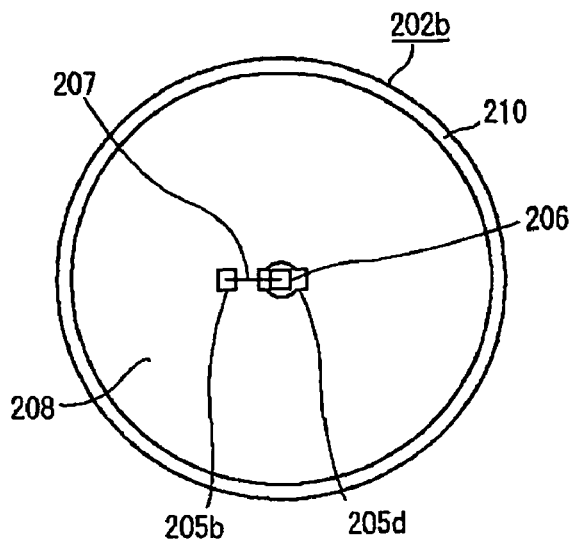
(b)
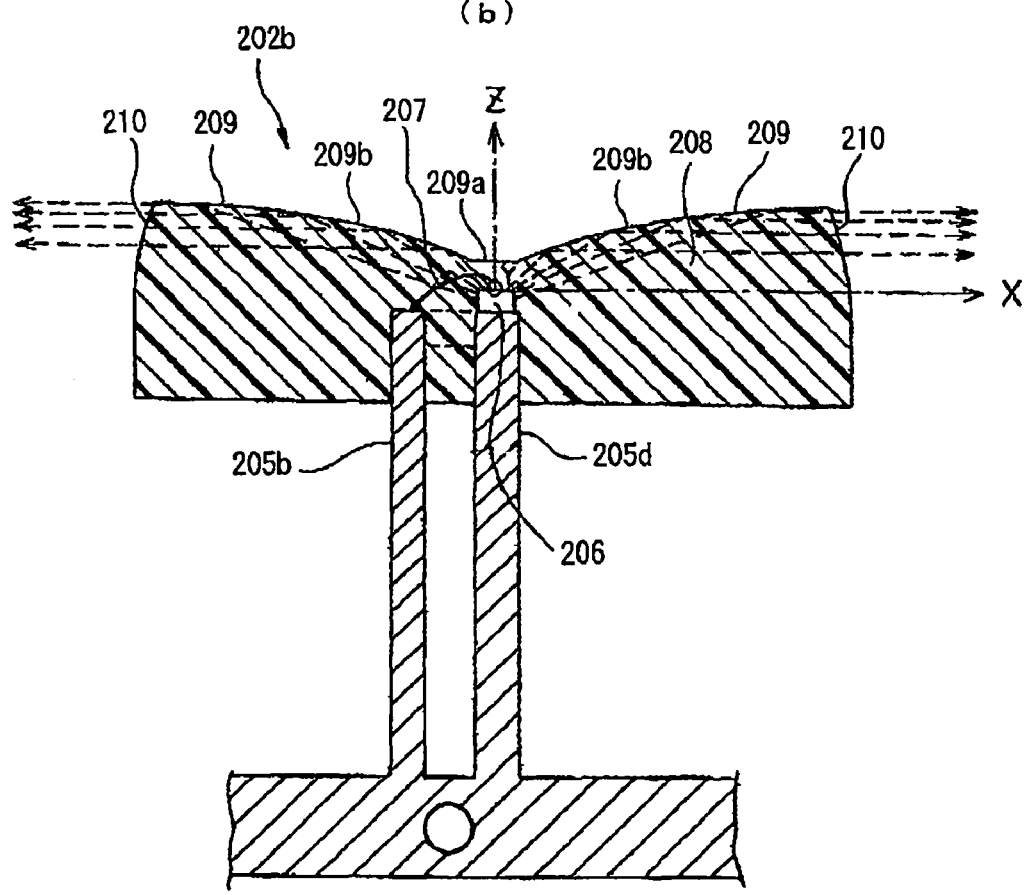

FIG. 40
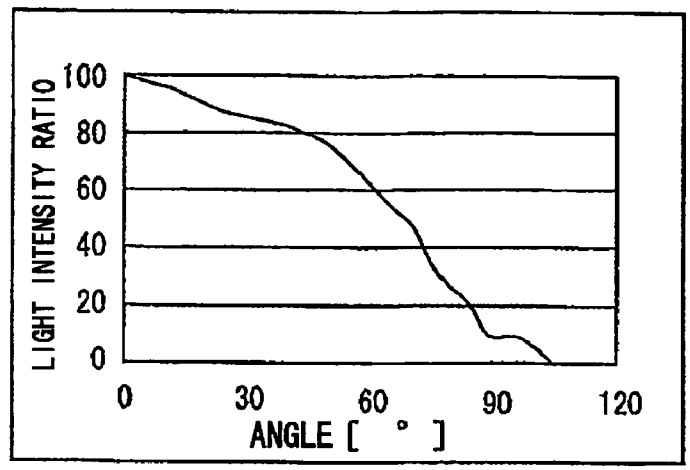
LIGHT INTENSITY DISTRIBUTION
(a)
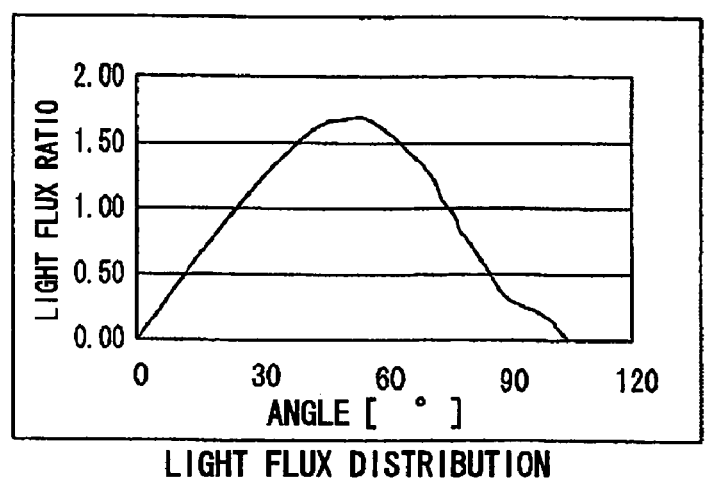
LIGHT FLUX DISTRIBUTION
(b)
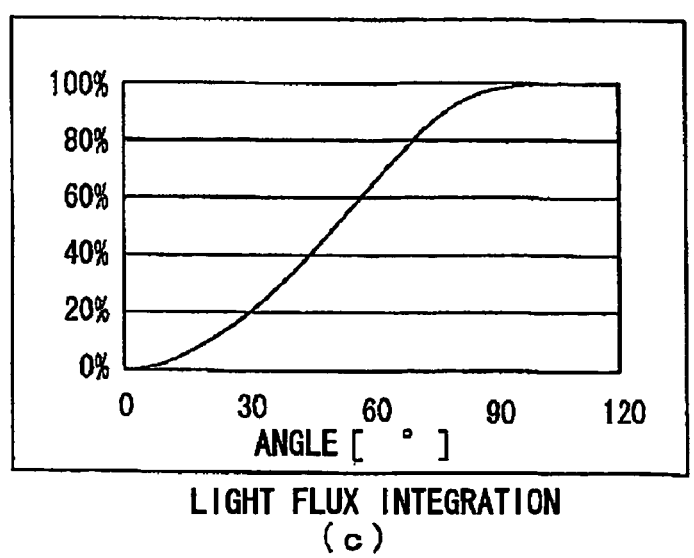
LIGHT FLUX INTEGRATION
(c)

FIG. 42
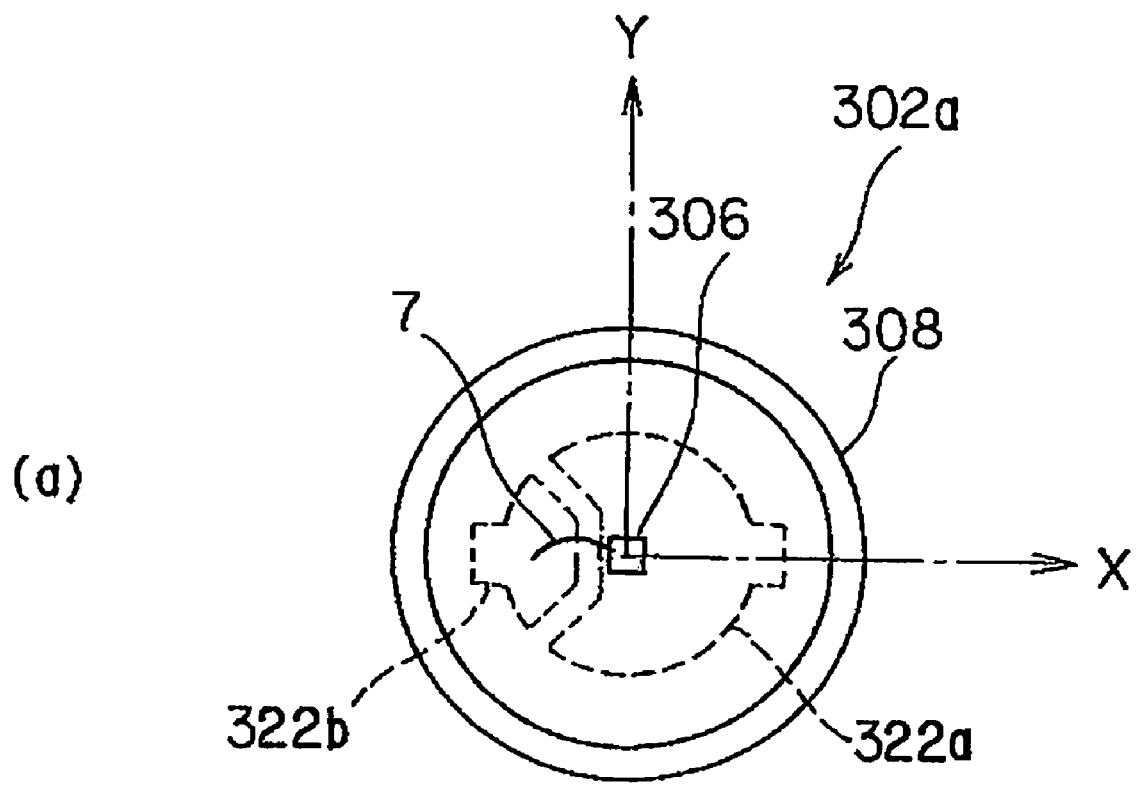
(a)
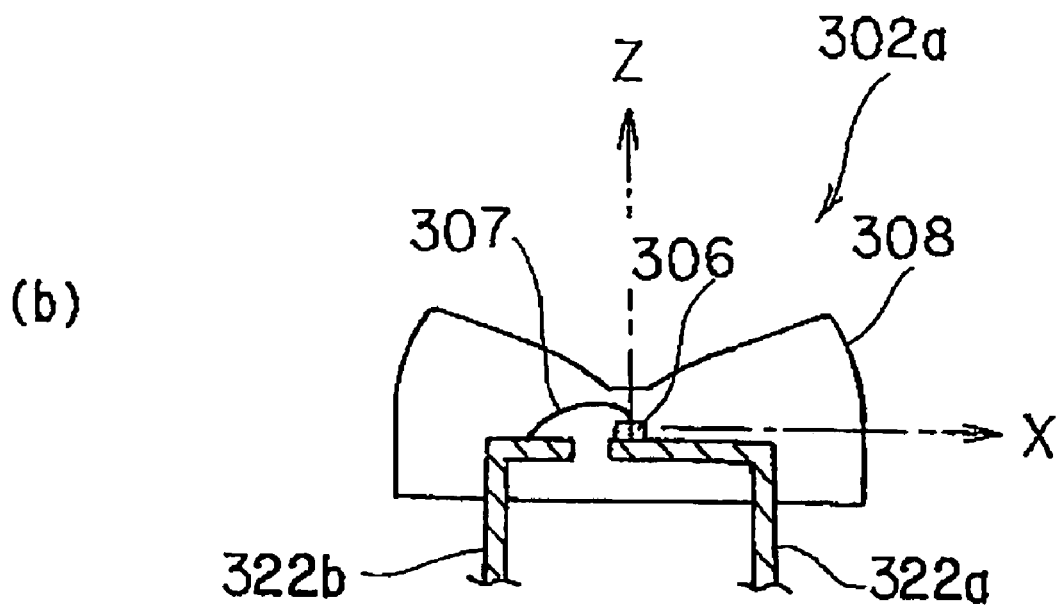
(b)

FIG. 48
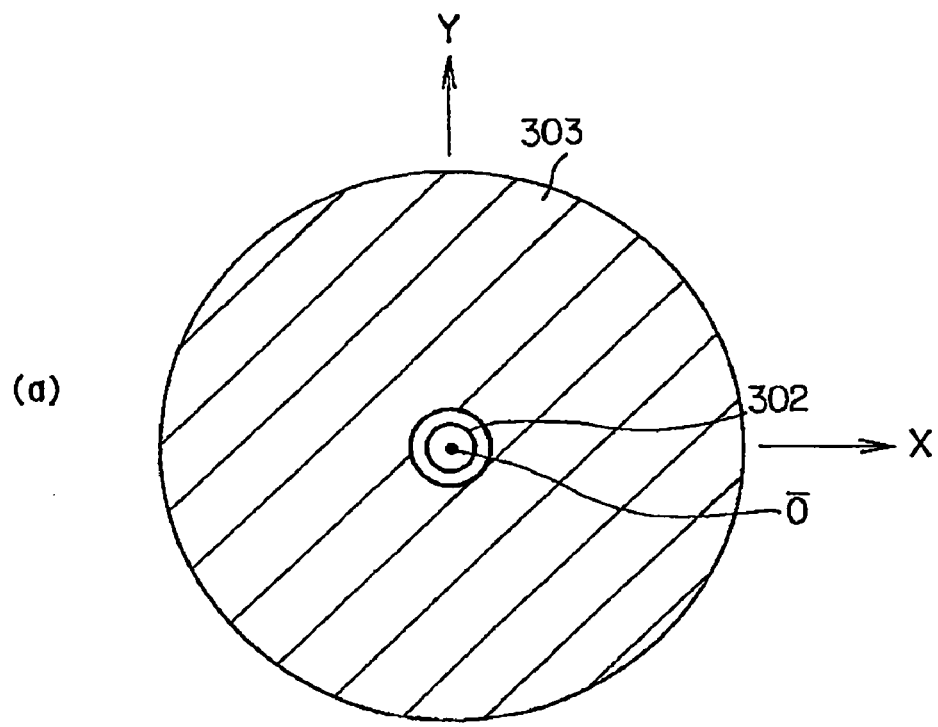
(a)
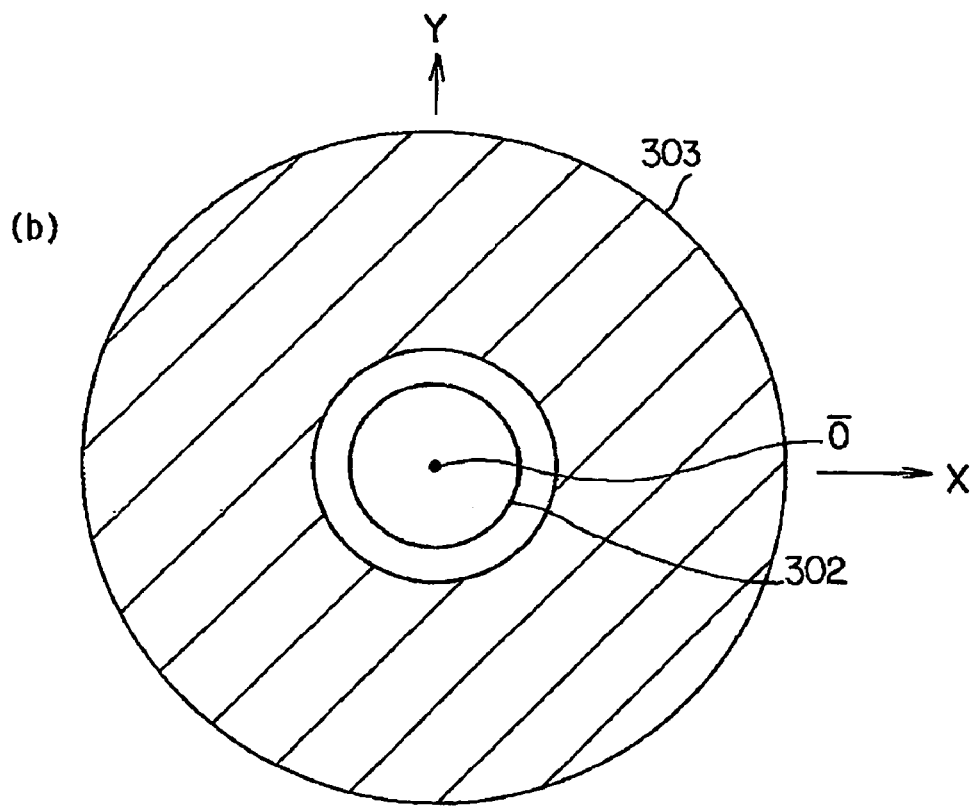
(b)

RELATIVE EMISSION INTENSITY

FIG. 57
(a) 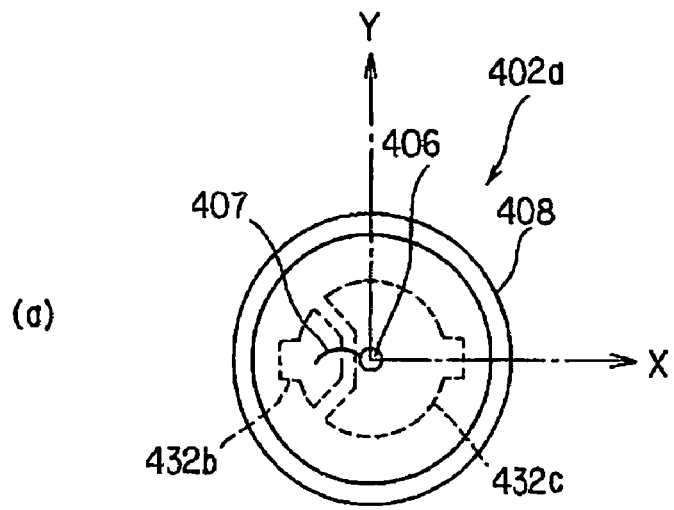
(b) 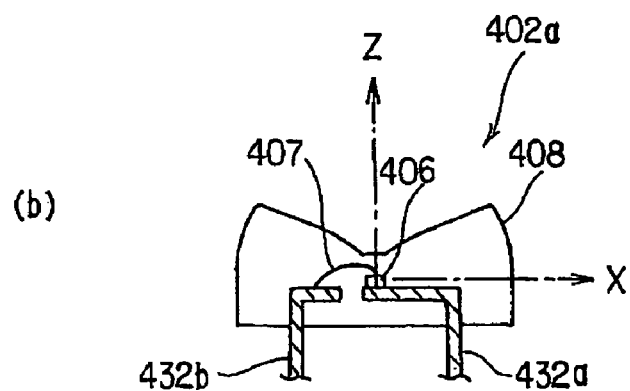
(c) 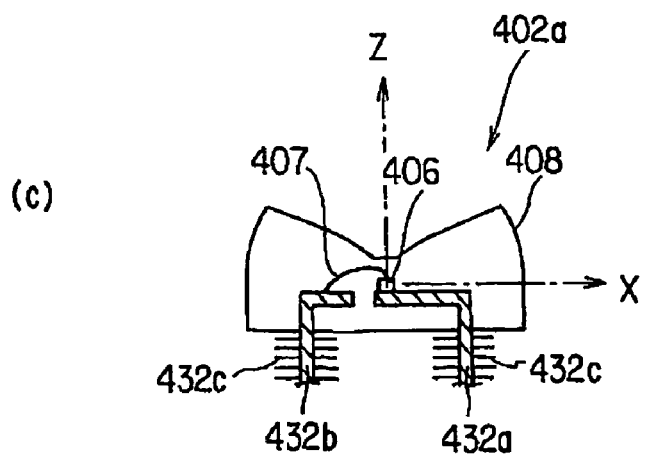

FIG. 61
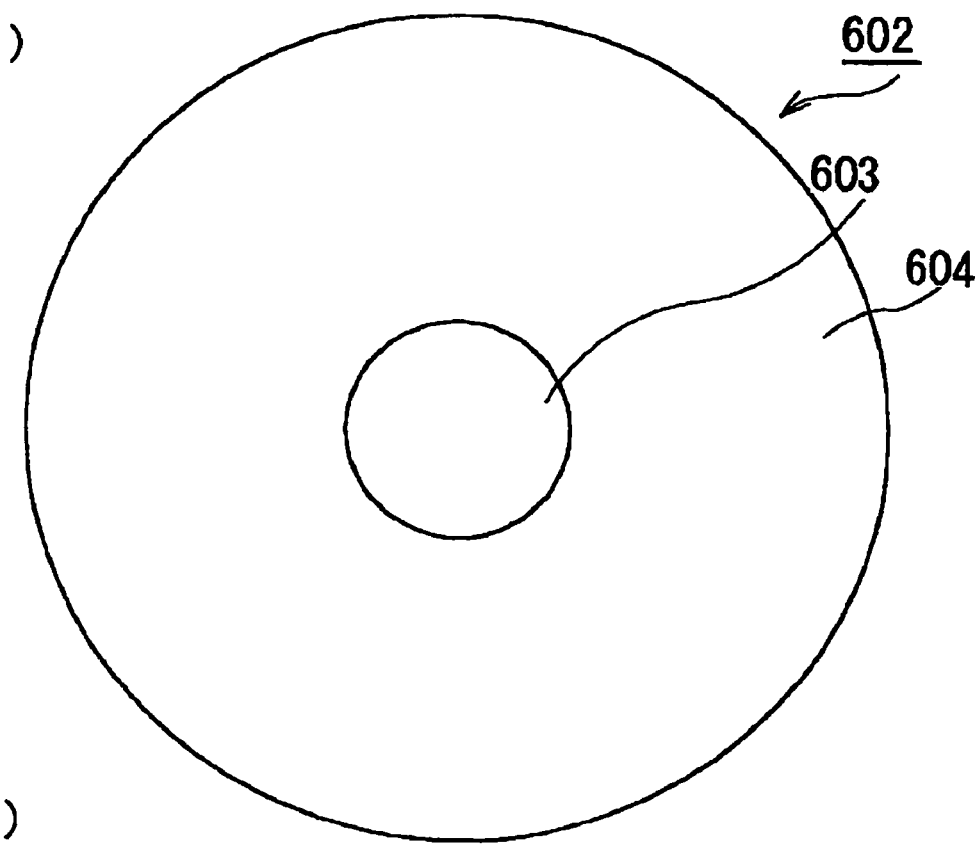
(a)
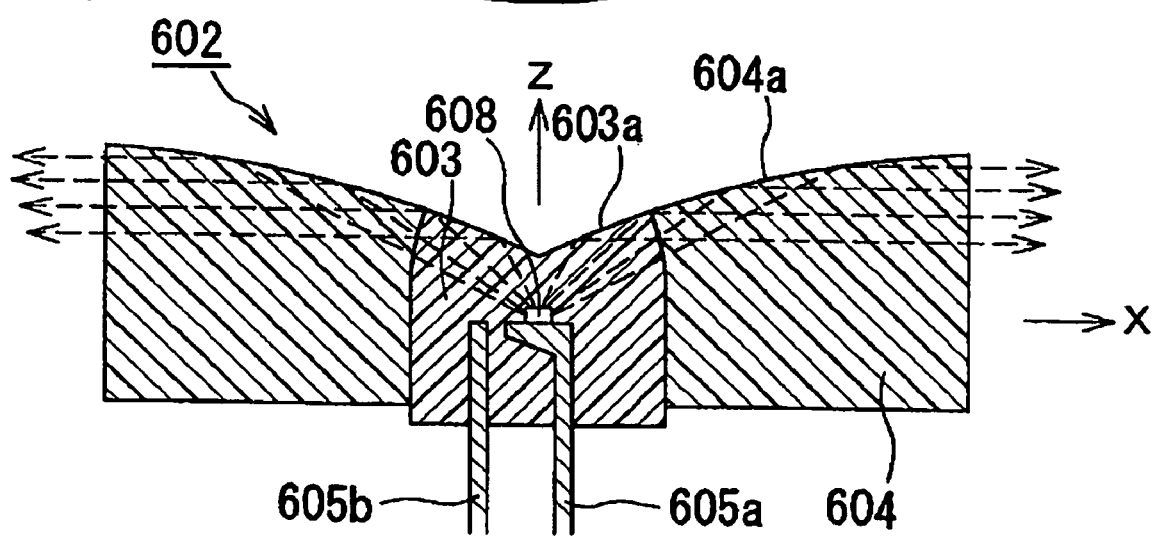
(b)

FIG. 66
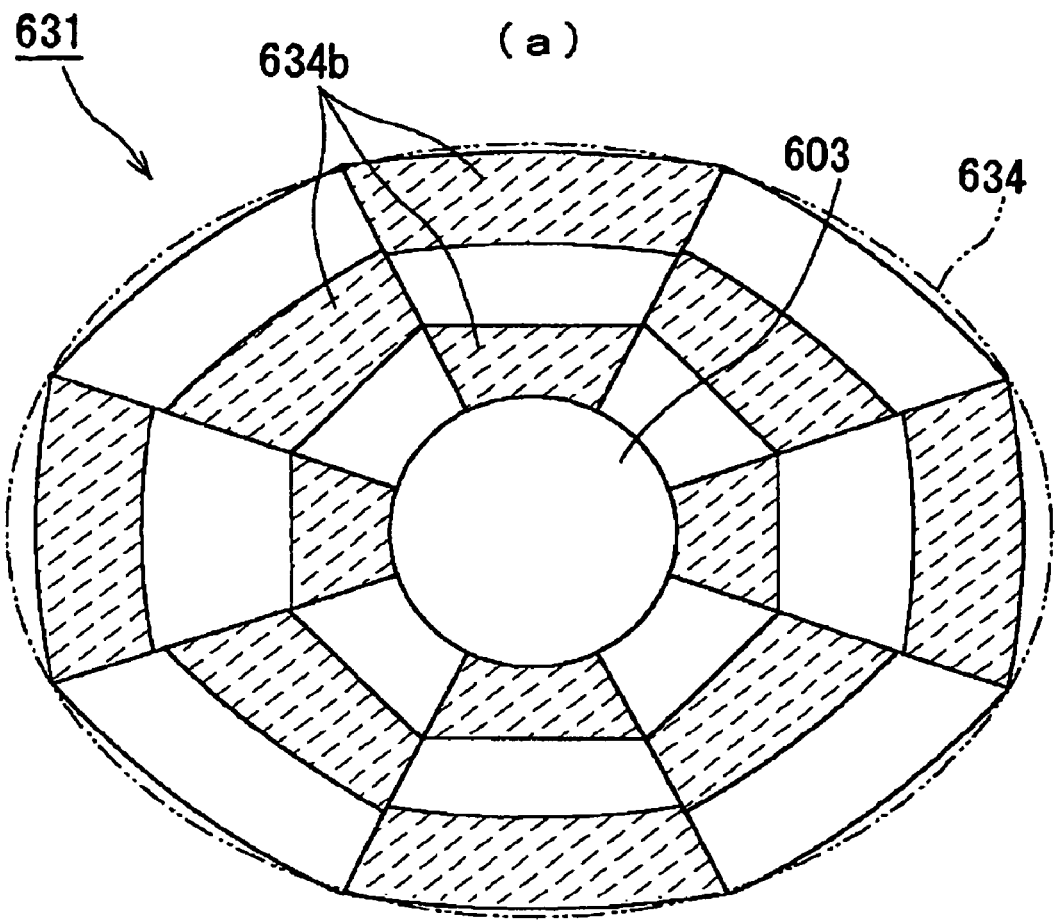
(a)
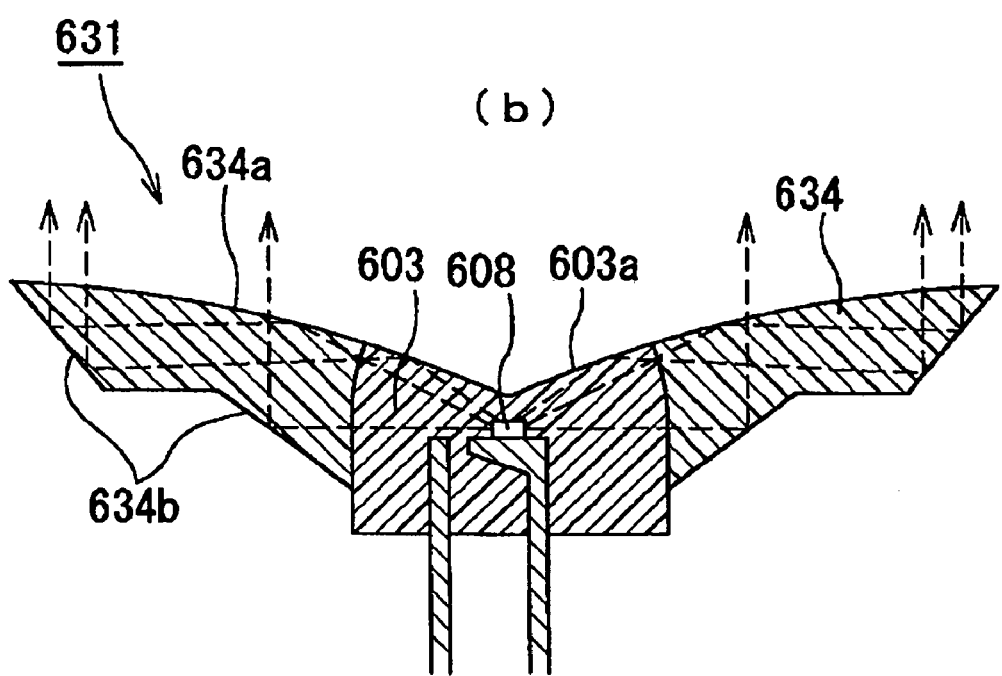
(b)

FIG. 96
(a)
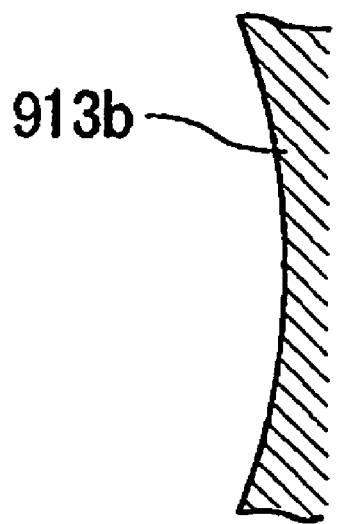
(b)
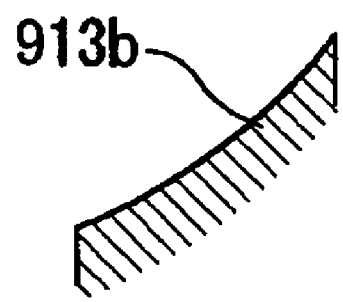

FIG. 104
(a)
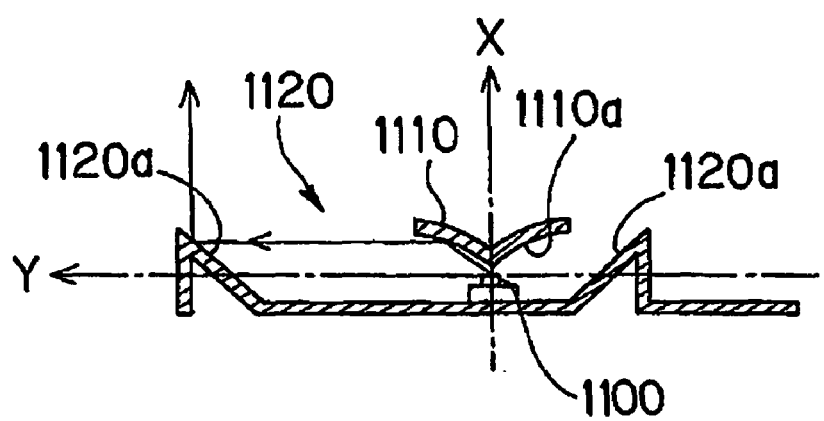
(b)
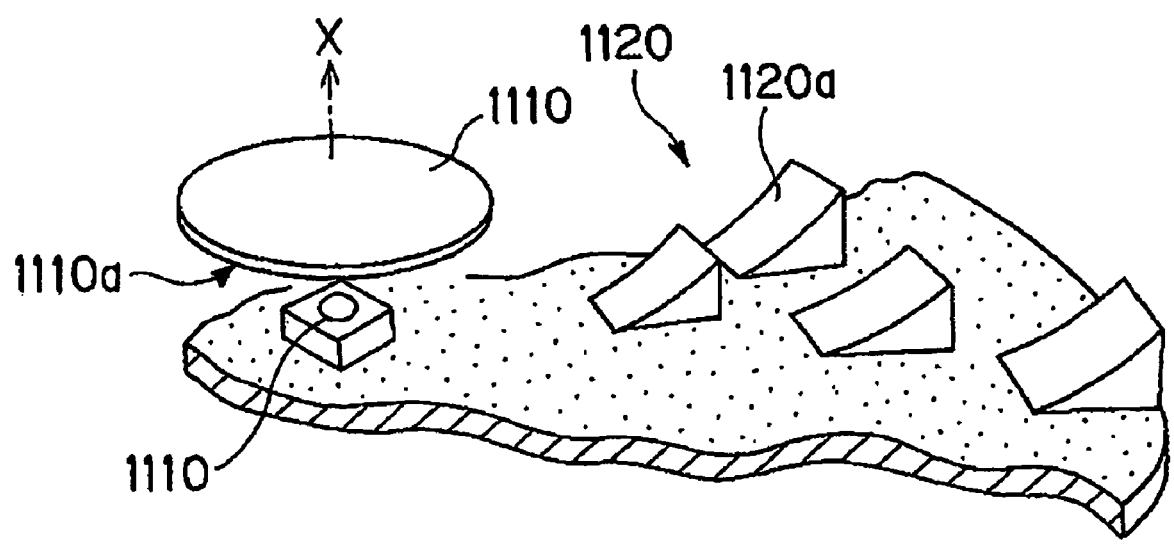

FIG. 105
(a)
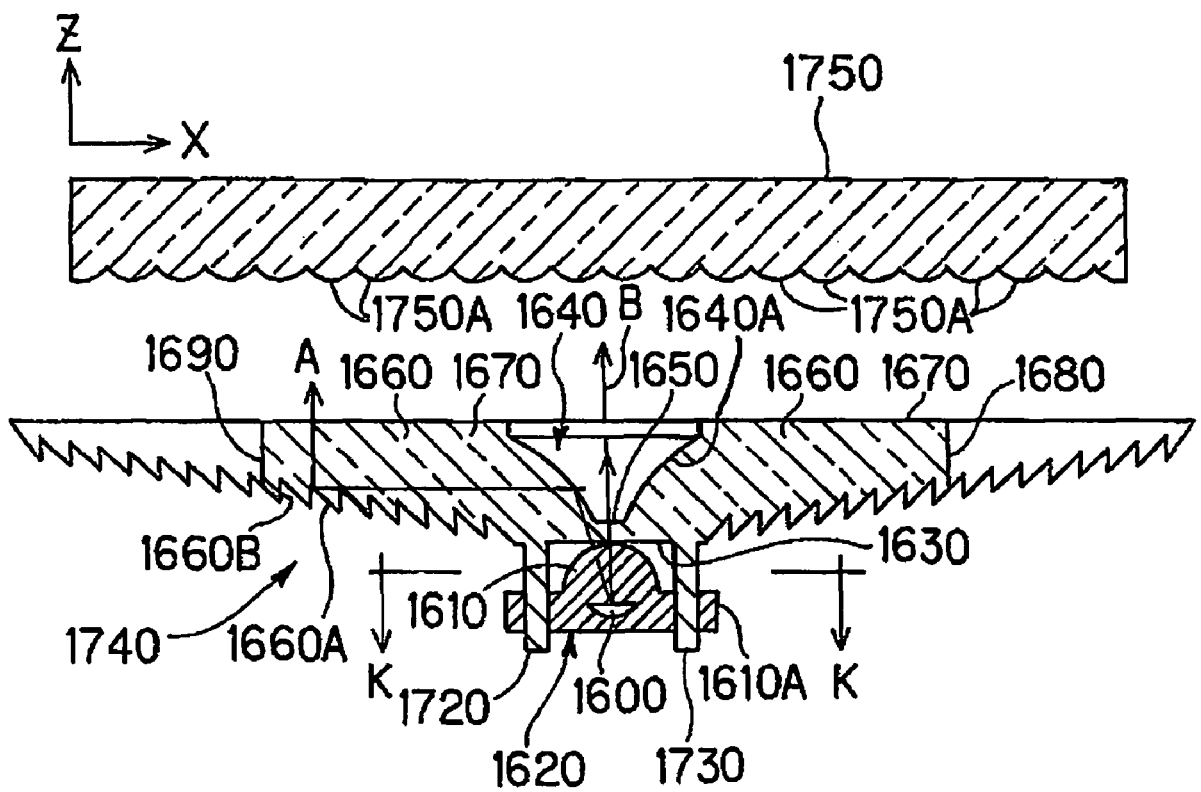
(b)
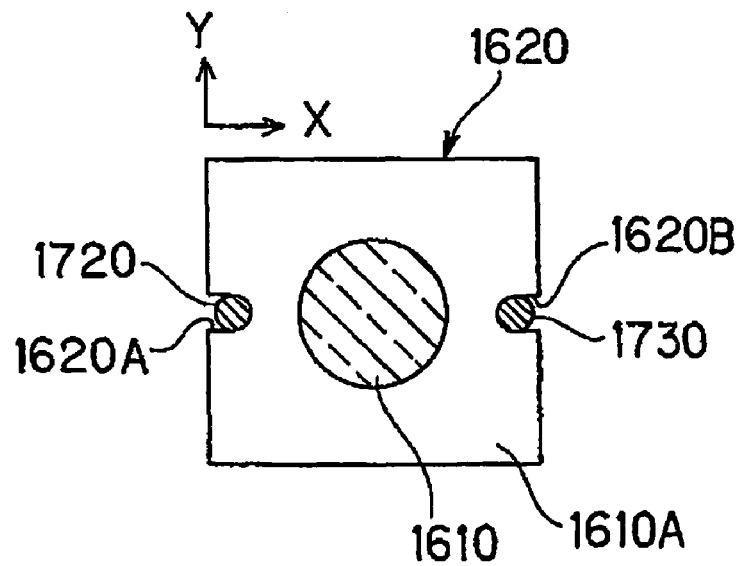

LIGHT-EMITTING DIODE, LED LIGHT, AND LIGHT APPARATUS

TECHNICAL FIELD

This invention relates to a package resin (hereinafter also referred to as light emitting diode or LED) with a light emitting element (hereinafter also referred to as LED chip) installed therein, and an LED light (hereinafter also referred to as light emitting unit) that the LED is used as a light source, and a lamp that is composed using the LED light and can be applied as an automobile tail lamp or stop lamp etc.

BACKGROUND ART

Along with the development of high-brightness light emitting element, an LED light using LED as a light source is progressively used for an automobile rear lamp etc. LED offers a good visibility due to its sharp spectrum. Also, it has a high signaling speed to a following vehicle since the response speed is high, and it has a significant effect in reducing the braking distance in the case of high-speed driving. Further, since LED itself is a monochromatic light source, it is not necessary to cut light color other than desired color by using a filter as is the case with an electrical light bulb. Thus, it can be a monochromatic light source with high efficiency and can save energy.

FIG. 103 shows an example of the LED light. As shown in FIG. 103, a LED light 1000 uses, as a light source, a lens-type LED 1010 that a light emitting element 1020 is sealed with transparent epoxy resin 1050 while being formed of a convex lens. The lens-type LED 1010 is fabricated such that the light emitting element 1020 is mounted on a lead 1030a of a pair of leads 1030a, 1030b, the light emitting element 1020 is bonded to the lead 1030b through a wire 104, and the entire LED is sealed with transparent resin 1050 while being formed of a convex lens. A reflection mirror 1060 with paraboloid is disposed around the lens type LED 1010, and a Fresnel lens 1070 is disposed over the LED 1010. In the above composition, light to be radiated from the lens type LED 1010 is reflected by the reflection mirror 1060 or converged by the Fresnel lens 1070, and is all radiated upward nearly in parallel. Then, light is transmitted through a resin lens 1090 while being diffused by an uneven interface that is formed on the bottom surface of resin lens 1090, and is externally radiated having a diffusion angle of about 20 degrees to meet the regulation for vehicle rear lamp.

On the other hand, as the output of light emitting element is further enhanced, it is desired to cover a predetermined emission area by using a reduced number of light emitting element. This aims to reduce the number of parts and to save labor in mounting parts.

However, in the LED light 1000 described above, if it is tried to use one light emitting element to cover a large area, its dimension increases at a homothetic ratio both in the width direction and in the depth direction. Further, if it is tried to forcedly make it low-profile, its appearance is spoiled. Therefore, there is a problem that it is difficult to provide a low-profile light source which is a characteristic of LED. In addition, light not heading from the light emitting element 1020 to the reflection mirror 1060 or Fresnel lens 1070 cannot be optically controlled and cannot be, therefore, externally radiated. Thus, there is a further problem in external radiation efficiency.

To solve these problems, Japanese patent application laid-open No. 2001-93312 discloses an LED light.

FIG. 104 shows the LED light disclosed therein. FIG. 104(a) is a cross sectional view showing the LED light with a light source centered. FIG. 104(b) is a perspective view showing part of the LED light. The LED light is composed of: the light source 1100; a first reflection surface 1110 that is disposed at a position on the center axis of light source 1100 while being opposite to the light source 1100 and that has a parabolic reflection surface 1110a to allow light radiated from the light source 1100 to be reflected in the Y direction nearly orthogonal to the center axis X of light source 1100; and a second reflection surface 1120 that is disposed around the first reflection surface 1110 and that has a plurality of reflection facets 1120a to allow light reflected by the first reflection surface 1110 to be reflected in the direction of center axis X. In this composition, light to be radiated from the light source 1100 is reflected in the Y direction by the parabolic reflection surface 1110a of first reflection surface 1110, and then the reflected light is reflected in the direction of center axis X by the reflection facets 1120a of second reflection surface 1120. Thus, vehicle signaling light with a predetermined radiation angle can be radiated over a predetermined area.

However, in the LED light, there is a problem that light directly radiated from the light source 1100 cannot be taken out in the perpendicular direction because of being blocked by the first reflection surface 1110 disposed over the light source 1100 and, therefore, a dark portion is generated at the center.

To solve this problem, International Publication No. 99/09349 discloses an LED light.

FIG. 105 shows the LED light disclosed therein. FIG. 105(a) is a cross sectional view showing the LED light with a light source centered. FIG. 105(b) is a cross sectional view cut along the line K-K in FIG. 105(a). The LED light is composed of: a light source 1620 that has a light emitting element 1600, light emitting source, a dome section 1610 and a base section 1610A; a lens element 1740 that has an incident surface 1630, a first reflection region 1640, a first reflection surface 1640A, a direct transmitting region 1650, a second reflection region 1660, a radiation surface 1670, an edge 168, and posts 1720, 1730; and an optical element 1750 that pillow lenses 1750A are arrayed. The second reflection region 1660 of lens element 1740 has pairs of an extraction surface 1660A and a step down 1660B that are formed 360 degrees around the first reflection region 1640. Further, as shown in FIG. 105(b), the light source 1620 is composed such that the dome section 1610 is positioned at the center of first reflection region 1640 by fitting the posts 1720, 1730 of lens element 1740 into recesses 1620A, 1620B of the base section 1610A.

In this composition, light to be radiated from the light source 1620 is reflected by the first reflection surface 1640A in a direction orthogonal to the center axis of light source 1620. Then, reflected light is further reflected by the extraction surface 1660A in the center axis direction to be radiated as light A from the radiation surface 1670. On the other hand, light B from the light source 1620 is directly transmitted though the direct transmitting region 1650 to be radiated in the center axis direction. Thus, light with an enlarged radiation area is entered into the optical element 1750.

However, in the above LED light, there is a problem that the entire thickness must be increased since there is provided the dome section 1610 to converge light radiated from the light source 1620 to the center axis.

Further, it is difficult to perfectly align the center axis of lens element 1740 with the center axis of light source 1620 in fabrication and, therefore, a deviation in position may occur and uniformity in brightness is difficult to obtain over all directions. Namely, the light source 1620 and lens element 1740 are separately prepared and then aligned with each other in fabrication. If a precision in alignment of the center axis of light source 1620 with the first reflection region 1640 of lens element 1740 lowers, the amount of reflected light in all reflection directions given by the first reflection region 1640 becomes uneven and unevenness (difference) in brightness will occur on the surface of LED light. Especially in the case of optical system with such a high light focusing characteristic that most of light radiated from the light source 1620 is radiated upward, there occurs a significant difference in brightness due to unevenness in the light distribution of light source 1620 itself or due to unevenness in optical characteristics thereof caused by a deviation in position in a direction perpendicular to the center axis between the lens element 1740 and the light source 1620. Namely, in the above LED light, since light form the light emitting element 1600 is radiated being focused by the dome section 1610, there may occur a significant difference in the distribution of light to be radiated from the dome section 1610 even when a slight deviation in position is generated between the center axis of light source 1600 and the center axis of dome section 1610. As described above, it has a potential problem that the structure of light source 1620 itself may cause a difference in light distribution characteristic. In addition, due to a deviation in position in mounting the lens element 1740 separately prepared, there occurs a problem that the amount of reflected light in all reflection directions given by the first reflection region 1640 becomes uneven.

Further, there are problems that the light utilization efficiency lowers due to sideward light not enabled to be focused on the center axis by the dome section 1610 and that the radiation area cannot be therefore enlarged. Namely, light to be radiated from the light source 1620 in the horizontal direction (X direction) is reflected by the second reflection region 1660. Further, light not enabled to be reflected by neither the first reflection region 1640 nor the second reflection region 1660 is not radiated in the z direction. Thus, the light utilization efficiency lowers.

Further, since the light source 1620 and the lens element 1740 are prepared separately, light from the light source 1620 is transmitted through air layer before entering into the incident surface 1630 of lens element 1740. Therefore, loss of light is generated in that air layer or at the interface. If a stain exists at the interface of the light source 1620 and lens element 1740, further loss of light is generated. Still further, due to the separate preparation, a deviation in position may occur when being subjected to a physical shock. Therefore, it is difficult to design an optical system that the light emitting element and reflection mirror is close to each other. Further, there are problems that the number of parts or fabrication steps increases and that variation of precision in fabrication increases.

These problems described above are also included in the LED light disclosed in Japanese patent application laid-open No. 2001-93312.

Accordingly, even when a lamp such as an automobile brake lamp-integrated tail lamp is manufactured by using such LED lights, the proper brightness of light source cannot be utilized due to the above problems. Because of this, the lamp appears dark as a whole and lacks a degree of freedom in appearance.

An object of the invention is to provide a light emitting diode and an LED light that have a good appearance based on the low-profile property of LED, an enlarged radiation area while using one light emitting element, and an even brightness in all directions and high external radiation efficiency, and to provide a high-brightness lamp that is enabled to efficiently use light radiated from a light source.

Another object of the invention is to provide a light emitting unit that is low-profile, highly efficient and that can be applied to an irregular shape without reducing the efficiency and that can be disposed along a slope while having high external radiation efficiency.

A further object of the invention is to provide a lamp using a light emitting unit that is enabled to radiate light with an angle widened as much as possible while preventing the proper brightness of a light source.

A still further object of the invention is to provide a lamp that is low-profile, highly efficient, and that has a large degree of freedom in appearance and an even brightness on the entire surface and that offers a natural feel with glitter.

DISCLOSURE OF INVENTION

To solve the abovementioned problems, a light emitting diode (LED) of the invention comprises:

a light emitting element mounted on a power source supply means;

a sealing means of a transparent material to seal the light emitting element;

a reflection surface that is opposite to an emission surface of the light emitting element and reflects light emitted from the light emitting element in a direction orthogonal to the center axis of the light emitting element or in a direction at a large angle to the center axis; and a side radiation surface that sideward radiates light reflected by the reflection surface in a direction orthogonal to the center axis of the light emitting element or in a direction at a large angle to the center axis.

The LED may have a central radiation surface that is disposed at the center of the reflection surface and radiates light emitted from the light emitting element in a direction nearly parallel to the center axis of the light emitting element.

It is desirable that the central radiation surface has an area smaller than the emission area of the light emitting element. For example, when the central radiation surface is formed circular, it is more desirable that it is 0.1 mm or more and less than the diagonal length of emission surface of the light emitting element. This is because, in the case of less than 0.1 mm, the radiation effect of central radiation surface cannot be expected so much and, in the case of exceeding the diagonal length of emission surface, light cannot be efficiently radiated in the horizontal direction and, when a reflection mirror is provided around the light emitting element, the reflection intensity by reflection mirror is unbalanced to the radiation intensity from central radiation surface. The central radiation surface may be formed planar, curved, concave or convex, or into its combination.

The side radiation surface may radiate, in addition to light reflected by the reflection surface, light directly irradiated from the light emitting element in a direction orthogonal to the center axis or in a direction at a large angle to the center axis.

The central radiation surface and the reflection surface may be close to the light emitting element. It is preferable that the distance between central radiation surface and light emitting element is, for example, in the range of 0.1 mm to 1.5 mm from the element emission surface. It is more preferable that, when a wire-bonding type light emitting element is used, the central radiation surface is formed in the range of 0.3 mm to 1.0 mm from the element emission surface in the center axis direction of light emitting element. This is because, in the case of using a wire-bonding type light emitting element, the wire is upward drawn out and bent and, therefore, if bent excessively, its disconnection may be generated, and because at least a space of 0.3 mm is needed since the wire is also sealed with the transparent resin. In the case of exceeding 1.0 mm, as described later in embodiment 1, in the wire-bonding type light emitting element, the increment in solid angle of the reflection surface decreases and, therefore, its difference decreases as compared to the case of not forming the central radiation surface.

It is preferable that the outer diameter of the sealing means of transparent material is 5 to 15 mm. This is because, in the case of less than 5 mm, the reflection efficiency of reflection surface cannot be expected sufficiently and, in the case of exceeding 15 mm, the damage to light emitting element due to resin stress become significant.

Further, to solve the abovementioned problems, a light emitting diode (LED) of the invention comprises:

a light emitting element mounted on a power source supply means; and a sealing means of a transparent material to seal the light emitting element;

wherein the sealing means comprises: a reflection surface that reflects light emitted from the light emitting element in a direction orthogonal to the center axis of the light emitting element or in a direction at a large angle to the center axis; and a side radiation surface that sideward radiates light reflected by the reflection surface; and the reflection surface has a shortest distance from the light emitting element of less than ½ a radius R of the reflection surface so as to form a proximity optical system.

Further, a light emitting diode (LED) of the invention comprises:

a light emitting element mounted on a power source supply means; and a sealing means of a transparent material to seal the light emitting element;

wherein the sealing means comprises: a reflection surface that reflects light emitted from the light emitting element in a direction orthogonal to the center axis of the light emitting element or in a direction at a large angle to the center axis; and a side radiation surface that sideward radiates light reflected by the reflection surface; and the reflection surface is formed such that its radius R is greater than a height H from the emission surface of the light emitting element to an edge of the reflection surface in the center axis direction of the light emitting element so as to form a proximity optical system.

It is desirable that, in the LED, the light emitting element has a radiation intensity $I(\theta)$ represented by: $I(\theta)=k\cdot\cos\theta+(1-k)\cdot\sin\theta$ at an emission angle $\theta$ of emitted light to the center axis direction, where k is a constant to be determined by a radiation intensity according to the emission angle $\theta$ of the light emitting element, and $k \leqq 0.8$ is satisfied.

It is preferable that, in the LED, the light emitting element comprises a transparent substrate to have a light transmitting property to light emitted therefrom.

It is desirable that, in the LED, the sealing means comprises a light diffusing material to cover the light emitting element.

In the LED, the light diffusing material may be a phosphor.

Further, to solve the abovementioned problems, a light emitting diode (LED) of the invention comprises:

a light emitting element that is mounted on a power source supply means and sealed with a sealing member of a transparent material; and the sealing member that comprises a reflection surface and a side reflection surface formed thereon, the reflection surface reflecting light radiated from an emission surface of the light emitting element and the side radiation surface radiating reflected light from the reflection surface and direct light form the light emitting element;

wherein the reflection surface has a solid angle of $2\pi\{1-\cos\theta c\}$ or greater to the light emitting element, where $\theta c$ is a critical angle of the transparent material, and the side radiation surface is formed such that an incident angle of reflected light from the reflection surface and an incident angle of direct light from the light emitting element are smaller than $\theta c$ so as to externally radiate light emitted from the light emitting element.

The reflection surface may have a shape to be formed by rotating, around the center axis of the light emitting element, part of a line represented by $Z=f(X)$ in a plane formed between the center axis (Z-axis) of the light emitting element and an X-axis orthogonal to the Z-axis, and the $Z=f(X)$ satisfies $\{d^2f(X)/dX^2\}<0$. If the $Z=f(X)$ satisfies $\{d^2f(X)/dX^2\}<0$, even when a large solid angle to the light emitting element is taken in the case of the reflection surface having the same diameter, then an incident angle to the side radiation surface can be small.

The reflection surface may have a shape to be formed by rotating, around the center axis of the light emitting element, part of ellipse, parabola or hyperbola with a focal point at the light emitting element or its vicinity. These are typical forms, practically available, of curves represented by $\{d^2f(X)/dX^2\}<0$.

The side radiation surface may have a slope to be inclined to the light emitting element.

The side radiation surface may compose part of a spherical surface centered at the light emitting element.

Further, to solve the abovementioned problems, a light emitting diode (LED) of the invention comprises:

the lead frame that is protruded out of the transparent resin while being bent under its mount surface from the vicinity of a mount position of the light emitting element so as to reduce part of the lead frame sealed with the transparent resin as much as possible.

The LED may comprise the lead frame that comprises part sealed with the transparent resin that has a wide area sufficient to widely conduct and disperse heat generated from the light emitting element.

The lead frame may be of a material with a high thermal conductivity. It is desirable that it is of a conductive material with a thermal conductivity of 300 W/m·k or more.

Further, a light emitting diode of the invention may comprise:

a light emitting element to emit light;

a lead frame to supply electric power to the light emitting element mounted thereon; and a transparent resin to seal the light emitting element and the lead frame;

wherein the transparent resin comprises: a first transparent resin to seal the light emitting element and part of the lead frame; and a second transparent resin disposed in contact with and around the side of the first transparent resin.

Further, to solve the abovementioned problems, a light emitting diode (LED) of the invention comprises:

an light emitting section that comprises a two-dimensional direction reflection surface to reflect light emitted from a light emitting element embedded in a transparent material at least in a two-dimensional direction; and a reflector section that is optically connected at least around in the two-dimensional direction of the light emitting section and comprises a reflection surface formed extending from the two-dimensional direction reflection surface.

The reflector section may be formed low-profile and additionally reflect light reaching a surface opposite to the reflection surface of light radiated from the light emitting section.

The reflector may comprise a stepwise reflection surface that is opposite to the reflection surface and, in a direction perpendicular to the two-dimensional direction, reflects light being reflected by the two-dimensional direction reflection surface and the reflection surface in the two-dimensional direction.

The two-dimensional direction reflection surface of the light emitting section may have a shape to be formed by rotating, around a perpendicular axis passing through the center of an emission surface of the light emitting element, part of ellipse, parabola, hyperbola or its approximated curve with a focal point at the light emitting element or its vicinity.

A light emitting diode of the invention may comprise:

a light source section that comprises a circular cone portion that is opposite to an emission surface of a light emitting element embedded and is formed protruding outside; and a reflection section that comprises a two-dimensional direction reflection surface that is connected at least to the circular cone portion and reflects light radiated from the light source section at least in a two-dimensional plane direction.

Further, to solve the abovementioned problems, an LED light of the invention comprises:

an LED; and a reflection mirror disposed around the LED;

wherein the LED comprises: a light emitting element mounted on a power source supply means; a sealing means of a transparent material to seal the light emitting element; a reflection surface that is opposite to an emission surface of the light emitting element and reflects light emitted from the light emitting element in a direction orthogonal to the center axis of the light emitting element or in a direction at a large angle to the center axis; and a side radiation surface that sideward radiates light reflected by the reflection surface in a direction orthogonal to the center axis of the light emitting element or in a direction at a large angle to the center axis.

It is desirable that the LED further comprises a central radiation surface that is disposed at the center of the reflection surface and radiates light emitted from the light emitting element in a direction nearly parallel to the center axis of the light emitting element.

An LED light of the invention may comprise:

an LED that comprises: a light emitting element mounted on a power source supply means; and a sealing means of a transparent material to seal the light emitting element; wherein the sealing means comprises: a reflection surface that reflects light emitted from the light emitting element in a direction orthogonal to the center axis of the light emitting element or in a direction at a large angle to the center axis; and a side radiation surface that sideward radiates light reflected by the reflection surface; and the reflection surface has a shortest distance from the light emitting element of less than ½ a radius R of the reflection surface so as to form a proximity optical system; and a reflection mirror that reflects light radiated from the LED.

The light emitting element may have a radiation intensity $I(\theta)$ represented by: $I(\theta)=k\cdot\cos\theta+(1-k)\cdot\sin\theta$ at an emission angle $\theta$ of emitted light to the center axis direction, where k is a constant to be determined by a radiation intensity according to the emission angle $\theta$ of the light emitting element, and $k\leq 0.8$ is satisfied.

An LED light of the invention may comprise:

an LED that comprises: a light emitting element that is mounted on a power source supply means and sealed with a sealing member of a transparent material; and the sealing member that comprises a reflection surface and a side reflection surface formed thereon, the reflection surface reflecting light radiated from an emission surface of the light emitting element and the side radiation surface radiating reflected light from the reflection surface and direct light form the light emitting element; wherein the reflection surface has a solid angle of $2\pi\{1-\cos\theta c\}$ or greater to the light emitting element, where $\theta c$ is a critical angle of the transparent material, and the side radiation surface is formed such that an incident angle of reflected light from the reflection surface and an incident angle of direct light from the light emitting element are smaller than $\theta c$ so as to externally radiate light emitted from the light emitting element; and a reflection mirror that reflects light radiated from the LED.

An LED light of the invention may comprise:

an LED that comprises: a light emitting element to emit light; a lead frame to supply electric power to the light emitting element mounted thereon; and a transparent resin to seal the light emitting element and the lead frame; wherein the lead frame is protruded out of the transparent resin while being bent under its mount surface from the vicinity of a mount position of the light emitting element; and a reflection mirror that reflects light radiated from the LED.

An LED light of the invention may comprise:

an LED that comprises: a light emitting element to emit light; a lead frame to supply electric power to the light emitting element mounted thereon; and a transparent resin to seal the light emitting element and the lead frame; wherein the lead frame comprises part sealed with the transparent resin that has a wide area sufficient to widely conduct and disperse heat generated from the light emitting element; and a reflection mirror that reflects light radiated from the LED.

An LED light of the invention may comprise:

a light emitting element;

a first reflection mirror that is formed on the light emitting element and reflects light emitted from the light emitting element in the side direction; and a second reflection mirror that upward reflects light from the first reflection mirror.

A third reflection mirror may be disposed inside the second reflection mirror and upward reflects light sideward emitted from the light emitting element.

The first reflection mirror and the second reflection mirror may be formed into one optical member.

The second reflection mirror may be in the shape of a polygon or its similar form when viewed from upward.

The light emitting element may be mounted on a circuit board on a metal plate.

Further, to solve the abovementioned problems, a light emitting unit of the invention comprises:

a light source that comprises: a light emitting element mounted on a power source supply means; a sealing means of a transparent material to seal the light emitting element; a first reflection surface that is opposite to an emission surface of the light emitting element and reflects light emitted from the light emitting element in a direction orthogonal to the center axis of the light emitting element or in a direction at a large angle to the center axis; and a side radiation surface that sideward radiates light reflected by the first reflection surface in a direction orthogonal to the center axis of the light emitting element or in a direction at a large angle to the center axis; and a reflector that comprises a plurality of second reflection surfaces to reflect the light radiated from the side radiation surface in a predetermined radiation direction.

It is preferable that, in the light emitting unit, the light source further comprises a central radiation surface that is disposed at the center of the first reflection surface and radiates light emitted from the light emitting element in a direction nearly parallel to the center axis of the light emitting element.

It is preferable that, in the light emitting unit, the first reflection surface is formed close to the light emitting unit so as to increase a light receiving angle (solid angle) of the upper reflection surface.

It is preferable that, in the light emitting unit, the light source is displaced from the center and the position of optical control surfaces neighboring in the circumference direction is different from each other in the radius direction.

In the light emitting unit, the reflector may reflect the light, as the predetermined radiation direction, in a direction with a predetermined inclination to the center axis of the light emitting element by the plurality of second reflection surfaces.

In the light emitting unit, the reflector may be mounted on an inclined section.

In the light emitting unit, the plurality of second reflection surfaces each may have an optical control surface that its angle and direction are set to allow reflected light to be reflected in a same direction.

Further, to solve the abovementioned problems, a lamp of the invention comprises:
a plurality of light emitting units each of which comprises: a light source that comprises an optical system to radiate light emitted from a light emitting element in a direction orthogonal to the center axis of the light emitting element or in a direction at a large angle to the center axis; and a reflector that comprises a plurality of second reflection surfaces to, in a predetermined direction, reflect the light radiated from the light source in the direction orthogonal to the center axis of the light emitting element or in the direction at the large angle to the center axis;
wherein the plurality of light emitting units are disposed in a predetermined arrangement.

In the lamp, the light source may have a lead frame fixed on aboard disposed on the back side of a housing, and its fixing position corresponds to a penetration hole of the reflection mirror.

In the lamp, the board may be, at the fixing position, provided with a concave member into which the lead frame is inserted.

In the lamp, the light source may comprise: a light emitting element mounted on a power source supply means; a sealing means of a transparent material to seal the light emitting element; a first reflection surface that is opposite to an emission surface of the light emitting element and reflects light emitted from the light emitting element in a direction orthogonal to the center axis of the light emitting element or in a direction at a large angle to the center axis; and a side radiation surface that sideward radiates light reflected by the first reflection surface in a direction orthogonal to the center axis of the light emitting element or in a direction at a large angle to the center axis.

In the lamp, the light source may comprise a plurality of LED's that are arranged radially such that an intersection point of the center axes of the plurality of LED's is a point on a same plane.

In the lamp, the plurality of light emitting units may be disposed such that part of the reflector of the neighboring light emitting units is overlapped.

In the lamp, the plurality of light emitting units may include a plurality of light emitting units that are arranged at multiple stages or in multiple rows, and the light emitting units at each stage include a plurality of light emitting units arranged linearly.

In the lamp, the plurality of light emitting units may be arranged through a partition plate to separate the plurality of light emitting units arranged linearly.

In the lamp, the plurality of light emitting units may have a light reflection finish on at least part of the circumference of the light emitting unit or the partition plate.

In the lamp, the plurality of light emitting units may be disposed such that the neighboring light emitting units are arranged at different stages in the center axis direction.

In the lamp, the plurality of light emitting units may be composed such that a plurality of reflection surfaces are concentric disposed around the light source.

In the lamp, the plurality of reflection surfaces may be formed nearly planar.

Herein, "angle" means an angle of the light source to the light radiation surface and "direction" means an angle of the light source to the light radiation direction.

BRIEF DESCRIPTION OF DRAWINGS

FIG. 3 is graphs showing the relationship between a distance h from the upper surface of a light emitting element to a central radiation surface and an increment of solid angle in the light emitting diode shown in FIG. 2, wherein (a) is the case of a diameter in transparent resin of 5 mm, (b) of 7.5 mm and (c) of 15 mm.

FIG. 11(a) is a plain view showing an LED light in embodiment 1B of the invention, (b) is a cross sectional view cut along the line A-A in (a), and (c) is an enlarged cross sectional view showing part P in (b).

FIG. 19(a) is a plain view showing a sixth modification of the LED light in embodiment 1B of the invention, (b) is a cross sectional view cut along the line E-E in (a), and (c) is a cross sectional view cut along the line F-F in (a).

FIGS. 31(a) and (b) are illustrations showing observation conditions of light amount radiated from LED.

FIG. 33(a) is a plain view showing an LED light using an LED in embodiment 2B of the invention, and (b) is a cross sectional view showing the vicinity of a light emitting element in (a).

FIG. 35(a) is a plain view showing an LED light using an LED in embodiment 2C of the invention, and (b) is a cross sectional view showing the vicinity of a light emitting element in (a).

FIGS. 40(a), (b) and (c) are characteristic diagrams showing a light intensity distribution, a light flux distribution, and a light flux integration in a standard light emitting element (in case of 20 mil and 14 mil).

FIG. 42(a) is a plain view showing a first modification of the LED in embodiment 3A of the invention, and (b) is a cross sectional view thereof.

FIG. 48 shows a dimensional relationship between LED and second reflection mirror in an LED light using the LED in embodiment 3B of the invention, wherein (a) is the case of using LED with a small diameter and (b) is the case of using LED with a large diameter.

FIG. 57(a) is a plain view showing the LED with lead frames of wide area, (b) is a cross sectional view of (a), and (c) is a cross sectional view in the case of having fins in (b).

FIG. 61(*a*) is a plain view showing an LED in embodiment 6A of the invention, and (b) is a cross sectional view thereof.

FIG. 66(*a*) is a plain view showing an LED in embodiment 6D of the invention, and (b) is a cross sectional view thereof.

FIG. 96(*a*) is a cross sectional view cut along the line A-A to show a segment of another modification of the lamp in embodiment 8A of the invention, and (b) is a cross sectional view cut along the line B-B.

FIG. 104 shows another example of the conventional LED light, wherein (a) is a cross sectional view showing the LED light with a light source centered, and (b) is a perspective view showing part of the LED light.

FIG. 105 shows another example of the conventional LED light, wherein (a) is a cross sectional view showing the LED light with a light source centered, and (b) is a cross sectional view cut along the line K-K in (a).

BEST MODES FOR CARRYING OUT THE INVENTION

The embodiments of the invention will be explained below with reference to the drawings.

Embodiment 1A

Figure 1:
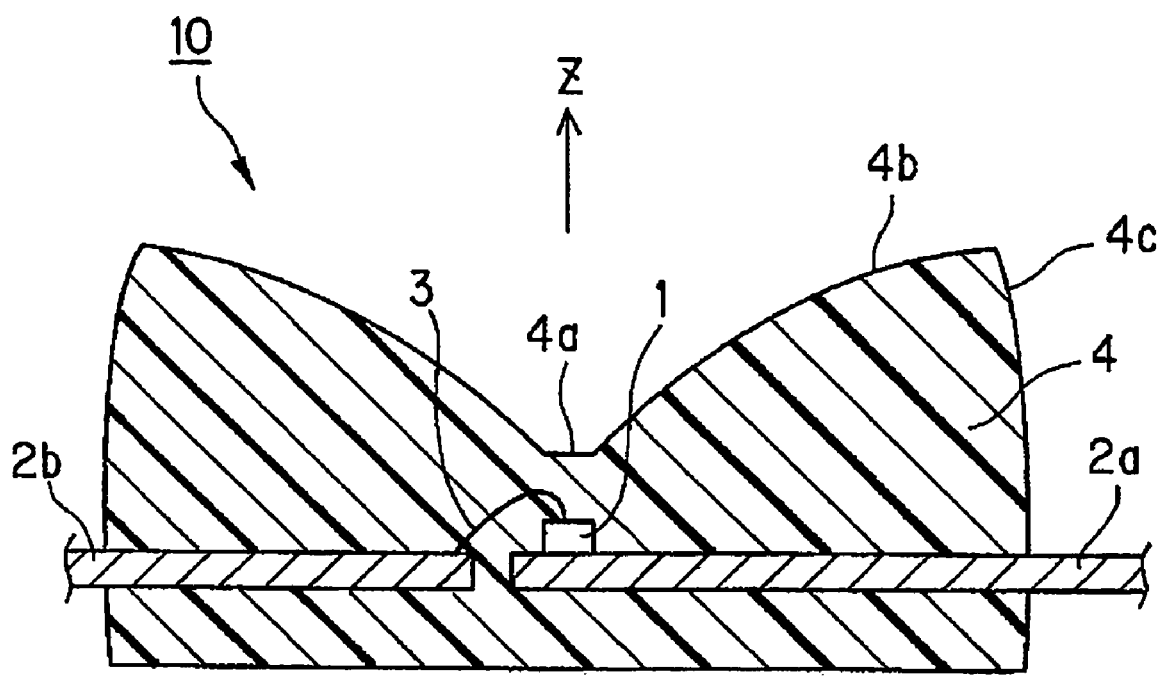
FIG. 1 is a cross sectional view showing a light emitting diode in embodiment 1A of the invention.

At first, a light emitting diode in embodiment 1A of the invention will be explained with reference to FIG. 1 and FIG. 2. As shown in FIG. 1, the light emitting diode 10 has a light emitting element 1 that has dimensions of 400×400 μm and is mounted through Ag paste (not shown) on a lead frame 2*a*. The light emitting element 1 has an electrode, which has a diameter of 0.1 mm and is formed on the center of emission surface, and a gold wire ball (not shown) formed thereon that are electrically connected through a wire 3 with a diameter of 30 μm to a lead 2b with an opposite polarity. These are sealed with transparent resin 4 and the optical surface is molded.

Figure 2:
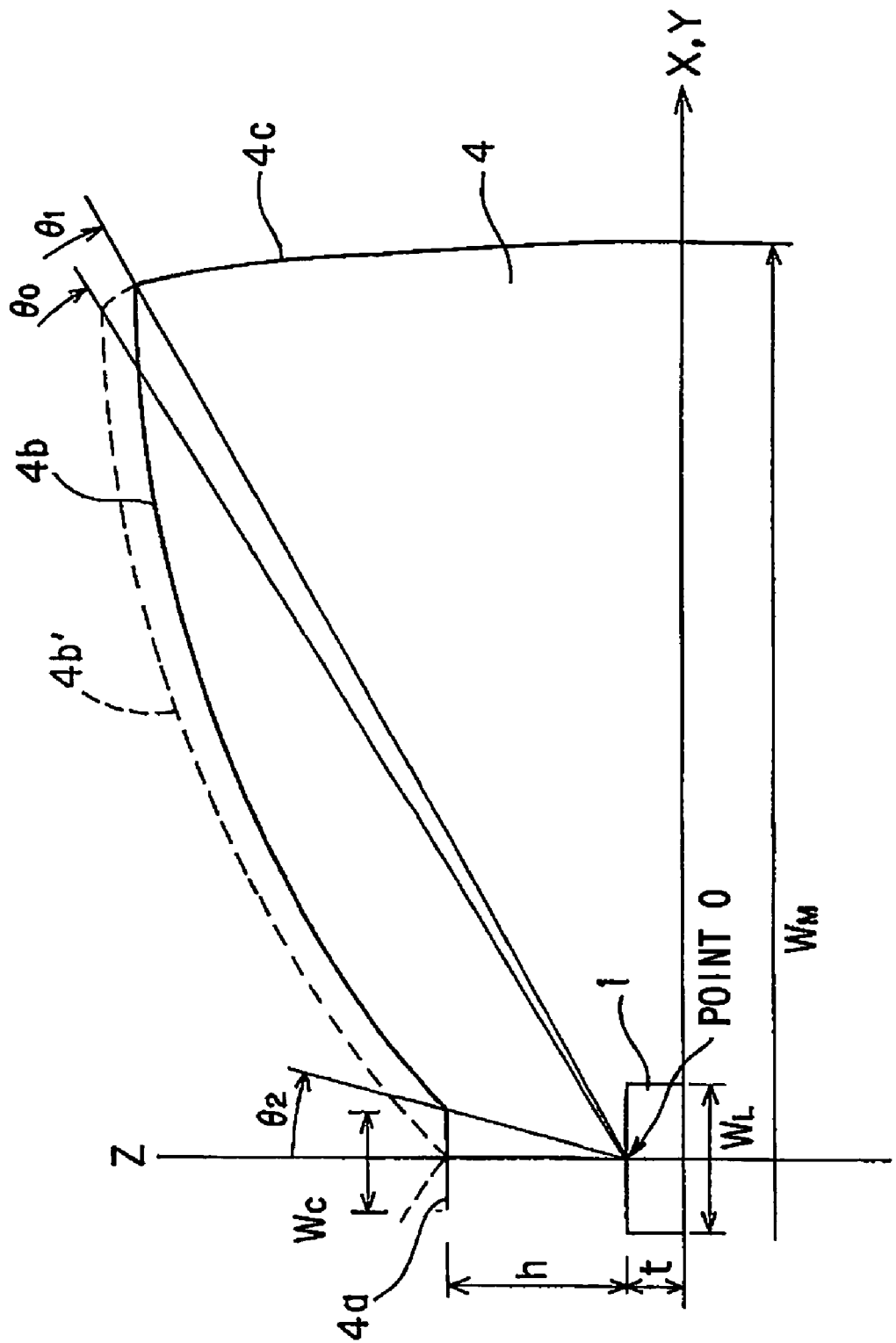
FIG. 2 is an enlarged cross sectional view showing part of the light emitting diode in embodiment 1A of the invention.

As shown in FIG. 2, the optical surface is composed of a central radiation surface 4a, an upper reflection surface 4b and a side radiation surface 4c. The central radiation surface 4a is h=0.5 mm above the upper surface of light emitting element 1 and is in the shape of a cylinder with a diameter of Wc=0.3 mm. The upper reflection surface 4b is formed by, around a z-axis, rotating a parabola that has a focal point at the center of upper surface of light emitting element 1, passing through the end of central radiation surface 4a, and having a symmetry axis perpendicular to the z-axis. The side radiation surface 4c is formed as a cylindrical surface that is nearly perpendicular to the z-axis and is slightly tapered to facilitate the release from a die. The transparent resin 4 composed of the central radiation surface 4a, upper reflection surface 4b and side radiation surface 4c has an outer diameter of Wm=7.5 mm.

In order to have a larger sold angle when the transparent resin 4 is set to be a predetermined outer diameter, the upper reflection surface may have a shape to be formed by rotating a parabola with the same focal position and a smaller homothetic ratio (for example, 4b' to 4b). However, in the case of a wire bonding type light emitting element, a wire space is needed over the light emitting element 1 as shown in FIG. 1. Namely, the light emitting element 1 has an electrode (n-electrode or p-electrode) on its upper surface and the wire 3 is bonded thereto. A space of at least 0.3 mm (0.2 mm for wire and 0.1 mm for seal) is required since the wire 3 to be drawn upward and bent in installation may be broken when being extremely bent and it has to be sealed with transparent resin. Therefore, the optical surface is provided with the upper reflection surface 4b with a homothetic ratio smaller than a virtual upper reflection surface 4b' indicated by a dotted curve and with the central radiation surface 4a.

Due to the optical surface thus composed, light heading to the Z-axis direction can be radiated from the center of LED package and the reflection efficiency in a direction perpendicular to the Z-axis can be enhanced. Namely, in FIG. 2, provided that the center of emission surface of light emitting element 1 is point 0 (zero), an angle to the Z-axis of a direction from the point 0 edge to the edge of upper reflection surface is $\theta_0$=60 degrees in the case of dotted curve 4b' and $\theta_1$=65 degrees in the case of solid curve 4b. These angles correspond to, as solid angle, $A_0$=3.1 strad and $A_1$=3.6 strad to the point 0 (in both cases, the upper reflection surface has a shape to be formed by rotating, around the Z-axis, a parabola with a symmetry axis perpendicular to the Z-axis). On the other hand, an angle $\theta_2$ to the Z-axis of a direction from the point 0 to the edge of central radiation surface is 17 degrees and a solid angle to the point 0 is $A_2$=0.25 strad. Namely, by providing the optical surface indicated by the solid curve, although at part of the central radiation surface the solid angle is decreased by $A_2$=0.25 strad since reflection to a direction nearly perpendicular to the Z-axis is not obtained, an increment of solid angle becomes $A_1-A_0$=0.5 by changing 4b' into 4b. Thus, an increment of solid angle is eventually $(A_1-A_0)-A_2$=0.25 when the decrement is subtracted. A solid-angle increment ratio of upper reflection surface to light source is 0.25/π, i.e., increased by about 10%. Accordingly, the radiation efficiency to a direction perpendicular to the Z-axis can be enhanced.

Although in embodiment 1A the light emitting diode 10 is exemplified that the central radiation surface with a diameter of 0.3 mm is provided the light emitting element 1 of 400 μm square, the other dimensions may be used other than the above. However, if the central radiation surface 4a is extremely expanded, more light will be radiated from the upper surface and the radiation efficiency to a direction perpendicular to the Z-axis will lower. Thereby, the original concept will be spoiled. Therefore, it is desired that the central radiation surface 4a is limited to about the dimensions of emission surface of light emitting element or smaller. Further, although in embodiment 1A the distance h between the upper emission surface of light emitting element 1 and the central radiation surface is 0.5 mm and the diameter of transparent resin 4 is 7.5 mm, suitable values other than the above may be used in the range the effect can be obtained.

FIG. 3(*a*), (*b*) and (*c*) show, as a function of h, a solid-angle increment of upper reflection surface to point 0 in the case of forming a central radiation surface (4a and 4b) in comparison with the case of not forming a central radiation surface (4b' in FIG. 2) while setting the diameter of transparent resin to be 5 mm, 7.5 mm and 15 mm, respectively. Referring to FIG. 3(*b*), in the case of transparent resin with a diameter of 7.5 mm, the solid-angle increment can be maximum at h=0.6 mm as compared to the case of not forming the central radiation surface. If h increases greater than this, a difference to the case of not forming the central radiation surface decreases and the solid-angle increment of upper reflection surface lowers. On the other hand, if h decreases, the solid-angle increment of upper reflection surface lowers since a solid angle occupied by the central radiation surface increases. Even when the diameter of transparent resin is changed, the same tendency is observed. Such a tendency is significant in the case of transparent resin with a small diameter rather than in the case of transparent resin with a large diameter. However, if the diameter is less than 15 mm, the advantageous effect in solid-angle increment can be obtained by providing the central radiation surface. In view of the above results, it is desirable to have h=0.3 to 1.0 mm and a diameter of transparent resin of 5 to 15 mm.

In FIG. 2 and FIG. 3, when the central radiation surface 4a is closed to the emission surface of light emitting element 1 like the case of transparent resin with a diameter of 15 mm and h=0.3 mm, the edge angle ($\theta_2$) of central radiation surface 4a and its solid angle ($A_2$) are increased theoretically. Therefore, the solid-angle increment $((A_1-A_0)-A_2)$ of upper reflection surface 4b to point 0 in the case of forming a central radiation surface in comparison with the case of not forming a central radiation surface becomes negative as shown in FIG. 3(*c*). However, in fact, since the light emitting element under the central radiation surface 4a is provided with the electrode with a diameter of 0.1 mm formed on the center of its emission surface and with the gold wire ball which are all non-emission parts, the amount of light to be externally radiated from the central radiation surface does not increase. Therefore, the influence of negative solid-angle increment caused by $A_2$ is exactly weak and the radiation efficiency to a direction nearly perpendicular to the Z-axis can be enhanced due to an increment $(A_1-A_0)$.

Figure 4:
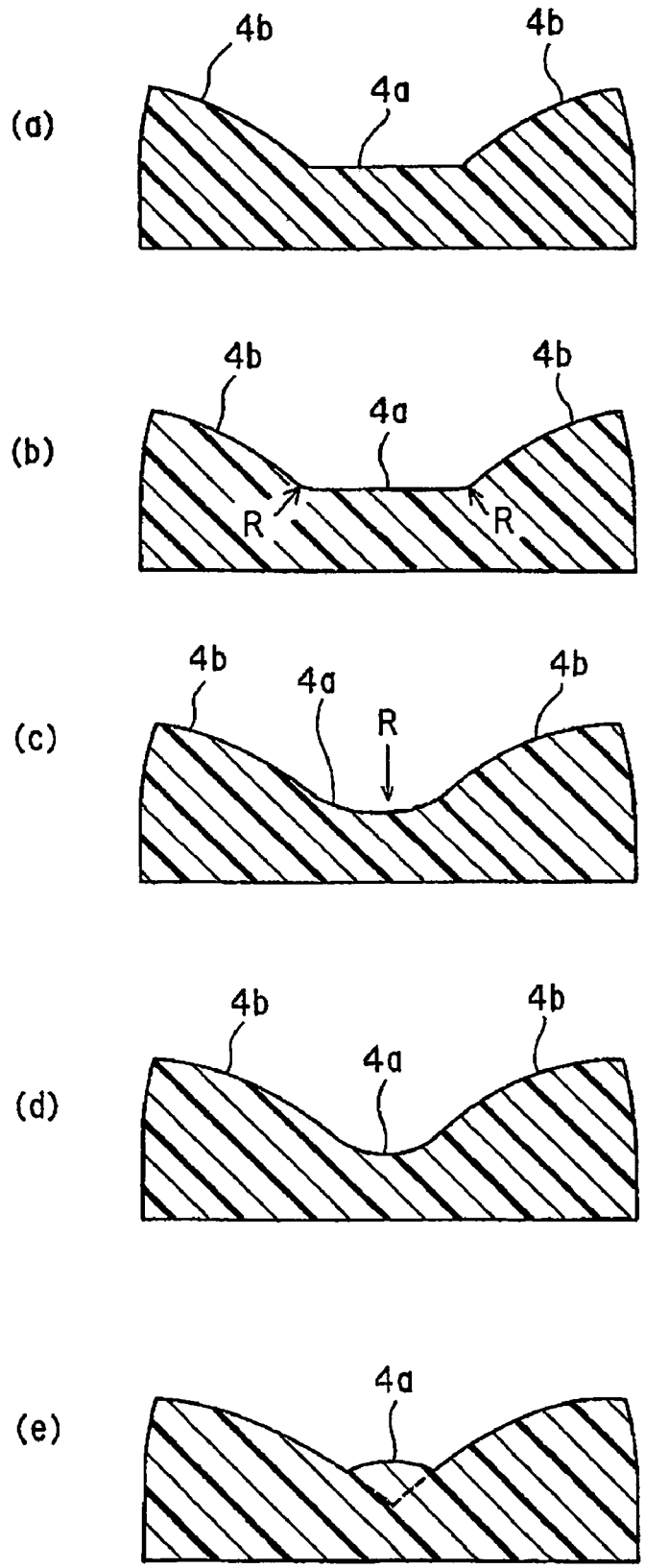
FIG. 4 is cross sectional views showing shape examples of the central radiation surface of the light emitting diode in embodiment 1A of the invention, wherein (a) is planar, (b) is curved only at the boundary of central radiation surface and upper reflection surface, (c) is curved on the entire central radiation surface, (d) is concaved and (e) is convexed.

The central radiation surface 4a is not limited to planar as shown in FIG. 4(*a*) and may be curved only at the boundary of central radiation surface 4a and upper reflection surface 4b as shown in FIG. 4(*b*), curved over the entire central radiation surface 4a as shown in FIG. 4(*c*), concave as shown in FIG. (d), or convex as shown in FIG. 4(*d*).

Figure 5:
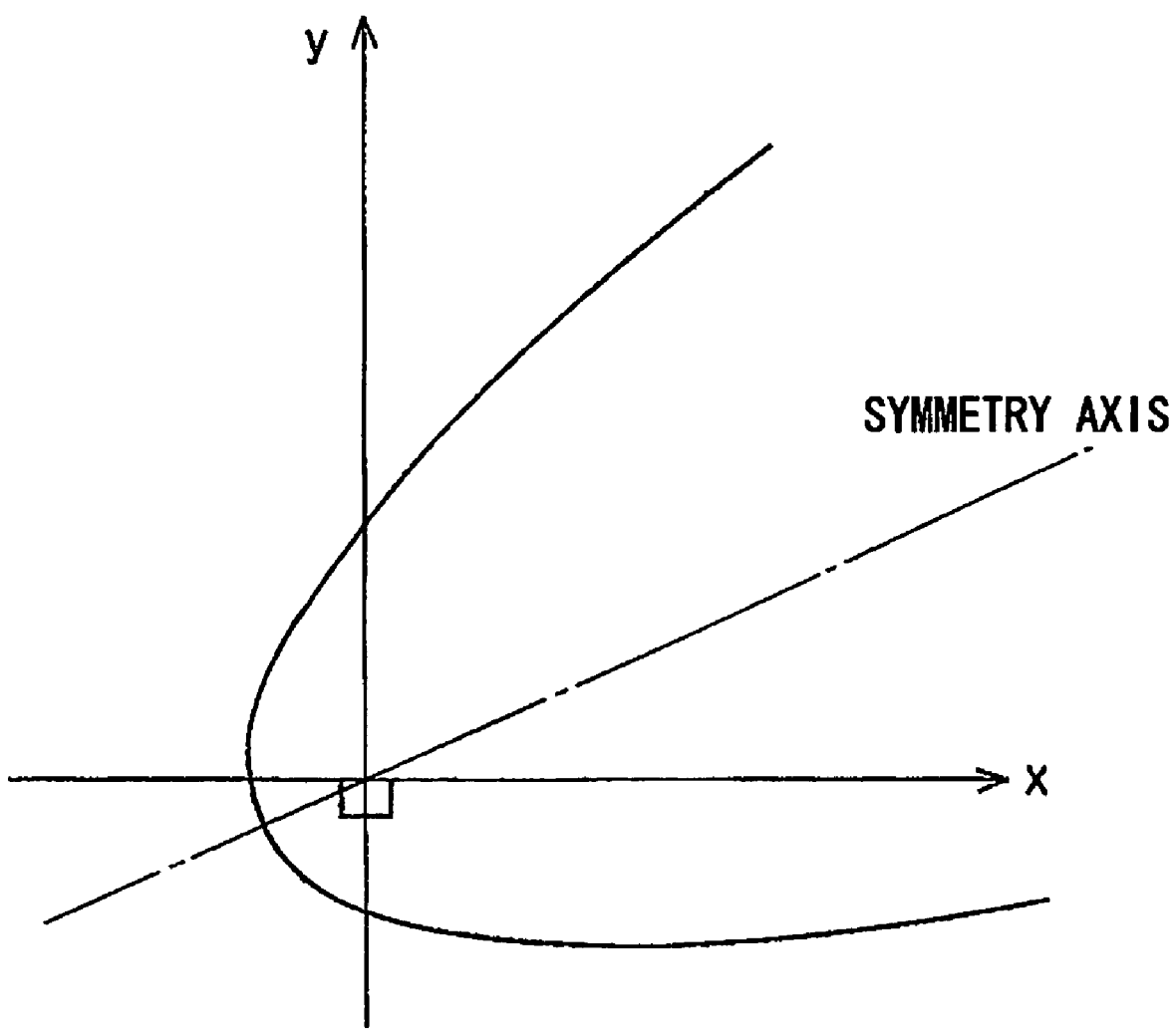
FIG. 5 is a graph illustrating another example of upper reflection surface of the light emitting diode in embodiment 1A of the invention.

The upper reflection surface 4b may have a shape to be formed not only by rotating a parabola with a focal point at the center of upper surface of light emitting element and with a symmetry axis on the X-axis but also by rotating a parabola that has a symmetry axis in a direction inclined from the X-axis as shown in FIG. 5. Further, it may have a shape to be formed by rotating an ellipse with long focus or hyperbola or the like other than parabolas.

The light emitting element may be provided with the electrode formed at the periphery of upper surface other than at the center of upper surface. In this case, the limitation of dimension h as described above does not occur in view of wire space. However, if disposed too close, the solid angle (to he light emitting element) of the central radiation surface 4a becomes significantly large at the upper reflection surface 4b. In the resin sealing, if the gap is narrow, the resin may be not filled therein and the light emitting element may be subjected to an unnatural stress even after the sealing. Therefore, it is desirable that a predetermined space is provided between the upper emission surface of light emitting element 1 and the central radiation surface.

Figure 6:
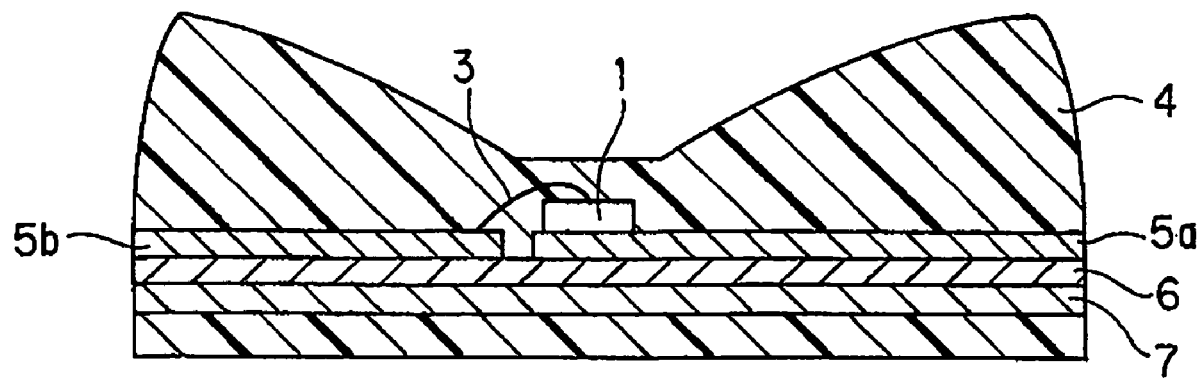
FIG. 6 is a cross sectional view showing another example of the light emitting diode in embodiment 1A of the invention.
Figure 7:
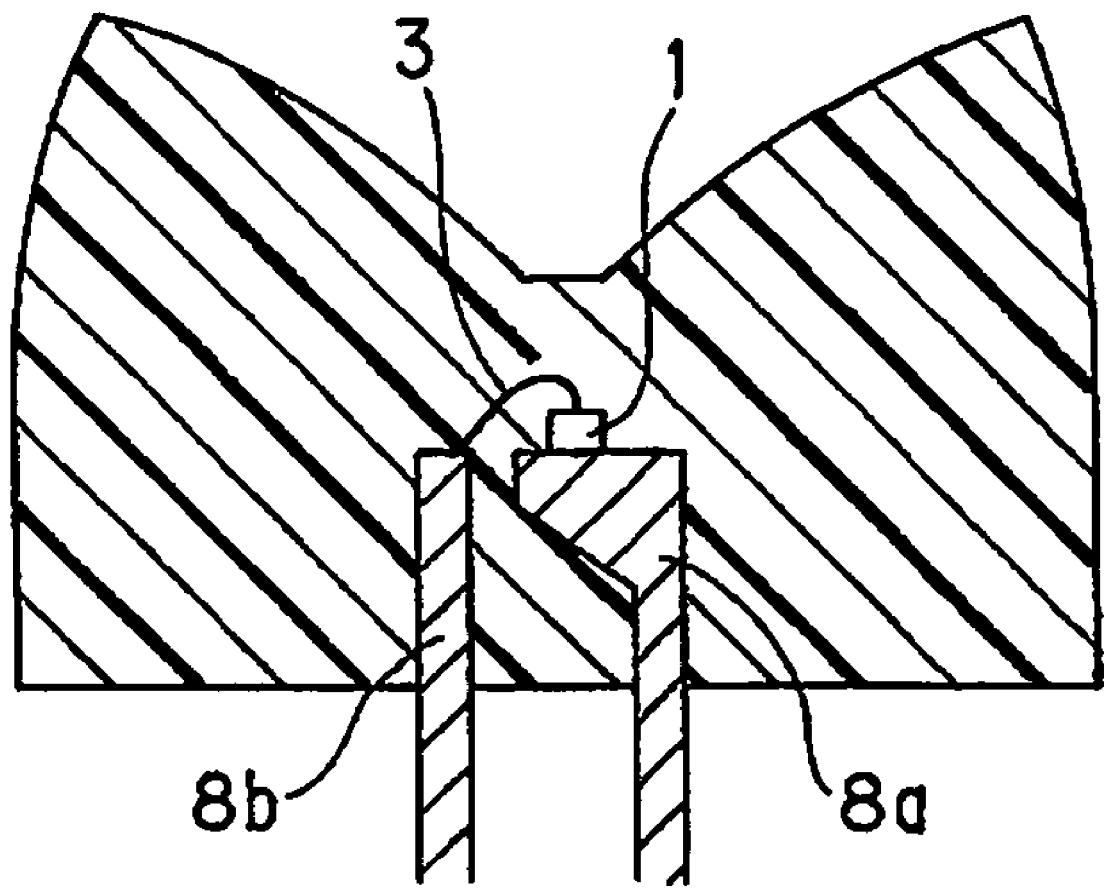
FIG. 7 is a cross sectional view showing another example of the light emitting diode in embodiment 1A of the invention.

The package form is not limited to that shown in FIG. 1 and may be such that copper-foil patterns 5a, 5b are formed on a metal board 7 through an insulation layer 6 and the light emitting element 1 is formed thereon as shown in FIG. 6 or such that leads 8a, 8b are drawn below as shown in FIG. 7.

Figure 8:
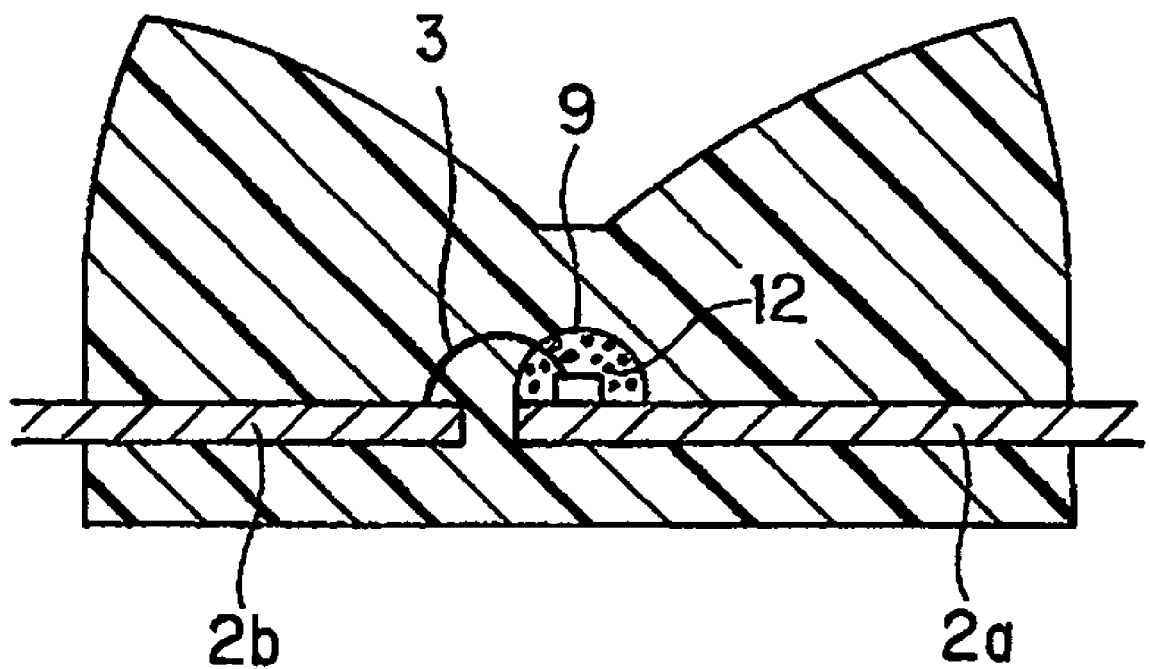
FIG. 8 is a cross sectional view showing another example of the light emitting diode in embodiment 1A of the invention.

The light emitting element may be coated with phosphor. In this case, as shown in FIG. 8, a light source 9 can be such that the light emitting element 1 is sealed with a coat including phosphor 12.

The light emitting diode 10 in embodiment 1A can be fabricated by using, e.g., the transfer molding. The transfer molding will be explained below referring to FIG. 9. At first, the light emitting element 1 is face-up bonded to the lead frame 2a being formed by pressing. Then, an Al bonding pad of the light emitting element 1 is electrically connected through a wire 3 to the lead frame 2b. Then, the lead frame 2a, 2b with the light emitting element 1 mounted is positioned on a die 20B, and sandwiched by a descending die 20A to keep the position of lead frames and die. Then, transparent epoxy 4 including a release agent is injected into the die. Then, the transparent epoxy 4 is cured under the conditions of 160° C. and 5 min. Then, the dies 20A, 20B are separated vertically and the light emitting diode 10 with transparent epoxy cured is taken out. In thus fabricating the light emitting diode 10 by the transfer molding, the transparent resin 4 is injected into interiors 20C, 20D of the die while sandwiching the lead frames 2a, 2b. Therefore, the positioning between the light emitting element 1 and optical surface can be performed at a high precision of ±0.1 mm. Thereby, dispersion in light distribution characteristic due to an individual difference of the light emitting diode 10 using the proximity optical system can be prevented.

The light emitting diode 10 can be also fabricated by the casting mold. The casting mold will be explained below referring to FIG. 10. At first, lead frames 21a, 21b are punched out by pressing. At that time, the lead frames 21a, 21b are kept connected with a lead at its multiple ends without being separated. Then, the lead-connected ends are secured by a supporting member. Then, the light emitting element 1 is face-up bonded to the tip of lead frame 21b. Then, an Al bonding pad of the light emitting element 1 is electrically connected through a wire 3 to the lead frame 21a. Then, the lead frames 21a, 21b are moved above a casting 20F for molding. Then, resin 4 is injected into the casting 20F. Then, the lead frames 21a, 21b are soaked in the casting 20F with resin 4 injected. Then, a space 20E with the casting 20F and lead frames 21a, 21b disposed is vacuumed to deaerate the resin 4. Then, the resin 4 is cured under the conditions of 120° C. and 60 min. Then, the light emitting diode 4 with resin 4 cured is taken out from the casting 20F. In the casting mold, since the tip (free end) of lead frames 21a, 21b is not restrained by the casting, precision in positioning between the light emitting element 1 and optical surface lowers to ±0.2 mm as compared to that in the transfer molding. However, by curing the transparent resin 4 for long hours, unevenness in thermal stress is reduced and the lead frames 21a, 21b are not likely to be released from the transparent resin 4. Meanwhile, by choosing the fabrication process management and the light distribution characteristic of light emitting element 1, the light distribution characteristic can be stabilized.

Embodiment 1B

Embodiment 1B of the invention will be explained with reference to FIG. 11 to FIG. 19.

As shown in FIG. 11, an LED light 31 in embodiment 1B of the invention is constructed such that the light emitting diode (LED) in embodiment 1A is, as a light source, mounted at the center of a circular body and is surrounded by a reflection mirror 33, as a second reflection mirror, which is formed concentric and stepwise. Herein, the center axis of light emitting element is defined as a Z-axis, and its origin is at the upper surface of light emitting element and an X-axis and a Y-axis intersect at right angles at the origin. These definitions are applied to modifications and embodiments described below as well.

As shown in FIG. 11(c), a reflection surface 33a of the reflection mirror 33 is about 45 degrees inclined to the X-Y plane. The reflection mirror 33 is made by molding acrylic resin and then being formed of the reflection surface by aluminum evaporation.

Figure 12:
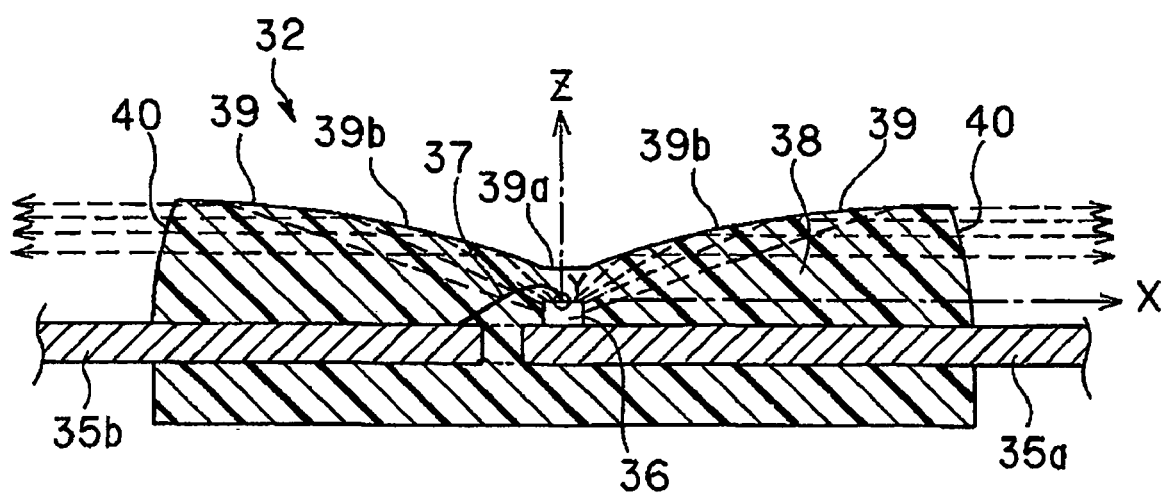
FIG. 12 is a cross sectional view showing an LED as a light source of the LED light in embodiment 1B of the invention.

Then, the LED 32 will be explained below with reference to FIG. 12. As shown in FIG. 12, a light emitting element 36 is mounted on the tip of a lead plate 35a with larger area of a pair of lead plates 35a, 35b. The upper-surface electrode of light emitting element 36 is electrically connected to the tip of lead frame 35b through a wire 37. The tip portion of lead plates 35a, 35b, light emitting element 36 and wire 37 as electric system are set in a die for resin mold, and they are sealed with transparent epoxy resin 38 to have a cross section as shown. The LED 32 has a central radiation surface 39a at the center of its upper surface 39 and, subsequently to the central radiation surface 39a, an upper reflection surface 39b with an umbrella-like shape to be formed by rotating, around the Z-axis, part of a parabola with a symmetry axis on the X-axis in the range of 60 degrees or more to the Z-axis from the origin (i.e., it is not a paraboloid of revolution). A side radiation surface 40 of LED 32 composes part of spherical surface centered at the light emitting element 36. The LED 32 thus composed is fixed at the center of the circular LED light 31.

The radiation principle of the LED light 31 thus composed will be explained with reference to FIG. 11 and FIG. 12. When a voltage is applied to the lead plates 35a, 35b of LED 32, the light emitting element 36 emits light. Of light emitted from the light emitting element 36, a light component heading to the Z-axis direction, i.e., upward is radiated out of the transparent resin 38 from the central radiation surface 39a, and is externally radiated passing through a transparent front plate (not shown) disposed covering the LED light 31. Further, of light emitted from the light emitting element 36, a light component in the range of 60 degrees or more to the Z-axis reaches the upper surface 39 as the first reflection mirror, being all subjected to total reflection due to a large incident angle to the upper surface 39, then heading to the side radiation surface 40. Since the upper reflection surface 39b has a shape to be formed by rotating part of a parabola with a symmetry axis on the X-axis and with a focal point at the light emitting element 36 around the Z-axis, all of light reflected by the upper surface 39 proceeds parallel to the X-Y plane, directly passing nearly in parallel through the side radiation surface 40 which composes part of spherical surface centered at the light emitting element 36, then being externally radiated forming nearly a plane in directions of 360 degrees around the Z-axis. Further, light directly heading to the side radiation surface 40 from the light emitting element 36 goes straight without refraction since the side radiation surface 40 composes part of spherical surface centered at the light emitting element 36, then being radiated externally.

The stepwise reflection mirror 33 as the second reflection mirror lies ahead. It has the reflection surface 33a with an inclination of about 45 degrees, and each light being reflected by the reflection surface 33a proceeds upward nearly vertically since light being reflected by the upper surface 39 nearly in parallel with the X-Y plane and light being directly radiated from the side radiation surface 40 proceeds in parallel with the X-Y plane. It is externally radiated passing through a transparent plate (not shown) at least in the range of 20 degrees from the Z-axis. Although even light represented as "parallel" in the above explanation is not perfectly parallel since the light emitting element 36 has a size, any light thereof is radiated nearly in parallel and is surely included at least in the range of 20 degrees from the Z-axis.

As described, the LED light 31 in embodiment 1B can be low-profile and can radiate light in a large area by using one light emitting element while taking advantage, low-profile, of LED, and it can offer a high external radiation efficiency.

Figure 13:
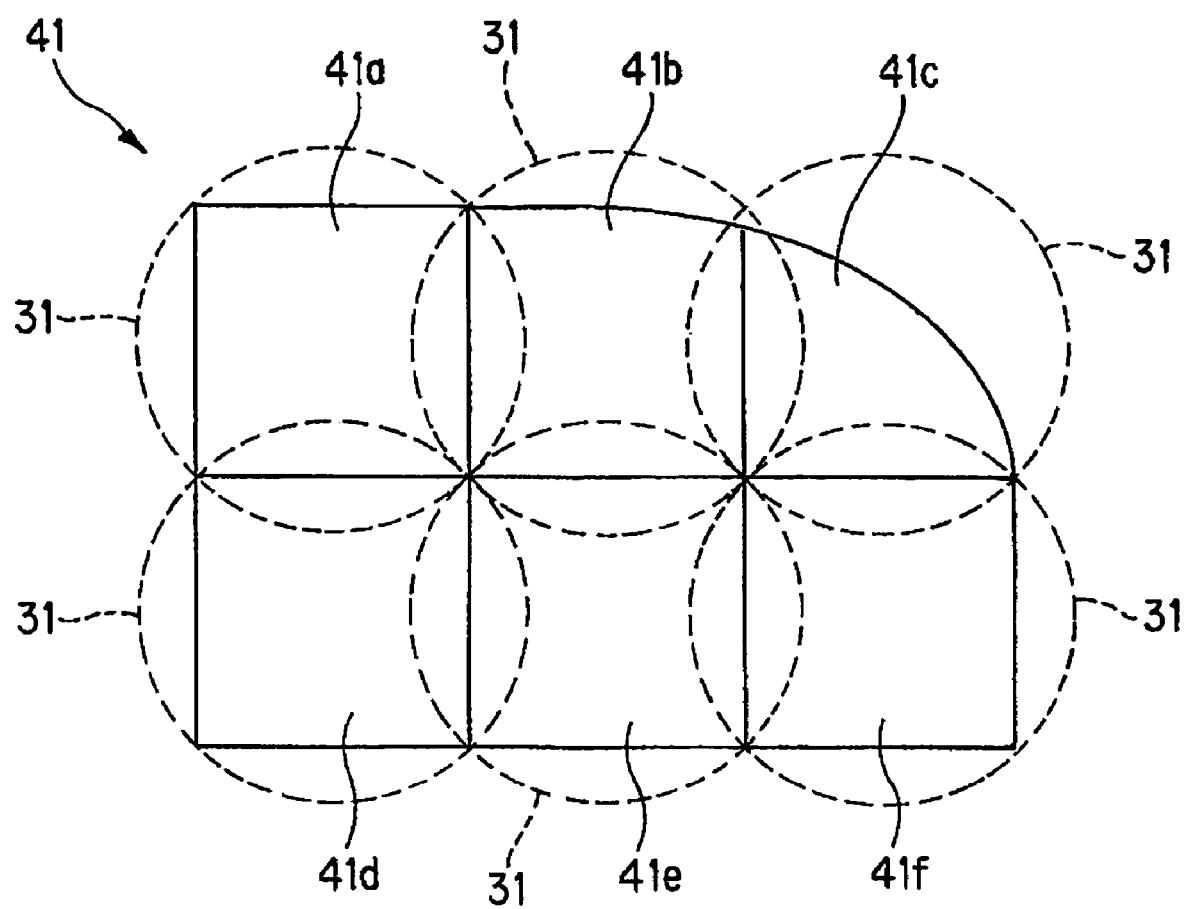
FIG. 13 is a plain view showing an integrated LED light to cover a predetermined area, wherein a plurality of the LED lights in embodiment 1B of the invention are cut into rectangular form.

An application of the LED light 31 in embodiment 1B is shown in FIG. 13. The circular LED light 31 is cut to form a square or a shape including part of square, and six segments 41a, 41b, 41c, 41d, 41e and 41f thus cut can be combined, as shown, to form an integrated LED light 41 with multiple light emitting elements to cover a predetermined area.

[Modification 1]

Figure 14:
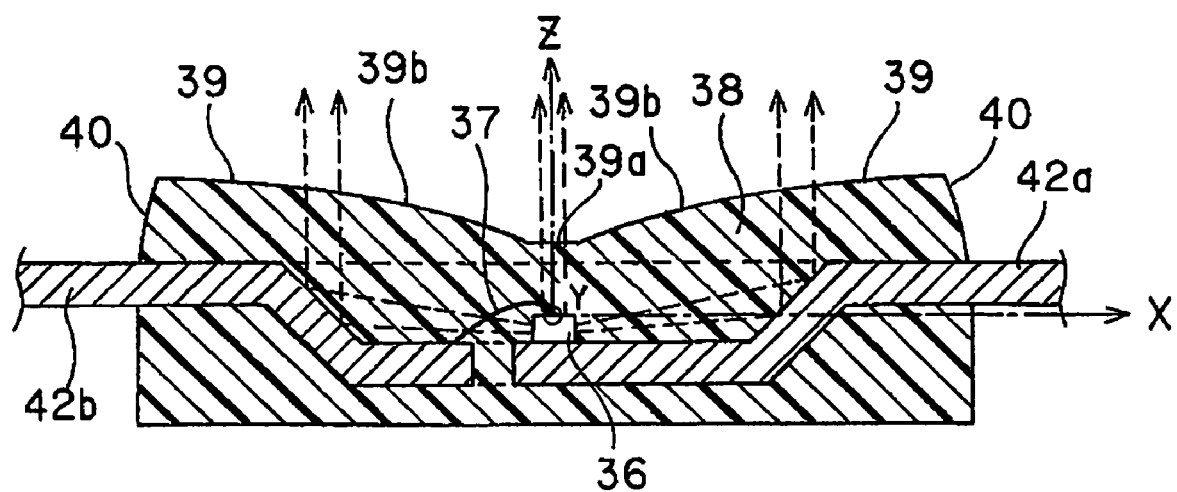
FIG. 14 is a cross sectional view showing a first modification of LED as a light source of the LED light in embodiment 1B of the invention.

As shown in FIG. 14, the first modification of the LED light 31 in embodiment 1B may be composed such that a pair of lead plates 42a, 42b are caved only around the light emitting element 36 to provide a third reflection mirror. Thereby, although in the basic form in FIG. 12 light is radiated directly upward only from directly over the light emitting element 36, light can be also radiated upward from around the light emitting element 36 in LED. Thus, it further appears the entire portion emits light and, thereby, the appearance can be enhanced.

[Modification 2]

Figure 15:
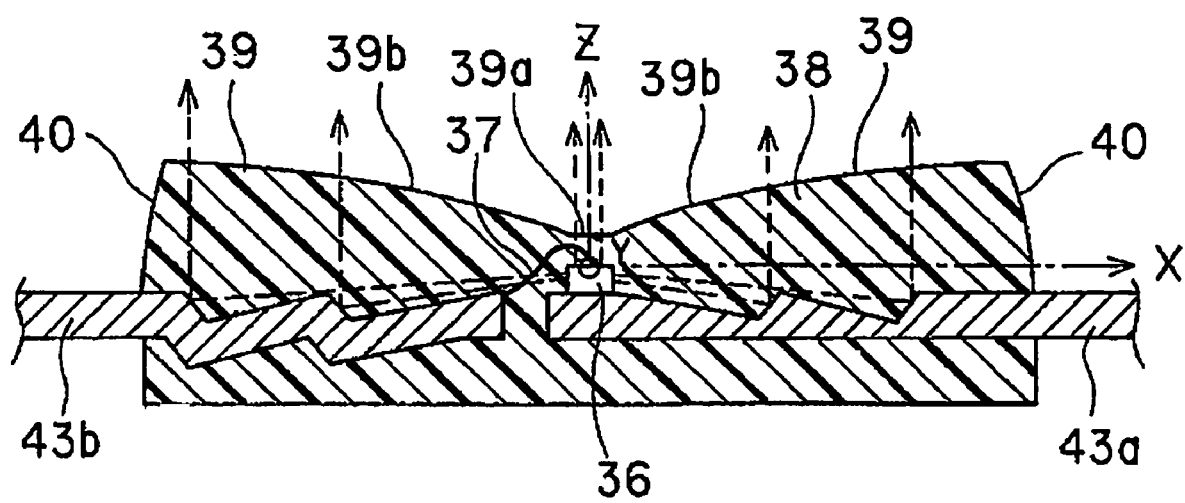
FIG. 15 is a cross sectional view showing a second modification of LED as a light source of the LED light in embodiment 1B of the invention.

As shown in FIG. 15, the second modification of the LED light 31 in embodiment 1B may be composed such that a pair of lead plates 43a, 43b are provided with a pattern by half etching or stamping pattern to reflect light to be radiated obliquely downward from the light emitting element 36 to radiate it upward. By forming multiple concentric reflection mirrors, like modification 1, it further appears the entire portion emits light and, thereby, the appearance can be enhanced. In this case, an adhesion area between transparent resin 38 and lead plates 43a, 43b increases and, thereby, release failure can be reduced because of having an adhesion form other than a plane. Especially, it will be effective for a large current type with much heat generation.

[Modification 3]

Figure 16:
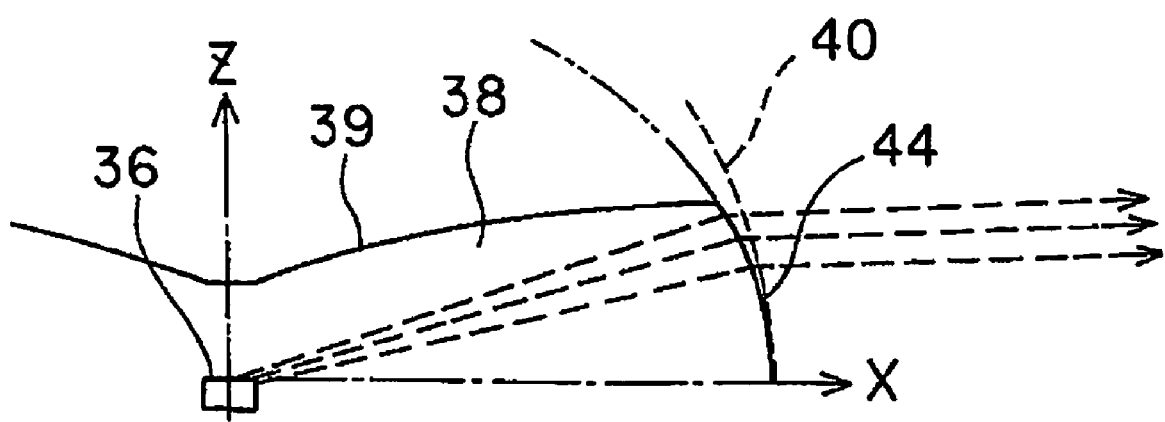
FIG. 16 is a cross sectional view showing a third modification of LED as a light source of the LED light in embodiment 1B of the invention.

As shown in FIG. 16, the third modification of the LED light 31 in embodiment 1B may be composed such that the sealing member of transparent epoxy resin 38 in LED has another side shape. In the basic example the side surface 40 composes part of spherical surface centered at the light emitting element 36 and light emitted from the light emitting element 36 is thus entered nearly perpendicularly into the side surface 40 then directly going straight. However, in modification 3, since a side 44 composes part of ellipsoid surface that has one focal point at the light emitting element 36, light emitted from the light emitting element 36 is refracted slightly downward to the straight direction in the side 44. Therefore, even when the stepwise reflection mirror 33 around LED is placed further low, the LED light can offer high external radiation efficiency. Thus, the LED light can be further low-profile.

[Modification 4]

Figure 17:
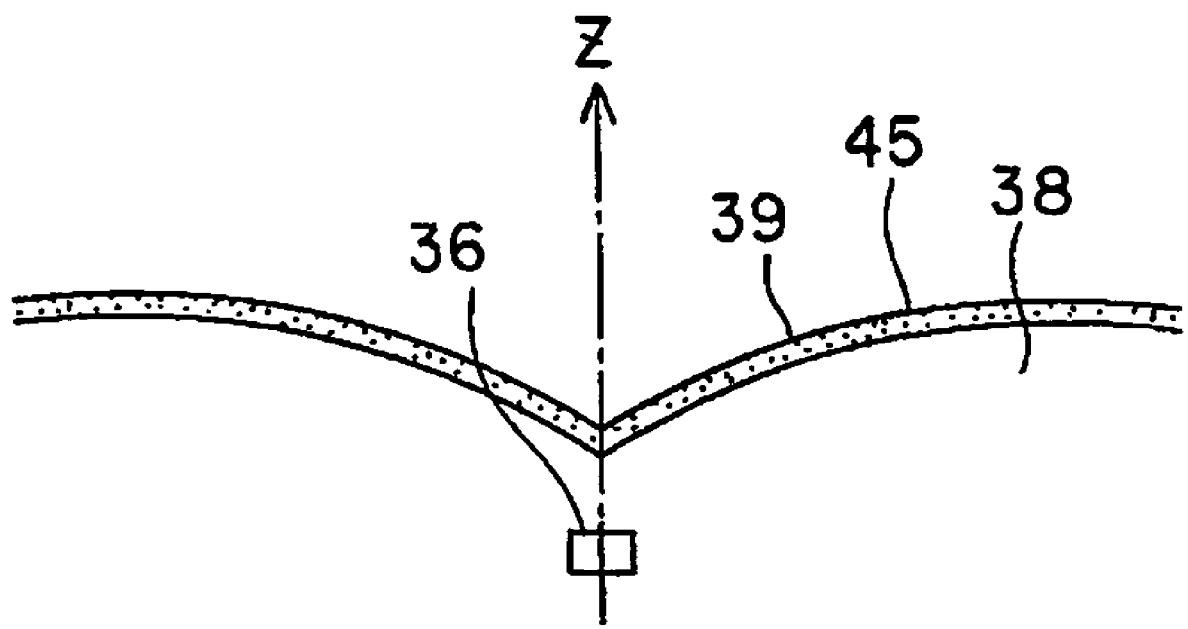
FIG. 17 is a cross sectional view showing a fourth modification of LED as a light source of the LED light in embodiment 1B of the invention.

As shown in FIG. 17, the fourth modification of the LED light 31 in embodiment 1B may be composed such that a metal reflection film 45 is formed on the upper surface 39 by plating or evaporation to conduct reflection in the side direction at the upper surface 39 as the first reflection mirror without using total reflection at the boundary of transparent resin 38 and air. In this case, if a plane is formed directly over the light emitting element 36, light to be radiated directly upward cannot be externally radiated. Therefore, it is needed that, also at the center of upper surface 39, the upper surface 39 has a shape to be formed by rotating, around the Z-axis, part of a parabola with a focal point located at the light emitting element 36.

[Modification 5]

Figure 18:
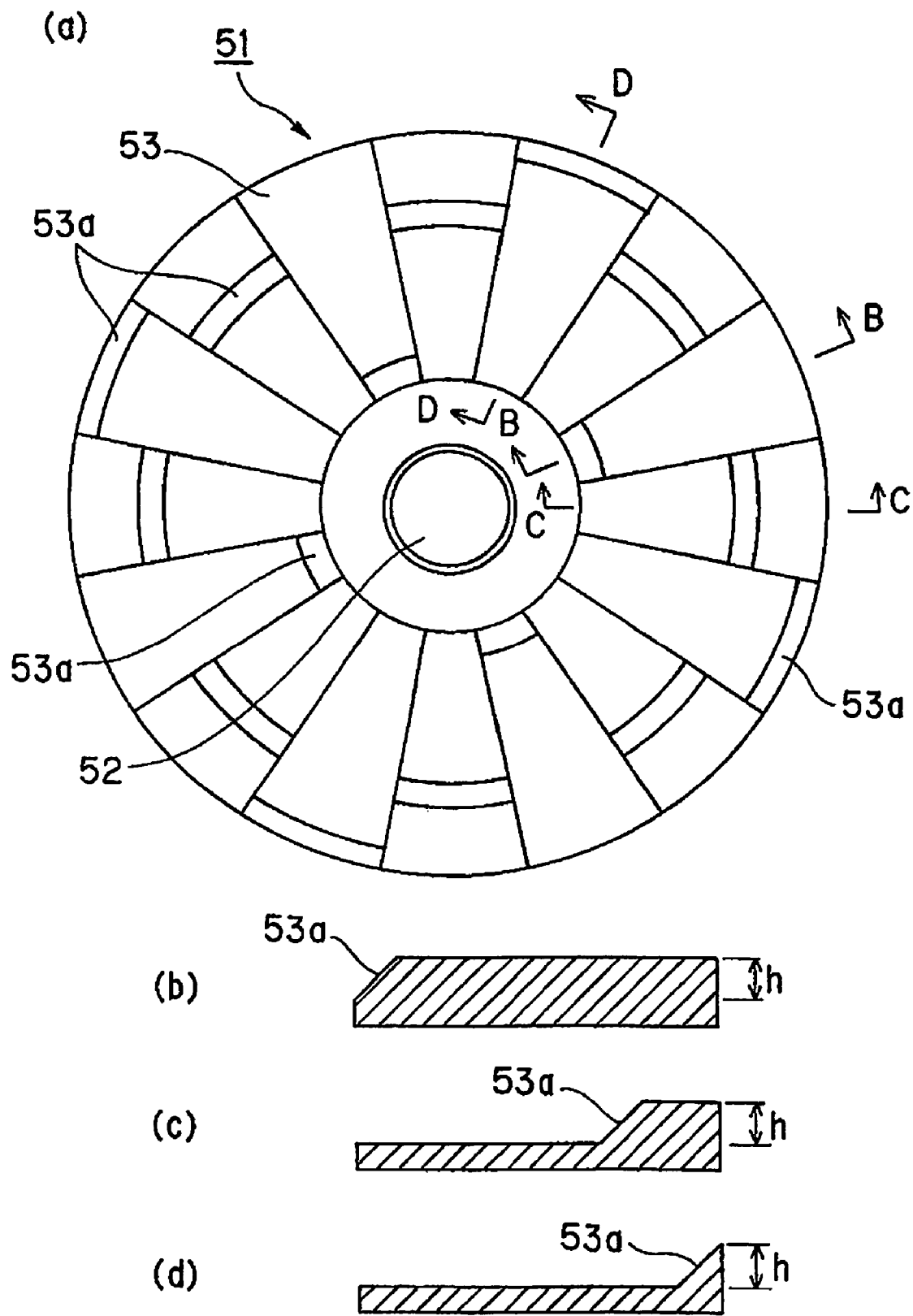
FIG. 18(a) is a plain view showing a fifth modification of the LED light in embodiment 1B of the invention, (b) is a cross sectional view cut along the line B-B in (a), (c) is a cross sectional view cut along the line C-C in (a), and (d) is a cross sectional view cut along the line D-D in (a).

The fifth modification (51) of the LED light 31 in embodiment 1B may be composed such that emission points are dotted whereas in the basic example the entire portion emits light nearly evenly. Namely, as shown in FIGS. 18(*a*), a circular reflection mirror 53 as the second reflection mirror is divided into fan-shaped sections and a distance from LED 52 to reflection surface 53a is differentiated as shown in FIGS. 18(*b*), (*c*) and (*d*). Therefore, viewing from the top, positions to reflect light are scattered in the circle and, thereby, an effect that it appears glittering can be obtained. Further, since LED 52 is provided with a small central radiation surface 4a, its appearance becomes better. Namely, the brightness of light to be externally radiated from the central radiation surface 4a and the reflection surfaces 53a can be equalized and luminescent spots can be arranged in good balance. The brightness can be equalized by reducing the amount of light to be externally radiated from the central radiation surface 4a to a small ratio such as less than 1/10 to that to be externally radiated reflected by the circular reflection mirror 53 after being radiated to the periphery of LED 52, i.e., by controlling most of light to be radiated to the periphery of LED 52. Further, in detail, as the circular reflection mirror 53 becomes bigger, the ratio of light to be externally radiated from the central radiation surface 4a may be reduced. Although the glittering effect can be obtained when the reflection surface 53a is nearly planar or convex, the ratio of light to be externally radiated from the central radiation surface 4a may be reduced according as the curvature of convex surface becomes larger. In modification 5, since light from LED 52 is to be all reflected by the single-stage reflection surface 53a at each fan-shaped section, it is desired that, as shown in FIGS. 18(*b*), (*c*) and (*d*), the height of reflection surface 53a is the same as the total height h of circular stepwise reflection mirror 33 in the basic example as shown in FIG. 11(*b*). Although the brightness is equalized in the above example, the brightness may be accented such that it becomes high toward the periphery or the other way around.

[Modification 6]

As shown in FIG. 19, the sixth modification (54) of the LED light 31 in embodiment 1B may be composed such that a reflection mirror 56 as the second reflection mirror is divided into fan-shaped sections with different lengths to allow the shape of reflection mirror 56 to be close to a square as one of polygons. Namely, as shown in FIGS. 19(b) and (c), provided that, in the shortest fan-shaped section, L is a length from reflection surface 56a to the next reflection surface 56a, the longest fan-shaped section separated 45 degrees from that section is made to have a length of $\sqrt{2}L$ from reflection surface 56a to the next reflection surface 56a. Thereby, as shown in FIG. 13, when combining multiple square LED lights 41a, . . . , it is not necessary to cut a circular LED light into a square. Therefore, reduction in external radiation efficiency can be prevented and a combined light can be offered with higher brightness. Further, when a nearly square LED is used as a light source instead of a nearly cylindrical LED 55, there is an advantage that a distance between the side of LED and reflection mirror 56 becomes nearly equal over the circumference.

Embodiment 1C

Embodiment 1C of the invention will be explained below with reference to FIG. 20.

Figure 20:
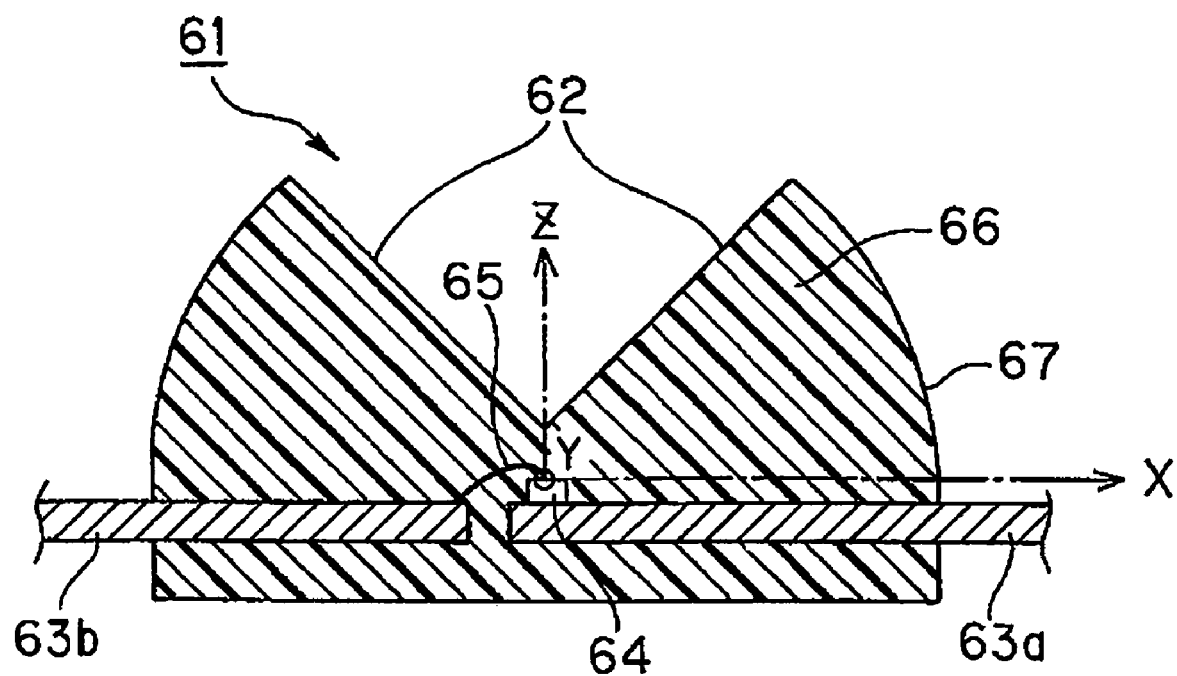
FIG. 20 is a cross sectional view showing an LED used for an LED light in embodiment 1C of the invention.

As shown in FIG. 20, LED 61 in embodiment 1C of the invention is composed such that, of a pair of lead plates 63a, 63b, the lead plate 63a has a light emitting element 64 mounted on its tip, and an upper electrode of light emitting element 64 is electrically connected through a wire 65 to the tip of lead plate 63b. The tip portion of lead plates 63a, 63b, light emitting element 64 and wire 65 as electric system are sealed with transparent epoxy resin 66 as a light-transmitting material. The transparent epoxy resin 66 is shaped such that an upper portion of semisphere centered at the light emitting element 64 is cut off like a circular cone. In this case, although light radiated from the light emitting element 64 is subjected to total reflection at upper surface 62 as the first reflection mirror, its reflected light corresponds to radiation light from a mirroring point of light emitting element 64 to the upper surface and, therefore, it is not converged and radiated from its side 67 while having a divergence angle. Thus, it is needed that a circular stepwise reflection mirror as the second reflection mirror for reflecting light upward has a height in the Z-axis direction greater than that for LED 32 in embodiment 1B.

In the case that a relatively wide light distribution is allowed in LED light or a very low-profile shape is not required in LED light, such the simple circular cone reflection surface 62 can be used.

Embodiment 1D

Embodiment 1D of the invention will be explained below with reference to FIG. 21.

Figure 21:
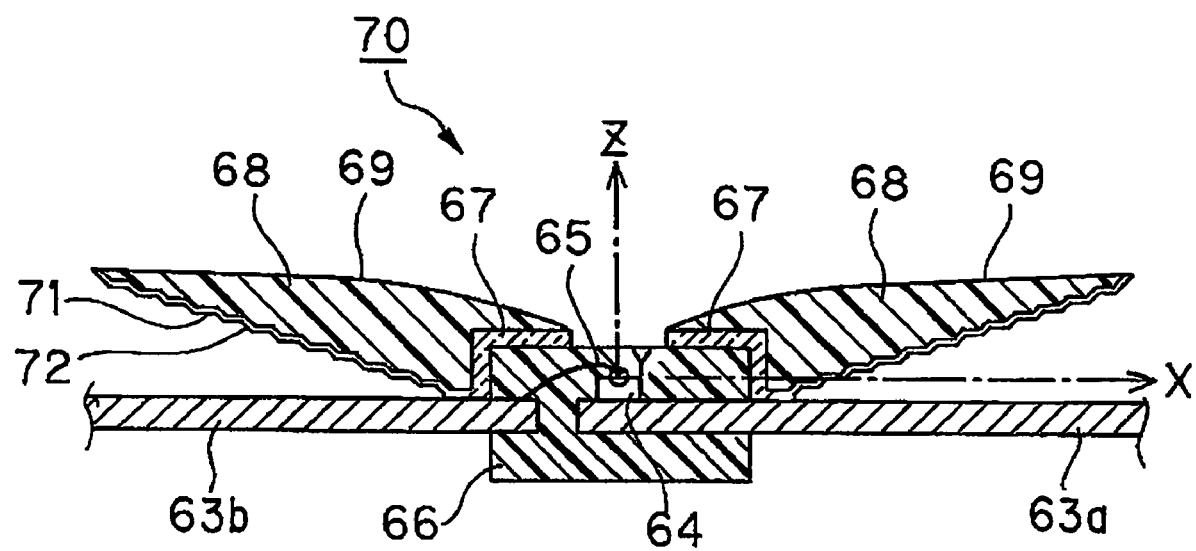
FIG. 21 is a cross sectional view showing an LED light in embodiment 1D of the invention.

As shown in FIG. 21, LED 70 in embodiment 1D of the invention is composed such that, of a pair of lead plates 63a, 63b, the lead plate 63a has a light emitting element 64 mounted on its tip, and an upper electrode of light emitting element 64 is electrically connected through a wire 65 to the tip of lead plate 63b. The tip portion of lead plates 63a, 63b, light emitting element 64 and wire 65 as electric system are sealed with transparent epoxy resin 66. The transparent epoxy resin 66 is shaped like a regular cylinder and therefore the upper surface of transparent epoxy resin 66 does not serve as the first reflection mirror. Instead, an optical member 68 like an umbrella molded with transparent acrylic resin is attached through a light-transmitting material 67 onto the upper surface of transparent epoxy resin 66. The optical member 68 has an upper surface 69 with a shape to be formed by rotating, around the Z-axis, part of a parabola with a focal point at the light emitting element 64 and with a symmetry axis on the X-axis.

A lower surface 71 of the optical member 68 is formed circular and stepwise with steps of about 45 degrees to replace the circular stepwise reflection mirror in embodiment 2 (1B) as the second reflection mirror. The lower surface 71 is provided with aluminum evaporation 72 on which an overcoat (not shown) is formed thereon to protect the aluminum evaporation film. In the present embodiment 4 (1D), a degree of freedom in overcoat after forming the evaporation mirror surface can be increased. Namely, the overcoat may be colored and its thickness is not limited.

The LED light 70 thus composed is operated such that a predetermined voltage is applied to the pair of lead plates 63a, 63b, the light emitting element 64 emits light, light heading upward directly goes straight because of not being blocked, being externally radiated passing through a transparent front plate (not shown). On the other hand, light radiated between obliquely upward and sideward is entered into the optical member 68 while passing through the light-transmitting material 67. Light being irradiated to the upper surface 69 as the first reflection mirror is subjected to total reflection and is all reflected sideward nearly in parallel with the X-Y plane since the upper surface 69 has a shape to be formed by rotating, around the Z-axis, part of a parabola with a focal point at the light emitting element 64. Then, it is reflected upward nearly in parallel with the Z-axis by the lower surface (circular stepwise reflection mirror) 71 as the second reflection mirror, being externally radiated passing through the upper surface 69 and the front plate. In like manner, light being directly irradiated to the lower surface (circular stepwise reflection mirror) 71 is radiated upward.

As described, the LED light in embodiment 1D can be low-profile and can radiate light in a large area by using one light emitting element while taking advantage, low-profile, of LED, even when using a regular cylindrical LED and it can offer high external radiation efficiency.

Embodiment 1E

Embodiment 1E of the invention will be explained below with reference to FIG. 22.

Figure 22:
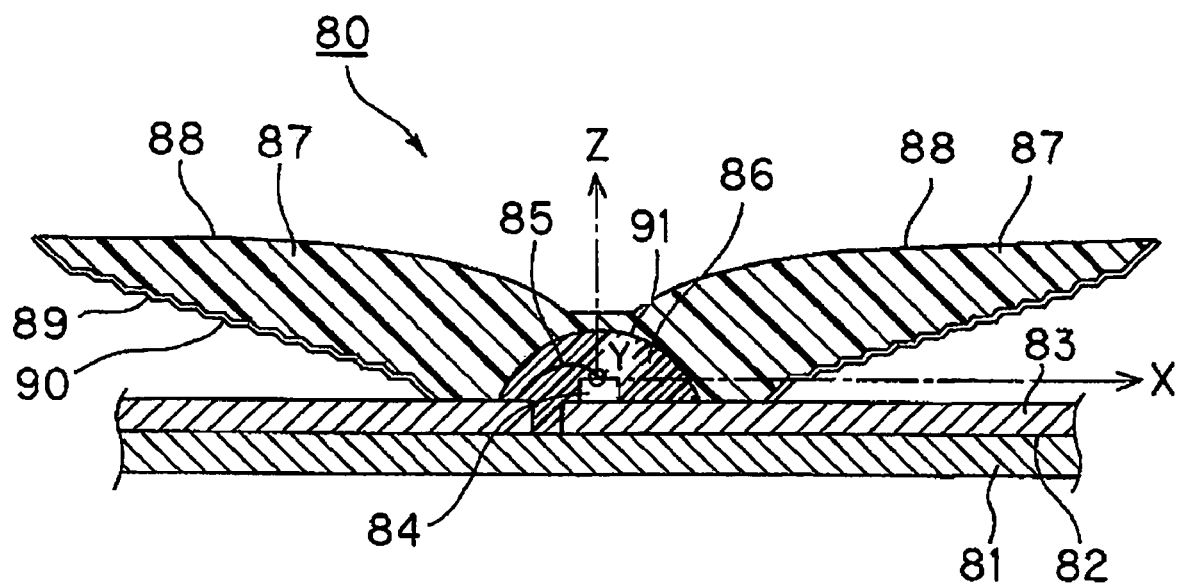
FIG. 22 is a cross sectional view showing an LED light in embodiment 1E of the invention.

As shown in FIG. 22, an LED light 80 in embodiment 1E is formed on an aluminum base 81 as a metal board. A circuit pattern 83 is formed on the aluminum base 81 to sandwich an insulation layer 82 and a light emitting element 84 is mounted thereon while having electrical connection through a wire 85. An optical member 87 like an umbrella concaved by a semisphere 91 molded with transparent acrylic resin is mounted on the circuit pattern 83, light emitting element 84 and wire 85 as electric system. In this case, transparent silicon resin as light-transmitting material is filled in the semisphere 91 and thereby the circuit pattern 83, light emitting element 84 and wire 85 are sealed. In the state of being thus fixed, the optical member 87 has an upper surface 88 with a shape to be formed by rotating, around the Z-axis, part of a parabola with a focal point at the light emitting element 84.

A lower surface 89 of the optical member 88 is formed circular and stepwise with steps of about 45 degrees to serve as the second reflection mirror. The lower surface 89 is provided with aluminum evaporation 90 on which an overcoat (not shown) is formed thereon to protect the aluminum evaporation film. Also in the present embodiment 1E, a degree of freedom in overcoat after forming the evaporation mirror surface can be increased. Namely, the overcoat may be colored and its thickness is not limited.

The LED light 80 thus composed is operated such that the light emitting element 84 emits light, light heading upward directly goes straight because of not being blocked, being externally radiated passing through a transparent front plate (not shown). On the other hand, light radiated between obliquely upward and sideward is entered into the optical member 87 while passing through the light-transmitting material 86. Light being irradiated to the upper surface 88 as the first reflection mirror is subjected to total reflection and is all reflected sideward nearly in parallel with the X-Y plane since the upper surface 88 has a shape to be formed by rotating, around the Z-axis, part of a parabola with a focal point at the light emitting element 84. Then, it is reflected upward nearly in parallel with the Z-axis by the circular stepwise reflection mirror 89 as the second reflection mirror, being externally radiated passing through the upper surface 88 and the front plate. In like manner, light being directly irradiated to the circular stepwise reflection mirror 89 is radiated upward.

The LED light 80 in the present embodiment 1E is mounted on the aluminum base 81 with a good thermal conductivity and thereby the heat radiation property can be significantly enhanced. Thus, even when large current is flown through the light emitting element 84, heat saturation does not occur. Therefore, a large optical output can be obtained.

As described, the LED light in embodiment 1E can be low-profile, with high brightness and can radiate light in a large area as well as having an enhanced heat radiation property and offering a large optical output without being affected by heat saturation.

Embodiment 1F

Embodiment 1F of the invention will be explained below with reference to FIG. 23.

Figure 23:
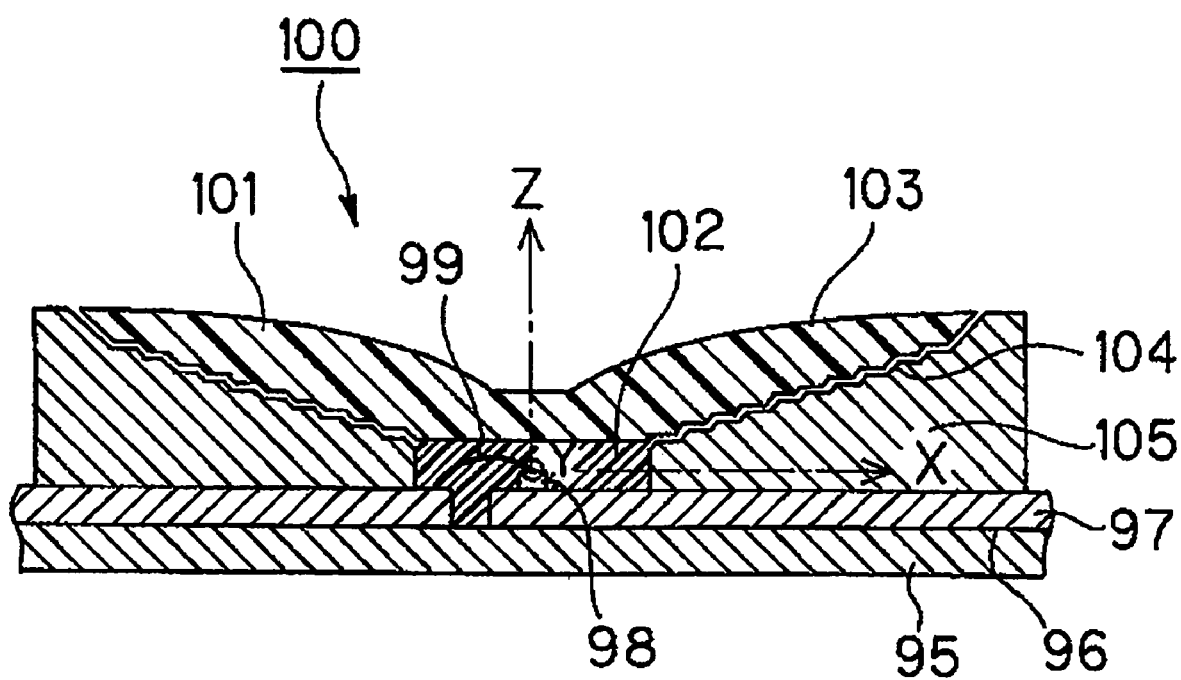
FIG. 23 is a cross sectional view showing an LED light in embodiment 1F of the invention.

As shown in FIG. 23, an LED light 100 in embodiment 1F is also formed on an aluminum base 95 as a metal board. A circuit pattern 97 is formed on the aluminum base 95 to sandwich an insulation layer 96 and a light emitting element 98 is mounted thereon while having electrical connection through a wire 99. The circuit pattern 97, light emitting element 98 and wire 99 as electric system are sealed with transparent epoxy resin 102 as a light-transmitting material. An optical member 101 molded with circular transparent acrylic resin is mounted thereon. In the state of being thus fixed, the optical member 101 has an upper surface 103 with a shape to be formed by rotating, around the Z-axis, part of a parabola with a focal point at the light emitting element 98, and it serves as the first reflection mirror.

A lower surface 104 of the optical member 101 is formed circular and stepwise with steps of about 45 degrees to serve as the second reflection mirror. In the LED light 100 of the present embodiment 1F, the lower surface 104 is not provided with metal evaporation. Namely, light from the light emitting element 98 to be reflected sideward by the upper surface 103 of optical member 101 as the first reflection mirror is reflected upward due to total reflection at the lower surface 104 of optical member 101 as the second reflection mirror. Thus, even without metal evaporation formed on the lower surface 104 of optical member 101, most of light can be reflected upward only by the total reflection at the lower surface 104. In order to reflect light that passes through the lower surface 104 without being subjected to the total reflection, a supplemental reflection member 105 is mounted on the circuit board 97 while providing an air layer under the lower surface of optical member 101. The supplemental reflection member 105 has an upper surface with a reflection surface formed thereon by plating and serves to upwardly reflect light passing through the lower surface 104.

In the LED light 100 of the present embodiment 1F, it is not necessary to provide the metal evaporation with the lower surface 104 of optical member 104 that serves both as the first reflection mirror and as the second reflection mirror, and the supplemental reflection member 105 with coating formed by simple plating only has to be provided to allow almost all of light emitted from the light emitting element 98 to be upwardly radiated. Thus, the high external radiation efficiency can be obtained.

The LED light 100 in the present embodiment 1F is also mounted on the aluminum base 95 with a good thermal conductivity and thereby the heat radiation property can be significantly enhanced. Thus, even when large current is flown through the light emitting element 98, heat saturation does not occur. Therefore, a large optical output can be obtained.

As described, the LED light in embodiment 1F be low-profile, with high brightness and can have the high external radiation efficiency by using the simple process as well as having an enhanced heat radiation property and offering a large optical output without being affected by heat saturation.

Embodiment 1G

Embodiment 1G of the invention will be explained below with reference to FIG. 24.

Figure 24:
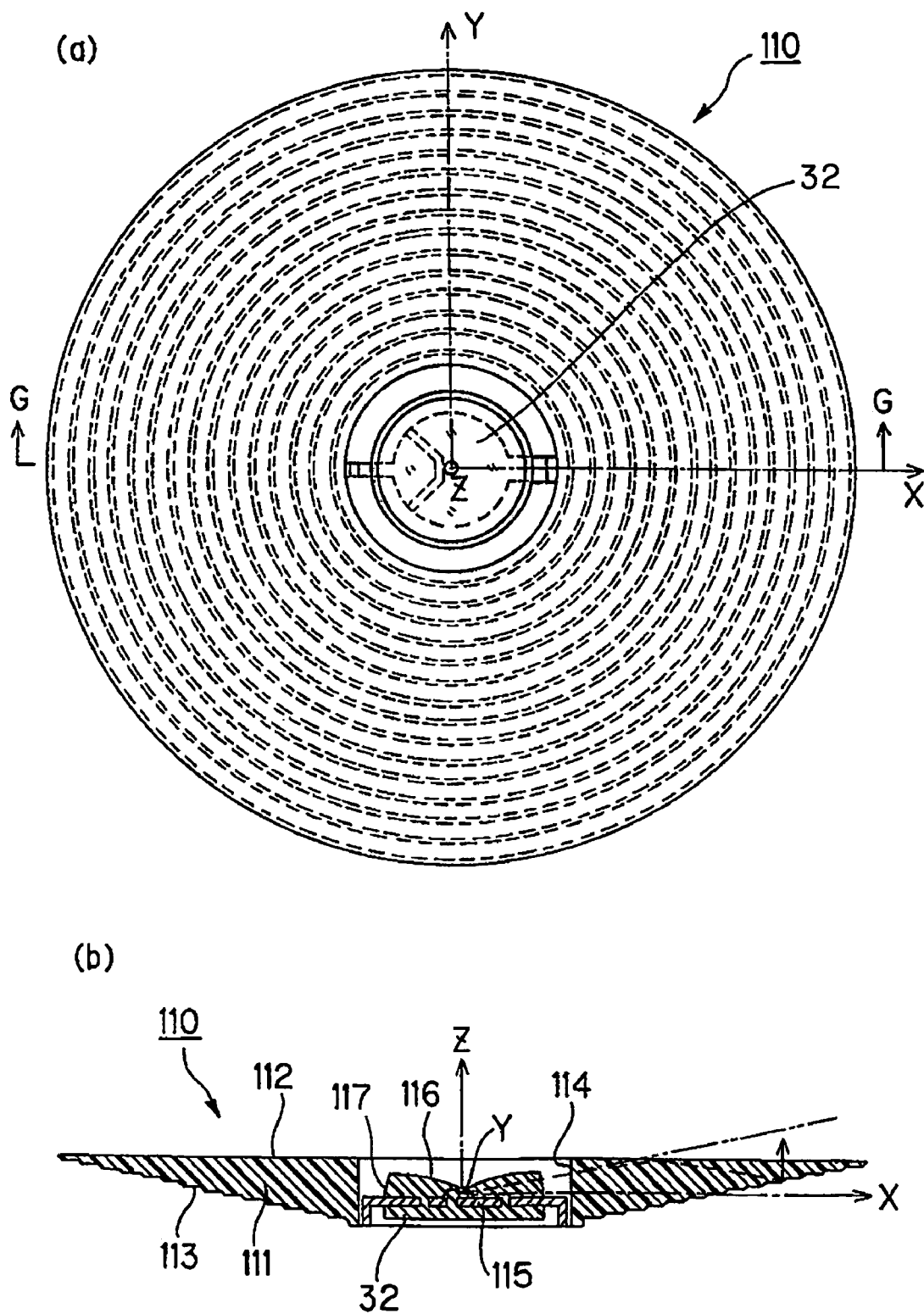
FIG. 24(a) is a plain view showing an LED light in embodiment 1G of the invention, and (b) is a cross sectional view cut along the line G-G in (a).

As shown in FIG. 24, an LED light 110 in embodiment 1G is composed of: an optical member 111 that is molded with transparent acrylic resin and has a lower surface 113 which is a stepwise reflection surface to serve as the second reflection mirror and a cylindrical space 114 formed at the center; and LED 32, like the LED light 31 in embodiment 1B, that is fixed in the space 114 at the center. Namely, the LED 32 is composed such that a light emitting element 115 etc. are sealed with transparent epoxy resin and has a paraboloid 116 at the upper surface as the first reflection mirror. Light to be radiated from the light emitting element 115 and sideward reflected by the upper surface 116 is upwardly reflected by the lower surface 113 of optical member 111 and then externally radiated passing through a front plate (not shown).

In the LED light 31 of embodiment 2 (1B), light to be directly (without being reflected by the upper surface 116) radiated from upper portion of the side surface 117 of LED 32 is not utilized without being upwardly reflected while proceeding along a path indicated by a two-dotted line. However, in the LED light 110 of the present embodiment 1G, it can be utilized such that it is, as indicated by a dotted line, reflected by the horizontal upper surface 112 of optical member 111 and then reflected upwardly by the lower surface 113. Thus, the LED light can be low-profile and with further enhanced external radiation efficiency. Further, light to be entered into the space 114 is refracted in a direction to give a large angle to the Z-axis and thereby the brightness at the periphery in viewing from the top in FIG. 24(*a*) can be enhanced.

In the above embodiments, transparent acrylic resin is used for the optical member that serves as the second reflection mirror or both as the first reflection mirror and as the second reflection mirror. However, the other material such as another transparent synthetic resin may be used for that.

Although the above embodiments explain that the central radiation surface is provided to take out light radiated from the center of LED, light radiated from the center of LED may be taken out without the central radiation surface by using a large size light emitting element or placing the upper surface optical system just nearby to make an incident angle from the light emitting element to the upper surface optical system to be within a critical angle.

Alternatively, when using a light emitting element with a narrow light distribution, a sufficient lateral radiation can be obtained without always placing the upper surface optical system nearby.

The composition, shape, number, material, dimensions, connection form etc. of the other part in the LED light are not limited to those described in the above embodiments.

Embodiment 2A

Figure 25:
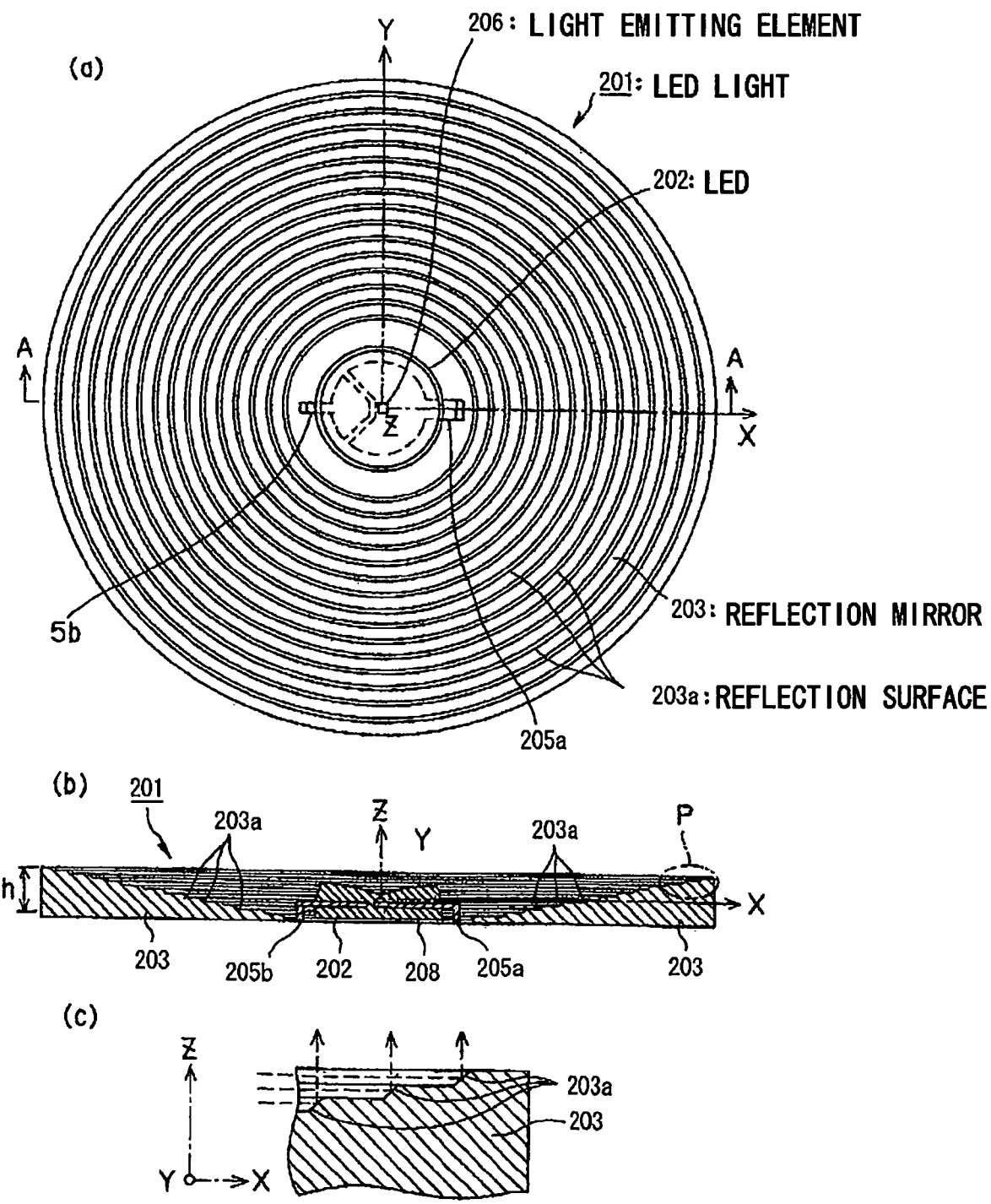
FIG. 25(a) is a plain view showing an LED light using an LED in embodiment 2A of the invention, (b) is a cross sectional view cut along the line A-A in (a), and (c) is an enlarged cross sectional view showing part P of (b).

FIG. 25(a) is a plain view showing an LED light 201 in embodiment 2A of the invention, (b) is a cross sectional view cut along the line A-A in (a), and (c) is an enlarged cross sectional view showing part P of (b). The LED light 201 is composed of: an LED 202 that has a light emitting element 206 with a predetermined light distribution characteristic at the center of a disk-shaped body; and a reflection mirror 203 that has a concentric and stepwise reflection surface 203a around the LED 202.

The reflection mirror 203 is molded of transparent acrylic resin and, after molding, the reflection surface 203a is formed by providing aluminum evaporation thereon to mirror-finish it. The reflection surface 203a is, as shown in FIG. 25(a), inclined about 45 degrees to the X-Y plane such that light to be entered from the X(Y) direction is reflected to the Z-axis direction.

FIG. 26(a) is a cross sectional view showing the LED 202, (b) is a plain view thereof, and (c) is a side view thereof. The LED 202 is composed of: lead frames 205a, 205b; a light emitting element 206; a bonding wire 207 to provide electrical connection between the lead frame 205b and light emitting element 206; transparent epoxy resin 208 that is with an optical surface while integrally sealing the lead frames 205a, 205b and light emitting element 206; a reflection mirror 209 that has a central radiation surface 209a and a reflection surface 209b; and a radiation surface 210 that composes part of a sphere centered at the light emitting element 206 to radiate light in the X-Y direction.

The lead frames 205a, 205b are of copper alloy and disposed having a gap for insulation on the X-Y plane, and the lead frame 205a with a large area has the light emitting element 206 mounted on an origin position thereof.

The light emitting element 206 is formed cubic, face-up bonded to the lead frame 205a and provided with an emission surface on its top. It is of large current type (high output type) in order to keep the emission intensity of LED 202 at a predetermined value while reducing the number of elements used as much as possible. The light emitting element 206 may be flip-chip mounted on the lead frame 205a.

The transparent epoxy resin 208 is of epoxy resin with a refractive index of 1.55 and has the central radiation surface 209a at the center (directly over the light emitting element 206) of upper surface thereof. The reflection mirror 209 is constructed such that the reflection surface 209b is formed continuously with the central radiation surface 209a. A proximity optical system is formed by disposing the light emitting element 206 close to the reflection mirror 209 and then integrally molding with resin.

Figure 26:
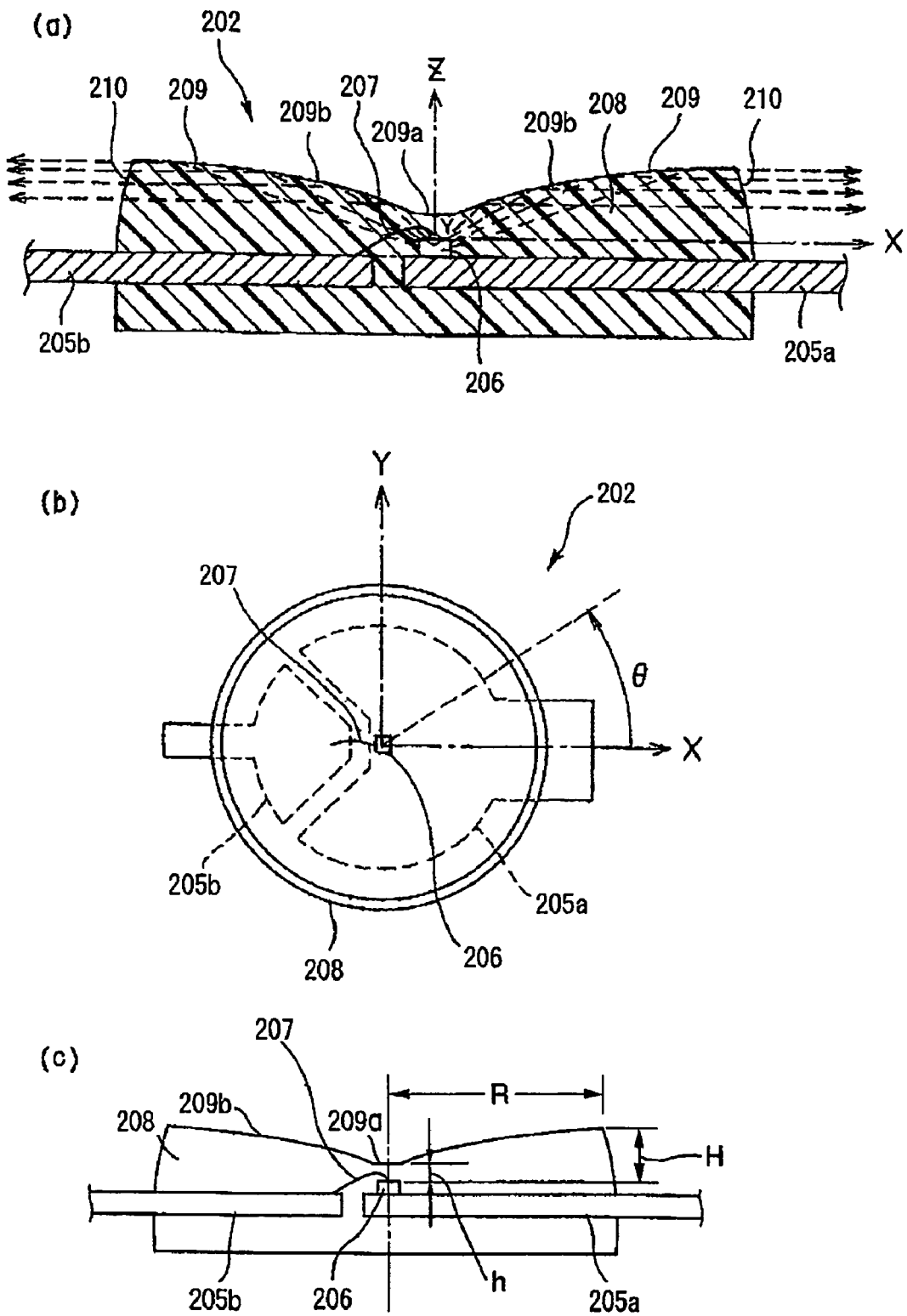
FIG. 26(a) is a cross sectional view showing an LED used for the LED light in embodiment 2A of the invention, (b) is a plain view thereof, and (c) is a side view showing the size of LED.

The reflection mirror 209 is composed of the central radiation surface 209a to radiate directly upwardly light radiated from the light emitting element 206, and the reflection surface 209 b that has a circular reflection shape to be formed by rotating, around the center axis Z, part of a parabola with a focal point at the center of emission surface of light emitting element 206 as the coordinate origin in FIG. 26 and with a symmetry axis on the X-axis. Alternatively, according to use, the reflection mirror 209 may be not provided with the central radiation surface 209a.

The reflection mirror 209 is the first reflection mirror to reflect light radiated from the light emitting element 206. As shown in FIG. 26(c), the radius R of reflection surface 209b is given such that almost all of light being radiated with a large sold angle to the light emitting element 206 can be effectively radiated sideward. In this example, where a height from the emission surface of light emitting element 206 to the edge of reflection mirror 209 in the Z-axis direction, H=2.0 mm and R=3.5 mm are given, the relationship between the edge height H of reflection mirror 209 and radius R is H<R. Further, in order to form a proximity optical system to provide a relatively large solid angle, the distance (thickness of transparent epoxy resin 208) h between the light emitting element 206 and the central radiation surface 209a is set to be 0.5 mm.

Figure 27:
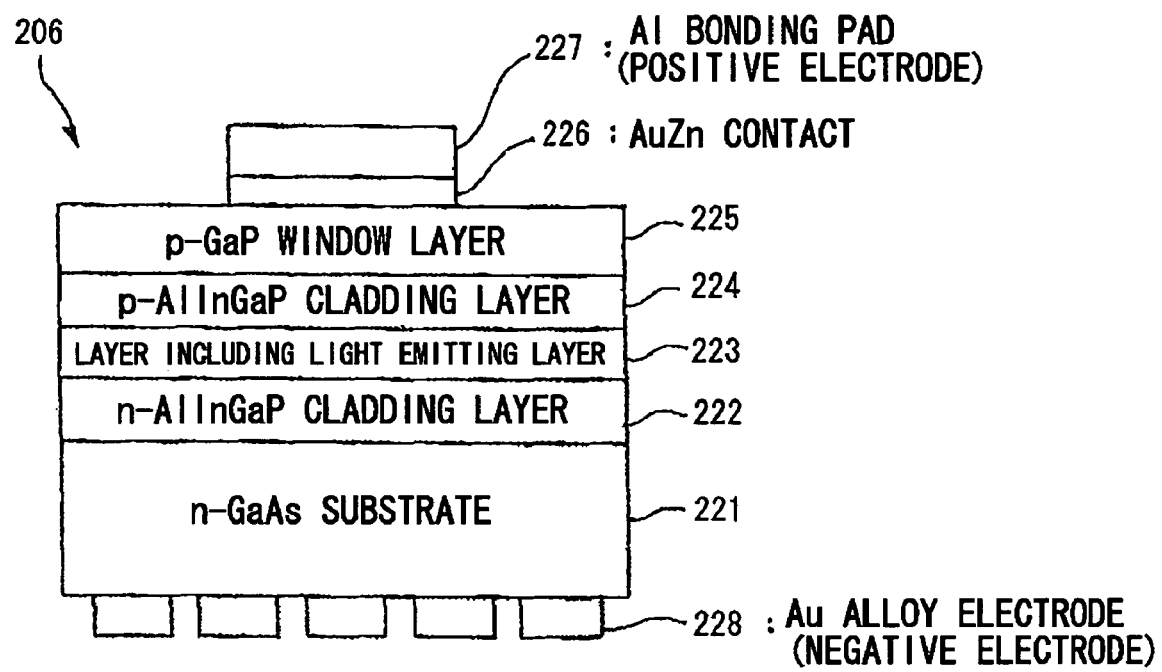
FIG. 27 is a side view showing a light emitting element in embodiment 2A of the invention.

FIG. 27 shows the composition of light emitting element 206. In the order of the bottom layer to the top layer, n-GaAs substrate 221, n-AlInGaP cladding layer 222, a layer 223 including a light emitting layer, p-AlInGaP cladding layer 224 and p-GaP window layer 225 are formed. On the p-GaP window layer 225, Al bonding pad (positive electrode) 227 is formed through AuZn contact layer 226 for the ohmic contact with the window layer 225. Further, under the n-GaAs substrate 221, Au alloy electrodes (negative electrodes) 228 are formed. The n-GaAs 221 substrate is not transparent to a wavelength of light emitted from the light emitting layer. The n-AlInGaP cladding layer 222 and p-AlInGaP cladding layer 224 are transparent thereto.

Figure 28:
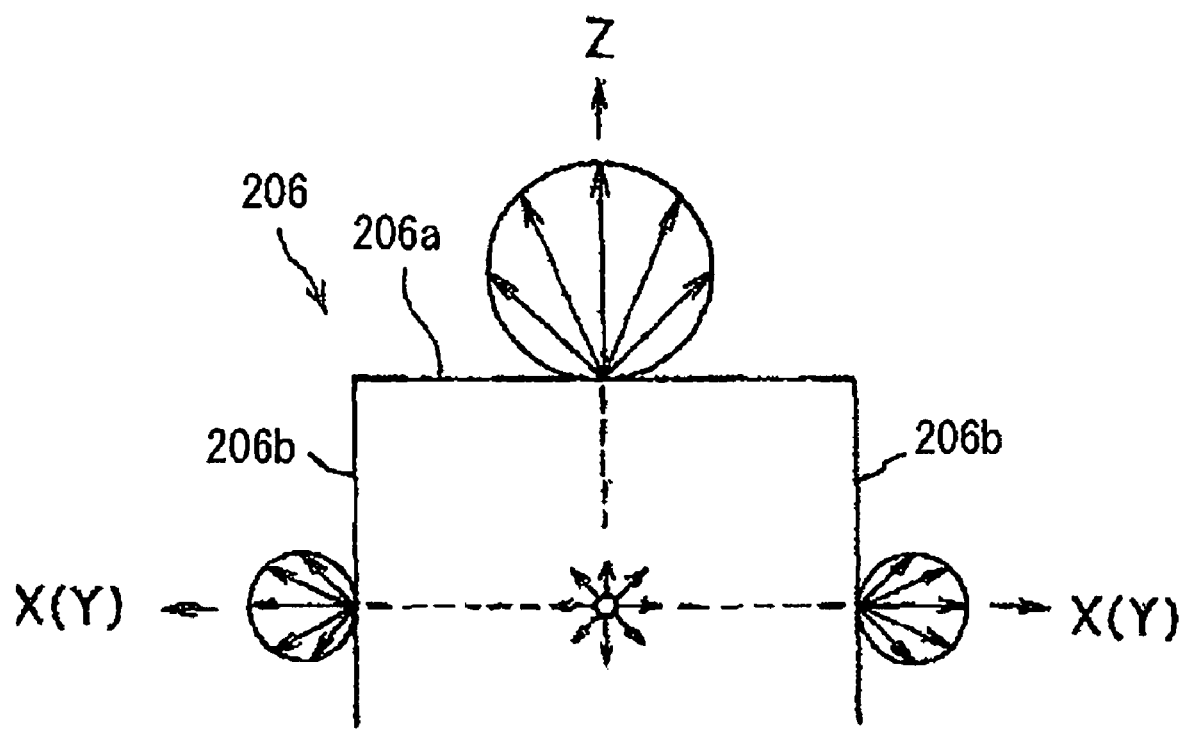
FIG. 28 is an illustration showing light radiated from an upper surface and a side surface of the light emitting element in embodiment 2A of the invention.

FIG. 28 is an illustration showing a light distribution characteristic of the light emitting element 206. A radiation intensity to be radiated from the top surface 206a and side surfaces 206b (four side surfaces) of light emitting element 206 is the sum of radiation intensity to be radiated from the top surface 206a and radiation intensity to be radiated from the four side surfaces 206b. The light distribution characteristic I(θ) is represented by the next formula (1):

$$I(\theta) = k \cdot \cos\theta + (1-k) \cdot \sin\theta \tag{1},$$

where k·cos θ indicates radiation intensity to be radiated from the top surface 206a and (1−k)·sin θ indicates radiation intensity to be radiated from the side surface 206b. θ is an angle to the Z-axis in light emitting element 206. As k is changed, the distribution of light to be radiated from the top surface 206a and light to be radiated from the side surface 206b is changed.

Figure 29:
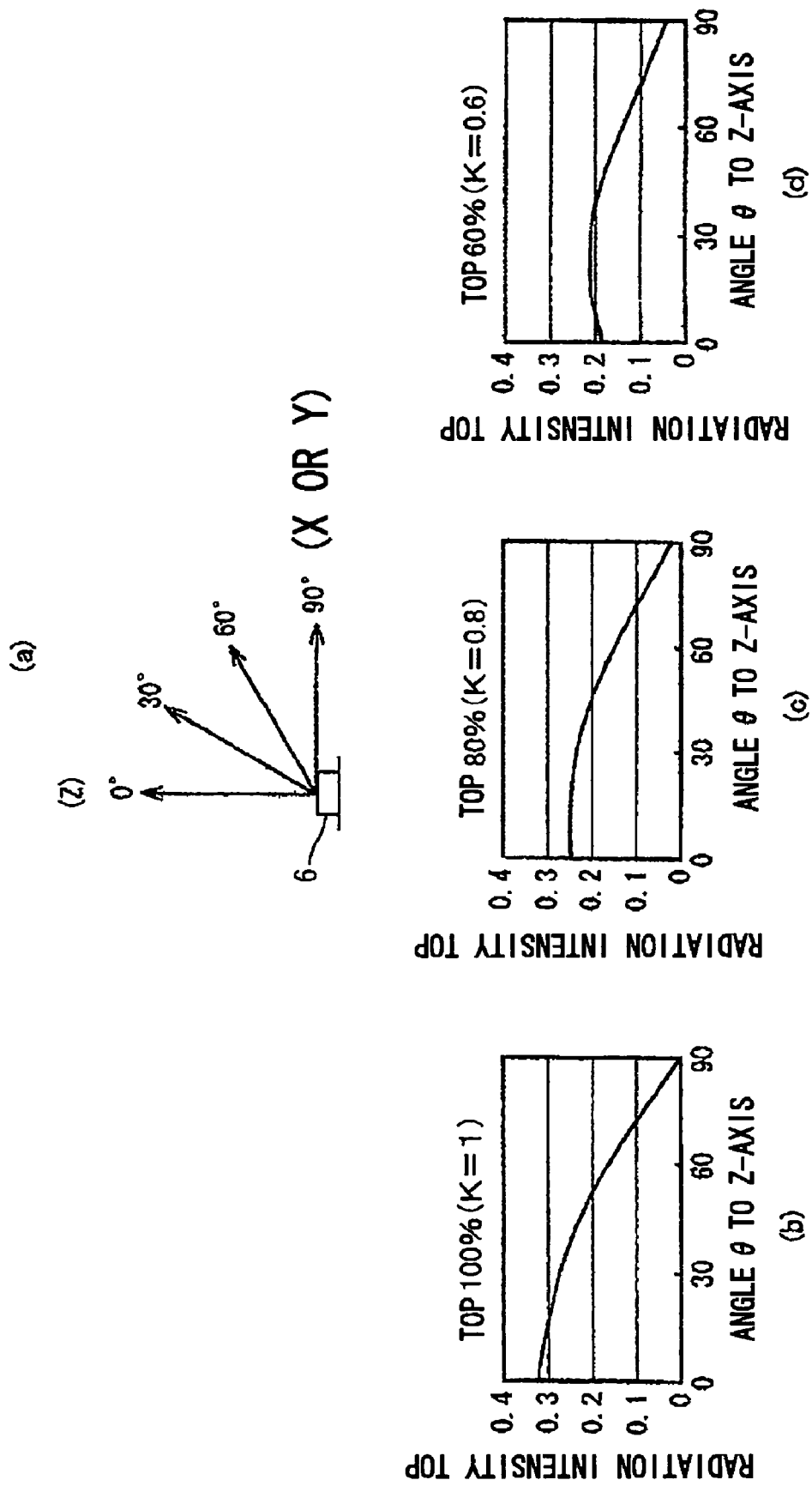
FIG. 29 shows light distribution characteristic curves in embodiment 2A of the invention, wherein (a) is an illustration showing an angle to Z-axis of light emitting element, (b) is a characteristic diagram showing a change in radiation intensity in case of k=1, (c) is a characteristic diagram showing a change in radiation intensity in case of k=0.8, and (d) is a characteristic diagram showing a change in radiation intensity in case of k=0.6.

FIG. 29 shows a change in radiation intensity (in the Z-axis direction) when θ is changed in light emitting element 206 with different light distribution characteristics based on the above formula (1). FIG. 29(a) shows a definition of angle to the light emitting element 206. FIG. 29(b) shows the state (top 100%) of light of 100% being radiated from the top surface 206a at k=1. FIG. 29(c) shows the state (top 80%) of light of 80% being radiated from the top surface 206a at k=0.8 and light of 20% being radiated from the side surface 206b. FIG. 29(d) shows the state (top 60%) of light of 60% being radiated from the top surface 206a at k=0.6 and light of 40% being radiated from the side surface 206b.

The light emitting element 206 has a characteristic at about k=0.8 that the ratio of light radiated from the top surface to light emitted from the layer 223 including light emitting layer becomes big since n-GaAs substrate 221 is a black absorbing material to emission color. Namely, light of 80% is radiated from the top surface 206*a* and light of 5% is radiated from each side surface 206*b*. In order to have a desired light distribution characteristic, the thickness of epitaxial layer or the shape of light emitting element 206 is controlled.

The light emitting element 206 with a light distribution characteristic as shown in FIG. 29(*b*) is characterized such that light is radiated from the top surface 206*a*, the radiation intensity lowers as θ increases and it becomes nearly zero at θ=90 degrees. The light emitting element 206 with a light distribution characteristic as shown in FIG. 29(*c*) is characterized such that light is also radiated from the side surface 206*b*, radiation intensity at θ=0 is smaller than that of the light emitting element in FIG. 29(*b*) and it however does not become zero even at 90 degrees and therefore light is radiated in the X-Y direction. The light emitting element 206 with a light distribution characteristic as shown in FIG. 29(*d*) is characterized such that the amount of light radiated from the side surface 206*b* is greater than that in FIG. 29(*c*) and, therefore, radiation intensity at θ=0 is smaller and, however, a reduction in radiation intensity along with a change of θ is smaller than that in FIG. 29(*b*) and (*c*), and it does not become zero even at 90 degrees and therefore light is radiated in the X-Y direction.

The light distribution characteristic of LED 202 depends on the light distribution characteristic of light emitting element 206, a position precision of optical surface in the light emitting element 206, central radiation surface 209*a*, reflection surface 209*b* and radiation surface 210, a mounting position precision of the light emitting element 206 to the lead frame 205*a*, and a setting position precision of the lead frame 205*a* and above optical surface to a die in molding integrally with resin. In order not to cause an unevenness in light distribution in θ direction as shown in FIG. 26(*b*), evenness in light to be radiated in the circumference direction (360 degrees) of radiation surface 210 centered at the Z-axis is required. If a displacement exists between the light emitting element 206 and optical surface, unevenness In Light Distribution in θ direction is generated according to the amount of displacement. Especially, the proximity optical system of LED 202 in the invention has such a compositional characteristic that it is likely to generate unevenness in light distribution due to a slight displacement.

Figure 30:
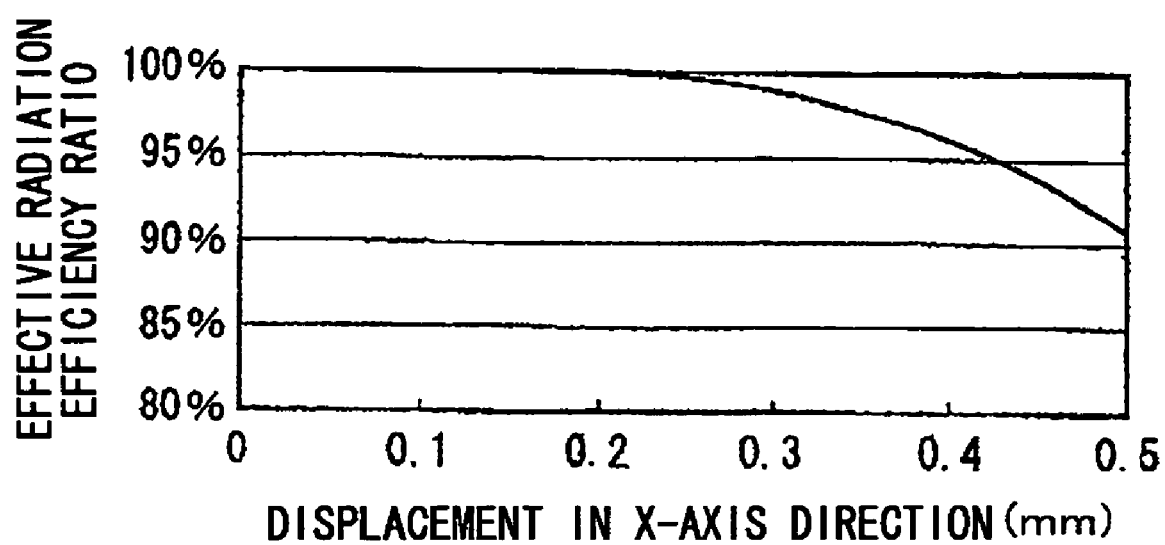
FIG. 30 is a graph showing a relationship between effective radiation efficiency ratio and a deviation in X-axis direction in embodiment 2A of the invention.

FIG. 30 shows a change in light amount of light radiated directly upward from the LED 202 and light irradiated to the reflection surface 203*a*, caused by a change in light distribution characteristic generated when, in the LED 202, the center axis of light emitting element 206 is displaced in the X-axis direction to the optical surface. In the case of light emitting element 206 with GaAs substrate, the effective radiation efficiency ratio lowers when a displacement is generated in the X-axis direction in manufacture. In FIG. 30, it significantly lowers, particularly, more than 0.3 mm.

FIGS. 31(*a*) and (*b*) show observation conditions of light amount radiated from LED 202, where the entire circumference of LED 202 is divided into φij to represent 32 regions. As shown in FIG. 31(*a*), its circumference of 360 degrees centered at the Z-axis is divided into eight sections (j=1 to 8). FIG. 31(*b*) shows an angle range of 0 to 20 degrees (i=1) to the Z-axis, an angle range of 20 to 60 degrees (i=2), an angle range of 60 to 100 degrees (i=3), and an angle range of 100 to 180 degrees (i=4). The amount of light radiated from LED 202 to theses regions will be explained below. Herein, it is assumed that a region in angle range of 0 to 20 degrees to the Z-axis corresponds to light to be directly externally radiated near the Z-axis from LED 202 and a region in angle range of 60 to 100 degrees to the Z-axis corresponds to light to be radiated from LED 202 to the reflection mirror 203 then reflected in a direction near the Z-axis by the reflection mirror 203 to be radiated externally.

Figure 32:
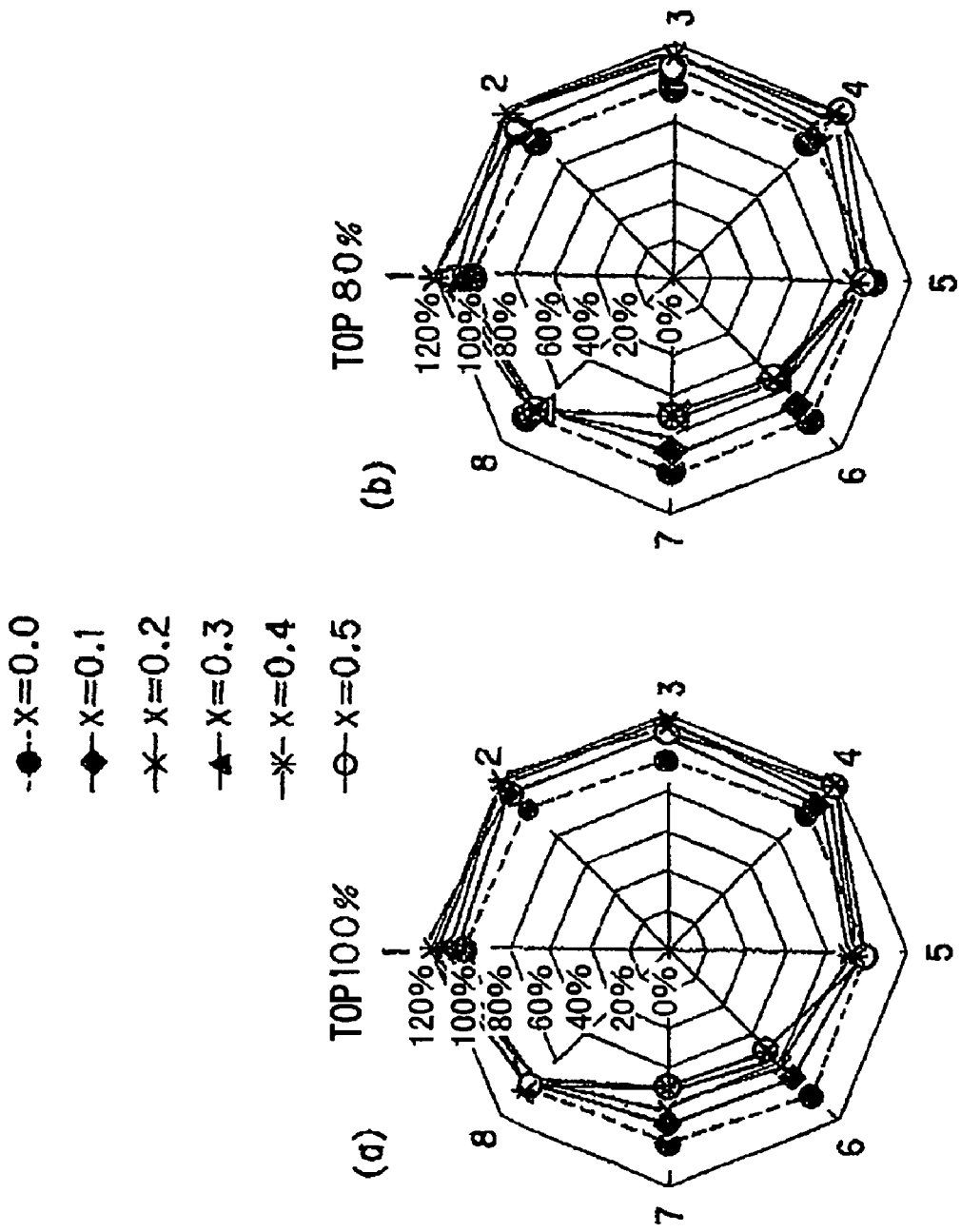
FIG. 32 shows a deviation in total light amount in effective radiation range of LED in embodiment 2A of the invention, wherein (a) is a characteristic diagram showing a deviation in total light amount in effective radiation range of LED using a light emitting element with a top light distribution characteristic of 100%, and (b) is a characteristic diagram showing a deviation in total light amount in effective radiation range of LED using a light emitting element with a top light distribution characteristic of 80%.

FIG. 32 shows a deviation in total light amount of LED 202 in using the light emitting element 206 with a top light distribution characteristic of 100% under the observation conditions as shown in FIG. 31. The deviation of total light amount is calculated under conditions that six displacements of 0.0 to 0.5 mm in the X-axis direction are generated, and the deviation of total light amount in each direction is shown connected with lines. As the amount of displacement increases, the deviation of total light amount increases. FIG. 32(*b*) shows a deviation in total light amount of LED 202 in using the light emitting element 206 with a top light distribution characteristic of 80%. Since the light emitting element 206 has a structure to radiate light from the side surface 206*b*, the deviation of total light amount is improved.

As described above, as the amount of light radiated laterally from the light emitting element 206 increases, the deviation of total light amount in effective radiation range due to a displacement between the light emitting element 206 and optical surface is reduced. Therefore, when using a light emitting element 206 with a light distribution characteristic of less than k=0.8, the deviation of total light amount in effective radiation range is almost removed and no visual influence is generated. This is because, even when the position of a light emitting element 206 mounted on the lead frame 205*a* is deviated within 0.1 mm in the X-axis (Y-axis) direction from the Z-axis, its influence can be compensated by the light distribution characteristic of light emitting element 206.

Figure 9:
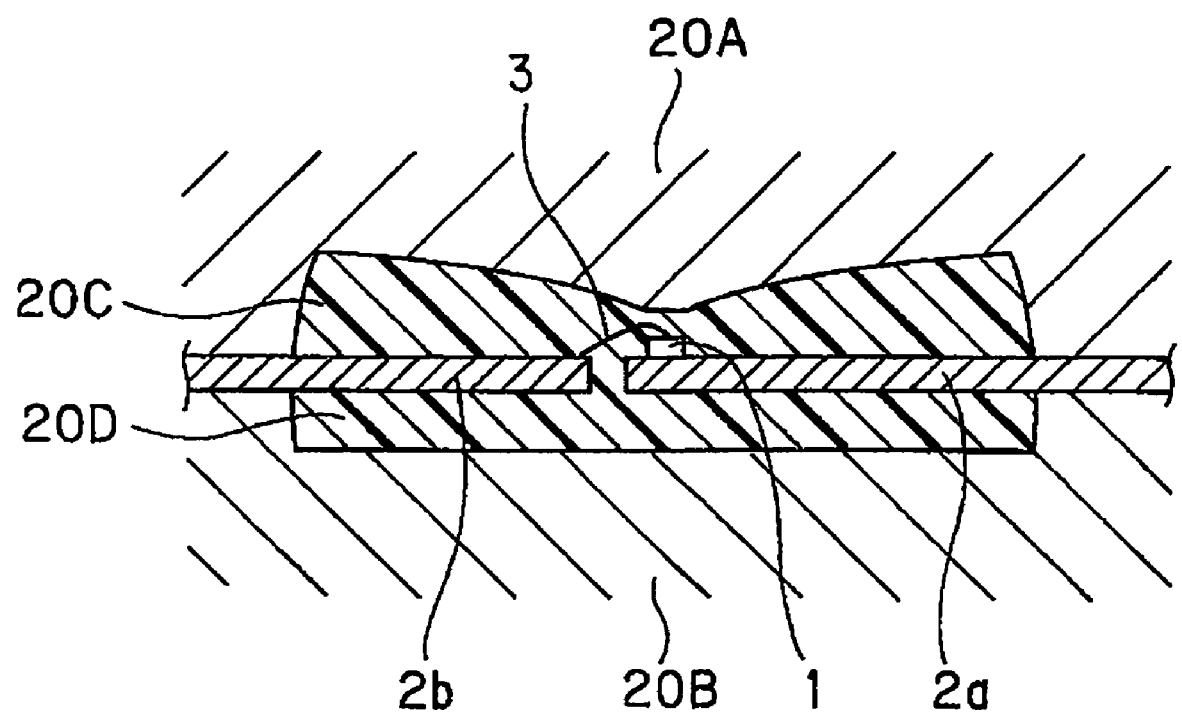
FIG. 9 is a cross sectional view showing a method (transfer molding) of making the light emitting diode in embodiment 1A of the invention.

The LED 202 may be fabricated by, e.g., transfer molding as explained referring to FIG. 9.

The operation of LED light 201 will be explained below.

When an operator turns on a power switch (not shown) of LED light 201, power source section (not shown) applies a voltage to the lead frames 205*a*, 205*b*. The light emitting element 206 emits light based on the applying of voltage. Light emitted directly upward along the Z-axis from the light emitting element 206 is externally radiated out of the transparent epoxy resin 208 from the central radiation surface 209*a*. 50 to 60% of light to be emitted from the light emitting element 206 is irradiated to the reflection surface 209*b* with a solid angle of about 2.7 strad to the light emitting element 206. Light to be emitted in a direction nearly horizontal from the light emitting element 206 is directly irradiated to the radiation surface 210, directly radiated externally in a direction nearly parallel to the X-Y plane from the radiation surface 210.

Light to be radiated nearly parallel to the X-Y plane from the LED 202 is reflected nearly in the Z-axis direction by the reflection surface 203*a* of reflection mirror 203, then radiated externally.

As described above, the LED light 201 in embodiment 2A described above is composed such that the light emitting element 206 of LED 202 composing a proximity optical system has a light distribution characteristic of less than k=0.8 in I(θ)=k·cos θ+(1−k)·sin θ and the light emitting element 206 and optical surface are integrally formed by transfer molding. Light in the X-axis direction to be radiated from the LED 202 and irradiated to the reflection mirror 203 has little deviation of total light amount in effective radiation range and can be radiated almost evenly in the Z-axis direction by the reflection mirror 203. Thereby, a low-profile lamp with a good appearance can be offered while having a large area of reflection mirror and no difference in surface brightness. When it is applied to a tail lamp or a brake lamp of automobile, visibility of light can be enhanced not only in the back direction of automobile but also in the lateral direction thereof.

Although the above LED light 201 is exemplified such that the LED 202 uses the light emitting element 206 with a light distribution characteristic of k=0.8, if it uses a light emitting element 206 with a light distribution characteristic of less than k=0.8, then the deviation of total light amount in effective radiation range due to a displacement between the light emitting element 206 and optical surface can be reduced to a level causing no problem practically.

In the manufacture by transfer molding, transparent epoxy resin 208 is injected into a die while sandwiching the lead frames 205a, 205b by the die. Therefore, the positioning between the light emitting element 206 and optical surface can be performed at a high precision of ±0.1 mm. Thereby, even when using the proximity optical system composed of a light emitting element 206 with k=0.8, the LED light 201 with a stabilized quality can be offered while preventing a dispersion in light distribution characteristic due to an individual difference of the LED 202.

Although in the above explanation transparent epoxy resin 208 is used as the transparent material to seal the light emitting element 206, another transparent material having about the same transparency and the other optical characteristics may be used. Further, although transparent acrylic resin is used for the reflection mirror 203, the other material such as another transparent synthetic resin may be used for that.

The composition, shape, number, material, dimensions, connection form etc. of the other part in the LED light are not limited to those described in the above embodiments.

Although the reflection surface 209b is provided to offer the total reflection of resin without being mirror fished, it may be alternatively mirror finished by metal evaporation etc.

Embodiment 2B

FIG. 33(a) is a plain view showing an LED 202a in embodiment 2B of the invention in viewing from the Z-axis direction, and (b) is a cross sectional view showing the vicinity of a light emitting element 206 in (a). The LED 202a is composed of: the light emitting element 206 that is of GaP substrate AlInGaP using a n-GaP substrate with a transparency and has a light distribution characteristic of top 60% (k=0.6); and lead frames 205b, 205c that are of copper alloy and folded at its resin-sealed region. The light emitting element 206 is mounted on the tip of lead frame 205c. Like parts are indicated by the same numerals used in embodiment 2A and the explanations thereof are omitted here.

Figure 34:
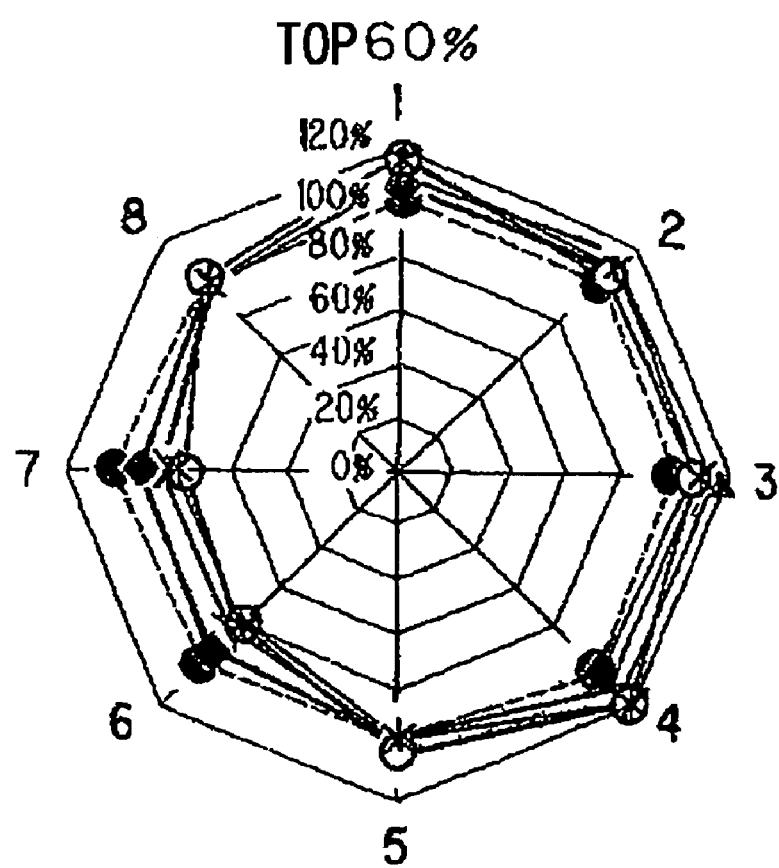
FIG. 34 is a characteristic diagram showing a deviation in total light amount in effective radiation range of LED using a light emitting element with a top light distribution characteristic of 60% (k=0.6) in embodiment 2B of the invention.

FIG. 34 shows a deviation in total light amount of LED 202a using a light emitting element 206 with a light distribution characteristic of k=0.6. As shown, even when X=0.4, the deviation in light distribution characteristic is kept within ±20% since the amount of light to be radiated from the side surface 206b of light emitting element 206 is increased, as compared to the light emitting element 206 with a light distribution characteristic of k=0.8. Thus, the deviation in total light amount is improved. The light emitting element 206 with k=0.6 may be formed using a substrate material that offers a light transparency to emission color of GaP etc. in order to increase the radiation amount from the side surface 206b based on a reflection in of the light emitting element 206.

Figure 10:
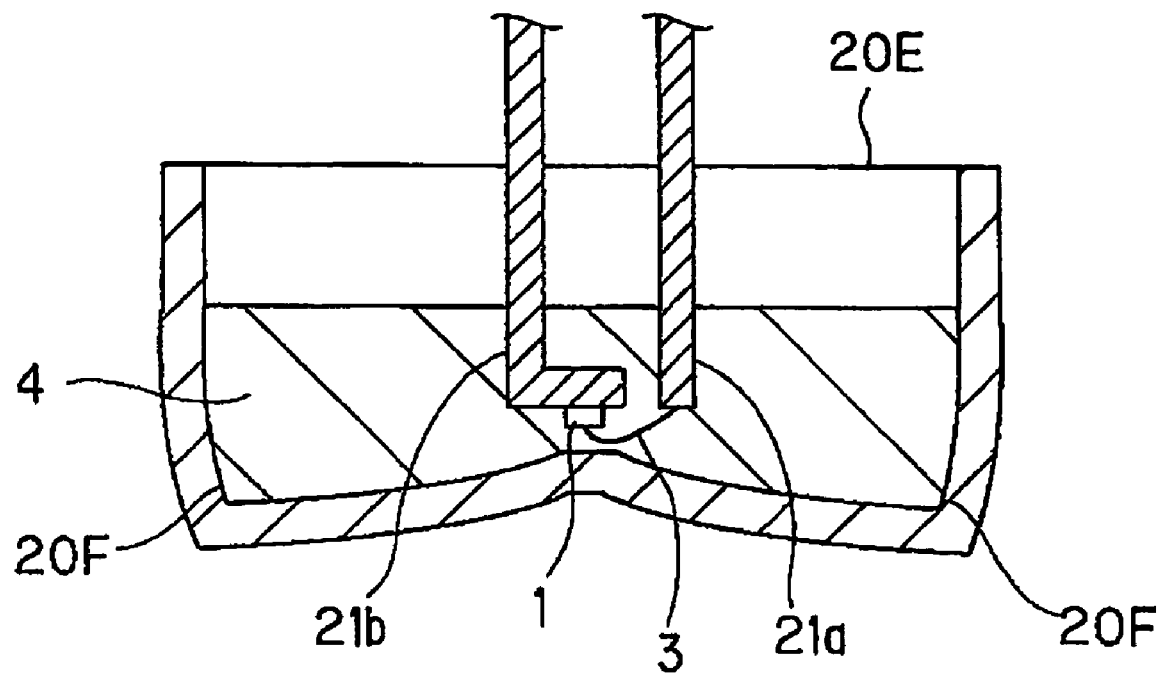
FIG. 10 is a cross sectional view showing a method (casting mold) of making the light emitting diode in embodiment 1A of the invention.

LED 202a may be fabricated by, e.g., casting mold as explained referring to FIG. 10.

Since the LED 202a in embodiment 2B has the light emitting element 206 using the n-GaP substrate with a transparency and it has a light distribution characteristic of k=0.6, it can have a wider light distribution characteristic than LED 202 with the light emitting element 206 using the n-GaAs substrate. Thereby, even if a small displacement is generated between the light emitting element 206 and optical surface, the deviation of total light amount in effective radiation range can be reduced to a level causing no problem practically.

In the casting mold, since the tip (free and) of lead frames 205b, 205c is not restrained by the casting, precision in positioning between the light emitting element 206 and optical surface lowers to ±0.2 mm as compared to that in the transfer molding. Especially, when the light emitting element 206 is mounted on the tip thick portion of planar lead frame, it is difficult to obtain a high precision in positioning. However, since the tolerance of precision in positioning is increased, the productivity can be enhanced and therefore it has an excellent mass production property. By curing the transparent epoxy resin 208 for long hours, unevenness in thermal stress is reduced and the lead frames 205b, 205c are not likely to be released from the transparent epoxy resin 208. Meanwhile, by choosing the fabrication process management and the light distribution characteristic of light emitting element 206, the light distribution characteristic can be stabilized.

Embodiment 2C

FIG. 35(a) is a plain view showing an LED 202b in embodiment 2C of the invention in viewing from the Z-axis direction, and (b) is a cross sectional view showing the vicinity of a light emitting element 206 in (a). The LED 202b is composed of: the light emitting element 206 that is of GaP substrate AlInGaP using a n-GaP substrate with a transparency and has a light distribution characteristic of top 40% (k=0.4); and lead frames 205b, 205d that are of copper alloy. Like parts are indicated by the same numerals used in embodiments 2A, 2B and the explanations thereof are omitted here.

The light emitting element 206 with k=0.4 has dimensions (e.g., 0.3 mm square) smaller than the light emitting element 206 with k=0.6, and thereby the radiation amount from the side surface 206b is further increased since the absorption loss in light emitting element is reduced.

The light emitting element 206 is mounted on the tip of lead frame 205c punched out by pressing.

Since the LED 202b in embodiment 2C has the light emitting element 206 mounted on the tip of lead frame 205c, it can have a reduced contact area between the lead frames 205b, 205d and transparent epoxy resin 208, thereby preventing the releasing, as well as having an excellent mass production property while reducing the deviation in total light amount in effective radiation range. Further, the process of folding the lead frames 205b, 205d is not needed and therefore the productivity can be enhanced.

Further, since the LED 202b in embodiment 2C has the light emitting element 206 using the n-GaP substrate with a transparency, it can have a wider light distribution characteristic than LED 202 with the light emitting element 206 using the n-GaAs substrate, like embodiment 2B. Thereby, even if a small displacement is generated between the light emitting element 206 and optical surface, the deviation of total light amount in effective radiation range can be reduced to a level causing no problem practically.

Embodiment 2D

Figure 36:
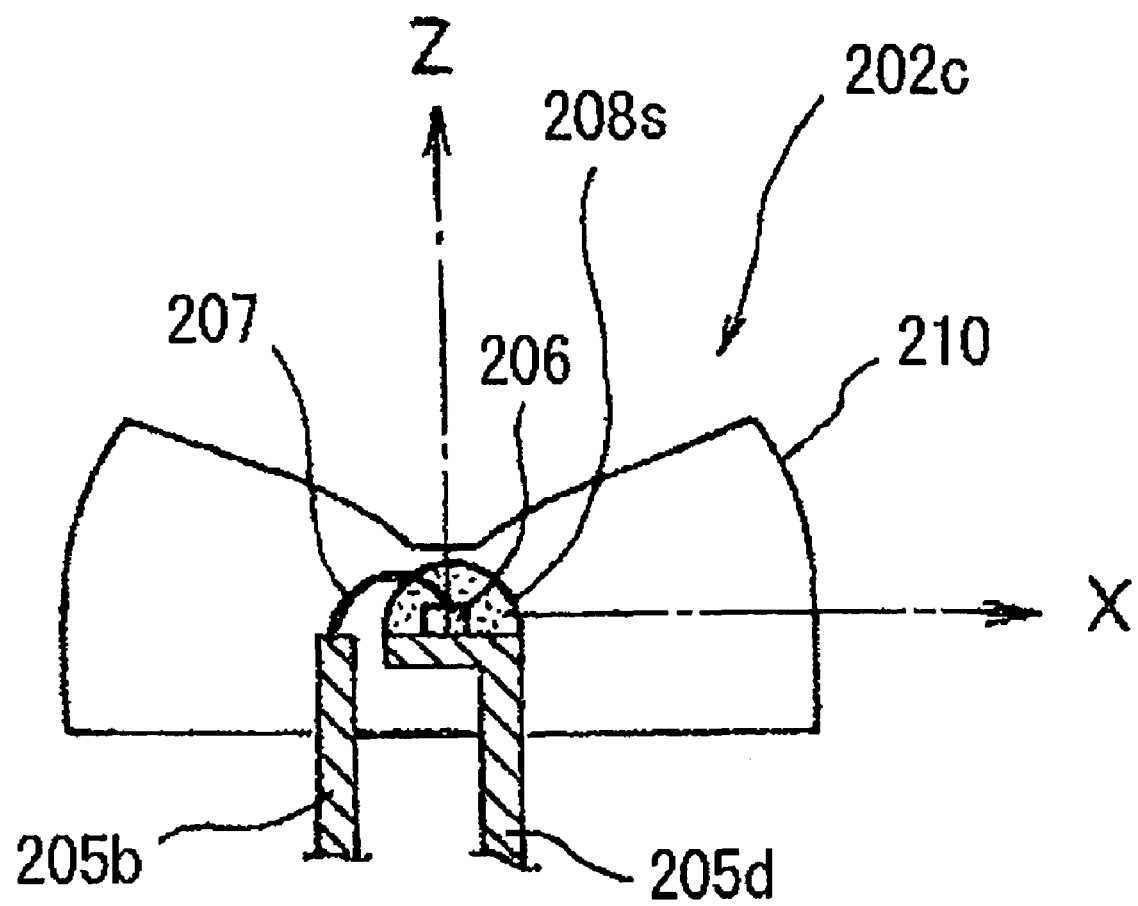
FIG. 36 is a cross sectional view showing an LED light using an LED in embodiment 2D of the invention.

FIG. 36 shows an LED 202c in embodiment 2D of the invention. The LED 202C is composed of: a light emitting element 206 of Al$_2$O$_3$ substrate GaN; lead frames 205b, 205d that are of copper alloy and folded at its resin-sealed region; and transparent epoxy resin 208 with an optical surface. The light emitting element 206 is mounted on the tip of lead frame 205d. The light emitting element 206 is sealed with sealing resin 208s including phosphor. In FIG. 36, the transparent epoxy resin 208 is shown as transparent member. Like parts are indicated by the same numerals used in embodiment 2A, 2B, 2C and the explanations thereof are omitted here.

Since the LED 202c in embodiment 2D has the light emitting element 206 that is mounted on the tip of lead frame 205d and sealed with sealing resin 208s in the shape of a semi-sphere, even when the light emitting element 206 does not have a wide light distribution characteristic, excitation light to be radiated from phosphor can be diffused. Thereby, its light distribution characteristic can be made to be suitable for the proximity optical system of the invention.

The phosphor available is Ce:YAG (yttrium aluminum garnet) etc. In order to enhance the light distribution characteristic, a light diffusion material for diffusing light may be mixed into the sealing resin 208s instead of the phosphor. Thereby, the same effect can be obtained. The light diffusion material may be, e.g., titanium oxide, alumina, SiO2.

Although in the above embodiments 2A to 2D the light emitting element 206 uses a GaAs system substrate, it may use a GaP substrate AlInGaP system or GaN system according to the light distribution characteristic. Further, it may selectively use a substrate with a transparency or non-transparency to emission wavelength. If applicable to the LED light 201, the light emitting element 206 is not limited to specific composition.

Although the light emitting diode is formed by molding the reflection surface and side reflection surface while sealing the light emitting element, it may be formed by sealing the light emitting element with a light-transmitting material while mounting a mold with reflection surface and side reflection surface being separately formed using transparent resin thereon. Thus, a proximity optical system to the light emitting element can be formed.

In the above embodiments 2A to 2D, the reflection mirror 209 has a circular reflection shape to be formed by rotating, around the Z-axis, part of a parabola with a focal point at the origin of light emitting element 206 and with a symmetry axis on the X-axis, and the radiation surface 210 has a shape to compose part of a spherical surface centered at the light emitting element 206. However, they are not specifically limited thereto if they are formed to radiate light being emitted from the light emitting element 206 in the side surface direction. Especially, in the shape of transparent epoxy resin 208 in the above embodiments or when the relationship of H<R is established, the reflection mirror 209 is placed close to the light emitting element 206 and thereby the same effect can be obtained in aspect of stabilization of light distribution characteristic in LED based on the positional precision of optical system. Even when the relationship of H<R is not satisfied, if h<1 mm, the same effect can be obtained.

Embodiment 3A

Figure 37:
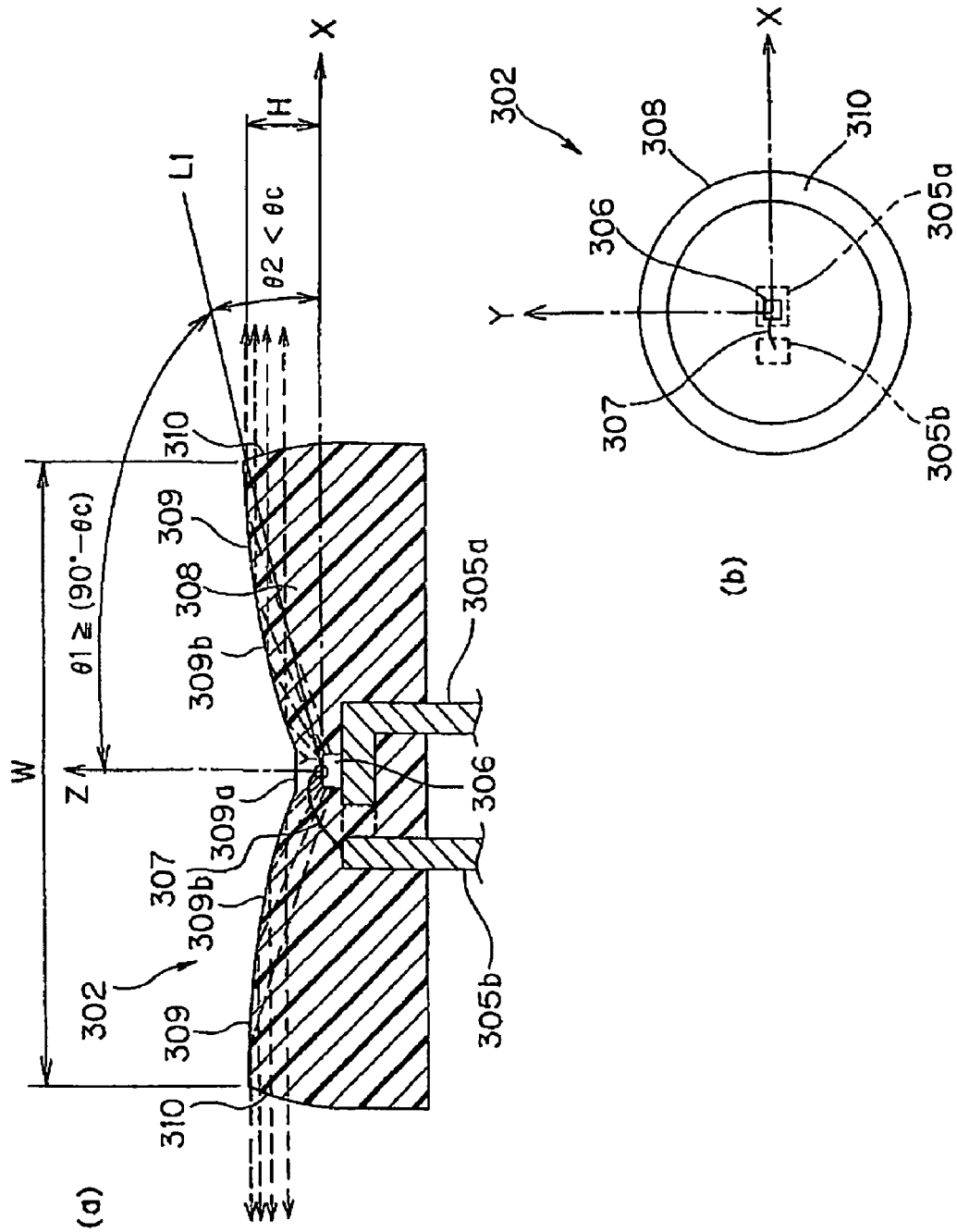
FIG. 37 shows an LED in embodiment 3A of the invention, wherein (a) is a cross sectional view thereof, and (b) is a plain view thereof.

FIG. 37 shows an LED in embodiment 3A of the invention, wherein (a) is a cross sectional view thereof, and (b) is a plain view thereof.

As shown in FIG. 37, the LED 302 in embodiment 3A has an integrated structure that a light emitting element 306 as a light source is sealed with transparent epoxy resin 308 while forming optical surface. In the explanation below, the center axis of light emitting element 306 is a Z-axis, a point on the top surface of light emitting element and on the Z-axis is an origin, and a coordinate system with an X-axis and a Y-axis orthogonal to the Z-axis at the origin is defined. Meanwhile, the Z-axis is also called center axis Z.

The LED 302 is composed such that the light emitting element 306 is, at the origin, mounted through Ag paste on a lead frame 305a of a pair of lead frames 305a, 305b that are of copper alloy and disposed through a gap for insulation on the X-Y plane, the upper surface electrode of light emitting element 306 is bonded through a gold wire 307 to the tip of lead frame 305b, and part of lead frames 305a, 305b, light emitting element 306 and wire 307 are sealed with transparent epoxy resin 308 (refractive index 1.55) while molding the optical surface.

The main feature of LED 302 is the shape of transparent epoxy resin 308. Namely, the transparent epoxy resin 308 has a central radiation surface 309a at the center of its upper surface (directly over the light emitting element 306) and a reflection surface 309b formed subsequently to the central radiation surface 309a to compose a reflection mirror 309.

The reflection surface 309b has a circular reflection shape to be formed by rotating, around the Z-axis, part of a parabola with a focal point at the origin and with a symmetry axis on the X-axis. The central radiation surface 309a is an optical surface to radiate light to be emitted from the light emitting element 306 in the Z-axis direction and may be formed concave or convex. According to use, the central radiation surface 309a may be not formed.

The reflection surface 309b has a solid angle of $2\pi\{1-\cos\theta c\}$ or greater, where θc is a critical angle of the abovementioned transparent material. Alternatively, an angle θ1 of an oblique line L1 to connect between the focal point of light emitting element 306 and the edge of reflection surface 309b to the Z-axis is set to be greater than (90 degrees−θc).

A diameter W of the reflection surface 309b is preferably less than φ10 mm. This is because, when the transparent epoxy resin 308 has a large size, though it is advantageous in optical design, a crack may be generated due to a thermal shock by remaining stress in resin curing and therefore the transparent epoxy resin 308 preferably has a small size.

Figure 38:
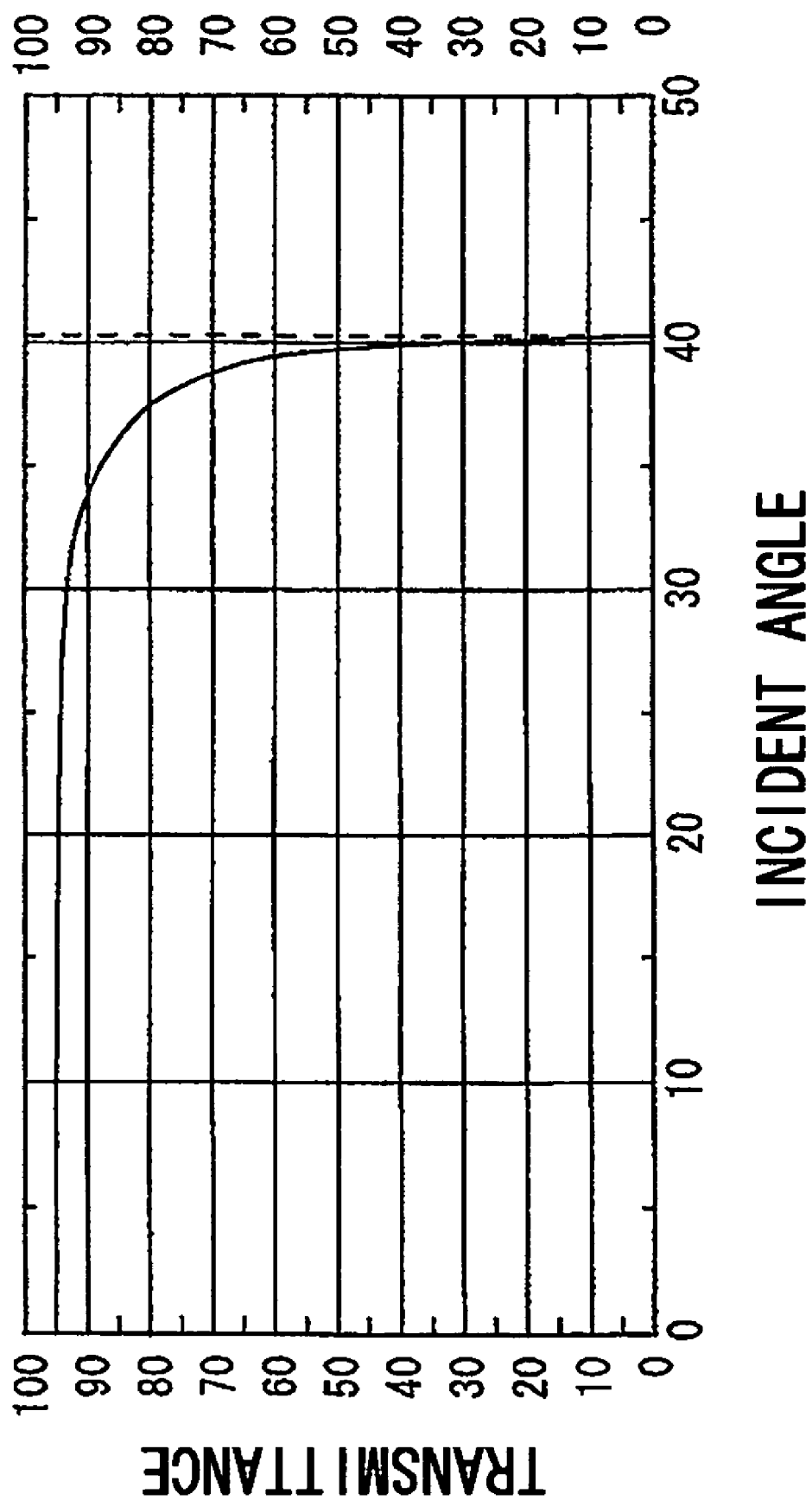
FIG. 38 is a graph showing a relationship between incident angle and transmittance in LED.

The transparent epoxy resin 308 has a side radiation surface 310 to compose part of a spherical surface centered at the origin. A height H to vertically connect between the edge of reflection surface 309b at the reflection surface 310 and the X-axis to be horizontally extended from the focal point of light emitting element 306 is set such that an angle θ2 to the X-axis of the oblique line L1 connecting between the focal point of light emitting element 306 and the edge of reflection surface 309b is less than the critical angle θc. The angle θ2 is preferably less than (θc−5 degrees). This is because, even when an incident angle does not reach θc, the interface reflection is likely to occur near θc as shown in FIG. 38.

Although the abovementioned (90 degrees−θc) or $2\pi\{1-\cos\theta c\}$ means having a large solid angle to the light emitting element 306, it also means a range that the interface reflection of light being directly irradiated from the light emitting element 306 to the side radiation surface 310 can be prevented in order not to be stray light. Even if the side radiation surface 310 is a vertical surface with no taper, when θ1 is greater than (90 degrees−θc), θ1 becomes less than θc and thereby no stray light due to total reflection is generated.

The LED 302 has such dimensions that the diameter is 10 mm, the diameter W of reflection surface 309b is 9 mm, the height H of outer edge in the Z-axis direction, and the angle θ1 to the Z-axis of the line from the top surface of light emitting element 306 to the edge of reflection surface 309b is 70 degrees.

The lead frame 305a with the light emitting element 306 mounted thereon is composed such that part of the lead frame 305a embedded in transparent epoxy resin 308 is reduced as much as possible to the extent that the wire 307 is not exposed, by drawing it out of transparent epoxy resin 308 under the mount surface from the vicinity of the mount position of light emitting element 306. The lead frame 305b is also in the shape of a strip-like plate and is disposed parallel to part of the lead frame 305a being drawn out of the resin.

Since the LED 302 of a type to radiate light in a direction perpendicular to the Z-axis, called side radiation type, requires a wide radiation range and sufficient radiation intensity, the light emitting element 306 used is of large current type (high-output type).

Figure 39:
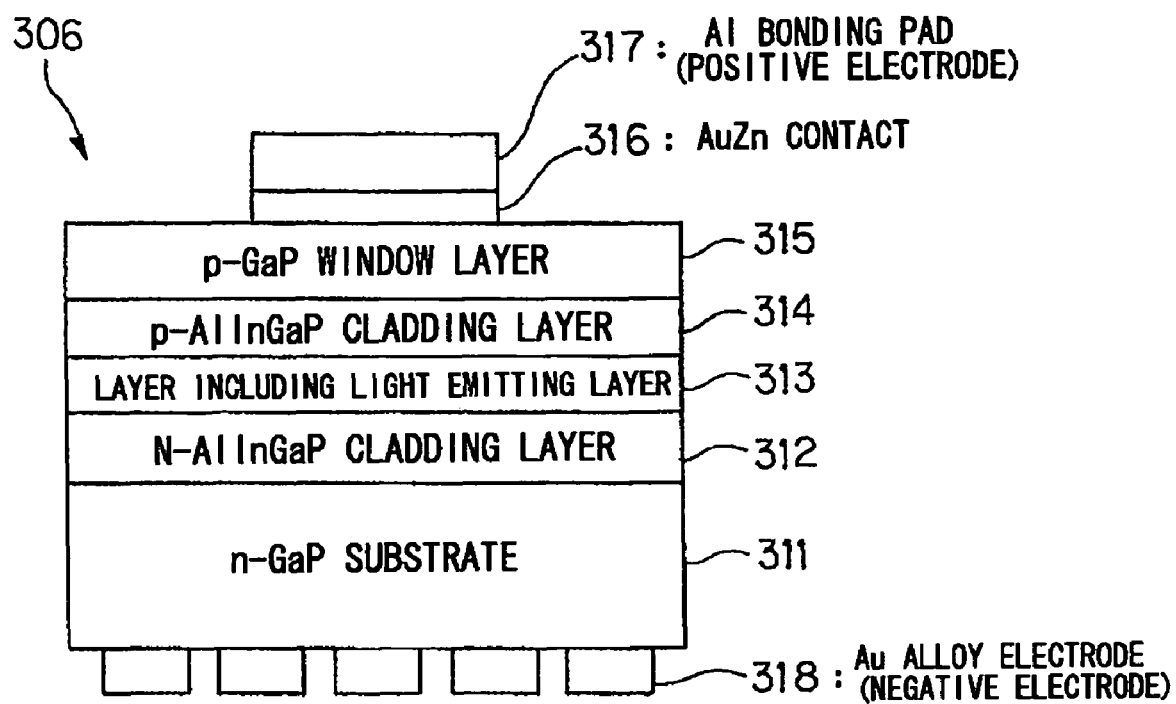
FIG. 39 is a cross sectional view showing a light emitting element used for the LED in embodiment 3A of the invention.

For example, as shown in FIG. 39, it is composed of n-AlInGaP cladding layer 312, layer 313 including a light emitting layer, AlInGaP cladding layer 314 and p-GaP window layer 315 that are sequentially formed on n-GaP substrate 311. Further, an Al bonding pad (positive electrode) 317 is formed through AuZn contact 316 for the ohmic contact with the window layer 315 on the p-GaP window layer 315. Further, Au alloy electrodes (negative electrodes) 228 are formed under the n-GaP substrate 311.

The light emitting element 306 with the negative electrodes 318 is mounted on the lead frame 305a, and the positive electrode 317 thereof is bonded through the wire 307 to the tip of lead frame 305b. By applying a predetermined voltage between the electrodes 317 and 318, the light emitting element 306 emits light. The emission of light is generated such that carriers (electron and hole) are confined in the layer 313 including the light emitting layer by the cladding layers 312, 314 and the carriers are recombined in the layer 313 including the light emitting layer.

The light emitting element 306 has a large heat release value since it is of large current type. In embodiment 3A, the lead frames 305a, 305b where to mount the light emitting element 306 are of a copper alloy material with a high thermal conductivity (300 W/m·k or higher) and the heat radiation property is enhanced by reducing the embedded portion as much as possible as shown in FIG. 37. Thus, by reducing heat to be accumulated in the light emitting element 306 and lead frame 305a as much as possible, the temperature rise of light emitting element 306 can be suppressed and the reduction of light output in LED 302, which has a negative light output dependency to temperature, can be prevented. Therefore, the LED 302 can offer a high light output by setting a large supply current. For example, a large amount of light can be obtained by supplying a large current of more than 100 mA.

The emission operation of LED 302 thus composed will be explained below.

When a voltage is applied to the lead frames 305a, 305b of LED 302, the light emitting element 306 emits light. Of light to be emitted from the light emitting element 306, light emitted directly upward along the Z-axis from the light emitting element 306 is externally radiated from the central radiation surface 309a while being directly transmitted through the transparent epoxy resin 308. Further, of light to be emitted from the light emitting element 306, light to reach the reflection surface 309b is all subjected to total reflection due to its large incident angle to the reflection surface 309b, then heading to the side radiation surface 310. Since the reflection surface 309b has the reflection shape described earlier, light being reflected by the reflection surface 309b is all radiated nearly in parallel with the X-Y plane. Since the side radiation surface 310 composes part of spherical surface centered at the light emitting element 306, the light being radiated nearly in parallel is radiated forming nearly a plane in directions of 360 degrees around the Z-axis though it is slightly refracted by the side radiation surface 310.

FIGS. 40(a), (b) and (c) are characteristic diagrams showing a light intensity distribution, a light flux distribution, and a light flux integration in a standard light emitting element. The lateral axis indicates an angle to the center axis, and the vertical axes indicate light intensity ratio, light flux ratio and light flux ratio, respectively. Since θ1 of the outer edge to the Z-axis is 70 degrees, about 80% of light to be emitted from the light emitting element is reflected reaching the reflection surface 309b, then radiated forming nearly a plane from the side radiation surface 310. The remaining part of about 20% is radiated in a direction of 70 degrees to the Z-axis without being refracted by the side radiation surface 310.

As described above, in the LED 302 of embodiment 3A, light to be emitted from the light emitting element 306 can be laterally radiated at an ideal efficiency because: the light emitting element as a light source is sealed with transparent epoxy resin 308; the central radiation surface 309a, reflection surface 309b and side radiation surface 310 as optical surfaces are molded; and the reflection surface 309b has a shape to be formed by rotating, around the center axis Z, part of a parabola with a focal point at the origin of light emitting element 306 and with a symmetry axis on the x-axis.

Further, since the side radiation surface 310 of transparent epoxy resin is formed composing part of spherical surface centered at the light emitting element 306, light being reflected by the reflection surface 309b and radiated nearly in parallel proceeds directly through the side radiation surface 310 and then externally radiated forming nearly a plane in directions of 360 degrees around the Z-axis, and light directly heading to the side radiation surface 310 from the light emitting element 306 is externally radiated directly without being refracted by the side radiation surface 310. Thus, since no light to be radiated in the range of a small angle to the Z-axis exists, the radiation efficiency of light to be externally radiated in the lateral direction while being controlled as primary light from the side radiation surface 310 can be significantly enhanced.

Further, since the side radiation surface 310 of transparent epoxy resin 308 composes part of spherical surface centered at the light emitting element 306, the side radiation surface 310 is in the shape of a taper. Therefore, the release from a die in potting mold or casting mold can be facilitated without breaking the transparent epoxy resin 308. In the case of an inverted taper or vertical wall, the release from a die cannot be facilitated and the transparent epoxy resin 308 may be broken. Thus, it can be made by using a manufacturing method and resin material generally available, and thereby its mass production property and stability in characteristic can be enhanced.

The side radiation surface 310 may be formed by using part of circular cone surface that is slightly inclined (e.g., a slope of about 4 degrees) to the center of a cylinder, other than the spherical surface. Also in this shape, the release from a die can be facilitated without breaking the transparent epoxy resin 308. Another shape to facilitate the release from a die may be also used.

The LED 302 can be formed further low-profile by providing the central radiation surface 309a at the center of reflection surface 309b, i.e., directly over the light emitting element 306 and by curving the reflection surface 309b from the circumference edge of central radiation surface 309a. If curved without forming the directly over plane, it is necessary to increase the distance between the light emitting element 306 and the directly over plane and therefore the thickness increases that much. Such a disadvantage can be avoided by forming the directly over plane. The central radiation surface 309a may be convex or concave other than planar.

Since the central radiation surface 309a is formed directly over the light emitting element 306, light (vertical light) heading directly upward of light to be emitted from the light emitting element 306 can be externally radiated from the central radiation surface 309a. Thus, light can be radiated from the entire radiation surface composed of the central radiation surface 309a and the side radiation surface 310 in LED 302.

Since the diameter W of reflection surface 309b is reduced to less than ϕ10 mm, a crack due to a thermal shock by remaining stress in resin curing to be generated when the transparent epoxy resin 308 has a large size can be eliminated.

According to use, the LED 302 may be not provided with the central radiation surface 309a. In this case, although light is not radiated in the Z-axis direction, light to be emitted from the light emitting element 306 can be, like the above manner, reflected in the direction of side radiation surface 310 by the reflection surface 309b.

Although the reflection surface 309b has the circular reflection shape to be formed by rotating, around the center axis Z, part of a parabola with a focal point at the origin and with a symmetry axis on the x-axis, it may have a circular reflection shape to be formed by rotating, around the center axis Z, part of a parabola with a symmetry axis of less than 90 degrees to the Z-axis. With such a reflection surface, light will be also reflected obliquely upward. The use of LED with this reflection surface is explained a modification in embodiment 3B as described later.

Figure 41:
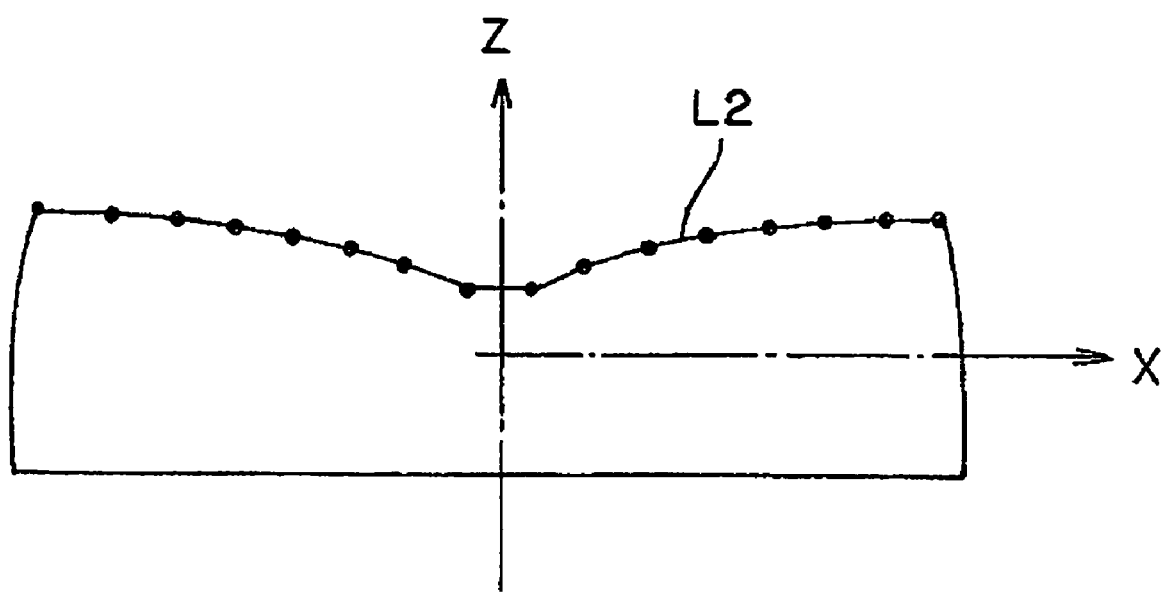
FIG. 41 is a cross sectional view showing another reflection surface formed on the LED in embodiment 3A of the invention.

Further, the reflection surface 309b may have a shape to be formed by rotating, around the center axis Z of light emitting element 306, part of an ellipse, a parabola or a hyperbola with a focal point at the light emitting element 306 or in its vicinity. Still further, as shown by L2 in FIG. 41, it may have a shape to be formed by rotating, around the center axis Z, part of lines to connect multiple points on a parabola. Further, it may be formed elliptic in viewing from the center axis Z, other than a shape to be formed by rotating around the center axis Z. Alternatively, anon axially-symmetrical shape may be used if it can effectively laterally radiate light to be emitted from the light emitting element 306.

Although the lead frames 305a, 305b are of copper alloy (thermal conductivity of 300 W/m·k or more), it may be of another material with a high thermal conductivity, which is not limited to 300 W/m·k or more. When the light emitting element 306 is not of large current type, it may be of iron alloy etc.

FIG. 42(a) is a plain view showing an LED 302a as a first modification of the LED 302, and (b) is a cross sectional view thereof. As shown, the LED 302a may be composed such that, of a pair of lead frames 322a, 322b, the lead frame 322a with the light emitting element 306 mounted thereon has a large area to enabled to widely diffuse heat of the light emitting element 306 to prevent a crack at the boundary between the lead frame and transparent epoxy resin 308, and that a strip-like plate is extended from an edge of the wide area portion and drawn out of the transparent epoxy resin 308 while being downward folded at the edge portion to reduce the embedded portion in transparent epoxy resin 308 as much as possible. Although in FIG. 42 the wide area portion forms a circle with the counterpart, it may have any shape if it has a wide area to diffuse heat.

In the LED 302a thus composed, since part of the lead frame 322a that is sealed with transparent epoxy resin 308 and on which the light emitting element 306 is mounted has the wide area to widely diffuse heat of the light emitting element 306, even when the light emitting element 306 is of large current type to have a large heat release value, heat to be directly conducted from the light emitting element 306 to the transparent epoxy resin 308 and heat to be conducted from the light emitting element 306 through the lead frame 322a to the transparent epoxy resin 308 can be diffused over the entire wide area lead frame 322a.

Further, the mount surface of lead frame 322a where to mount the light emitting element 306 can be used as a reflection surface to reflect light to be emitted downward from the light emitting element 306. It is optically advantageous.

Figure 43:
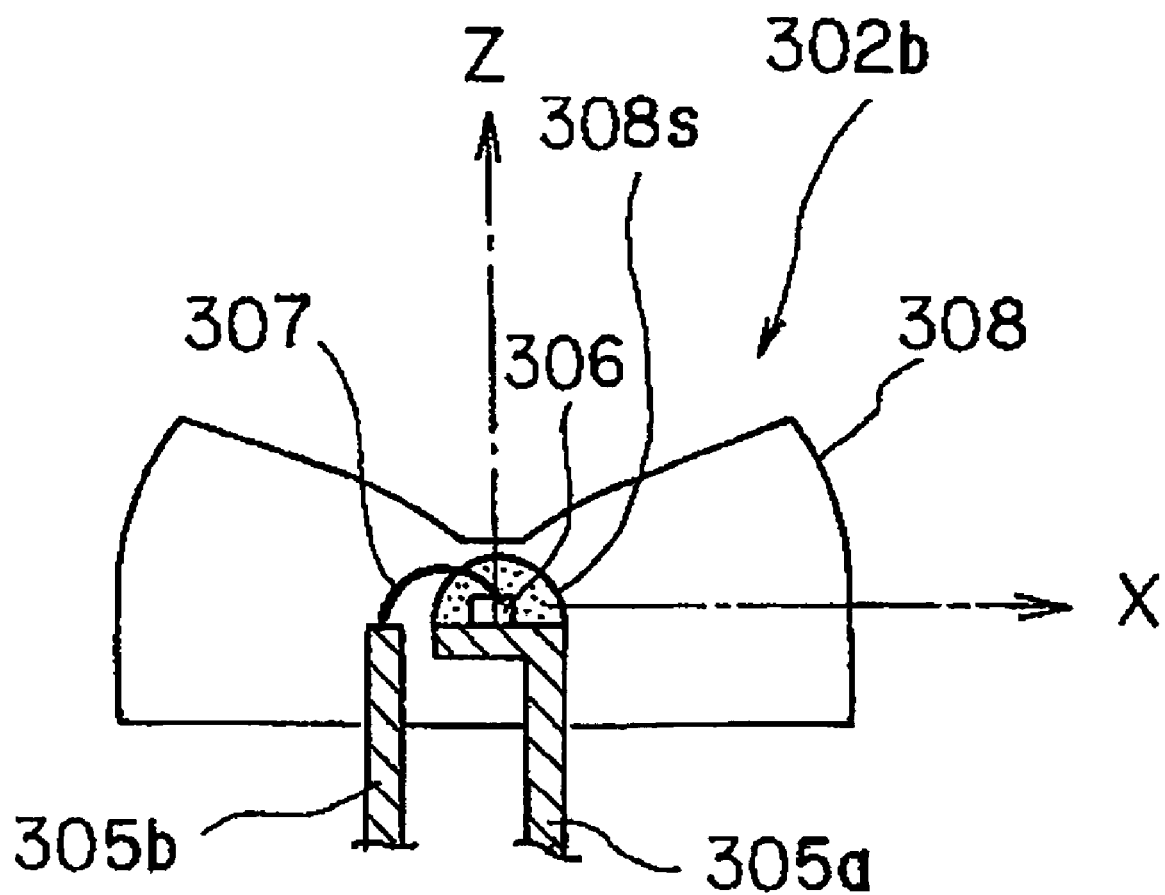
FIG. 43 is a plain view showing a second modification of the LED in embodiment 3A of the invention.

FIG. 43 is a plain view showing an LED 302b as a second modification of the LED 302.

As shown, the LED 302b may be sealed with transparent epoxy resin 308 after sealing the light emitting element 306 with transparent silicon resin 308s in the shape of a small mold. In this case, since the light emitting element 306 is first sealed with transparent silicon resin 308s in the shape of a small mold, the remaining stress can be further relaxed and the lifetime can be prolonged. The transparent silicon resin 308s may have phosphor mixed therein and may be replaced by another transparent material.

Third to sixth modifications of the LED 302 may be composed as shown in FIG. 44, FIG. 45, FIG. 16 and FIG. 17, respectively.

Figure 46:
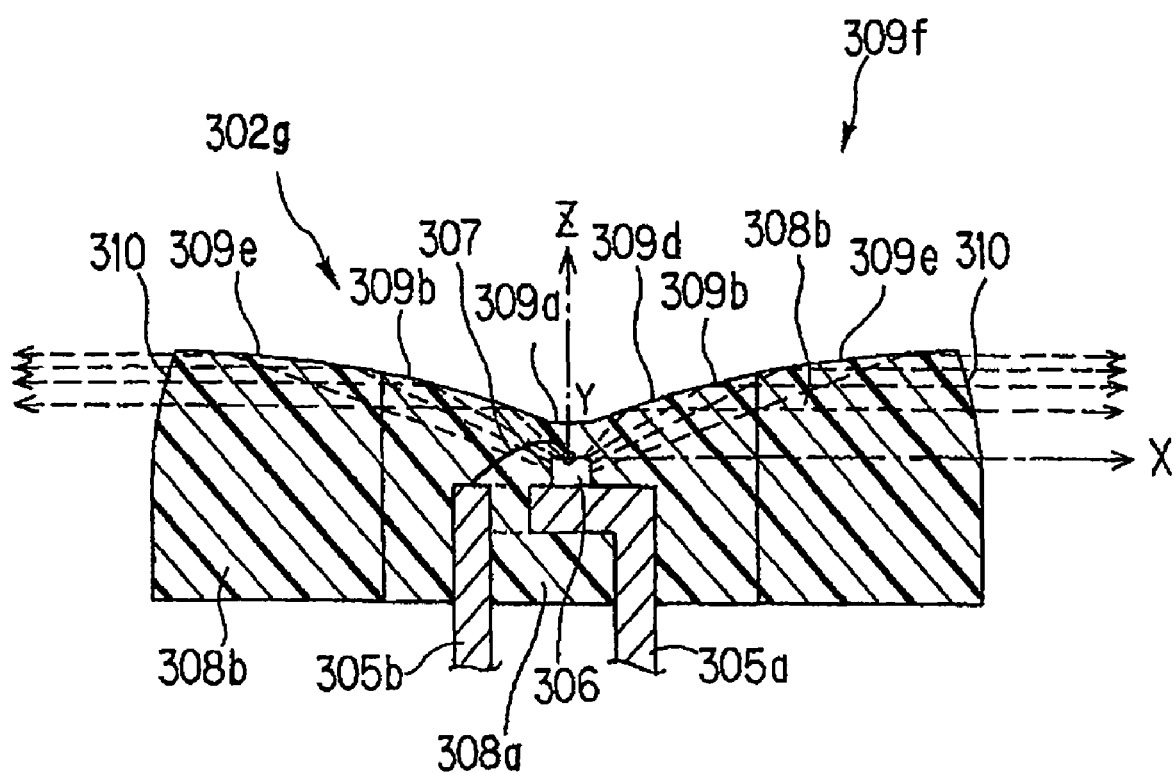
FIG. 46 is a plain view showing a seventh modification of the LED in embodiment 3A of the invention.

FIG. 46 is a plain view showing an LED 302g as a seventh modification of the LED 302.

The LED 302g is composed such that a reflection mirror 309f is formed by disposing a separate circular reflection mirror 309e around a nearly cylindrical reflection mirror 309d with a diameter smaller than that of the basic reflection mirror 309. In making the reflection mirror 309f, for example, a pair of the lead frames 305a, 305b (or lead frames 322a, 322b) with the light emitting element 306 mounted thereon as described earlier is set in a first resin sealing die, and then transparent epoxy resin 308a is injected thereinto and cured. Then, the reflection mirror 309d formed by the curing is set in a second resin sealing die, and then transparent epoxy resin 308b is injected thereinto and cured. Thereby, the ring-shaped reflection mirror 309e is formed. Alternatively, the nearly cylindrical reflection mirror 309d and the ring-shaped reflection mirror 309e may be formed separately, and the nearly cylindrical reflection mirror 309d may be fitted in the ring-shaped reflection mirror 309e.

The shape of the reflection mirror 309f thus formed is about the same as that of the basic reflection mirror 309. Therefore, like the basic reflection mirror 309, the outer side surface of ring-shaped reflection mirror 309e composes part of a spherical surface centered at the light emitting element 306. Although the boundary between the nearly cylindrical reflection mirror 309d and the ring-shaped reflection mirror 309e is vertical as shown in this modification, it may be formed to compose part of a spherical surface centered at the light emitting element 306, like the basic reflection mirror 309.

In the LED 302g, the transparent epoxy resin to seal the light emitting element 306, bonding wire 307 and a pair of lead frames 305a, 305b is divided into the first and second transparent epoxy resins 308a and 308b. Thereby, the volume of resin 308a and 308b becomes smaller than that of the basic transparent epoxy resin 308 and therefore each remaining stress thereof can be reduced. Namely, even when heat is conducted from the light emitting element 306 or from the light emitting element 306 through the lead frame 305a to the transparent epoxy resin 308a, 308b, the thermal expansion due to a remaining stress caused by heat can be reduced because each remaining stress is small and separate. Thus, a crack at the boundary between the light emitting element 306 and the lead frame 305a or transparent epoxy resin 308a can be prevented.

Further, when the seventh modification that the reflection mirror is composed of divided transparent epoxy resins is applied to the LED as shown in FIG. 44, FIG. 45, FIG. 16 and FIG. 17, such a crack can be prevented as well.

Embodiment 3B

FIG. 47(a) is a plain view showing an LED light using the LED in embodiment 3B of the invention, (b) is a cross sectional view cut along the line A-A in (a), and (c) is an enlarged cross sectional view showing part P in (b).

Figure 47:
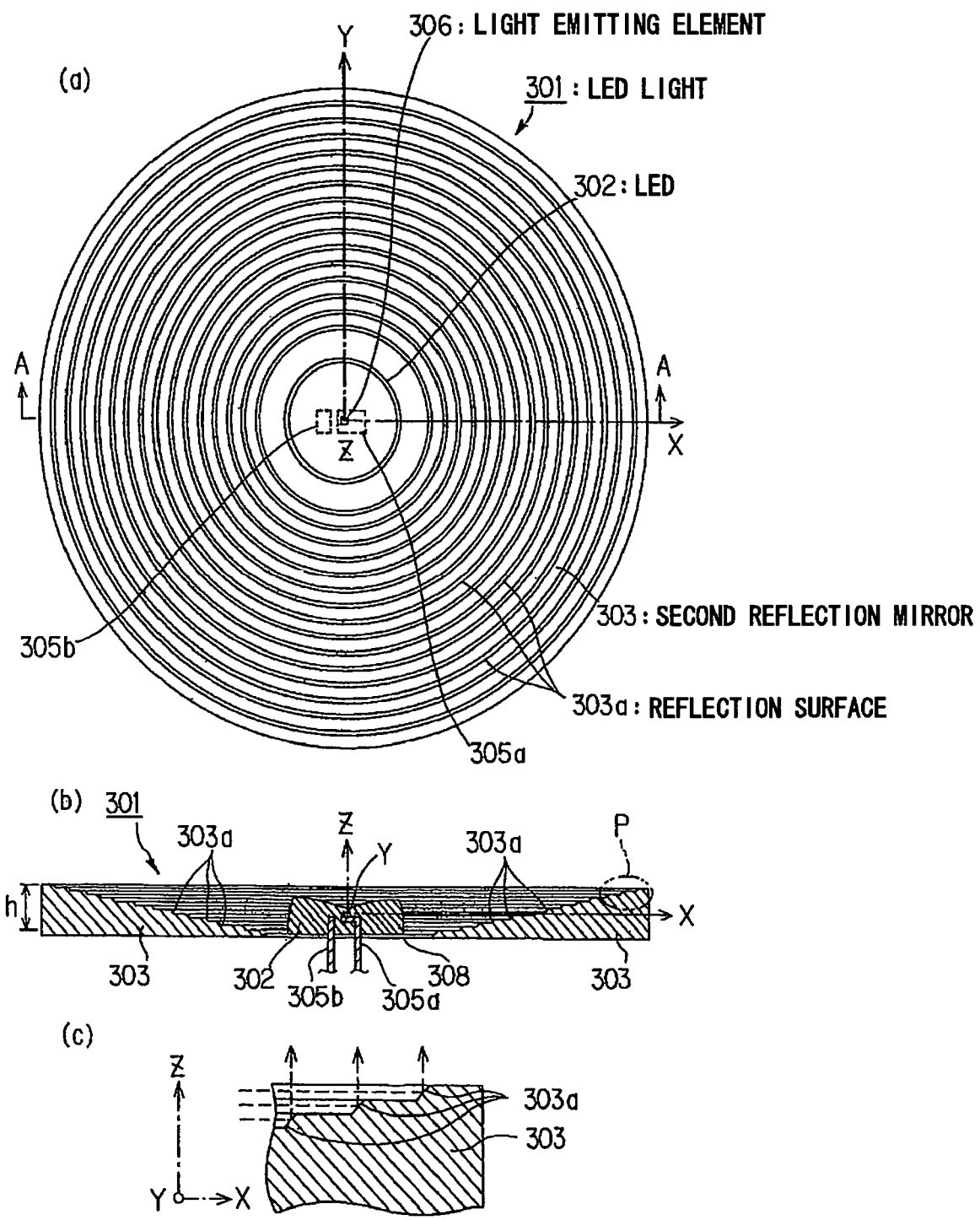
FIG. 47(a) is a plain view showing an LED light using an LED in embodiment 3B of the invention, (b) is a cross sectional view cut along the line A-A in (a), and (c) is an enlarged cross sectional view showing part P in (b).

As shown in FIG. 47, the LED light 301 is composed such that the LED 302 as shown in FIG. 37 is disposed at the center of a disk-like main body and a reflection mirror 303 with a concentric and stepwise reflection surface 303a formed thereon is formed around the LED 302. Hereinafter, the reflection mirror 309 of LED 302 is called first reflection mirror 309 and the above reflection mirror 303 is called second reflection mirror 303.

The second reflection mirror 303 has the reflection surface 303a that is made by molding transparent acrylic resin and then by applying aluminum evaporation thereon. The reflection surface 303a is, as shown in FIG. 47(c), inclined about 45 degrees to the X-Y plane.

The emission operation of LED light 301 using the LED 302 thus composed will be explained with reference to FIG. 47. When a voltage is applied to the lead frames 305a, 305b of LED 302, the light emitting element 306 emits light. Of light emitted from the light emitting element 306, light heading to the Z-direction, i.e., directly upward is radiated out of the transparent epoxy resin 308 from the central radiation surface, then transmitted through a transparent front plate (not shown) disposed on the LED light 301 to the outside. Of light emitted from the light emitting element 306, light in the range of 60 degrees or more to the Z-axis is irradiated to the top surface as the first reflection surface, thereby subjected to total reflection due to its large incident angle to the top surface, then heading to the side radiation surface. The top reflection surface has a shape to be formed by rotating, around the Z-axis, part of a parabola with a focal point at the light emitting element 306 and with a symmetry axis on the X-axis. Therefore, light to be reflected by the top reflection surface all proceeds parallel to the X-Y plane. Since the side radiation surface composes part of a spherical surface centered at the light emitting element 306, this light directly proceeds in parallel and is externally radiated in directions of 360 degrees around the Z-axis while forming about a plane. Further, light being directly irradiated to the side radiation surface from the light emitting element 306 proceeds straight without being refracted thereby since the side radiation surface composes part of a spherical surface centered at the light emitting element 306, then radiated externally. Light to be radiated in parallel with the X-Y plane from the LED 302 is reflected nearly in the Z-axis direction by the reflection surface 303a with an inclination of about 45 degrees on the second 303, then radiated externally.

Thus, the large-area and low-profile LED light 301 is composed by combining the LED 302 and the second reflection mirror 303. Further, instead of the LED 302, any of LED's 302 in the first to seventh modifications may be used and the same effect can be obtained thereby.

In the LED light 301, it is preferable that the LED 302 is small as compared to the second reflection mirror 303, though a comparative example is shown in FIG. 48(a) and (b). This is because in the LED 302 only the center portion is apt to appear to be emission point o. As shown in FIG. 48(a), in the case of the second reflection mirror 303 with a small inner diameter, nearly the entire radiation surface appears to radiate light. As shown in FIG. 48(b), in the case of the second reflection mirror 303 with a large inner diameter, radiated light appears to be thinned out.

By using the LED 302 with a small diameter, the LED light 301 can be composed having the relationship between the LED 302 and the second reflection mirror 303 as shown in FIG. 48(a). Therefore, nearly the entire radiation surface can be made to appear to radiate light.

Figure 44:
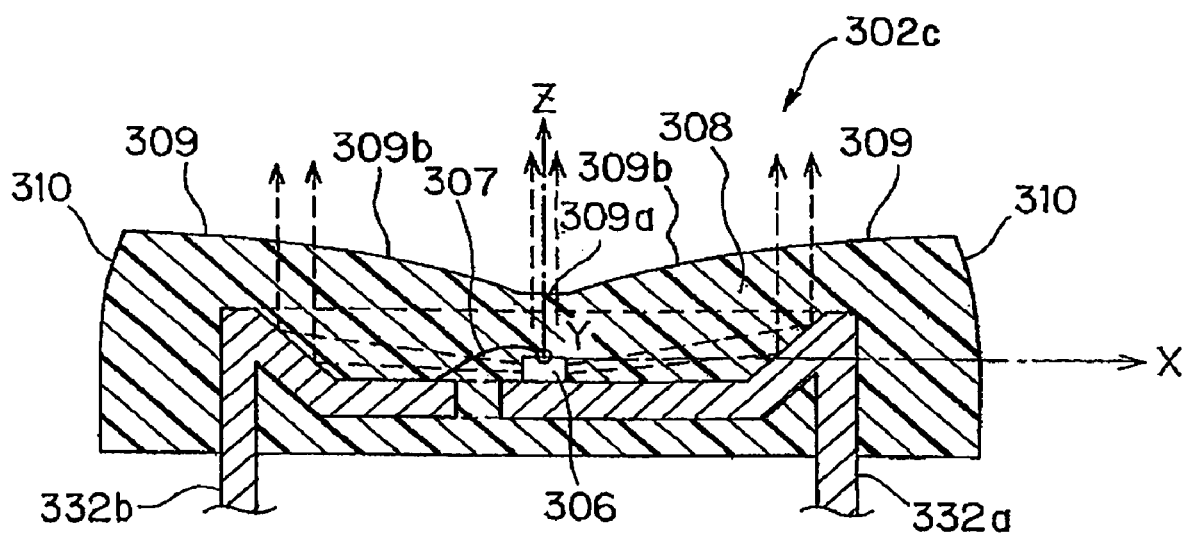
FIG. 44 is a plain view showing a third modification of the LED in embodiment 3A of the invention.
Figure 45:
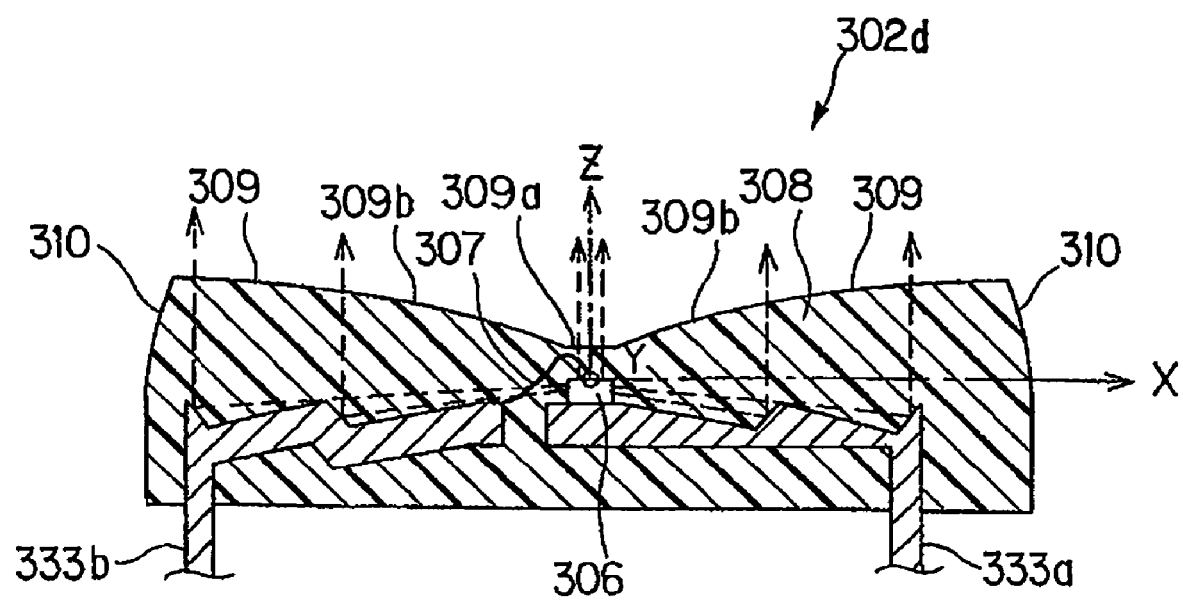
FIG. 45 is a plain view showing a fourth modification of the LED in embodiment 3A of the invention.

If the second reflection mirror 303 with a large inner diameter as shown in FIG. 48(b) is used, nearly the entire radiation surface can be made to appear to radiate light by using the LED 302c in FIG. 44 or the LED 302d in FIG. 45.

Figure 49:
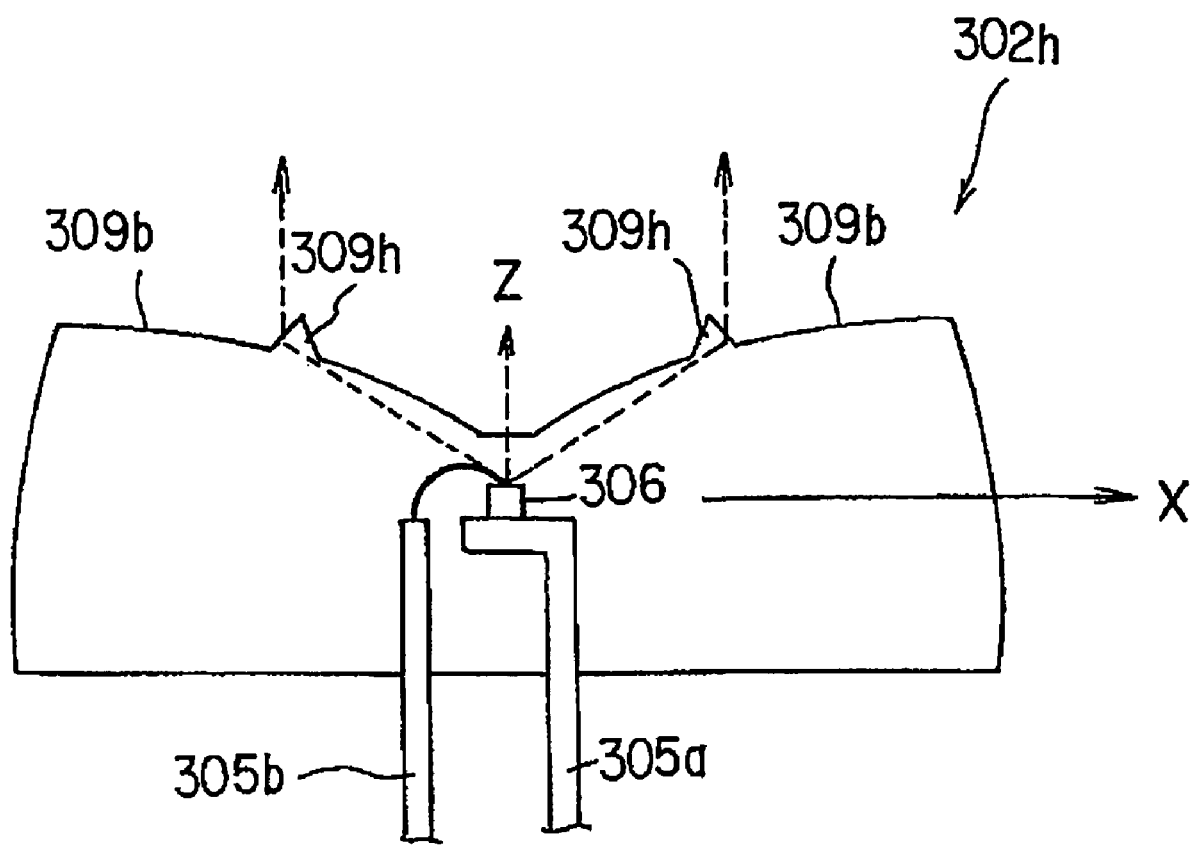
FIG. 49 is a cross sectional view showing an LED used for a first modification of the LED light in embodiment 3B of the invention.

A first modification, LED 302h, of the LED light 301 is composed such that, as shown in FIG. 49, a ring-shaped lends 309h is formed on the reflection mirror 309b to allow part of light emitted from the light emitting element 306 to be radiated upward other than the central radiation surface 309a. The LED 302h may be used for the composition in FIG. 48(b).

Figure 50:
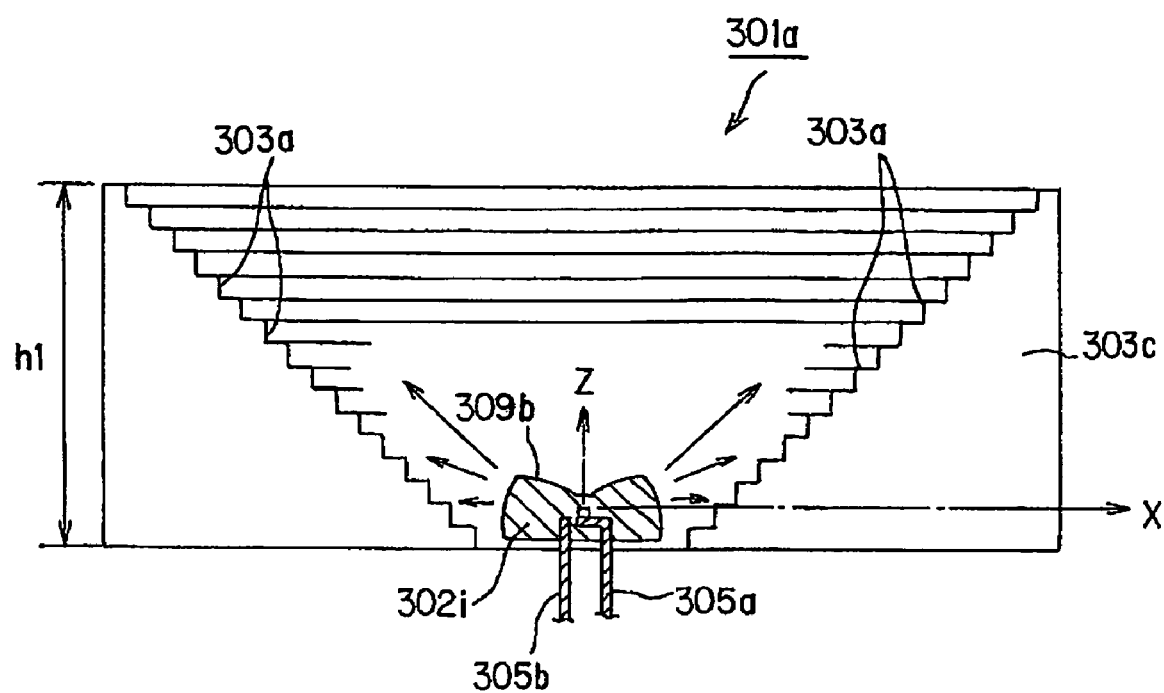
FIG. 50 is a cross sectional view showing a second modification of the LED light in embodiment 3B of the invention.
Figure 51:
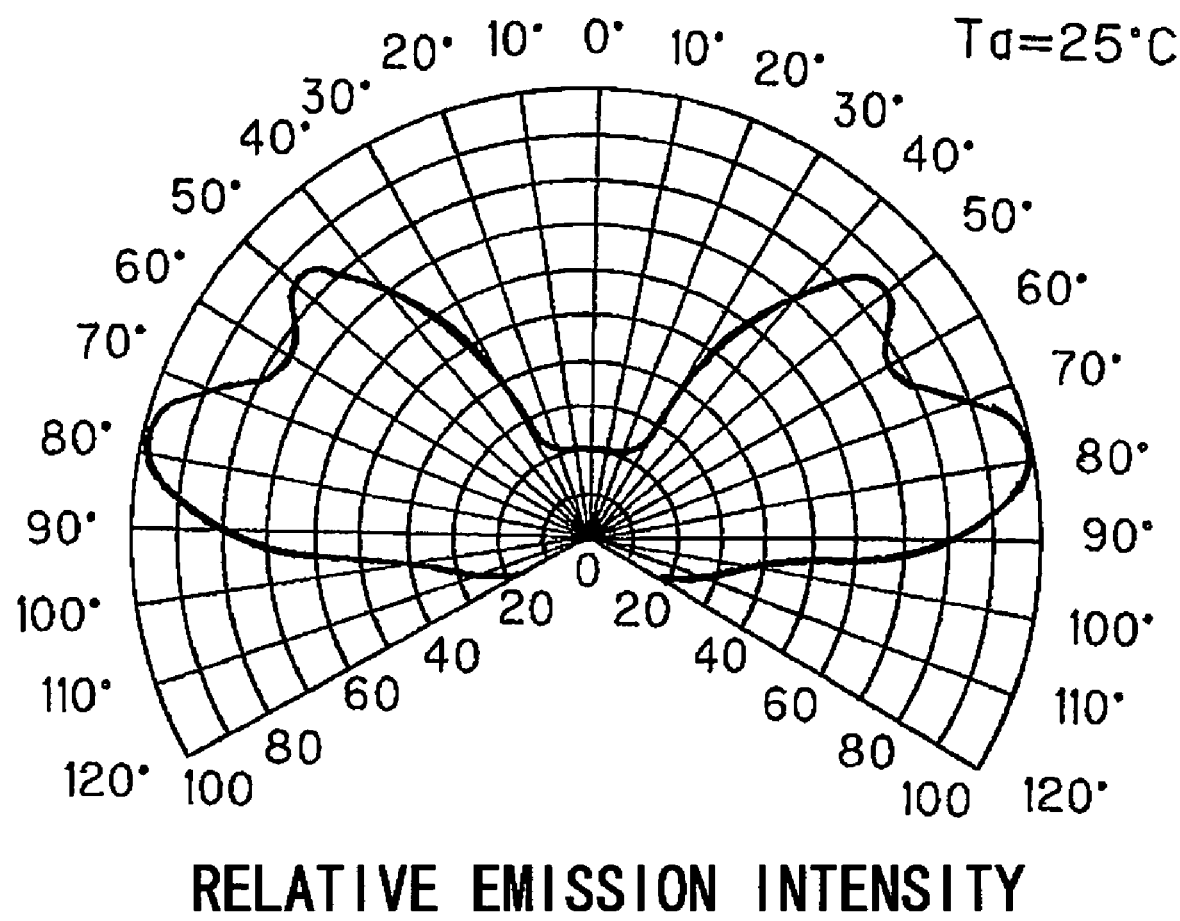
FIG. 51 is a diagram showing a light distribution characteristic of LED used for the second modification of LED light.

A second modification of the LED light 301 is an LED light 301a as shown in FIG. 50. The difference of an LED 302i used in the LED light 301a from the LED 302 is that its reflection surface 309b has a circular reflection shape to be formed, around the center axis Z, part of a parabola with a focal point not centered at the light emitting element 306. Thereby, although in the LED 302 light to be emitted from the light emitting element 306 is reflected nearly in parallel, the LED 302i allows light to be diffused. In this case, like the LED 302, light is externally radiated from the side radiation surface 310 while being controlled as primary light and as a result a light distribution as shown in FIG. 51 can be obtained. Meanwhile, it is necessary to have a second reflection mirror 303c with a height h1 greater than h in FIG. 47(b). However, in the LED 302i, the reflection surface may have a small size to the light emitting element 306 unless total reflection or large interface reflection at the side surface is generated.

FIG. 38 shows a transmittance to an incident angle at the side radiation surface 310. Near at 40 degrees as the critical angle θ c, the total reflection is generated and the transmittance becomes 0%. Even at (θc−5 degrees) or more, the influence of interface reflection is strong though the total reflection is avoided. Therefore, the incident angle to side radiation surface 310 is further desirably (θc−5 degrees).

In the LED light 301a thus composed, light from the LED 302h is efficiently radiated in the horizontal and oblique directions and reflected by the reflection surface 303a of reflection mirror 303c. Therefore, the LED light 301a can be a lamp with depth effect. Also in this case, by setting (90 degrees−θc), an effective external radiation without stray light loss is considered.

Figure 78:
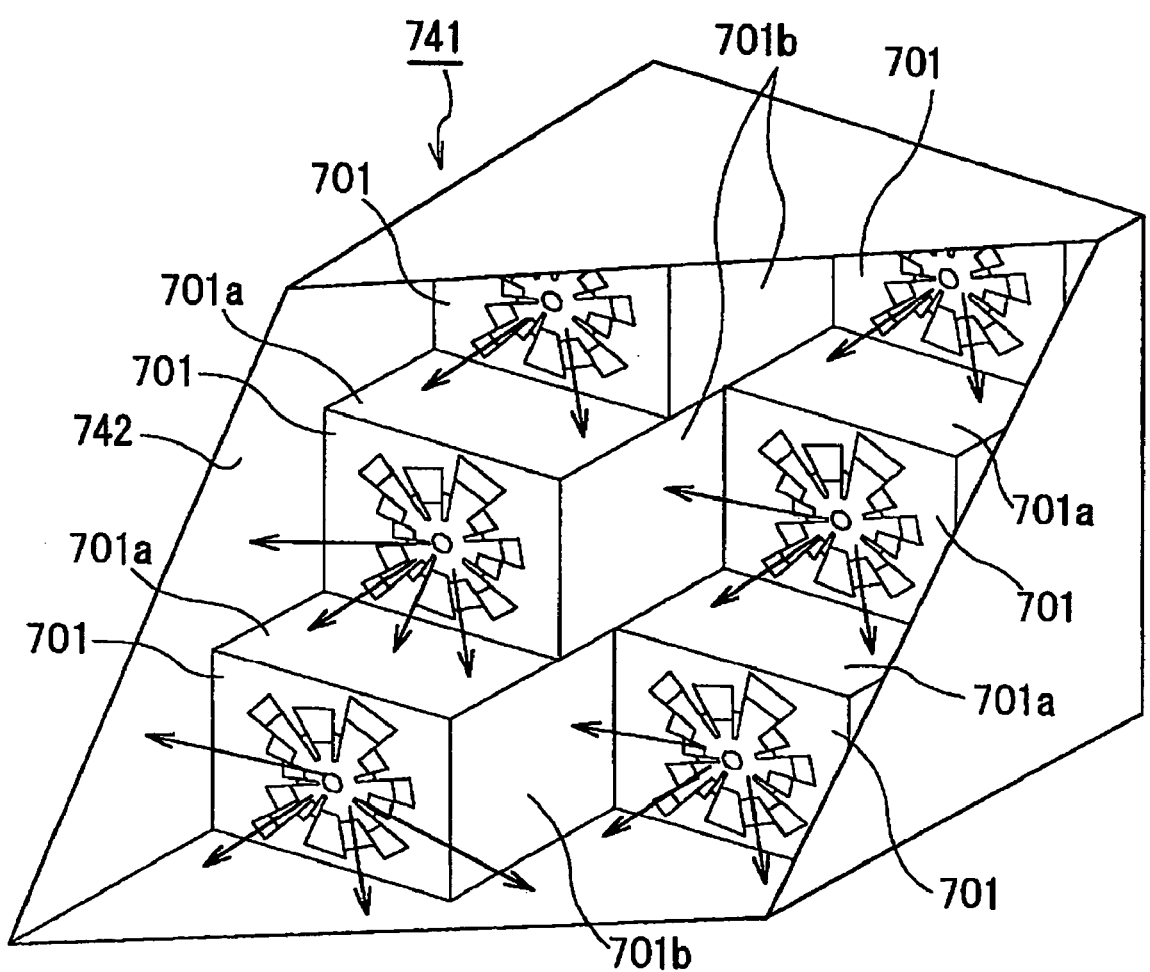
FIG. 78 is a perspective view showing a lamp in embodiment 7H of the invention.
Figure 90:
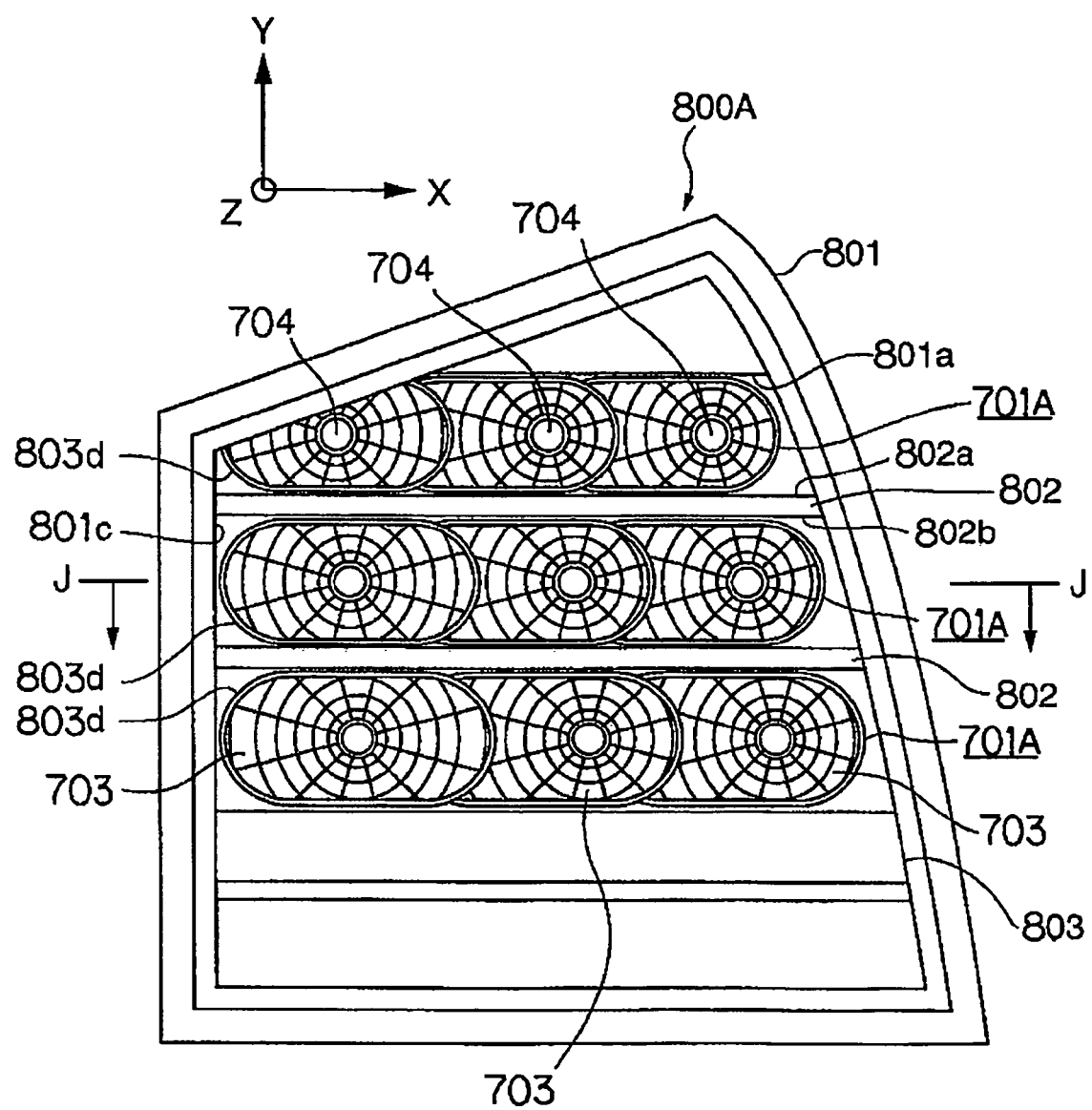
FIG. 90 is a front view showing an automobile combination lamp in embodiment 7N of the invention.

As a modification of the LED light 301, the second reflection mirror 303 may be composed such that the emission points are scattered as shown in FIG. 18 or may be divided into fan-shaped sections with different lengths to form a polygon as shown in FIG. 19. Further, as shown in FIG. 13, a circular LED light is cut to form a square or a shape including part of square, and segments thus cut can be combined to form an integrated LED light. Further, by using the LED light as shown in FIG. 19, a vehicle lamp such as an automobile tail lamp or brake lamp as shown in FIG. 78 and FIG. 90 may be formed.

Embodiment 4A

FIG. 52(a) is a plain view showing an LED light using an LED in embodiment 4A of the invention, (b) is a cross sectional view cut along the line A-A in (a), and (c) is an enlarged cross sectional view showing part P in (b).

As shown in FIG. 52(a), the LED light 401 of embodiment 4A is composed such that the LED 402 with a light emitting element 406 as a light source mounted therein is disposed at the center of a disk-like main body and a reflection mirror 403 with a concentric and stepwise reflection surface 403a formed thereon is formed around the LED 402.

In the explanation below, the center axis of light emitting element 406 is a Z-axis, a point on the top surface of light emitting element 406 to intersect with the Z-axis is an origin, and an X-axis and a Y-axis in the horizontal direction are orthogonal to the Z-axis at the origin.

The LED 402 integrally includes a first reflection mirror to reflect light emitted from the light emitting element 406, as described later. The reflection mirror 403 is called second reflection mirror 403.

The second reflection mirror 403 has the reflection surface 403a that is made by molding transparent acrylic resin and then by applying aluminum evaporation thereon. The reflection surface 403a is, as shown in FIG. 52(c), inclined about 45 degrees to the X-Y plane.

The composition of LED 402 will be explained below with reference to FIG. 53 and FIG. 54.

Figure 53:
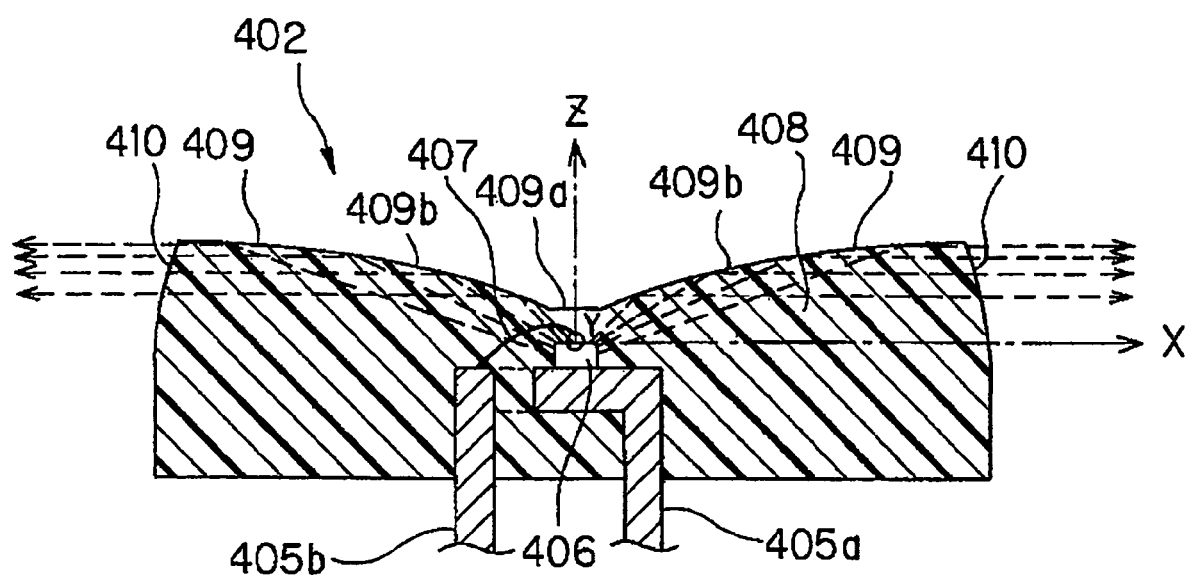
FIG. 53 is a cross sectional view showing the LED as a light source of the LED light in embodiment 4A of the invention.
Figure 54:
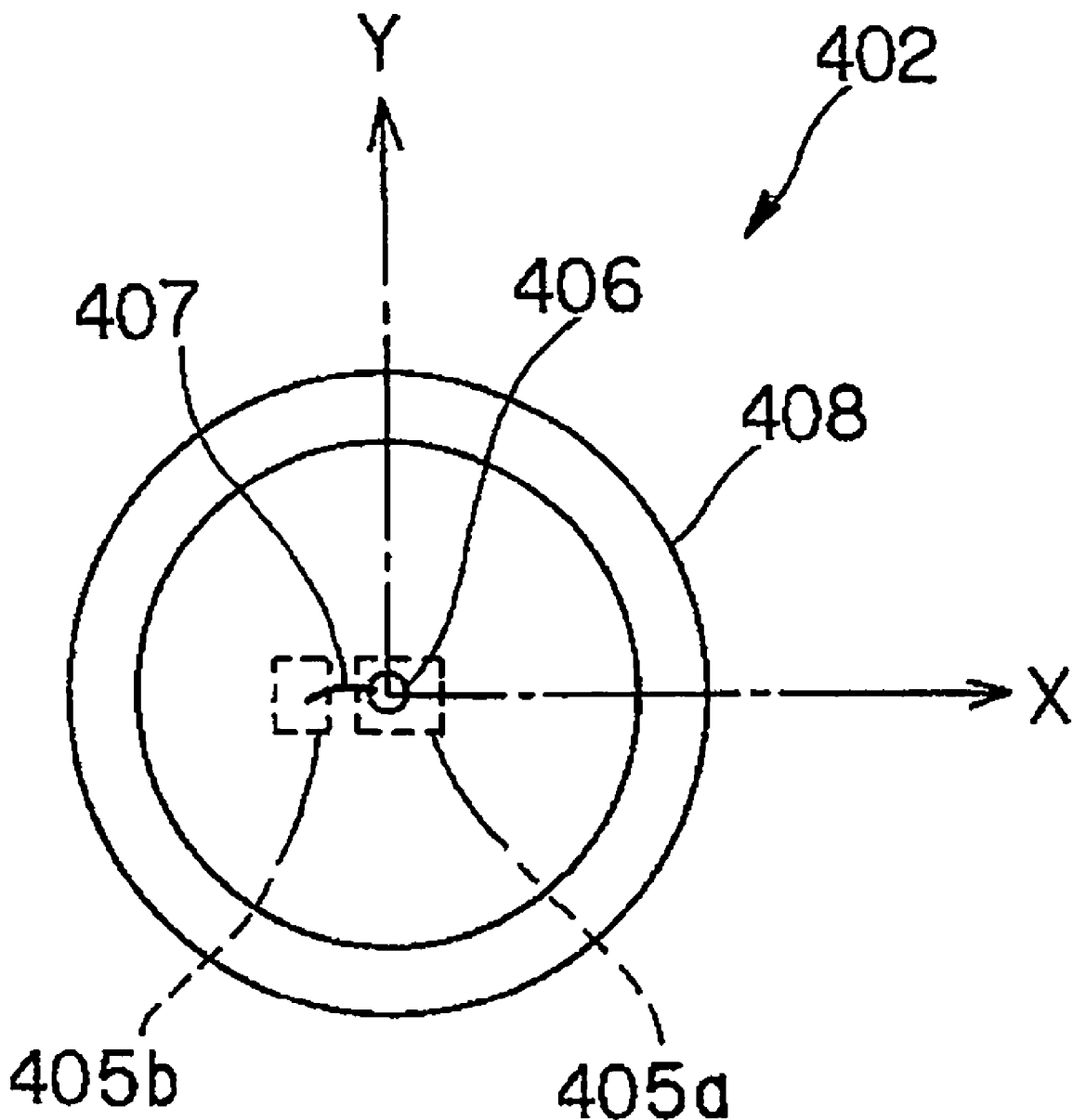
FIG. 54 is a plain view showing the LED in embodiment 4A of the invention.

As shown in FIG. 53 and FIG. 54, the LED 402 is composed such that the light emitting element 406 is, at the origin, mounted on a lead frame 405a with a strip-like plate bent into L-shape of a pair of lead frames 405a, 405b that are disposed through a gap for insulation on the X-Y plane, the upper surface electrode of light emitting element 406 is bonded through a wire 407 to the tip of lead frame 405b, and part of lead frames 405a, 405b, light emitting element 406 and wire 407 are sealed with transparent epoxy resin 408 to be formed planar and nearly cylindrical.

The feature of LED 402 is that: the light emitting element 406 is sealed with transparent epoxy resin 408 (hereinafter simply called resin 408) to form the first reflection mirror as described later and thereby the light emitting element 406 and the first reflection mirror are integrated; and the lead frame 405a with the light emitting element 406 mounted thereon is composed such that part of the lead frame 405a embedded in transparent epoxy resin 408 is reduced as much as possible by drawing it out of transparent epoxy resin 408 while being bent under the mount surface from the vicinity of the mount position of light emitting element 406. The lead frame 405b is in the shape of a strip-like plate and is disposed parallel to part of the lead frame 405a being drawn out of the resin.

Figure 55:
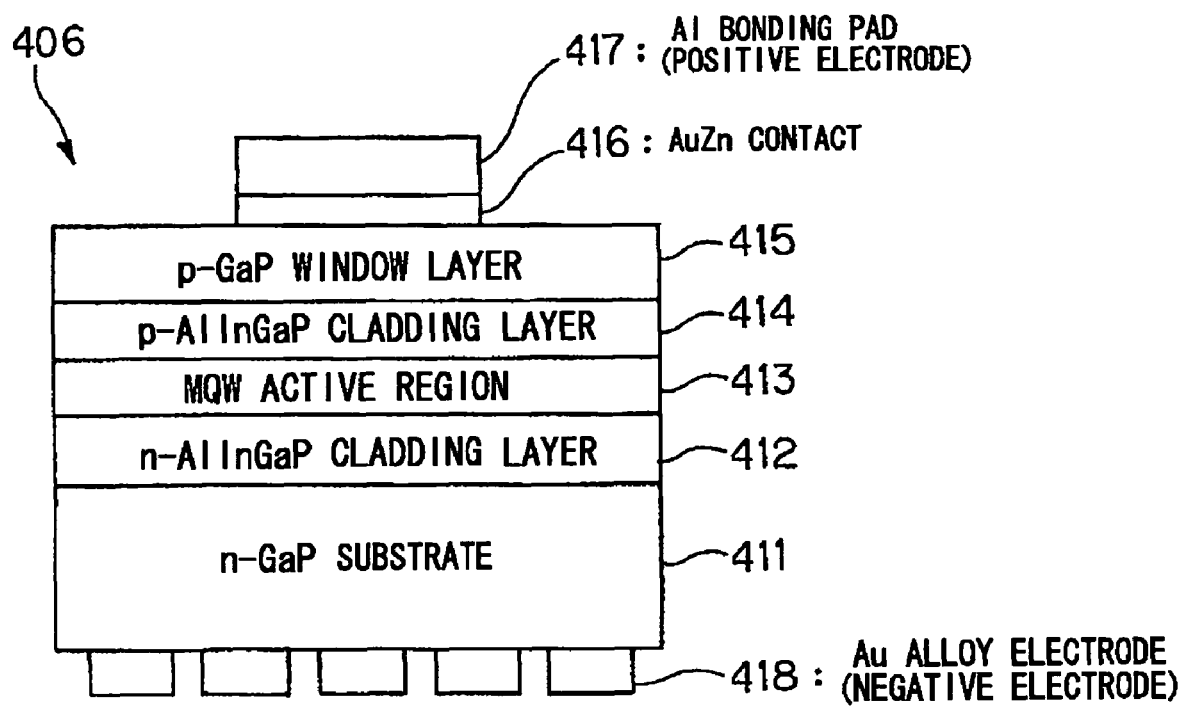
FIG. 55 is a cross sectional view showing a light emitting element used for the LED in embodiment 4A of the invention.

The light emitting element 406 is of large current type (high-output type) as shown in FIG. 55 so as to keep the emission intensity of LED 402 at a predetermined value while reducing the number as much as possible and to increase an area to be visually recognized by radiation of each LED 402 to enhance the design quality. This type is about the same as that descried in embodiment 3A referring to FIG. 39 and its explanation is omitted here.

Figure 56:
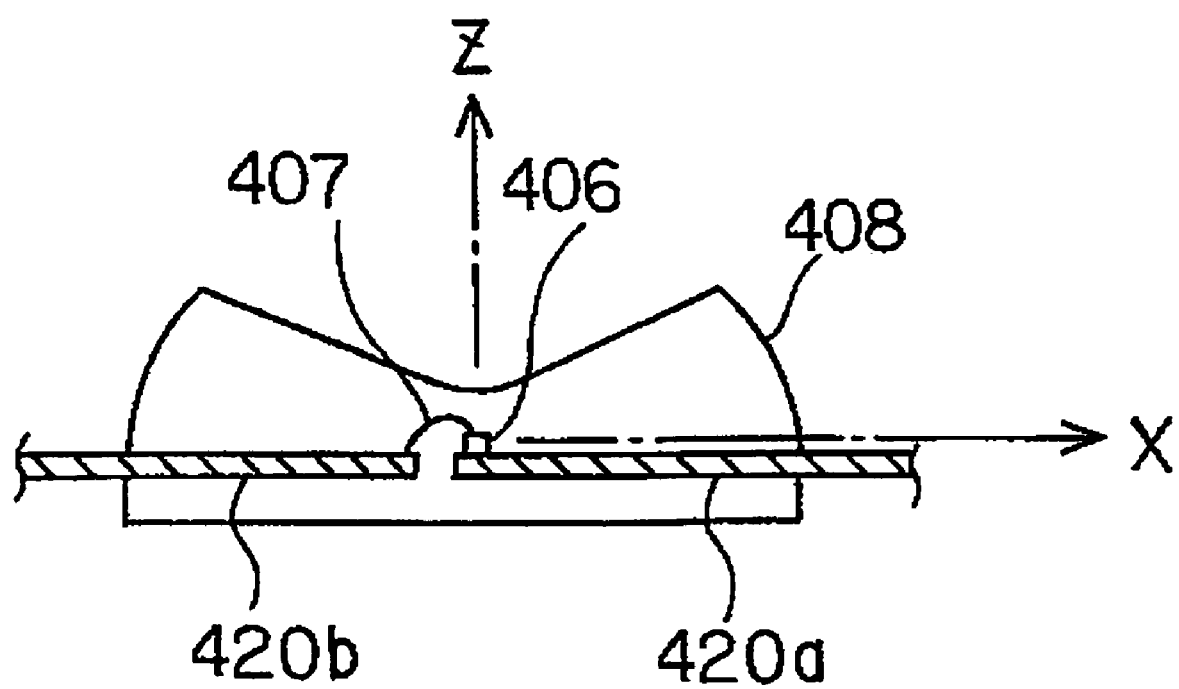
FIG. 56 is a cross sectional view showing the LED with lead frames projecting in horizontal direction.

The light emitting element 406 has a large heat release value since it is of large current type. Therefore, if the LED 402 is made by transfer molding that the pair of lead frames 420a, 420b in the form of a strip-like plate are, as shown in FIG. 56, horizontally opposed to each other in transparent epoxy resin 408 and drawn out therefrom, the length of embedded part from the mount position to mount the light emitting element 406 to the position where the transparent epoxy resin 408 is drawn out increases. As the embedded part of strip-like plate increases, heat generated from the light emitting element 406 is difficult to radiate out of the resin 408, and the light emitting element 406 is subjected to high temperatures. Thus, the brightness lowers. Further, since the resin 408 has a coefficient of thermal expansion different from the lead frames 420a, 420b, as the length of embedded part increases, the releasing of the resin 408 from the lead frames 420a, 420b, a crack in the resin 408 or the breaking of wire is likely to be generated when subjected to a heat shock.

In embodiment 4A, as shown in FIG. 53, the lead frame 405a with the light emitting element 406 mounted thereon is bent downward in the vicinity of the mount position of light emitting element 406 to shorten the embedded part. Thereby, the heat radiation property can be enhanced, and the releasing of the resin 408 from the lead frames 405a, 405b, a crack in the resin 408 or the breaking of wire when subjected to a heat shock can be prevented. Further, in order to enhance the heat radiation property, the lead frames 405a, 405b are of a material with a high thermal conductivity such as copper alloy.

The LED 402 is, as shown in FIG. 53 and FIG. 54, formed planar and nearly cylindrical, which is the shape of transparent epoxy resin 408. A central radiation surface 409a is formed at the center (portion directly over the light emitting element 406) of top surface of the LED 402, and a first reflection mirror 409 is formed subsequently to the central radiation surface 409a and has an umbrella-like reflection shape to be formed by rotating, around the Z-axis, part of a parabola with a focal point at the origin of light emitting element 406 (thus, it is not a paraboloid). Hereinafter, the shape of reflection surface in the first reflection surface 409 is called reflection shape.

The first reflection mirror 409 is made to have a diameter to allow most of light emitted from the light emitting element 406 to be subjected to total reflection in the horizontal direction. In this embodiment, it has such a diameter that light of 20 degrees or more to the Z-axis of emitted light can reach the top surface 409b. A side surface 410 of the LED 402 composes part of a spherical surface centered at the light emitting element 406. The LED 402 thus composed is fixed at the center of circular LED light 401.

The emission operation of the LED light 401 is about the same as that described in embodiment 3A and its explanation is omitted here.

In the LED 402, the lead frame 405a with the light emitting element 406 mounted thereon is bent downward in the vicinity of the mount position of light emitting element 406 and drawn out of the transparent epoxy resin 408 to shorten the embedded part in the resin 408 as much as possible. By thus bending downward the lead frame 405a while drawing it out of the resin 408, the embedded part is significantly reduced as compared to that in being protruded in the horizontal direction (X) of resin 408 since the lower part of a horizontal plane formed extending the mount surface of light emitting element 406 in resin 408 is considerably thinner than the upper part of the horizontal plane. Thereby, the heat radiation property can be enhanced, and the releasing of the resin 408 from the lead frames 405a, 405b, a crack in the resin 408 or the breaking of wire when subjected to a heat shock can be prevented by shortening the embedded part of lead frame 405.

Further, in order to enhance the heat radiation property, the lead frames 405a, 405b are of a material with a high thermal conductivity. Thereby, heat can be radiated more efficiently.

Therefore, even when large current is supplied to the light emitting element 406, a large optical output can be obtained without being affected by heat saturation. Further, in this embodiment, light being laterally radiated is reflected frontward by the reflection mirror. Thus, the low-profile LED light with an enlarged radiation area can be obtained. Since the LED has the large light output, sufficient brightness can be maintained even when the radiation area is enlarged.

Alternatively, as shown in FIG. 57(a) and (b), an LED 402a is composed such that, of a pair of lead frames 432a, 432b, the lead frame 432a with the light emitting element 406 mounted thereon has a wide area to allow heat of the light emitting element 406 to be diffused widely, and that a strip-like plate to connect the edge of wide area portion is formed and the strip-like plate is bent downward at the edge and drawn out of the resin 408 to reduced the embedded part in the resin 408 as much as possible. Although in FIG. 57 the wide area portion forms a circle with the counterpart, it may have any shape, such as rectangular and triangle, if it has a wide area to diffuse heat. However, since a sharp edge may cause a crack, it is desired that it is processed to be smoothed.

In the LED 402a thus composed, part of the lead frame 402a with the light emitting element 406 mounted thereon being sealed with the transparent epoxy resin 408 has a wide area to allow heat of the light emitting element 406 to be diffused widely. Therefore, even when the light emitting element is of large current type and has a large heat release value, heat to be conducted from the light emitting element 406 directly to transparent epoxy resin 408 and heat to be conducted from the light emitting element 406 through the lead frame 432a to the transparent epoxy resin 408 can be diffused over the entire lead frame 432a with the wide area. In addition to this, by shortening the embedded part of lead frame, the releasing of the resin 408 from the lead frames 432a, 432b, a crack in the resin 408 or the breaking of wire when subjected to a heat shock due to the difference in coefficient of thermal expansion between the transparent epoxy resin 408 and the lead frames 432a, 432b can be prevented in the vicinity of the mount portion of light emitting element 406.

Further, as shown in FIG. 57(c), part of the lead frame 432a being drawn out of the transparent epoxy resin 408 may be provided with multiple fins 432c to promote the external radiation of heat.

Modifications of the LED light 401 are as follows. The LED may be altered to that shown in FIG. 44, FIG. 45, FIG. 16 and FIG. 17. The second reflection mirror may be composed such that the emission points are scattered as shown in FIG. 18 or that it is divided into fan-shaped sections with different lengths to form a polygon as shown in FIG. 19. As shown in FIG. 13, a circular LED light may be cut to form a square or a shape including part of square, and segments thus cut can be combined to form an integrated LED light. Further, by using the LED light as shown in FIG. 19, a vehicle lamp such as an automobile tail lamp or brake lamp as shown in FIG. 78 and FIG. 90 may be formed.

Embodiment 5A

Figure 58:
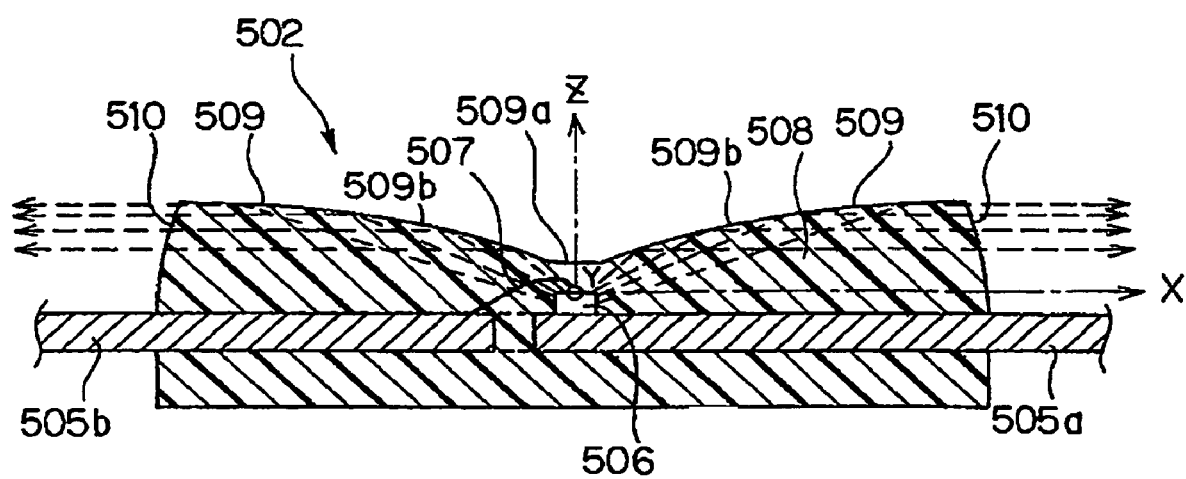
FIG. 58 is a cross sectional view showing an LED as a light source of an LED light in embodiment 5A of the invention.
Figure 59:
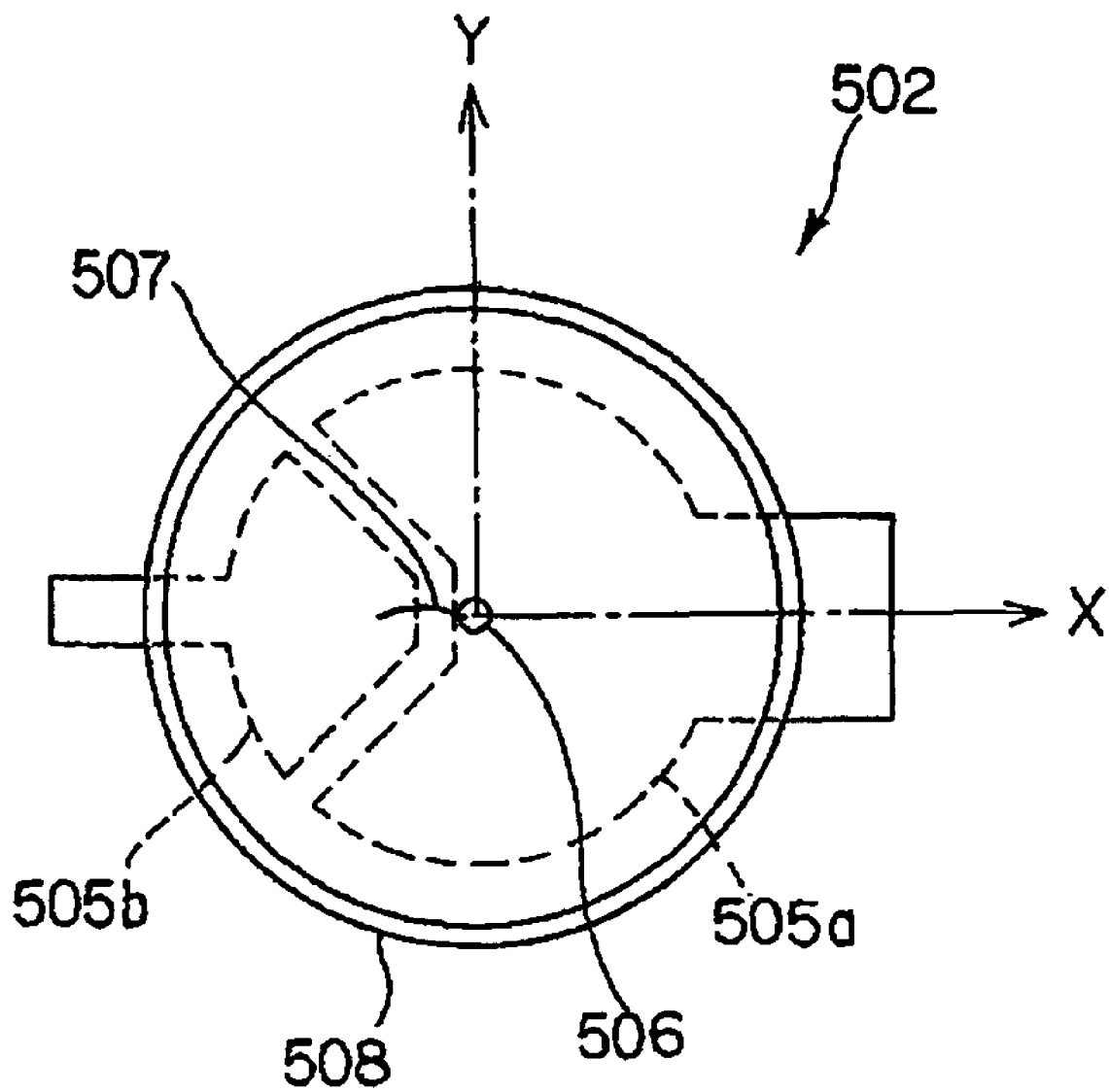
FIG. 59 is a plain view showing the LED in embodiment 5A of the invention.

FIG. 58 and FIG. 59 show the composition of an LED 502 in embodiment 5A of the invention. The light emitting element 506 has a large heat release value since it is of large current type. Therefore, if the lead frame 505a with the light emitting element 506 mounted thereon is thin like a typical one, then the light emitting element 506 and lead frame 505a are heated by thermal accumulation and a crack may be generated at the boundary between there and the transparent epoxy resin 508.

In embodiment 5A, in order to prevent the crack at the boundary between there and the transparent epoxy resin 508, the lead frame 505a with the light emitting element 506 mounted thereon has a such wide area that heat of the light emitting element 506 can be widely diffused and part of the lead frame to be protruded from the transparent epoxy resin 508 has such a wide area that heat can be radiated as much as possible. The lead frames 505a, 505b are of a material with a high thermal conductivity such as copper alloy. Although, in embodiment 5A, the lead frames 505a, 505b form a circle to be combined with the counterpart, it may have any shape, such as rectangular and triangle, if it has a wide area to diffuse heat to prevent a crack. However, since a sharp edge may cause a crack, it is desired that it is processed to be smoothed.

In the LED 502 thus composed, part of the lead frame 505a with the light emitting element 506 mounted thereon being sealed with the transparent epoxy resin 508 has a wide area to allow heat of the light emitting element 506 to be diffused widely. Therefore, even when the light emitting element 506 is of large current type and has a large heat release value, heat to be conducted from the light emitting element 506 directly to transparent epoxy resin 508 and heat to be conducted from the light emitting element 506 through the lead frame 505a to the transparent epoxy resin 508 can be diffused over the entire lead frame 505a with the wide area. The object of providing the lead frame 505a with the wide area is to rapidly radiate heat remaining in the transparent epoxy resin 508 while dispersing the influence of such heat. This is because heat generated at the light emitting element 506 is mainly radiated from a radiation plate extended out of the transparent epoxy resin 508. Therefore, it is desired that part of the lead frame 505a being protruded from the transparent epoxy resin 508 has a wide area.

In other words, part of the lead frame 505a being protruded from the transparent epoxy resin 508 is made to have an area enabled to externally conduct heat as far as possible and, thereby, heat can be efficiently radiated out of the resin to promote the heat radiation.

Further, in order to enhance the heat radiation property, the lead frame 405a is of a material with a high thermal conductivity. Thereby, heat can be radiated more efficiently. Therefore, even when large current is supplied to the light emitting element 506, a large optical output can be obtained without being affected by heat saturation.

[Modification]

Figure 60:
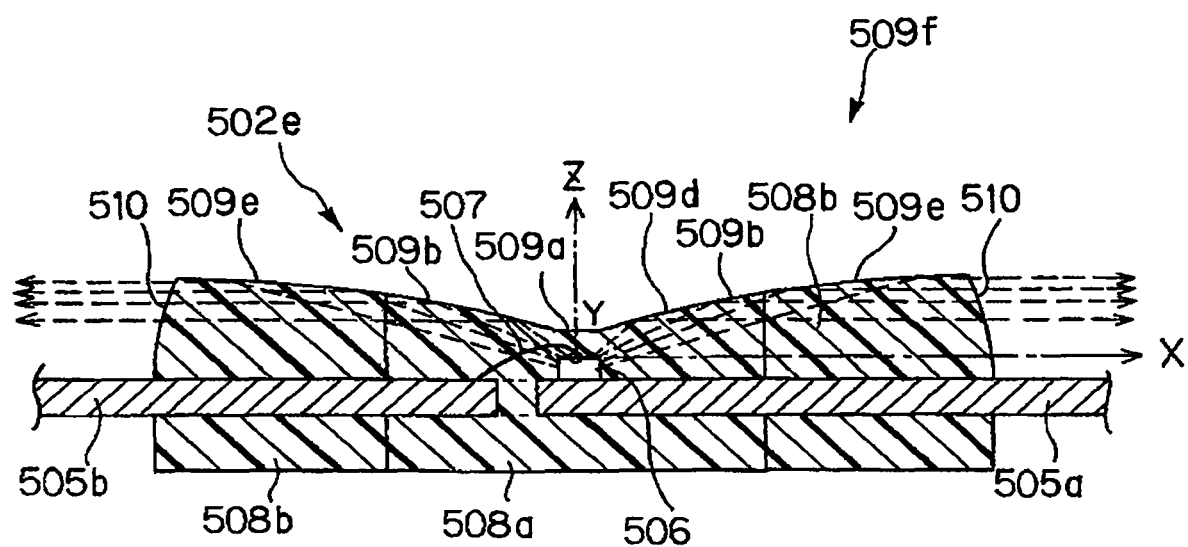
FIG. 60 is a cross sectional view showing a modification of LED as a light source of the LED light in embodiment 5A of the invention.

FIG. 60 shows a modification of the LED 502.

An LED 502e is, as shown in FIG. 60, composed such that transparent epoxy resin with which the light emitting element 506, bonding wire 507 and a pair of lead frames 505a, 505b are sealed is divided into first and second transparent epoxy resins 508a, 508b. Thereby, the volume of resin 508a and 508b becomes smaller than that of the basic transparent epoxy resin 508 and therefore each remaining stress thereof can be reduced. Namely, even when heat is conducted from the light emitting element 506 or from the light emitting element 506 through the lead frame 505a to the transparent epoxy resin 508a, 508b, the thermal expansion due to a remaining stress caused by heat can be reduced because each remaining stress is small and separate. Thus, a crack at the boundary between the light emitting element 506 and the lead frame 505a or transparent epoxy resin 508 can be prevented.

Further, when the above modification that the first reflection mirror is composed of divided transparent epoxy resins is applied to the LED as shown in FIG. 14 to FIG. 17, such a crack can be prevented as well.

Further, the second reflection mirror may be composed such that the emission points are scattered as shown in FIG. 18 or may be divided into fan-shaped sections with different lengths to form a polygon as shown in FIG. 19. Further, as shown in FIG. 13, a circular LED light is cut to form a square or a shape including part of square, and segments thus cut can be combined to form an integrated LED light. Further, by using the LED light as shown in FIG. 19, a vehicle lamp such as an automobile tail lamp or brake lamp as shown in FIG. 78 and FIG. 90 may be formed.

Embodiment 6A

An LED in embodiment 6A of the invention will be explained below with reference to FIG. 61 to FIG. 63.

At first, the composition of LED 602 in embodiment 6A is explained with reference to FIG. 61.

As shown in FIG. 61, the LED 602 is made by attaching a reflector 604 to an emission section 603. The emission section 603 is composed such that, of a pair of vertically disposed leads 605a, 605b, the lead 605a has a light emitting element 608 mounted thereon, and the light emitting element 608 is electrically connected through a wire (not shown) with the lead 605b. The tip portion of leads 605a, 605b, the light emitting element 608 and the wire are set in a die for resin sealing and then sealed with transparent epoxy resin while being formed into a cross section as shown in FIG. 61(b).

A small plane is formed at the center of the upper surface 603a of emission section 603. The reflection surface 603a as two-dimensional radiation surface is formed subsequently to the center plane and has an umbrella-like shape to be formed by rotating, around the Z-axis, part of a parabola with a focal point nearly at the center of an emission surface of light emitting element 608 and asymmetry axis on the X-axis. The side surface of emission section 603 composes part of a spherical surface centered at the light emitting element 608. The diameter of LED 602 is 5 mm. Light to be emitted upward from the light emitting element 608 is reflected nearly in the horizontal direction by the reflection surface 603a, radiated 360 degrees in a two-dimensional direction. Further, light to be emitted sideward from the light emitting element 608 is radiated from the side surface, which composes part of spherical surface, to a two-dimensional direction.

The emission section 603 with the small diameter and two-dimensional radiation has a good mass productivity and a high reliability, but it is optically disadvantageous. So, the ring-shaped reflector 604 is attached to the outer face of emission section 603. The reflector 604 is of acrylic resin with about the same refractive index as the emission section 603 and is physically and optically bonded thereto by an optical binder. However, the physical bonding is not always needed. Since a gap between the emission section 603 and the reflector 604 is small and both interfaces are nearly in parallel, even if the optical binder is not used, the optical loss is small. Therefore, optical binder is not always needed.

Since the emission section 603 has the reflection surface 603a while sealing the light emitting element 608, the reflection surface 603a can be disposed close to the light emitting element 608. For example, it can be disposed 0.3 mm like a height of wire. By disposing close thereto, a large solid angle can be taken geometrically. Thus, it is optically advantageous as compared to the case that the reflection surface 603a is made of the other material.

The reflector 604 has the upper surface 604a that is a curved surface formed subsequently to the upper surface 603a of emission surface 603. Light to be emitted from the light emitting element 608 and then reflected by the upper surface 604a of reflector 604 is radiated nearly in the horizontal direction and 360 degrees in a two-dimensional direction. The outer diameter of emission section 603 is φ5 and the outer diameter of reflector is φ20. The optical advantage of reflector 604 attached is explained with reference to FIG. 62. As shown in FIG. 62, in the case of emission section 603 only, only light at an angle of less than θ1 from a vertical line passing through the center of light emitting element 608 is radiated in the two-dimensional direction. However, by attaching the reflector 604, light at an angle of up to θ2 from the vertical line can be also radiated in the two-dimensional direction. Thus, light to be radiated at an angle of θ1 to θ2 can be also effectively in the two-dimensional direction.

Figure 62:
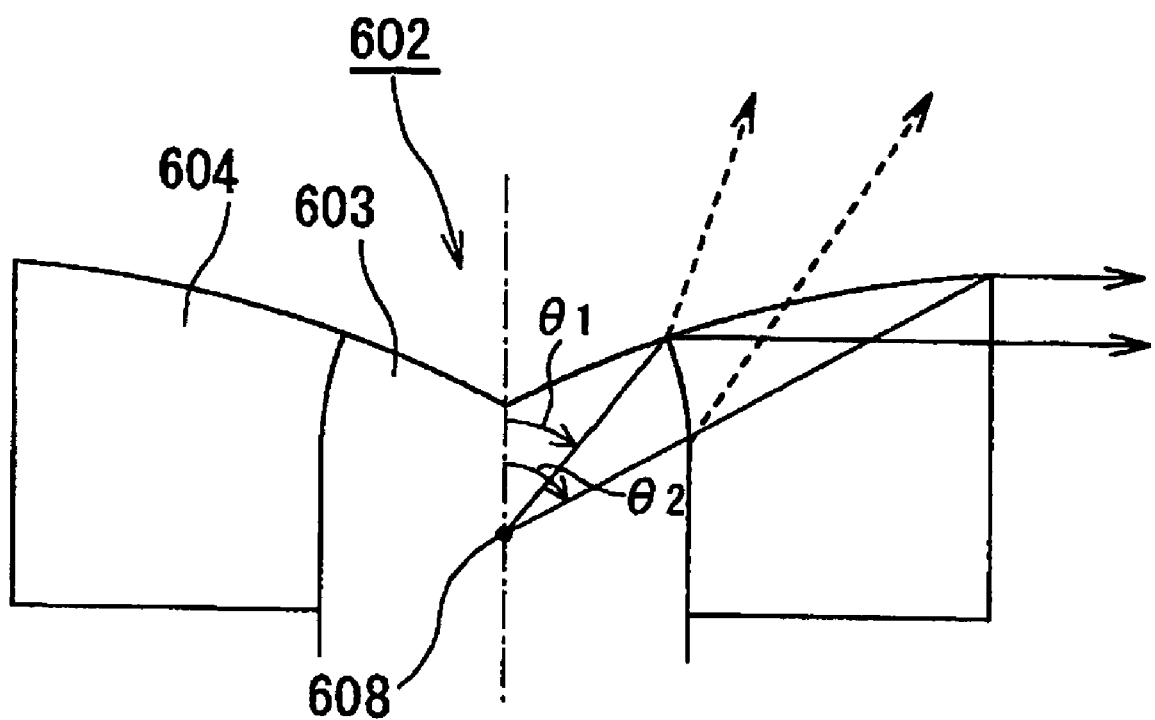
FIG. 62 is an illustration showing a two-dimensional radiation characteristic of the LED in embodiment 6A of the invention.
Figure 63:
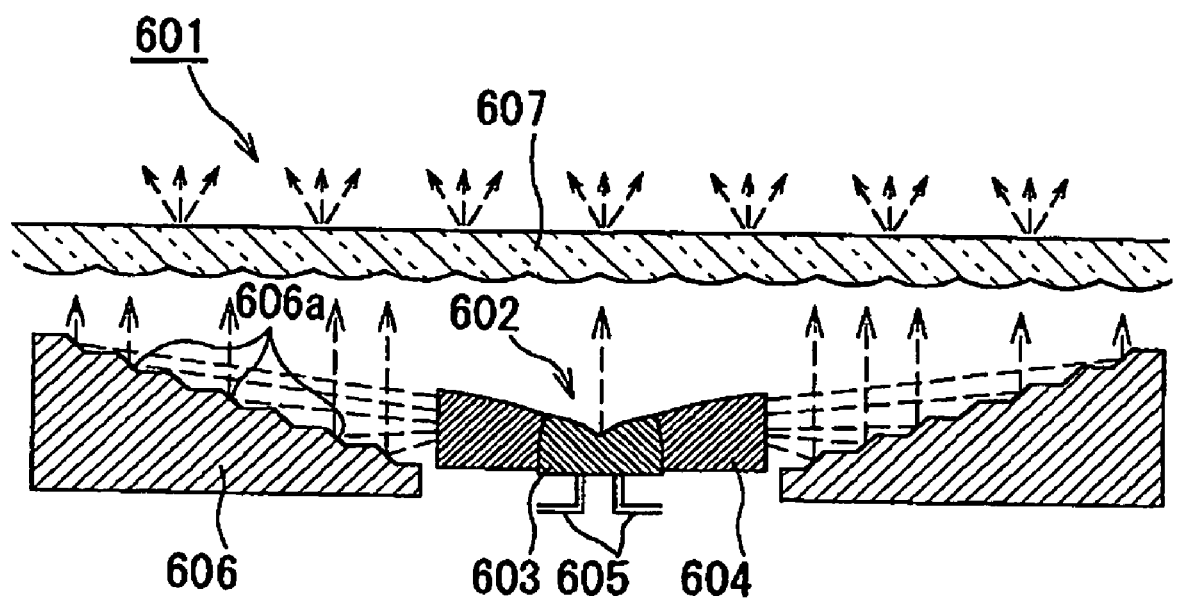
FIG. 63 is a cross sectional view showing a lamp using the LED in embodiment 6A of the invention.

Although a two-dimensional system in cross section is shown in FIG. 62, light with a solid angle of θ1 to θ2 is exactly radiated and a significant effect can be obtained thereby.

A lamp using the LED 602 in embodiment 6A of the invention will be explained with reference to FIG. 63. As shown in FIG. 63, the lamp 601 using the LED 602 in embodiment 6A is composed such that the LED 602 as a two-dimensional radiation light source with a light emitting element built therein is disposed at the center, and that about 45 degrees obliquely formed portions 606a of stepwise surface of a reflection member 606 disposed around the LED 602 compose a reflection surface. A front cover lens 607 covering these parts is provided. When power is supplied through leads 605 to the LED 602, light from the light emitting element is radiated 360 degrees in the two-dimensional direction from the side surface of reflector 604 being attached to around the emission section 603. The light is reflected by the reflection surface 606a of reflection member 606 nearly in the vertical direction and then externally radiated through the front cover lens 607.

Herein, the two-dimensional direction means a direction from the LED 602 to the reflection surface 606a of reflection member 606 disposed around the LED 602. It is not strictly a planar direction perpendicular to the Z-axis from the LED 602 and means a direction that light from the LED 602 can be efficiently radiated to the reflection surface disposed around the LED 602.

Thus, the lamp 601 using the LED 602 in embodiment 6A is highly low-file, and most of light to be radiated from the LED 602 can be effectively utilized and efficiently radiated externally through the front cover lens 607.

Embodiment 6B

An LED in embodiment 6B of the invention will be explained below with reference to FIG. 64.

Figure 64:
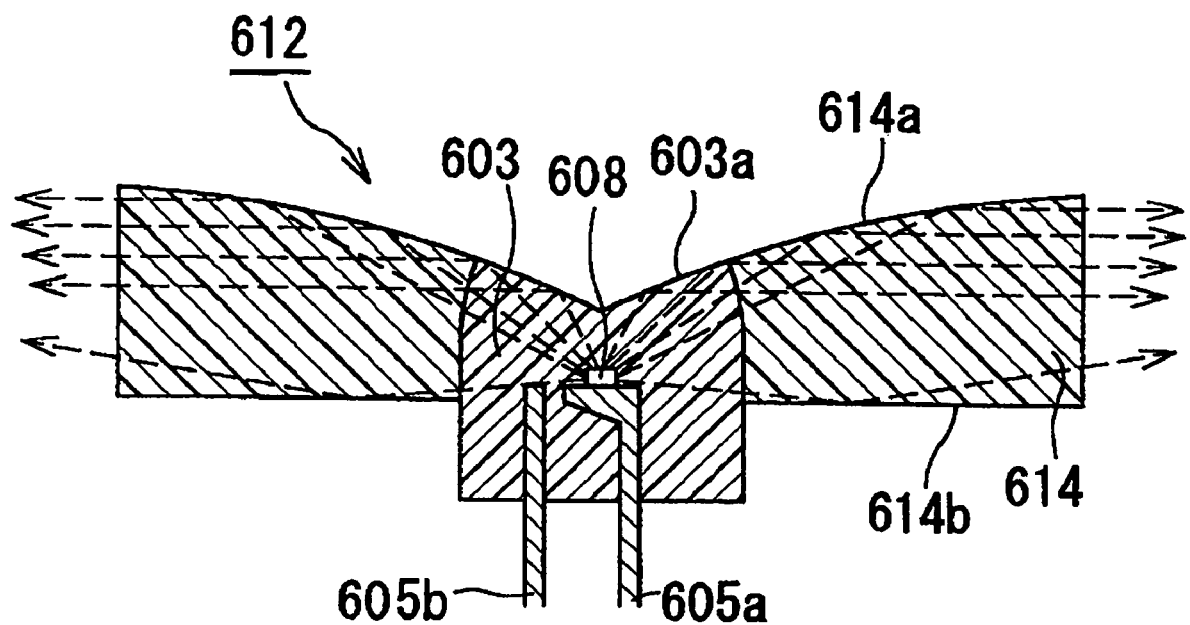
FIG. 64 is a cross sectional view showing an LED in embodiment 6B of the invention.

As shown in FIG. 64, the LED 612 in embodiment 6B has about the same emission section 603 as that in embodiment 6A. However, a reflector 614 thereof has a bottom surface 614b that is upward moved close to the mount surface level of light emitting element 608 and the reflector 614 is thus low-profile. Thereby, in addition to light to be upward radiated from the light emitting element 608, light to be downward radiated from the side surface of light emitting element 608 is radiated in the two-dimensional direction from the side surface of reflector 614 while being subjected to total reflection by the bottom surface 614b of reflector 614 since its incident angle to the bottom surface 614b of reflector 614 increases exceeding the critical angle.

Although light may be downward reflected by the upper surface 614a of reflector 614 without being reflected in the horizontal direction as shown in FIG. 64 since the light emitting element 608 has a size, such light can be also radiated from the side surface of reflector 614 in the two-dimensional direction while being subjected to total reflection by the bottom surface 614b of reflector 614.

Therefore, the amount of light to be radiated from the LED 612 in the two-dimensional direction increases, and the two-dimensional radiation LED with good radiation efficiency can be obtained.

Embodiment 6C

An LED in embodiment 6C of the invention will be explained below with reference to FIG. 65.

Figure 65:
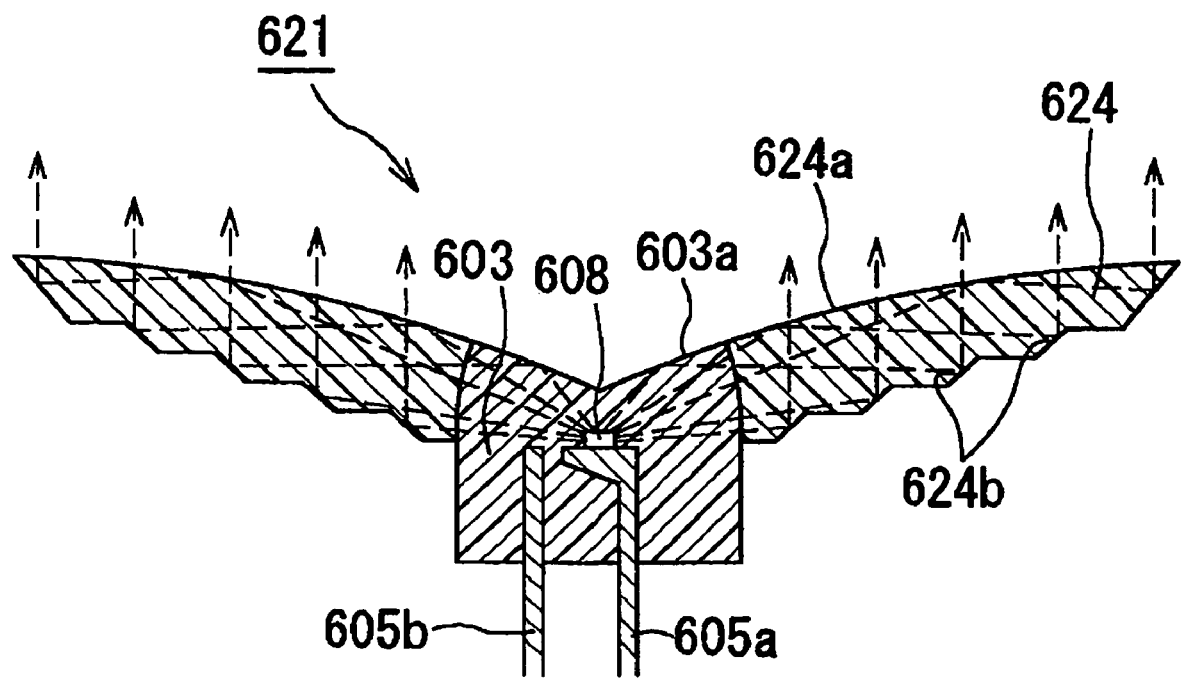
FIG. 65 is a cross sectional view showing an LED in embodiment 6C of the invention.

As shown in FIG. 65, the LED 621 in embodiment 6C has about the same emission section 603 as that in embodiment 6A. However, a reflector 624 thereof has a stepwise bottom surface that includes a reflection surface 624b at its oblique portion, and light to be radiated from the upper surface 603a, 624a in the two-dimensional direction is upward reflected by the reflection surface 624b. Light being upward reflected is subjected to refraction by the upper surface 624a when it is externally radiated through the upper surface 624a of reflector 624. Thus, the reflection direction of reflection surface 624a is controlled to allow light after refraction to be externally radiated nearly in the vertical direction. If the angle of reflection surface 624b to the two-dimensional radiation light becomes an angle not causing total reflection, then the reflection surface 624b needs to be externally mirror-finished by metal evaporation etc. to secure a high reflectivity.

Thus, by forming the reflection surface 624b to reflect the two-dimensional radiation light nearly in the vertical direction, the LED 621 serves as a small lamp.

Embodiment 6D

An LED in embodiment 6D of the invention will be explained below with reference to FIG. 66.

As shown in FIG. 66, the LED 631 in embodiment 6D has about the same emission section 603 as that in embodiment 6A. However, a reflector 634 thereof is elliptic while that of the above embodiments is circular. The reflector 634 has, like embodiment 6C, a stepwise bottom surface that includes a reflection surface 634b at its oblique portion, and light to be radiated from the upper surface 603a, 634a in the two-dimensional direction is upward reflected by the reflection surface 634b. Light being upward reflected is subjected to refraction by the upper surface 634a when it is externally radiated through the upper surface 634a of reflector 634. Thus, the reflection direction of reflection surface 634a is controlled to allow light after refraction to be externally radiated nearly in the vertical direction. If the angle of reflection surface 634b to the two-dimensional radiation light becomes an angle not causing total reflection, then the reflection surface 634b needs to be externally mirror-finished by metal evaporation etc. to secure a high reflectivity.

Further, as shown in FIG. 66(a), the bottom surface of reflector 634 is divided into eight segments between neighboring segments of which the reflection surface 634b is formed alternately. Each reflection surface 634b has a curvature according to a radiation density from the emission section 603 and, thereby, the entire LED 631 can have even brightness. As a result, in viewing from the top, the LED 631 can have an even brightness on the entire surface and can offer a natural feel with glitter. Further, the LED 631 can reflect external light even when it is turned off and thereby can offer a good appearance with glitter evenly on the entire surface.

Embodiment 6E

An LED in embodiment 6E of the invention will be explained below with reference to FIG. 67.

Figure 67:
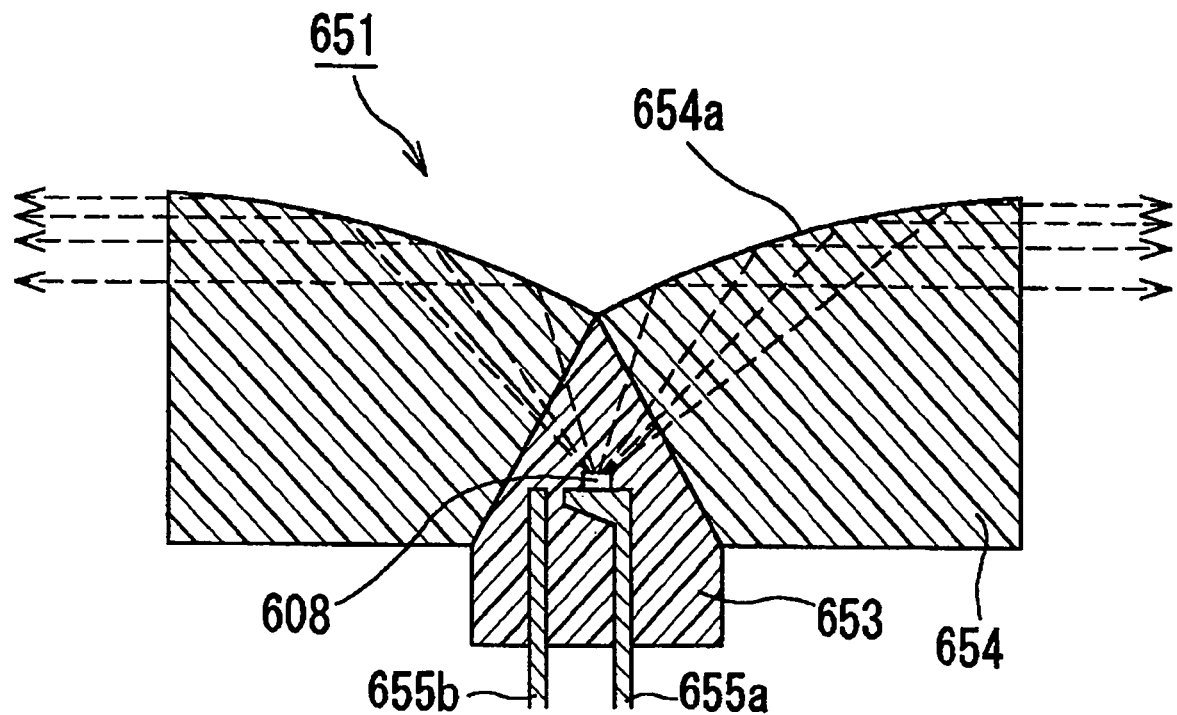
FIG. 67 is a cross sectional view showing an LED in embodiment 6E of the invention.

As shown in FIG. 67, the LED 651 in embodiment 6E has a light source section 653 and a reflection section 654 different from the above embodiments. The light source section 653 is composed such that, of a pair of vertically disposed leads 655a, 655b, the lead 655a has a light emitting element 608 mounted thereon, and the light emitting element 608 is electrically connected through a wire (not shown) with the lead 655b. The tip portion of leads 655a, 655b, the light emitting element 608 and the wire are set in a die for resin sealing and then sealed with transparent epoxy resin while being formed into an integrated shape of circular cone and cylinder as shown in FIG. 67. The reflection section 654 is of acrylic resin with about the same refractive index as transparent epoxy resin and is, at the center, provided with a recess corresponding to the cone portion of light source section 653. It is, at the cone portion, physically and optically bonded thereto by an optical binder. However, the physical bonding is not always needed. Since a gap between the light source section 653 and the reflection section 654 is small and both interfaces are nearly in parallel, even if the optical binder is not used, the optical loss is small. Therefore, optical binder is not always needed.

The reflection section 654 has an upper surface 654a to serve as a two-dimensional reflection surface that light to be emitted from the light emitting element 608 is reflected nearly in the two-dimensional parallel direction. Thus, when power is supplied through the pair of leads 655a, 655b and the light emitting element 608 emits light, light to be upward emitted therefrom and then reflected by the upper surface 654a is reflected nearly horizontally 360 degrees in the two-dimensional direction, then externally radiated from the side surface of reflection section 654.

Thus, even without using the combination of emission section and reflector that have a two-dimensional reflection surface to reflect light in a two-dimensional plane direction, the LED can radiate light at high radiation efficiency in the two-dimensional direction. The reflection section 654 is not always limited to one being formed combined only to the cone portion of light source section 653 and may be formed also combined to the cylindrical portion of light source section 653 extended below.

Although the LED in the above embodiments 6A to 6E uses a red light emitting element, whatever color light emitting element it may use. Although the transparent material to seal the light emitting element etc. in the emission section or light source section is transparent epoxy resin, the other material such as transparent silicon resin may be used.

The flat surface at the center of upper surface of emission section may be concave or convex, or the reflection surface may be formed at the center. The reflection surface is not limited to a shape to be formed by rotating, around the Z-axis, part of a parabola with a symmetry axis on the X-axis. Even when it has a shape to be formed by rotating, around the Z-axis, part of an ellipse, a parabola, a hyperbola or its approximated curve with a focal point at the light emitting element or in its vicinity, light can be radiated in the predetermined range.

Although in the above embodiments the reflector and reflection section is circular or elliptic, they may have the other shape. Further, although the reflector and reflection section is of acrylic resin, whatever material they may use if it has about the same refractive index as the sealing material of emission section.

The composition, shape, number, material, dimensions, connection form etc. of the other part in the LED are not limited to those described in the above embodiments.

Embodiment 7A

A light emitting unit in embodiment 7A of the invention will be explained below with reference to FIG. 68 and FIG. 70.

Figure 68:
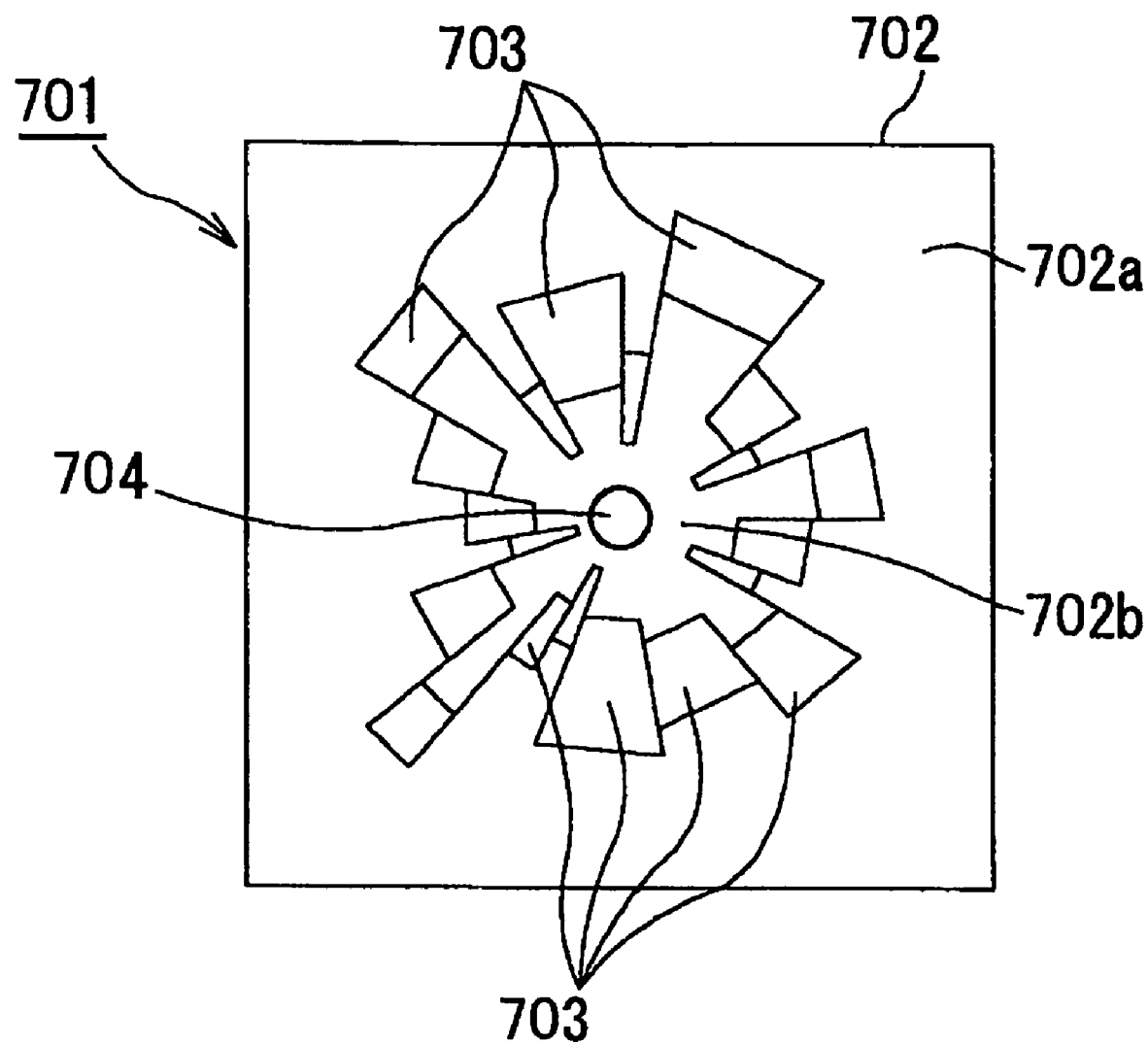
FIG. 68 is a plain view showing a light emitting unit in embodiment 7A of the invention.
Figure 69:
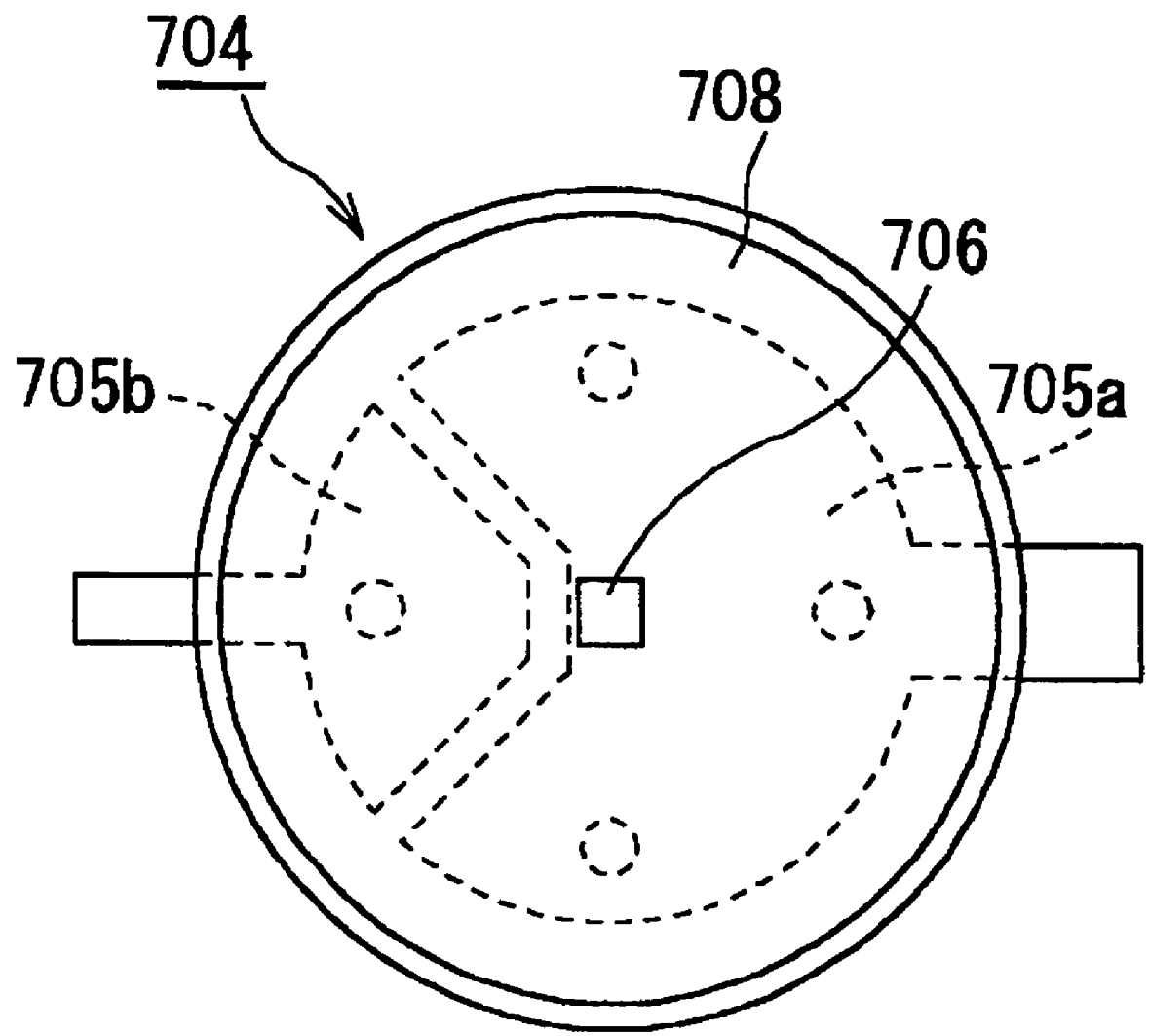
FIG. 69 is a plain view showing an LED as a light source of the light emitting unit in embodiment 7A of the invention.

As shown in FIG. 68, the light emitting unit 701 in embodiment 7A has a reflection plate 702, which composes its main body, that a reflection surface (optical control surface) 703 with different shapes is formed with an angle of about 45 degrees declined to the center and its center portion is at a bottom section 702b with a level lower than a periphery 702a of the reflection plate 702. An LED 704 as a light source to radiate light in a plane direction is located at the center of bottom section 702b. Light to be radiated 360 degrees in the plane direction from the LED 704 is reflected by each reflection surface 703 and then radiated toward over the sheet surface of FIG. 68.

Figure 70:
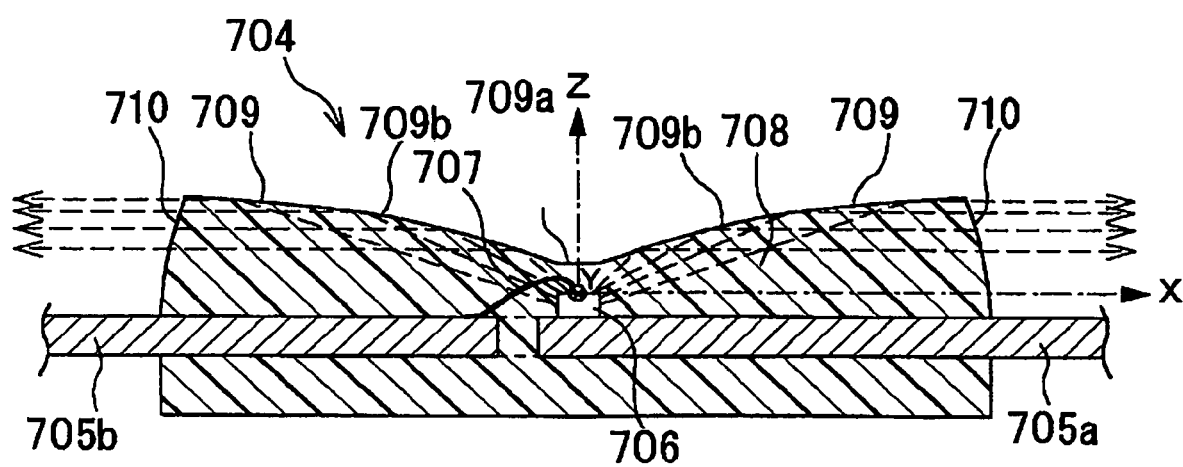
FIG. 70 is a cross sectional view showing the LED as a light source of the light emitting unit in embodiment 7A of the invention.

The composition and radiation principle of LED 704 as shown in FIG. 70 are about the same as those in embodiment 2 as shown in FIG. 26(a), (b) and its explanation is omitted here.

The light emitting unit 701 in embodiment 7A is low-profile, highly efficient and can be applied to an odd-shaped lamp etc. As shown in FIG. 68, light to be radiated 360 degrees in the plane direction from the LED 704 and then reflected has different angle ranges depending on a circumference direction in light radiation. Namely, the optical control surface 703 to light radiated from the LED 704 has wide and narrow widths. Therefore, even when asymmetrical in height and width, the control of light distribution can be conducted simply by using the reflection plate 702. Further, since the LED 704 as a light source has a reflection surface 709 being opposite to a light emitting element 706 to radiate light in the side direction of light emitting element 706, it can radiate light in the plane direction by using the single package. By dividing the optical control surface in circumference direction, radiation direction etc. from the light source, the reflection surface can be disposed at an arbitrary position. Thereby, the optical design can be made based on reflected light and the design property can be enhanced.

Embodiment 7B

A light emitting unit in embodiment 7B of the invention will be explained below with reference to FIG. 71.

Figure 71:
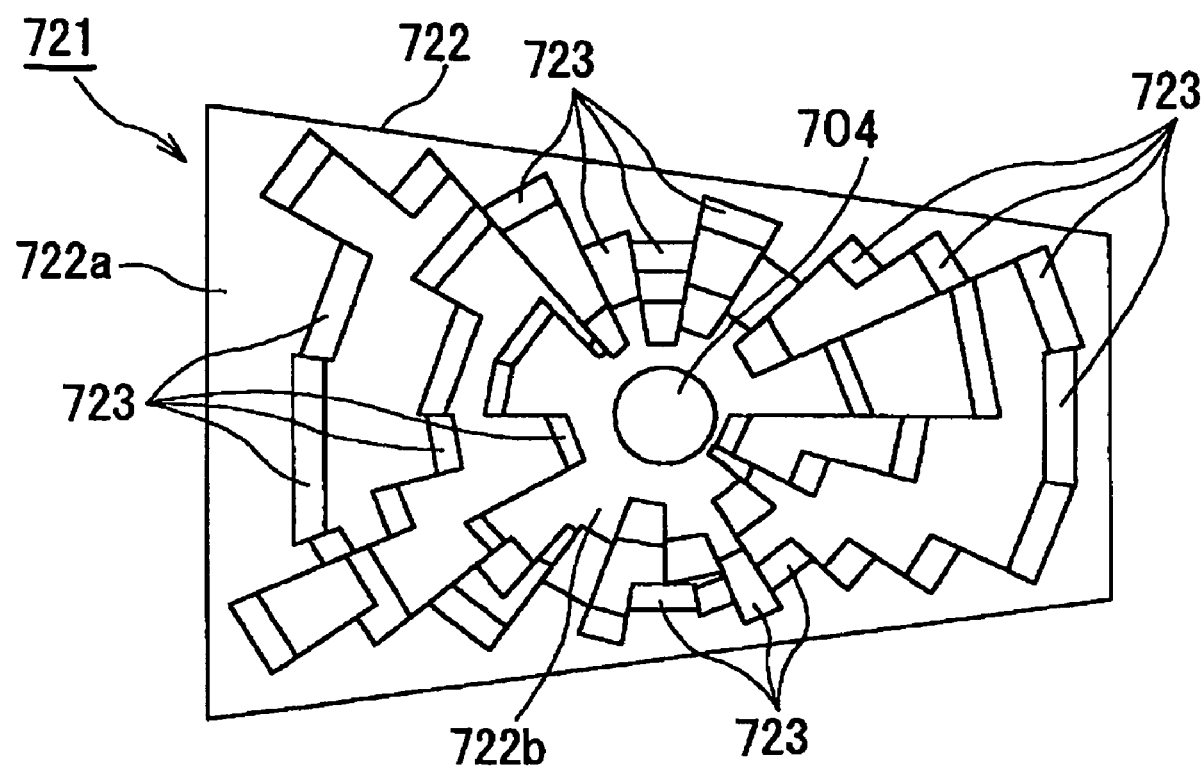
FIG. 71 is a plain view showing a light emitting unit in embodiment 7B of the invention.

As shown in FIG. 71, the light emitting unit 721 in embodiment 7B is an example asymmetrical in height and width. Namely, its reflection plate 722 has a trapezoidal shape that its left side is long and its short right side is short. Like embodiment 7A, the reflection plate 722 has a reflection surface (optical control surface) 723 with different shapes to be formed with an angle of about 45 degrees declined to the center and its center portion is at a bottom section 722b with a level lower than a periphery 722a of the reflection plate 722. An LED 704 as a light source to radiate light in a plane direction is located at the center of bottom section 722b. Light to be radiated 360 degrees in the plane direction from the LED 704 is reflected by each reflection surface 723 and then radiated nearly perpendicularly toward over the sheet surface of FIG. 71.

Even when the reflection plate 722 has such a shape, multiple optical control surfaces can be provided stepwise in one direction and the reflection surface can have a wide or narrow width depending on the direction. Thus, on the right side with a narrow width of reflection plate 722, the number of reflection surfaces in one direction is increased by increasing the step number and the width of reflection surface is narrowed to increase the density of reflection surface. Thereby, the amount of reflected light per unit area on the right side increases and can be balanced with the amount of reflected light on the left side.

Hence, in the light emitting unit 721 of embodiment 7B, even when the reflection plate 722 is asymmetrical in height and width, light can be radiated disposing the emission surface at a desired position.

Embodiment 7C

A light emitting unit in embodiment 7C of the invention will be explained below with reference to FIG. 72 and FIG. 73.

Figure 72:
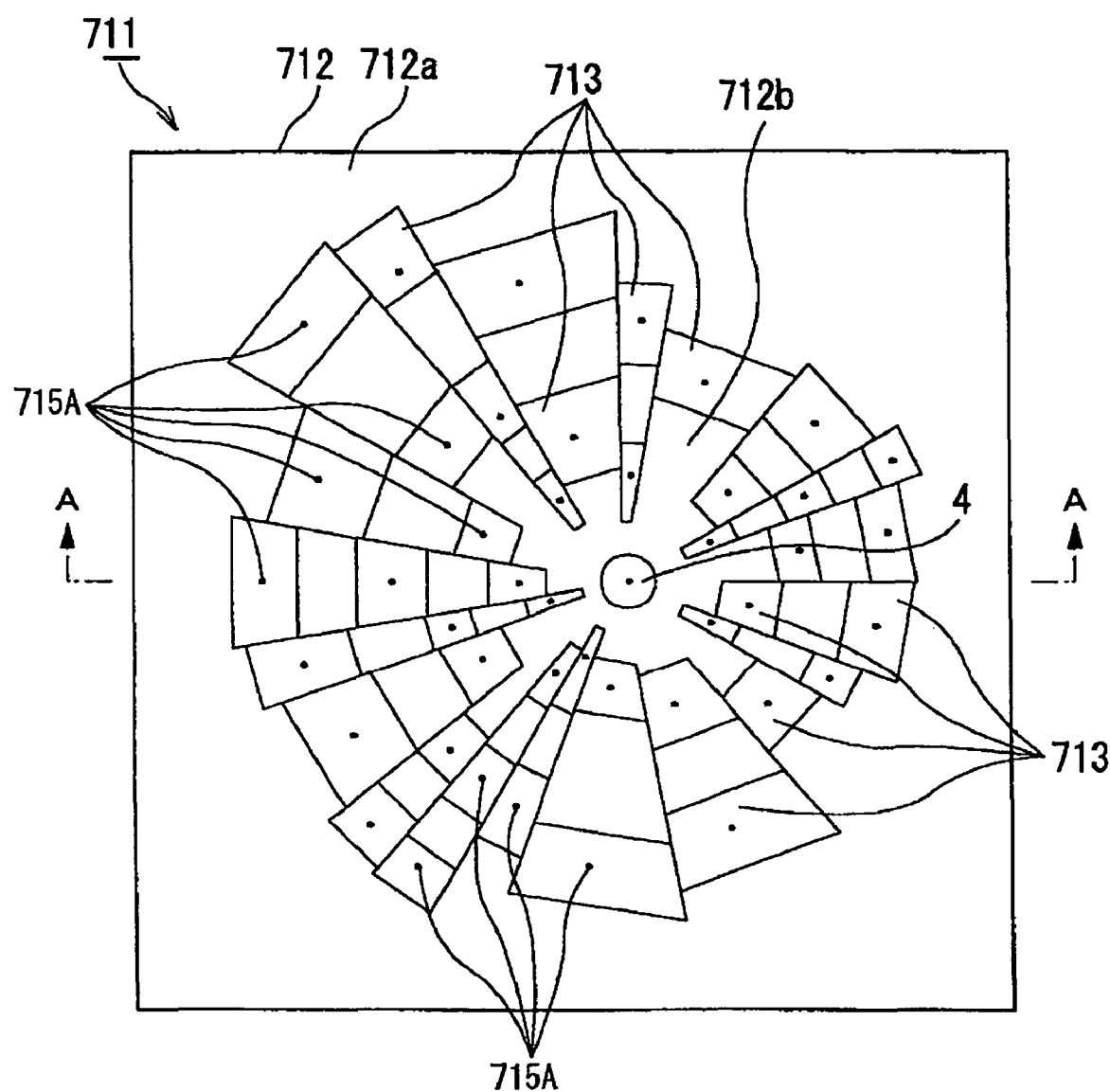
FIG. 72 is a plain view showing a light emitting unit in embodiment 7C of the invention and a distribution of light emitting points in the light emitting unit.
Figure 73:
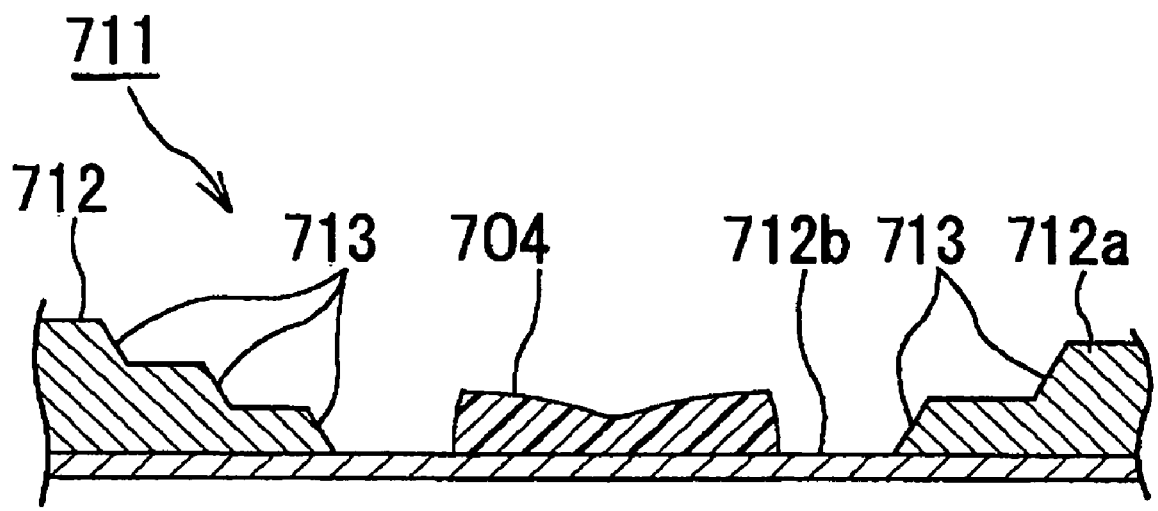
FIG. 73 is a cross sectional view showing the light emitting unit in embodiment 7C to be cut along the line A-A in FIG. 72.

As shown in FIG. 72 and FIG. 73, the light emitting unit 711 in embodiment 7C, like embodiment 7A, has a reflection plate 712, which composes its main body, that a reflection surface (optical control surface) 713 with different shapes is formed with an angle of about 45 degrees declined to the center and its center portion is at a bottom section 712b with a level lower than a periphery 712a of the reflection plate 712. An LED 704 as a light source to radiate light in a plane direction is located at the center of bottom section 712b. Light to be radiated 360 degrees in the plane direction from the LED 704 is reflected by each reflection surface 713 and then radiated nearly perpendicularly toward over the sheet surface of FIG. 72.

Different from embodiment 7A, as shown in FIG. 72, the reflection surface 713 is provided two or three steps around the LED 704 in each direction. Thus, the optical control surface 713 is provided at multiple positions to a radiation direction from the light source.

Thereby, as shown in FIG. 72, the density of emission point 715A can be increased significantly. The density of emission point 715A can be kept even when the area of reflection plate is increased.

Thus, the light emitting unit 711 in embodiment 7C is low-profile, highly efficient and can be applied to an odd-shaped lamp without lowering the efficiency. Further, since the optical control surface is provided at multiple positions to a radiation direction from the light source, it can be also applied to a shape with a large aspect ratio and the density of emission point can be increased. Further, since light can be also externally radiated from the central radiation surface 709a formed at the center of LED 704, the center of LED 704 also becomes emission point and, therefore, the center of reflection plate can be avoided from being a dark point. Thus, the light emitting unit can offer a good balance in distribution of emission point 715A.

Embodiment 7D

Figure 74:
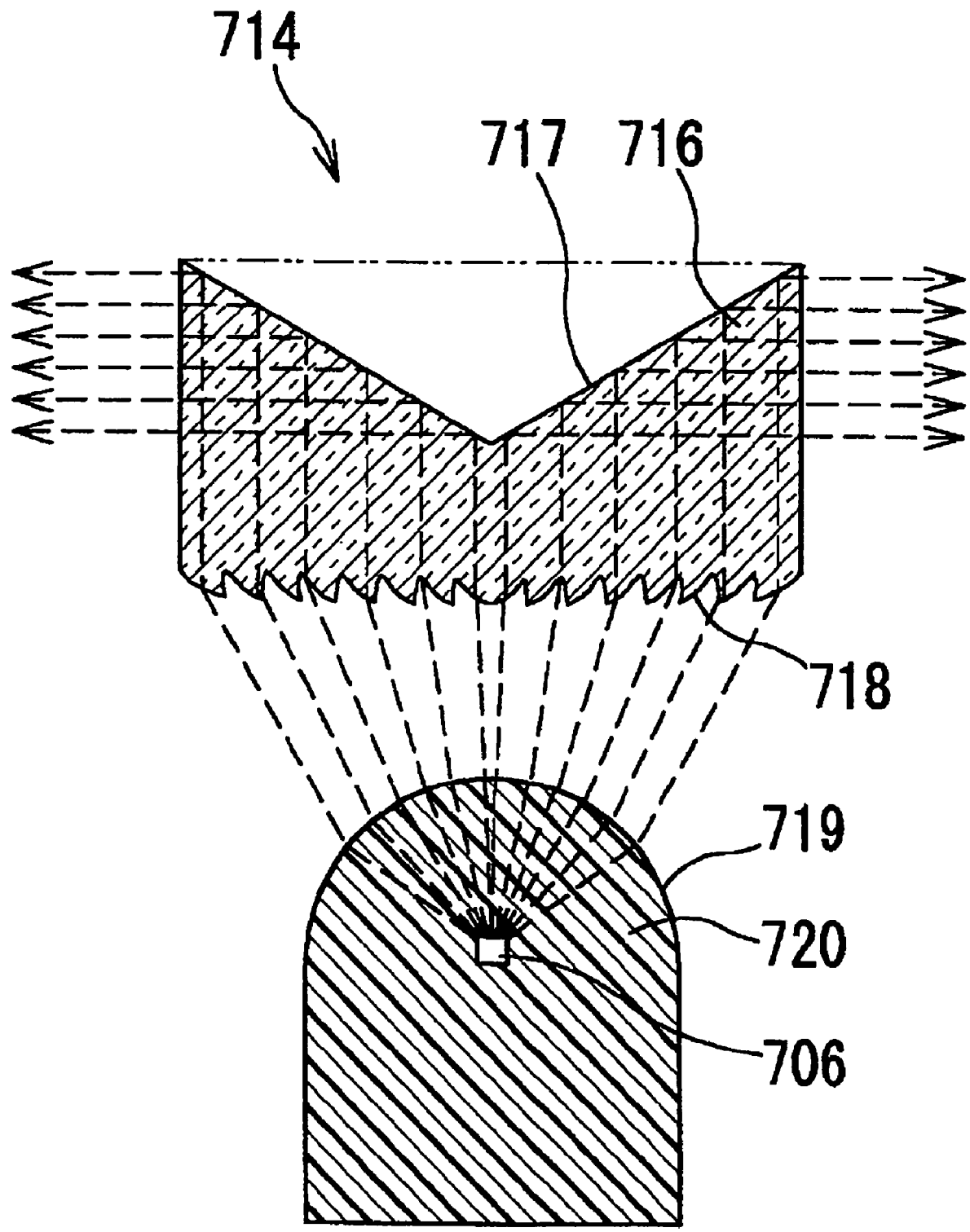
FIG. 74 is a cross sectional view showing a light source of a light emitting unit in embodiment 7D of the invention.

A light emitting unit in embodiment 7D of the invention will be explained below with reference to FIG. 74.

A light source 714 of light emitting unit in embodiment 7D is disposed at the bottom section of a reflection plate like that shown in embodiments 7A to 7C. As shown in FIG. 74, the light source 714 is composed of a lamp-type LED 719 that a light emitting element 706 is sealed with transparent epoxy resin 720, and a reflection mirror 716 of light-transmitting material disposed above that. The reflection mirror 716 is provided with a Fresnel lens 718 at the bottom.

The light source 714 thus composed is operated such that light to be emitted from the emission surface of light emitting element 706 is radiated from the LED 719 while being converged by the convex lens type transparent epoxy resin 720 and is then irradiated to the Fresnel lens 718 at the bottom of reflection mirror 716. Light to be converged nearly vertically by the Fresnel lens 718 is subjected to total reflection by a reflection surface 717 at the upper surface of reflection mirror 716 being concaved in the shape of a circular cone, then radiated 360 degrees nearly in the horizontal direction. The reason why the Fresnel lens 718 is provided at the bottom of reflection mirror 716 is that, since the radiation efficiency lowers when the lens-type LED has a high light convergence characteristic, the Fresnel lens is used together in order to increase the effective light amount without increasing the light convergence characteristic of LED 719.

Thus, the light source 714 in embodiment 7D can radiate planar light and thereby it can be used as a light source of light emitting unit, like the LED 704 in embodiments 7A to 7C.

Embodiment 7E

Figure 75:
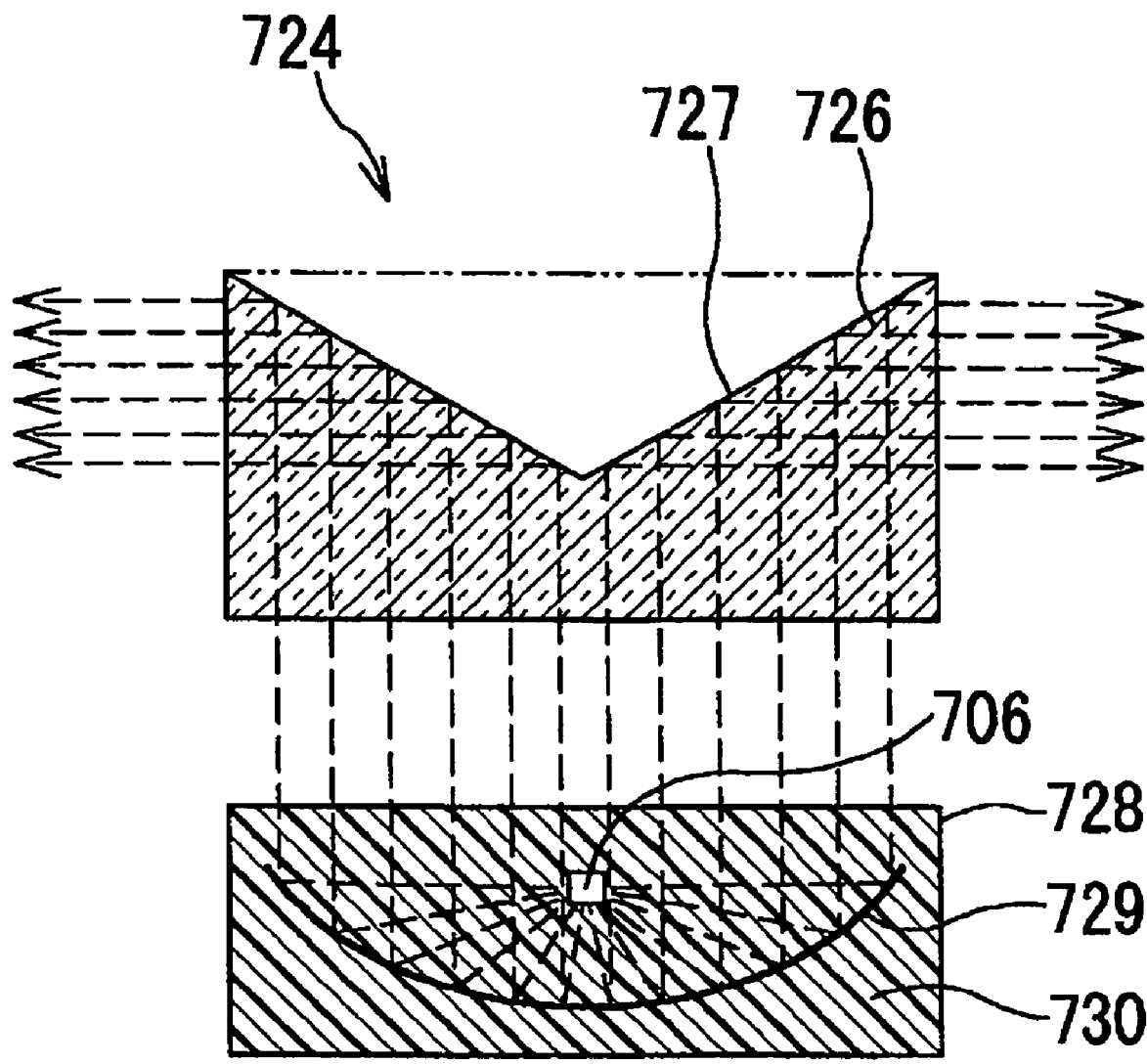
FIG. 75 is a cross sectional view showing a light source of a light emitting unit in embodiment 7E of the invention.

A light emitting unit in embodiment 7E of the invention will be explained below with reference to FIG. 75.

A light source 724 of light emitting unit in embodiment 7E is disposed at the bottom section of a reflection plate like that shown in embodiments 7A to 7C. As shown in FIG. 75, the light source 724 is composed of a reflection-type LED 728 that a light emitting element 706 and a cup-shaped reflection mirror 729 are sealed with transparent epoxy resin 730, and a reflection mirror 726 of light-transmitting material disposed above that. The reflection mirror 729 of reflection-type LED 728 is in the shaped of a paraboloid with a focal point at the light emitting element 706.

The light source 724 thus composed is operated such that light to be emitted from the emission surface (bottom surface) of light emitting element 706 is nearly vertically upward reflected by the paraboloid reflection mirror 729, then radiated from the LED 728 and irradiated to the reflection mirror 726. Light to be nearly vertically entered thereto is subjected to total reflection by a reflection surface 727 at the upper surface of reflection mirror 726 being concaved in the shape of a circular cone, then radiated 360 degrees nearly in the horizontal direction. In this case, since the radiation efficiency is kept high even when the light convergence characteristic is enhanced to convert radiation light of LED 728 into nearly parallel light, the effective light amount can be kept high without providing a Fresnel lens at the bottom of reflection mirror 726. Further, the reflection mirror 726 may be bonded to the LED 728 through an optical binder so as not to generate the interface reflection between the reflection surface of LED 728 and the incident surface of reflection mirror 726. The LED 728 and the reflection mirror 726 may be integrally formed.

Thus, the light source 724 in embodiment 7E can radiate planar light and thereby it can be used as a light source of light emitting unit, like the LED 704 in embodiments 7A to 7C.

Embodiment 7F

Figure 76:
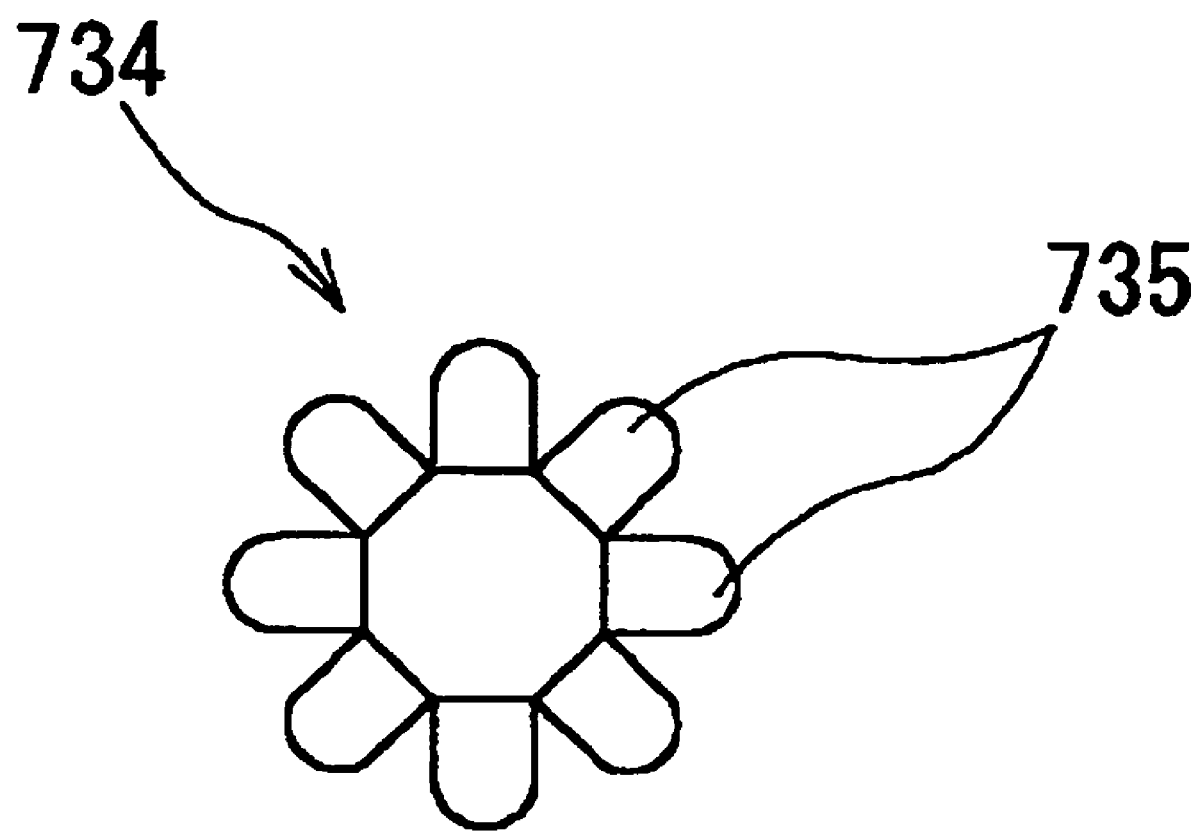
FIG. 76 is a plain view showing a light source of a light emitting unit in embodiment 7F of the invention.

A light emitting unit in embodiment 7F of the invention will be explained below with reference to FIG. 76.

A light source 734 of light emitting unit in embodiment 7F is disposed at the bottom section of a reflection plate like that shown in embodiments 7A to 7C. As shown in FIG. 76, the light source 734 is composed of eight small lamp-type LED's 735 that are similar to that in the lamp-type LED 719 in embodiment 7D and that are arrayed circularly while having its light radiation surface toward outside. The small lamp-type 735 is sealed to be thin and elliptic in cross section in a direction perpendicular to the sheet surface of FIG. 76. Therefore, the light source is operated such that light is not diffused in the direction perpendicular to the sheet surface of FIG. 76 and that planar light is radiated 360 degrees.

Thus, the light source 734 in embodiment 7F allows planar light to be radiated by the simple composition that the flat lamp-type LED's 735 are arrayed circularly and thereby it can be used as a light source of light emitting unit, like the LED 704 in embodiments 7A to 7C.

Embodiment 7G

Figure 77:
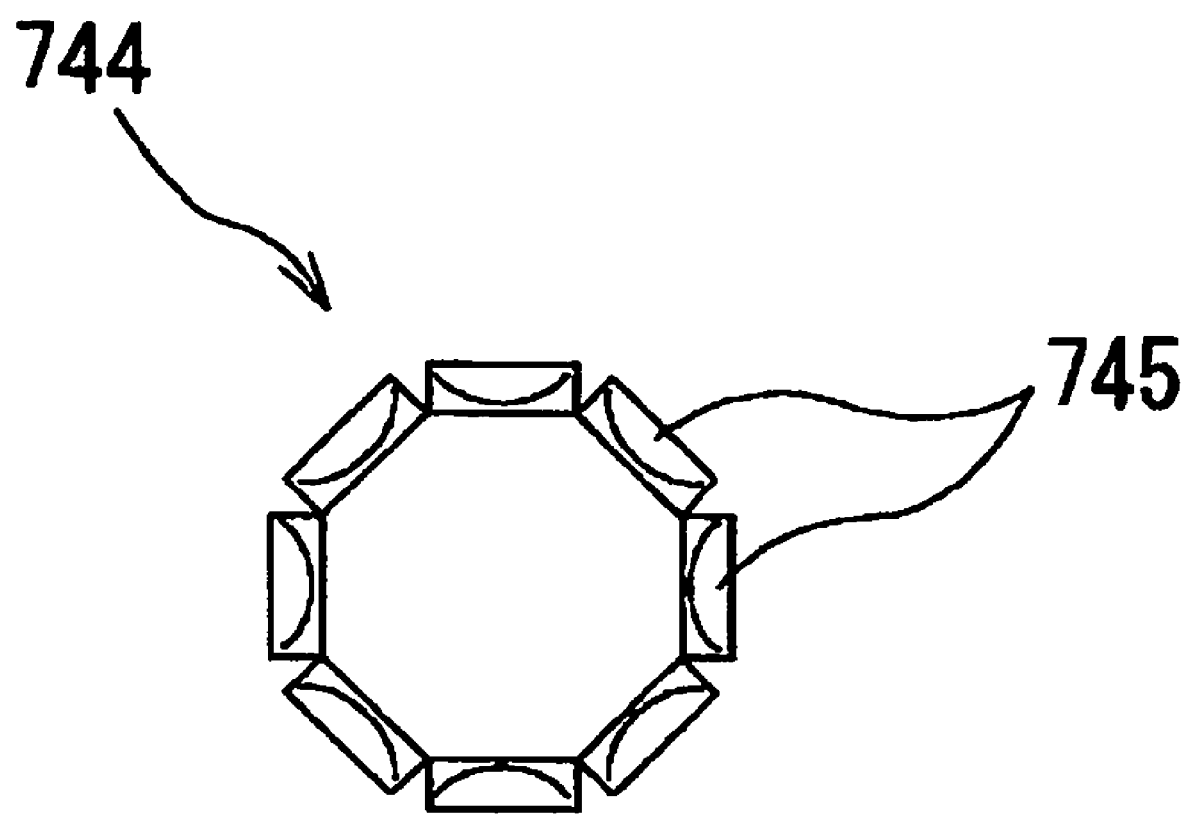
FIG. 77 is a plain view showing a light source of a light emitting unit in embodiment 7G of the invention.

A light emitting unit in embodiment 7G of the invention will be explained below with reference to FIG. 77.

A light source 744 of light emitting unit in embodiment 7G is disposed at the bottom section of a reflection plate like that shown in embodiments 7A to 7C. As shown in FIG. 77, the light source 744 is composed of eight small reflection-type LED's 745 that are similar to that in the reflection-type LED 728 in embodiment 7E and that are arrayed circularly while having its light radiation surface toward outside. The small reflection-type 745 is formed thin and flat in a direction perpendicular to the sheet surface of FIG. 77. Therefore, the light source is operated such that light is not diffused in the direction perpendicular to the sheet surface of FIG. 77 and that planar light is radiated 360 degrees.

Thus, the light source 744 in embodiment 7G allows planar light to be radiated by the simple composition that the flat reflection-type LED's 745 are arrayed circularly and thereby it can be used as a light source of light emitting unit, like the LED 704 in embodiments 7A to 7C.

Embodiment 7H

A lamp in embodiment 7H of the invention will be explained below with reference to FIG. 78.

As shown in FIG. 78, the lamp 741 in embodiment 7H is composed of the six light emitting units in embodiment 7A. The six light emitting units are disposed two wide, three high in a lamp housing such that they are at different stages from each other and further in the back from the bottom toward the top. The top surface 701a and side surface 701b of each light emitting unit 701, and the inner wall 742 of housing of the lamp 741 are provided with smooth aluminum coating with a high reflectivity formed thereon.

Of light to be radiated from the light source of each light emitting unit, light inclined to some extent in the horizontal direction is irradiated to the top surface 701a or side surface 701b of light emitting unit 701 or to the inner wall 742 of lamp 741 while being not reflected by its optical control surface. These surfaces have the aluminum coating with a high reflectivity formed thereon and therefore most of light irradiated can be reflected thereby and radiated out of the lamp 741. Therefore, light of the lamp 741 can be visually recognized even from outside the radiation range of lamp 741. Thus, the lamp 741 with a wide recognition range of light can be offered.

Embodiment 7I

A light emitting unit in embodiment 7I of the invention will be explained below with reference to FIG. 79 and FIG. 80.

Figure 79:
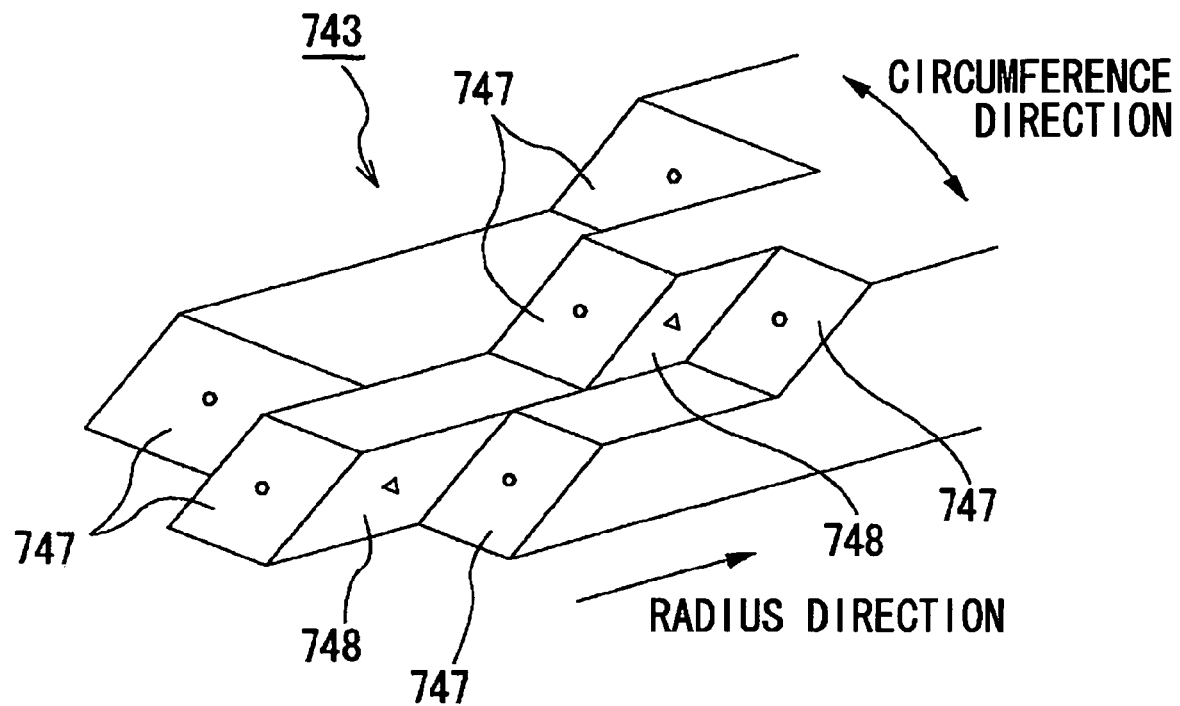
FIG. 79 is an enlarged perspective view showing part of a reflection surface of a light emitting unit in embodiment 7I of the invention.

As shown in FIG. 79, the light emitting unit 743 in embodiment 7I has such a reflection surface that the position of an optical control surface 747 neighboring in the circumference direction is different from each other. Thereby, an oblique reflection surface 748 is formed since part of the side surface of optical control surface 747 is exposed.

Figure 80:
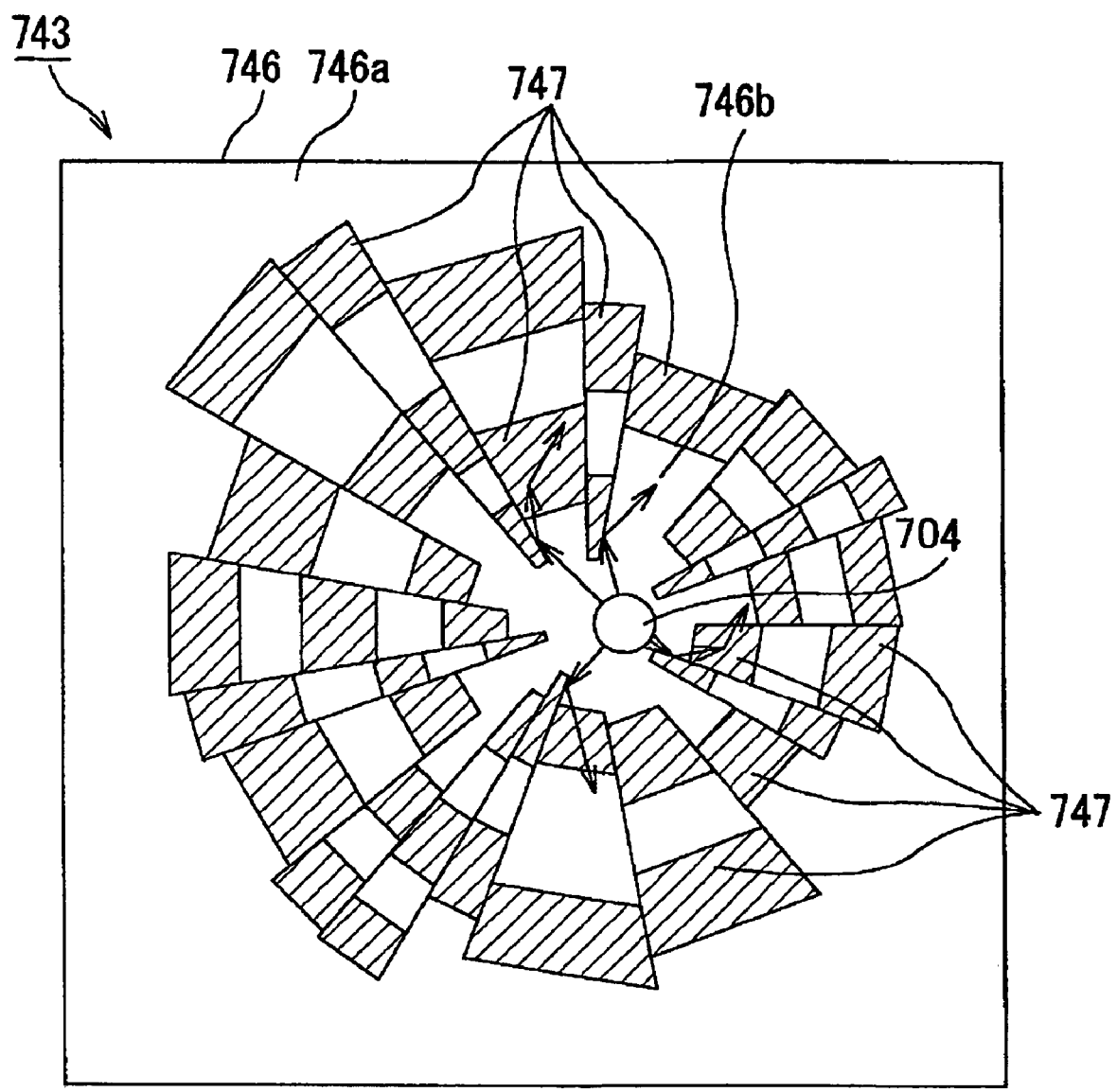
FIG. 80 is a plain view showing the light emitting unit in embodiment 7I of the invention.

As shown in FIG. 80, using such a reflection surface, the position of a light source 704 is displaced from the center. Thus, by displacing the light source 704 from the center, light can be, as shown by arrows in FIG. 80, irradiated not only to the optical control surface 747 with hatched lines but also to the oblique reflection surface 748 on the side surface thereof. Therefore, when looking at the light emitting unit 743 from outside the reflection direction of optical control surface 747, the reflection of light can be visually recognized at the oblique reflection surface 748 that the position of optical control surface 747 neighboring in the circumference direction is different from each other. Thus, the light emitting unit with a large visual recognition angle can be offered.

Although the LED in the above embodiments uses a red light emitting element, whatever color light emitting element it may use. Although the transparent material to seal the light emitting element etc. in LED is transparent epoxy resin, the other material such as transparent silicon resin may be used.

The composition, shape, number, material, dimensions, connection form etc. of the other part in the light emitting unit are not limited to those described in the above embodiments.

Embodiment 7J

A light emitting unit in embodiment 7J of the invention will be explained below with reference to FIG. 81 to FIG. 83.

Figure 81:
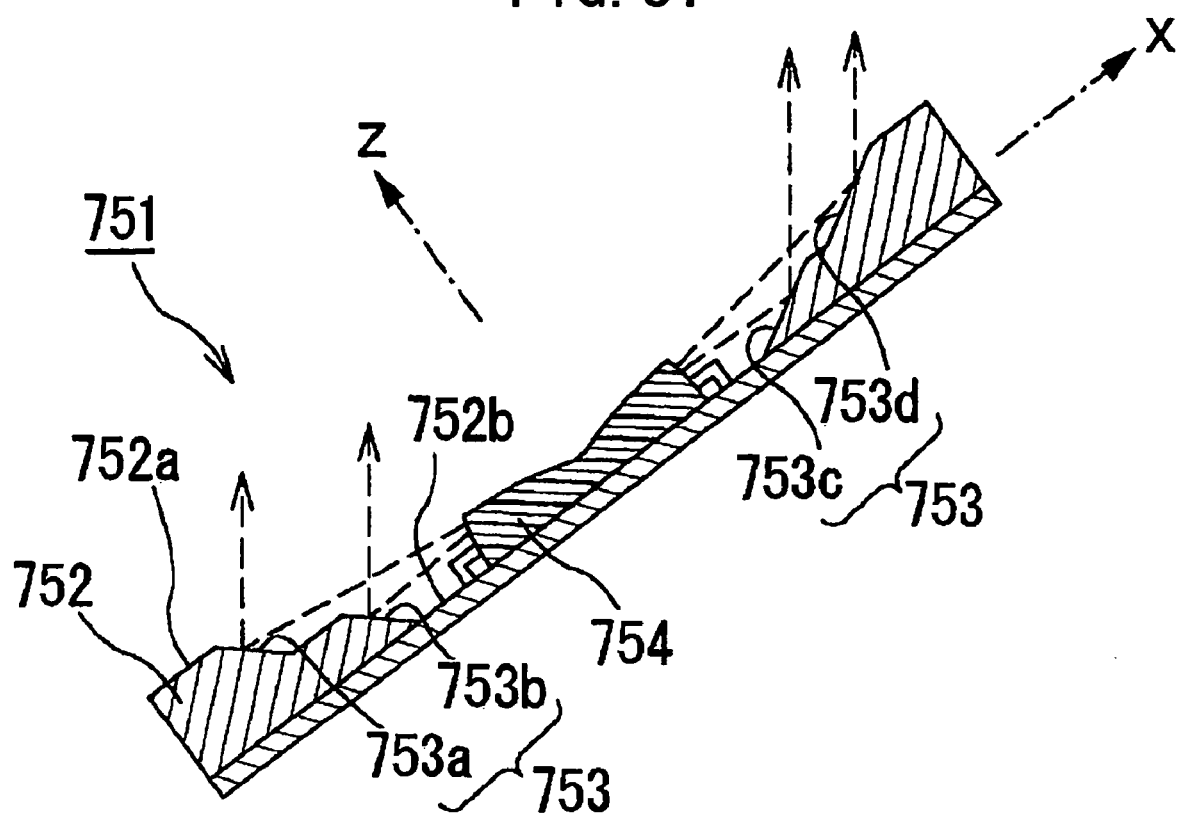
FIG. 81 is a cross sectional view showing a light emitting unit in embodiment 7J of the invention.

As shown in FIG. 81, the light emitting unit 751 in embodiment 7J is composed such that a reflection plate 752 as a main body has a first reflection surface 753 where reflection surfaces (optical control surfaces) 753a, 753b, 753c, 753d, . . . are formed that its angles vary gradually such that a direction vector perpendicular to the optical control surface 753a at the lowest position has the largest angle to the Z-axis and a direction vector perpendicular to the optical control surface 753d at the highest position has the smallest angle to the Z-axis, and that the reflection plate 752 has a center portion at its bottom section 752b one stage down its circumference 752a. An LED 754 as a light source to radiate planar light is disposed at the center of bottom section 752b. In operation, light to be radiated 360 degrees in a plane direction from the LED 754 is reflected by the first reflection surface 753, and then radiated in a direction oblique to the center axis (Z-axis) of light emitting element in the LED 754.

Figure 82:
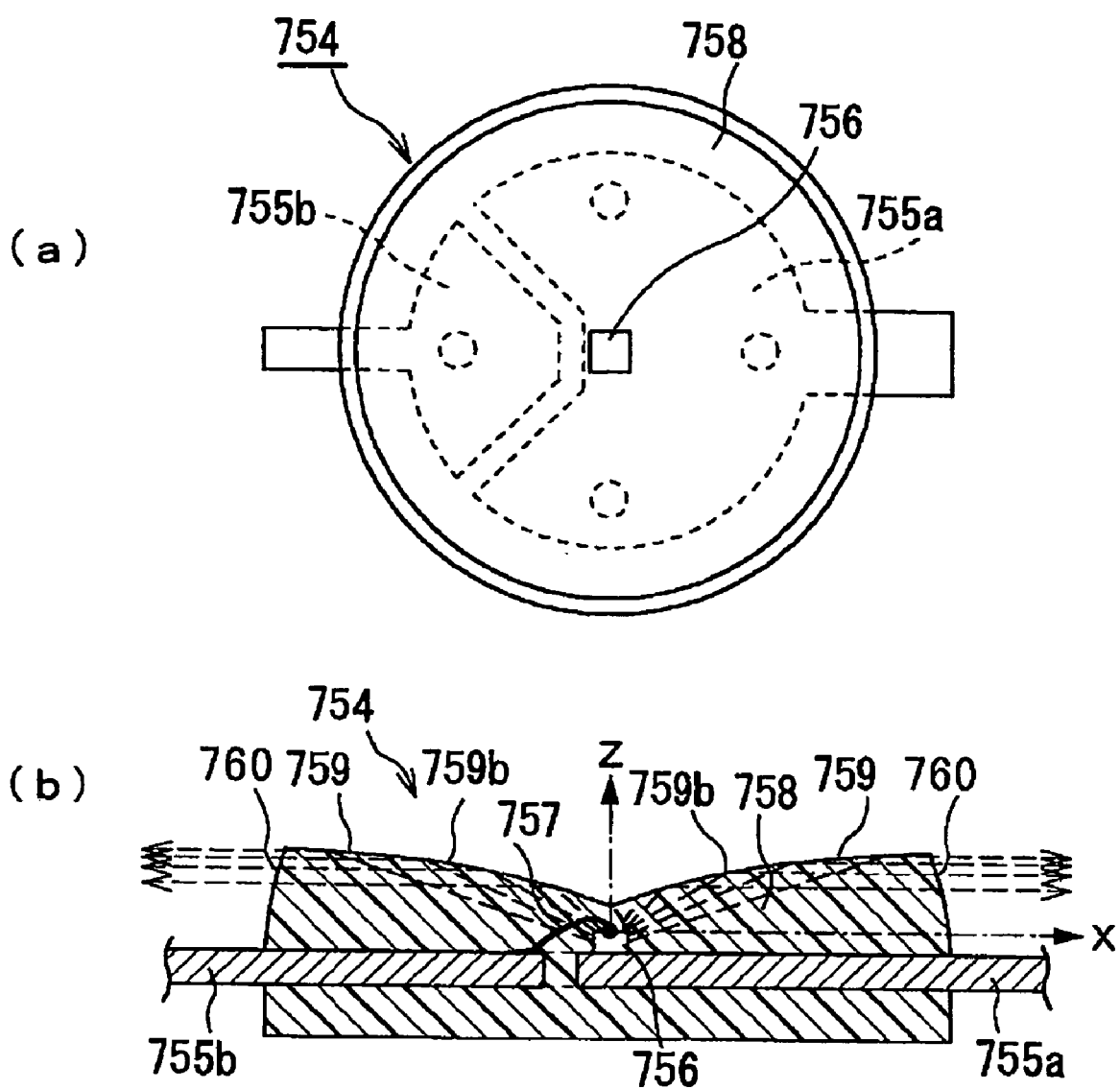
FIG. 82(*a*) is a plain view showing an LED used as a light source of the light emitting unit in embodiment 7J of the invention, and (b) is a cross sectional view thereof.
Figure 83:
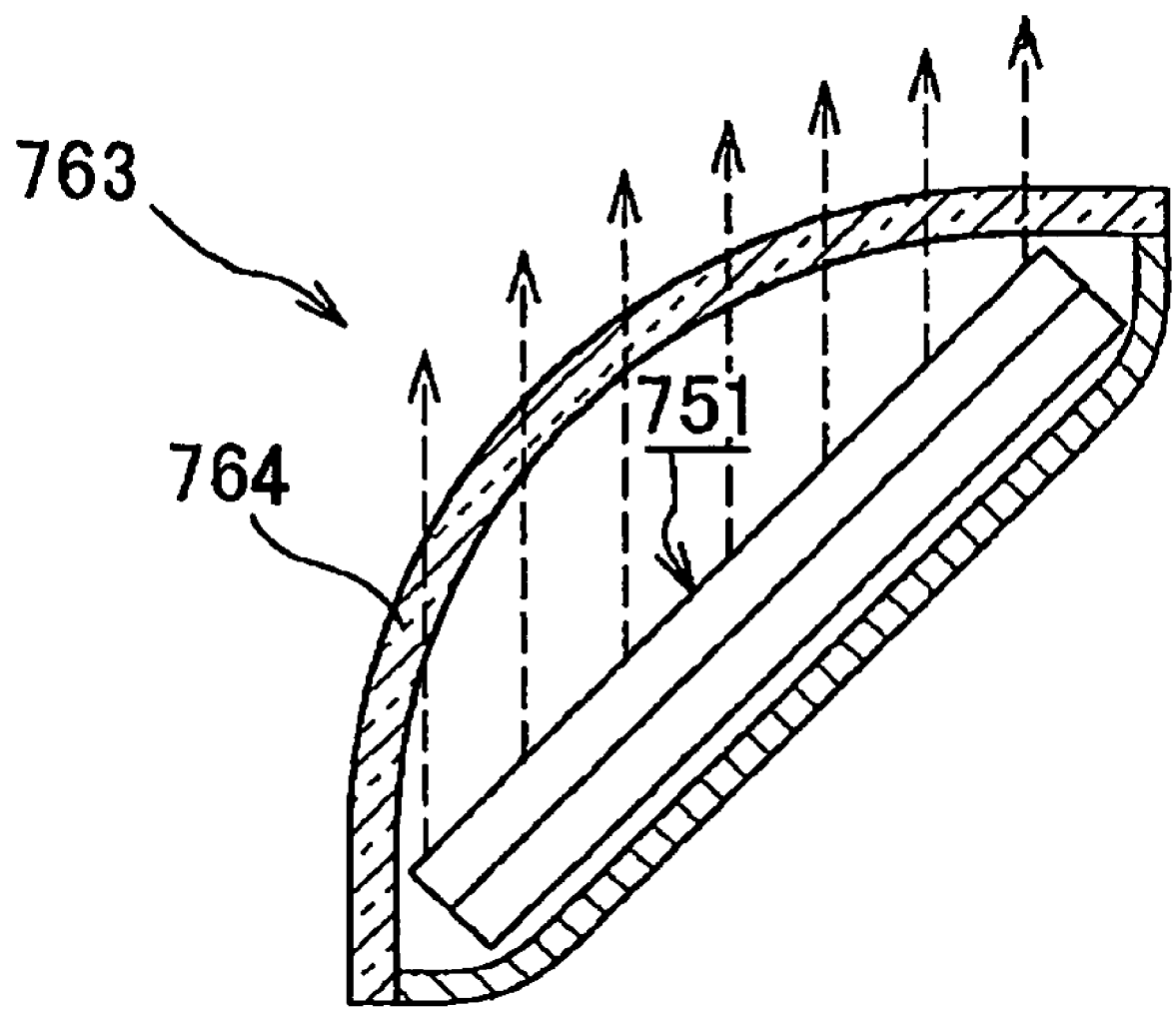
FIG. 83 is a cross sectional view showing the light emitting unit in embodiment 7J of the invention to be attached to a car body.

The composition and operation of LED 754 as shown in FIG. 82 are about the same as those in LED of embodiment 2 as shown in FIG. 26, and its explanation is omitted here.

An application of the light emitting unit 751 to automobile rear lamp will be explained below with reference to FIG. 83. As shown in FIG. 83, even when the automobile rear lamp 763 is disposed at an inclined section 764 with a curvature in the backward and forward direction, it can be disposed close to the inclined section 764 since the light emitting unit 751 is low-profile and operable to radiate nearly parallel light in the oblique direction. Thereby, as compared to conventional rear lamps, its mount space can be significantly saved and high external radiation efficiency can be offered.

Thus, the light emitting unit 751 in embodiment 7J is low-profile, and capable of being disposed along an inclined section and offering high external radiation efficiency.

Embodiment 7K

A light emitting unit in embodiment 7K of the invention will be explained below with reference to FIG. 84.

Figure 84:
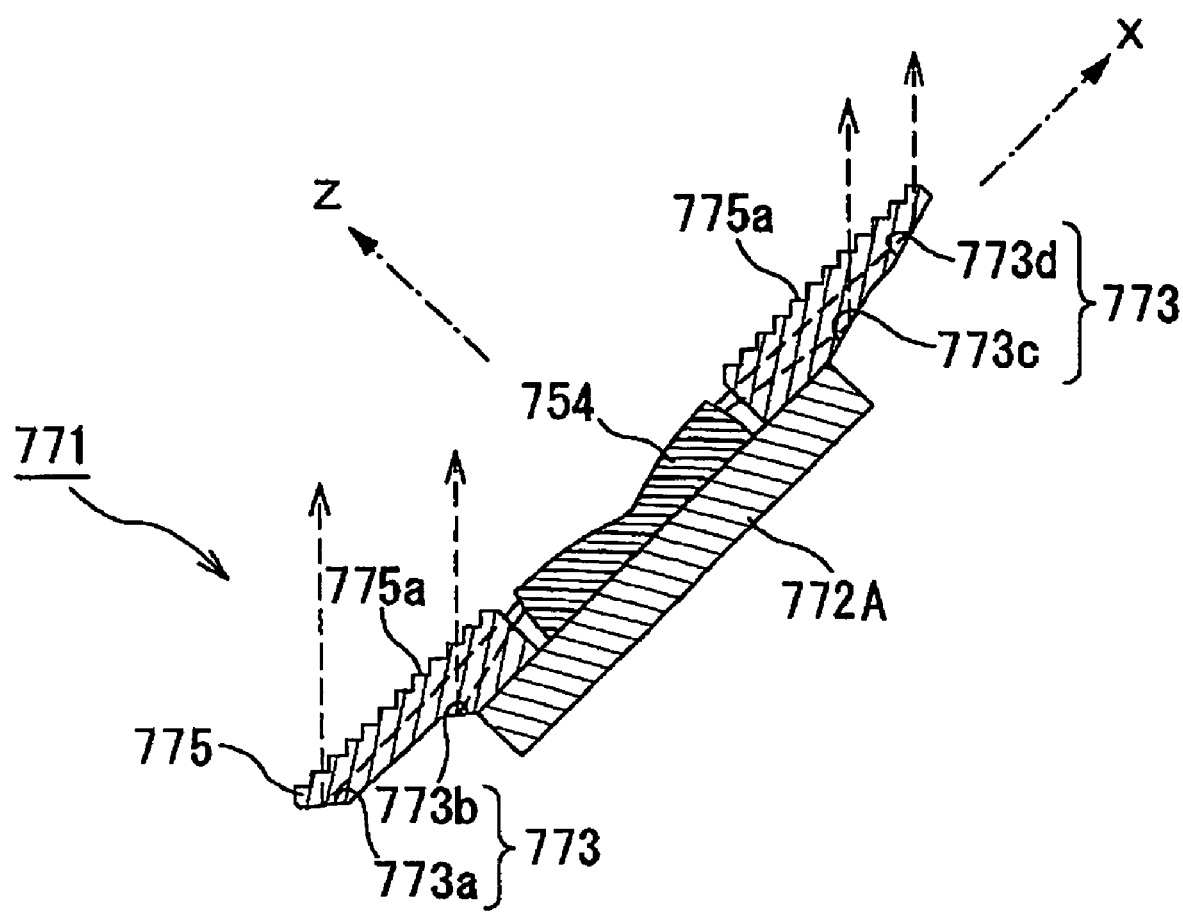
FIG. 84 is a cross sectional view showing a light emitting unit in embodiment 7K of the invention.

As shown in FIG. 84, the light emitting unit 771 in embodiment 7K is, like embodiment 7J, composed such that an LED 754 as a light source to radiate planar light is disposed at the center of a board 772A as a main body. A transparent umbrella-shaped disk-like optical member 775 is disposed around the LED 754 on the board 772A. The optical member 775 has, at its bottom, reflection surfaces (optical control surfaces) 773a, 773b, 773c, 773d, . . . that its angles vary gradually such that a direction vector perpendicular to the optical control surface 773a at the lowest position has the largest angle to the Z-axis and a direction vector perpendicular to the optical control surface 773d at the highest position has the smallest angle to the Z-axis. Further, the optical member 775 has a stepwise top surface, and a staircase surface 775a in the horizontal direction is nearly perpendicularly to the radiation direction of light from the LED 754 to be reflected on the reflection surfaces 773a, 773b, 773c, 773d, . . . .

The light emitting unit 771 thus composed is operated such that light to be radiated 360 degrees nearly in parallel with the X-axis direction from the LED 754 is entered to the optical member 775 and reflected by the first reflection surface 773 upward in the vertical direction. Since the horizontal surface of stepwise top surface is nearly perpendicular to the vertical direction in FIG. 84, reflected light is directly radiated in the vertical direction in FIG. 84 with high external radiation efficiency, without being refracted by the optical member 775.

Thus, the light emitting unit 771 in embodiment 7K is low-profile, and capable of being disposed along an inclined section and offering high external radiation efficiency. Although in embodiment 7K the first reflection surface of optical member 775 gives total reflection, the first reflection surface 773 may have metal plating, metal evaporation etc. formed thereon.

Embodiment 7L

A light emitting unit in embodiment 7L of the invention will be explained below with reference to FIG. 85.

Figure 85:
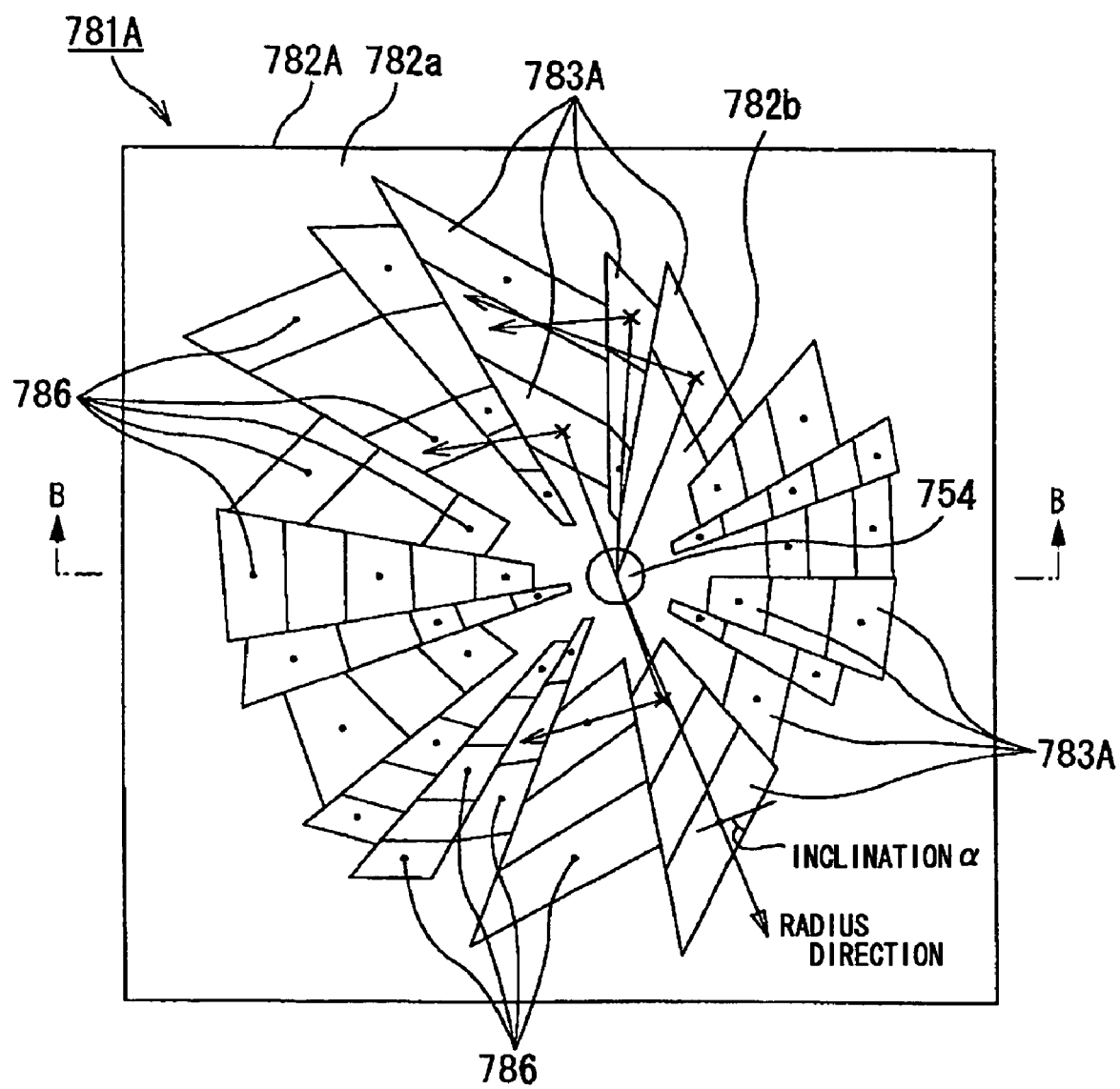
FIG. 85 is a plain view showing the light emitting unit in embodiment 7L of the invention.

As shown in FIG. 85, the light emitting unit 781A in embodiment 7L is composed such that a reflection plate 782A has a first reflection surface 783A that is an integration of multiple optical control surfaces. An LED 754 similar to that in embodiments 7J, 7K is disposed at the center of a bottom surface 782a of the reflection plate 782A. The light emitting unit 781A in embodiment 7L is composed such that the angle and direction of each optical control surface is set to allow light reflected by the multiple optical control surfaces to head to the same direction. Herein, "angle" means an angle of planar light from the LED 754 as a light source to the light radiation surface and "direction" means an angle to the light radiation direction of LED 754.

For example, as shown in FIG. 85, even when the "angle" of optical control surface is 45 degrees, if the "direction" thereof is not perpendicular to the radius direction of LED 754 but inclined α degrees, then the direction of reflected light is slanted not directly over (toward over the sheet surface of FIG. 85). As a matter of course, the direction of reflected light can be freely changed by changing the "angle" of optical control surface. By suitably setting the "angle" and "direction" of each optical control surface, light can be uniformly reflected in a slanted direction. Thereby, the mount of light in that direction increases a great deal and, therefore, the external radiation efficiency increases.

Although the LED in the above embodiments uses a red light emitting element, whatever color light emitting element it may use. Although the transparent material to seal the light emitting element etc. in LED is transparent epoxy resin, the other material such as transparent silicon resin may be used.

The composition, shape, number, material, dimensions, connection form etc. of the other part in the light emitting unit are not limited to those described in the above embodiments.

Embodiment 7M

An automobile combination lamp in embodiment 7M of the invention will be explained below with reference to FIG. 86.

Figure 86:
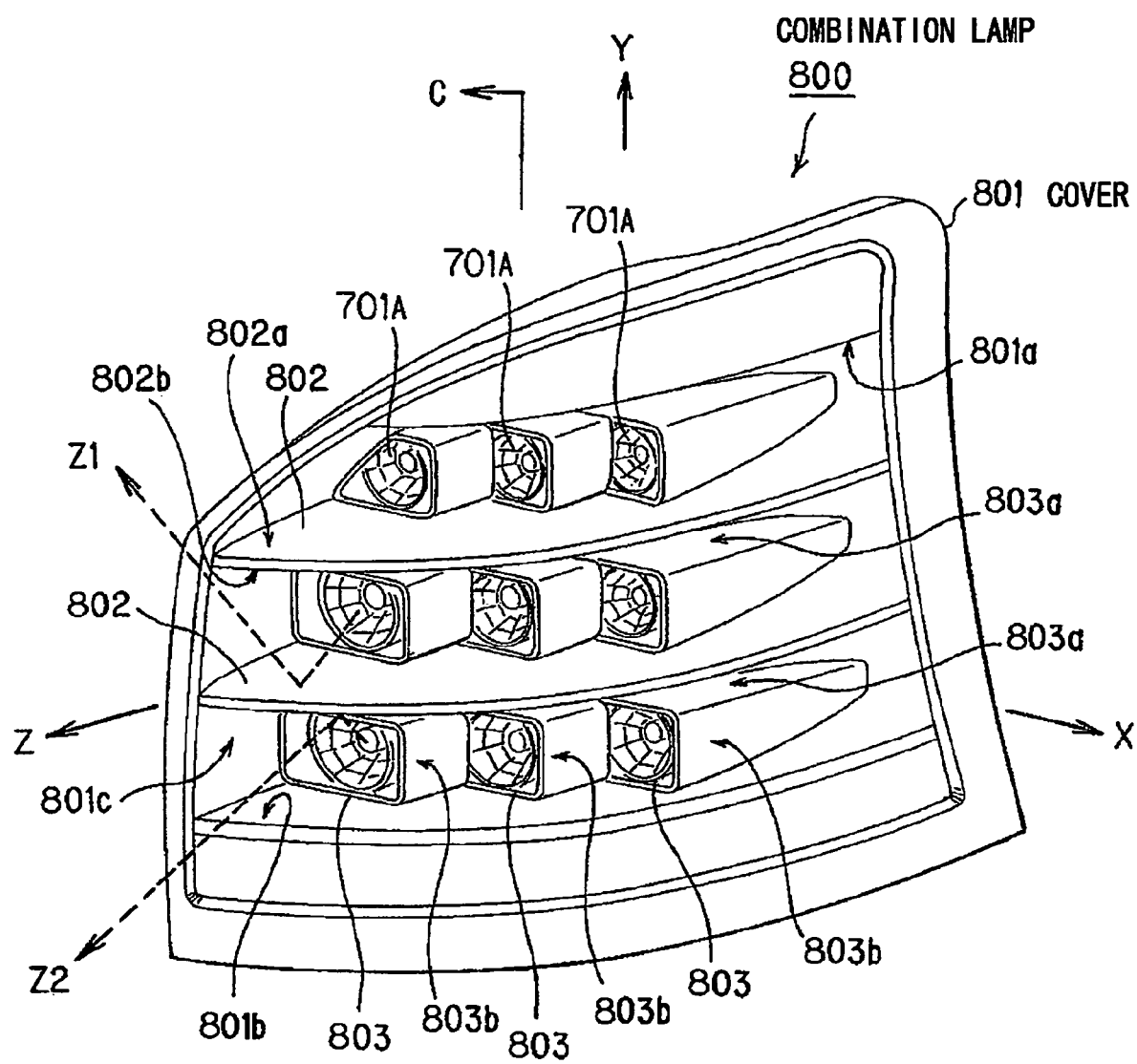
FIG. 86 is a perspective view showing an automobile combination lamp in embodiment 7M of the invention.

As shown in FIG. 86, the combination lamp 800 is composed such that, in a cover 801 that is open from a front surface in a direction shown by an arrow Z to a side surface in a direction shown by an arrow X and has a hollow interior, two partition plates 802 are disposed horizontally and in parallel to divide the interior into three levels at equal intervals, and three bases 803 are laterally arrayed at each level, and an LE light 701A is attached to the front side of each base 803. Aluminum evaporation is formed on the ceiling surface 801a, bottom surface 801b and side surface 801c in the interior wall of cover 801, on the top surface 802a and bottom surface 802b of partition plate 802, and on the top surface 803a and side surface 803b of base 803. In other words, the interior of cover 801 is all formed of aluminum evaporation.

Figure 87:
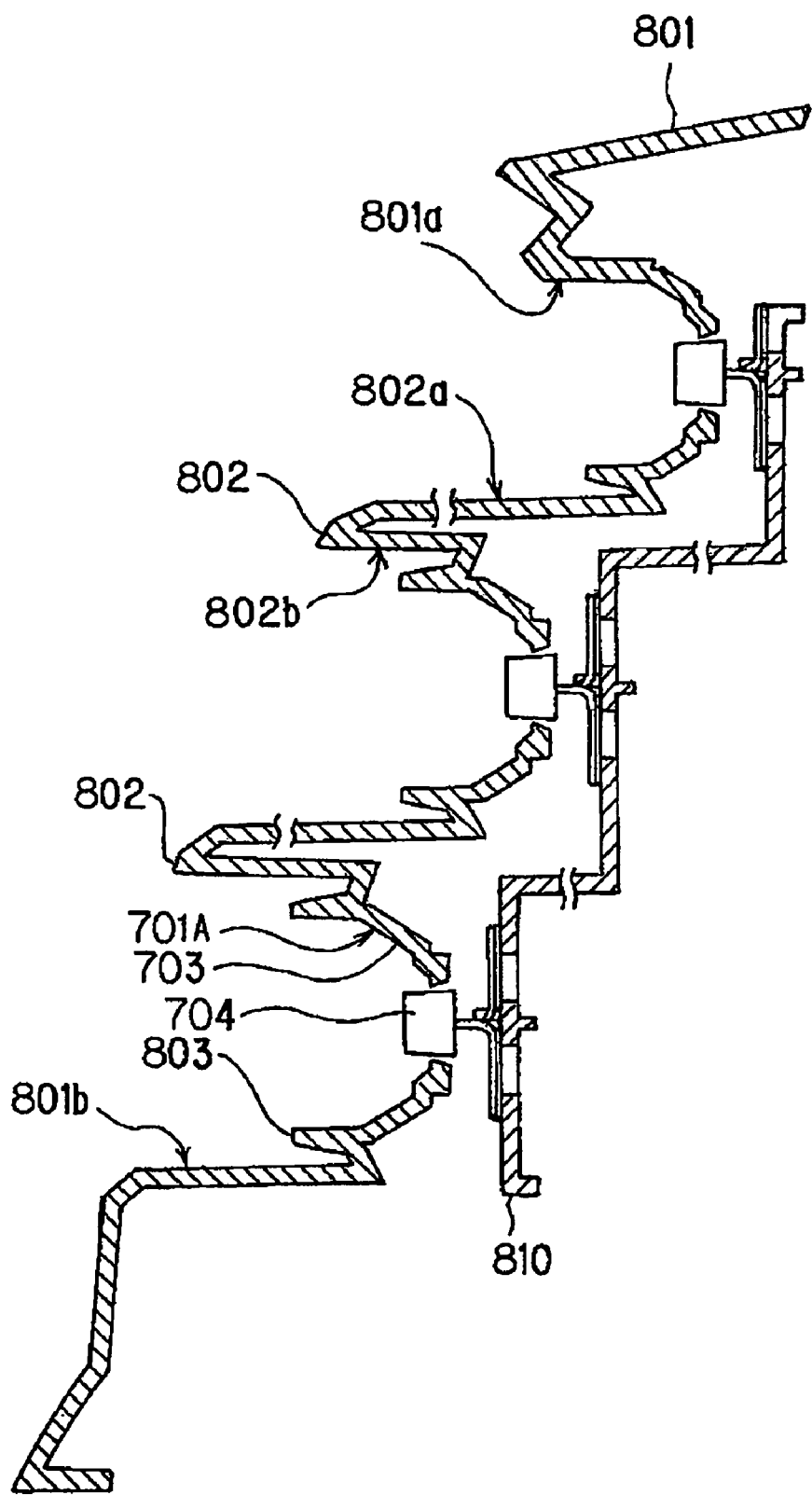
FIG. 87 is a cross sectional view cut along the line C-C in FIG. 86.
Figure 88:
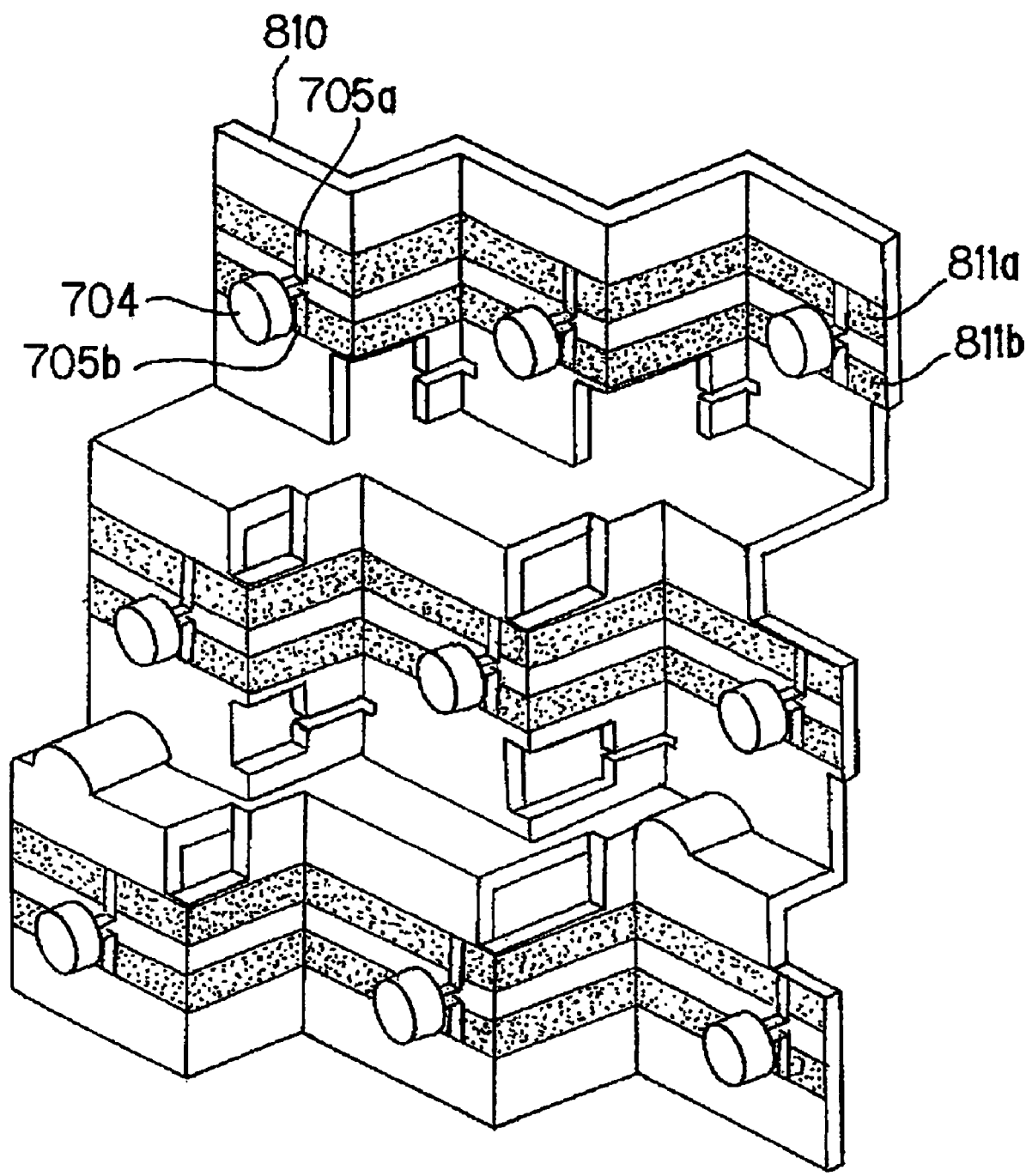
FIG. 88 is a perspective view showing an LED mounting board of the combination lamp in FIG. 87.

As shown in FIG. 87, which is a cross sectional view cut along the line C-C in FIG. 86, each LED light 701A is composed of a combination of LED 704 and reflection mirror 703. The LED 704 is attached to an LED attachment board 810. The LED attachment board 810 is, as shown in FIG. 88 as a perspective view, such composed that it has a shape corresponding to the back side of bases 803 that are arrayed three-levels, three-rows in the cover 801, and that two separate wiring patterns 811a, 811b formed by evaporation of aluminum, copper etc. are formed in parallel at each level. A pair of lead frames 705a, 705b is welded to the wiring patterns 811a, 811b. The LED attachment board 810 with the wiring patterns 811a, 811b formed thereon has a symmetrical structure.

Figure 89:
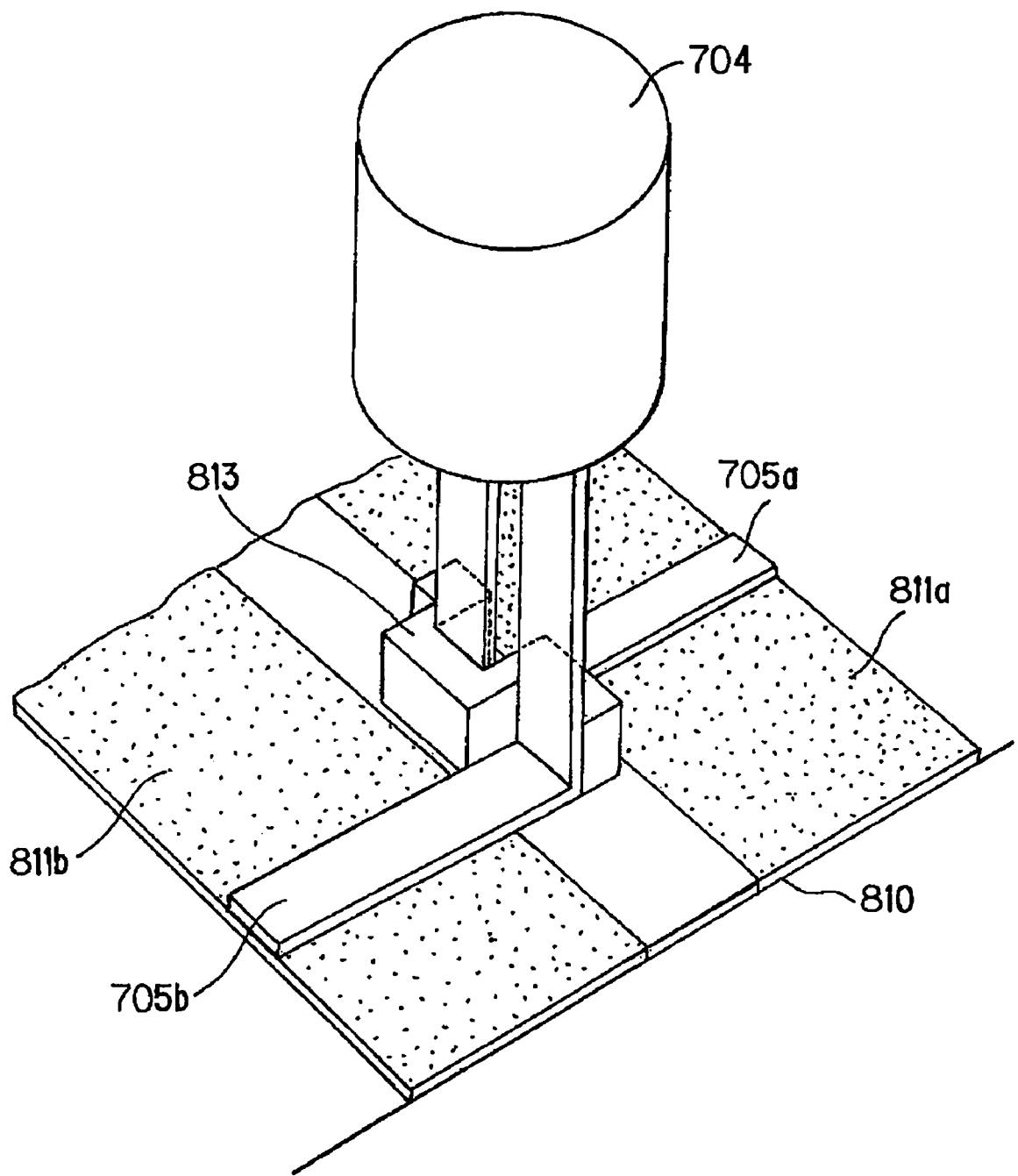
FIG. 89 is an enlarged perspective view showing an LED mounting part of the LED mounting board in FIG. 88.

The lead frames 705a, 705b are attached positioned corresponding to the LED 704 to be protruded through a penetration hole at the center of each reflection mirror 703 as shown in FIG. 87. They are fixed as shown in FIG. 89. Namely, a cranked LED attachment 813 of insulating material is fixed at a predetermined position in the LED attachment board 810, and the lead frames 705a, 705b can be positioned corresponding to the penetration hole of reflection mirror 703 by fitting them in the concave portion of LED attachment 813. After the fixing, the lead frames 705a, 705b are welded to the wiring patterns 811a, 811b.

Then, the LED attachment board 810 thus made by welding is, as shown in FIG. 87, placed at the back side of cover 801 and moved forward while positioning the LED 704 at the penetration hole of each reflection mirror 703. Thereby, the attachment is completed. Thus, the attachment can be conducted easily.

Figure 52:
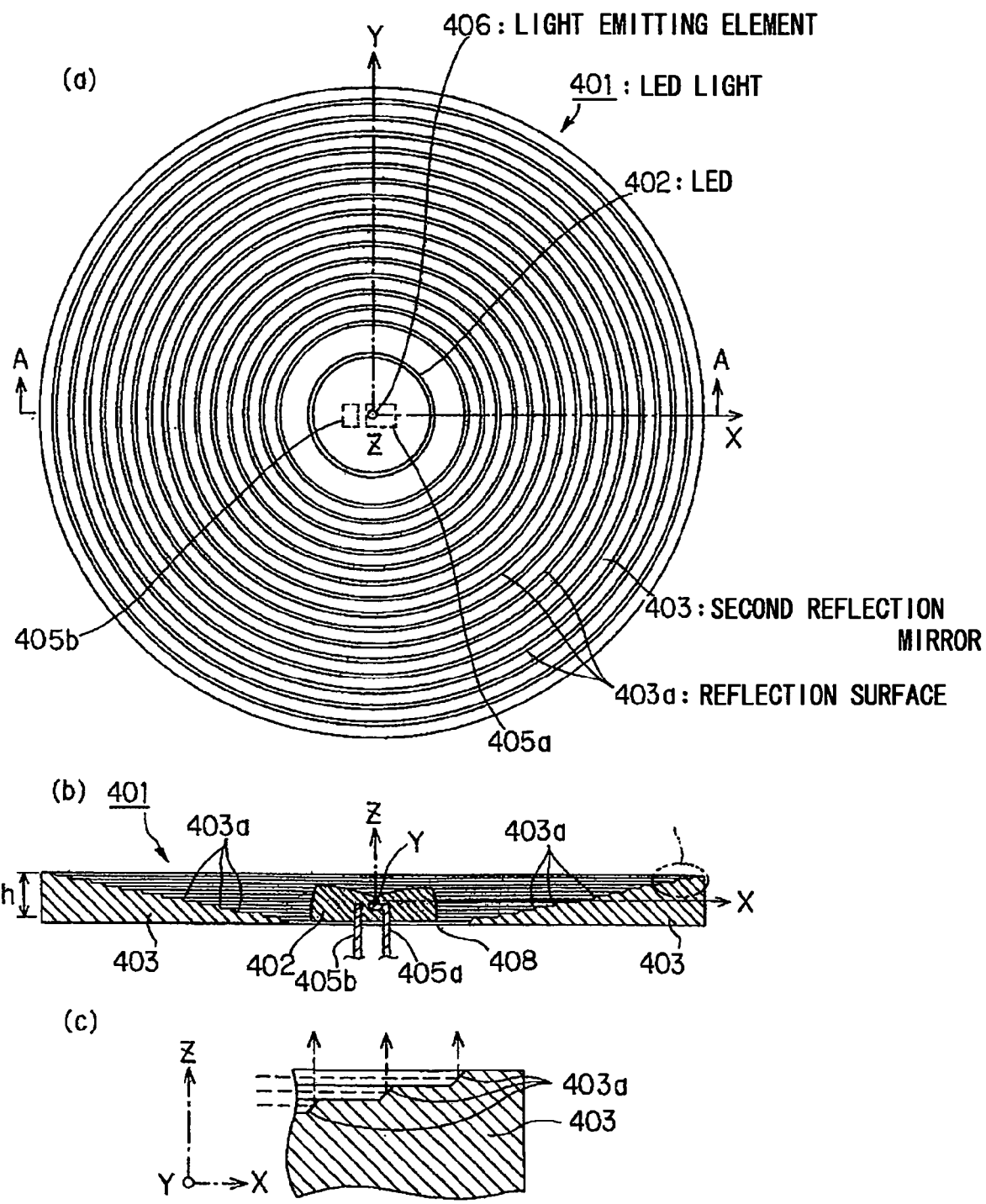
FIG. 52(a) is a plain view showing an LED light using an LED in embodiment 4A of the invention, (b) is a cross sectional view cut along the line A-A in (a), and (c) is an enlarged cross sectional view showing part P in (b).

The composition and radiation principle of LED light 701A are about the same as those in embodiment 4 as shown in FIG. 52 and its explanation is omitted here.

In this embodiment, light directly radiated from the light source (LED 704) is radiated without being blocked on the way as in the conventional one and, further, radiated light is efficiently reflected by all the inner surface of cover 801. Therefore, the combination lamp 800 can have an increased brightness, and the visibility of light not only in the back direction of automobile but also in the vertical and lateral directions thereof can be enhanced.

Embodiment 7N

An automobile rear combination lamp 800A in embodiment 7N of the invention will be explained below with reference to FIG. 90. Like components are indicated by the same numerals used in embodiment 7M and its explanation is omitted.

The combination lamp 800A is composed such that three LED lights 701A, each of which is formed elliptic and has a second reflection mirror 703 as a peripheral reflector and LED 704, are laterally disposed into an array and three arrays are vertically disposed while being fixed to a base 803. The rear combination lamp has a cover 801 of transparent resin on the front side. The cover 801 has a light reflection surface formed by aluminum evaporation at the interior.

Figure 91:
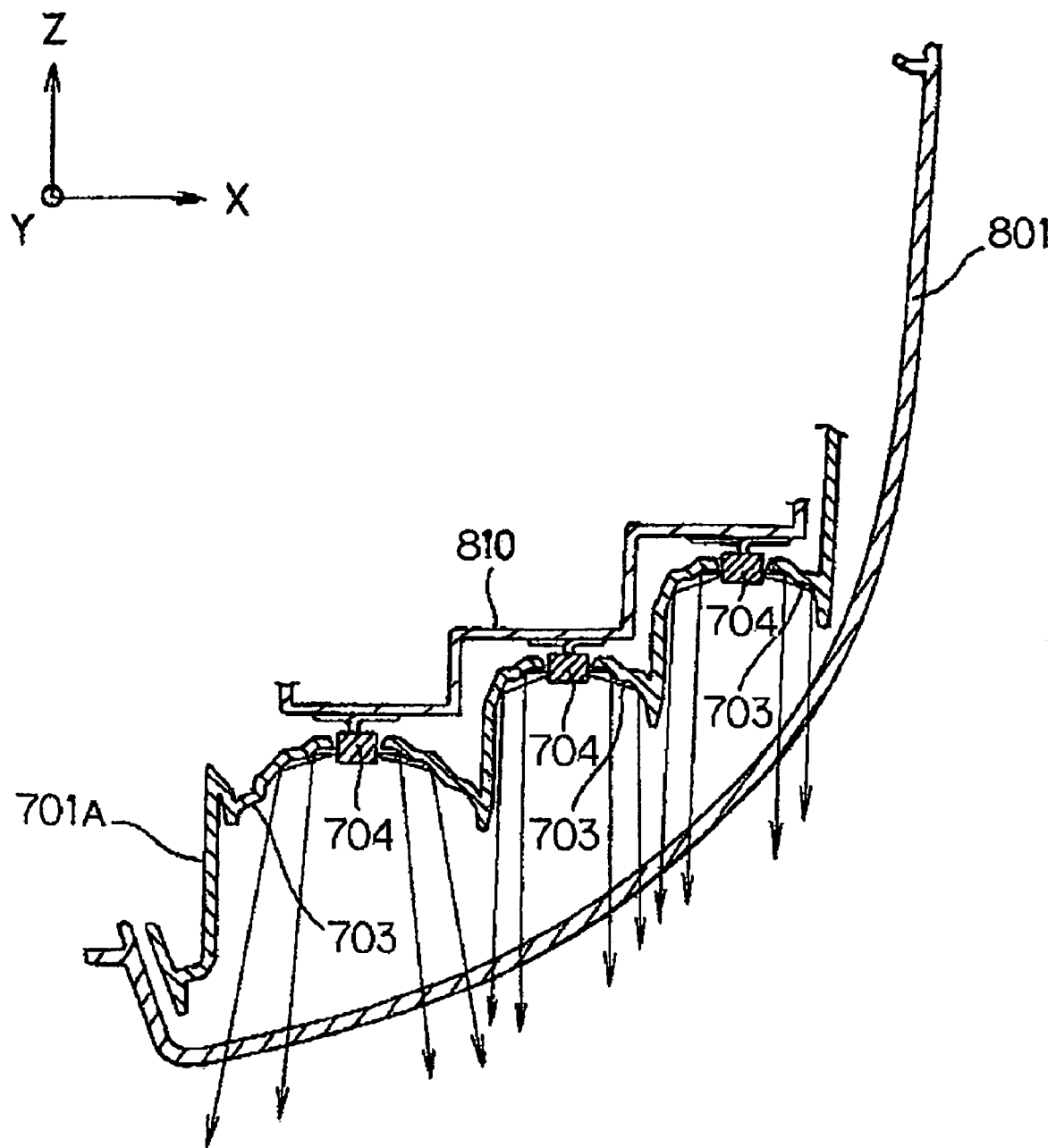
FIG. 91 is a cross sectional view cut along the line J-J in FIG. 90.

FIG. 91 is a cross sectional view cut along the line J-J in FIG. 90. The LED light 701A is disposed such that its part is overlapped in its depth direction (Z direction), and an LED light 701A on the left is disposed forward of an LED light on the right.

The second reflection mirror 703 is composed such that multiple reflection surfaces are concentric disposed around the LED 704.

The LED 704 is electrically connected to an attachment board disposed behind and is disposed at a predetermined position to the second reflection mirror 703.

In embodiment 7N, since the multiple elliptic LED lights 701A are disposed overlapped in the depth direction in the cover 801, a novel visual appearance can be obtained based on the reflection pattern when the LED light 701A is turned on. Even when the LED light 701A is not turned on (e.g., at noon), light to be entered through the cover 801 from outside is reflected by the light reflection surface including the second reflection mirror 703 of rear combination lamp and, thereby, a novel visual appearance with a depth feel can be offered. Meanwhile, the number and arrangement of LED light 701A are not limited to those as shown. The same is equally true of the disposition thereof. For example, an LED light 701A at the center of an array may be disposed forward or backward of the two neighboring LED lights 701A.

Since the light distribution characteristic of lamp can be secured by the optical control based on reflection of the second reflection mirror 703 without using another optical part such as a lens, the cover 801 can have a plain structure and therefore light with a transparent feel can be radiated in operation. Even when not in operation, the interior of cover 801 can be seen and therefore a novel visual appearance can be obtained based on the shape of the second reflection mirror 703. The cover 801 may be colorless, or colored, e.g. in red, yellow, orange etc.

Alternatively, the light distribution characteristic of lamp may be controlled by using another optical part such as a lens. For example, the cover 801 may have a lens formed at its transparent portion.

Embodiment 7P

Figure 92:
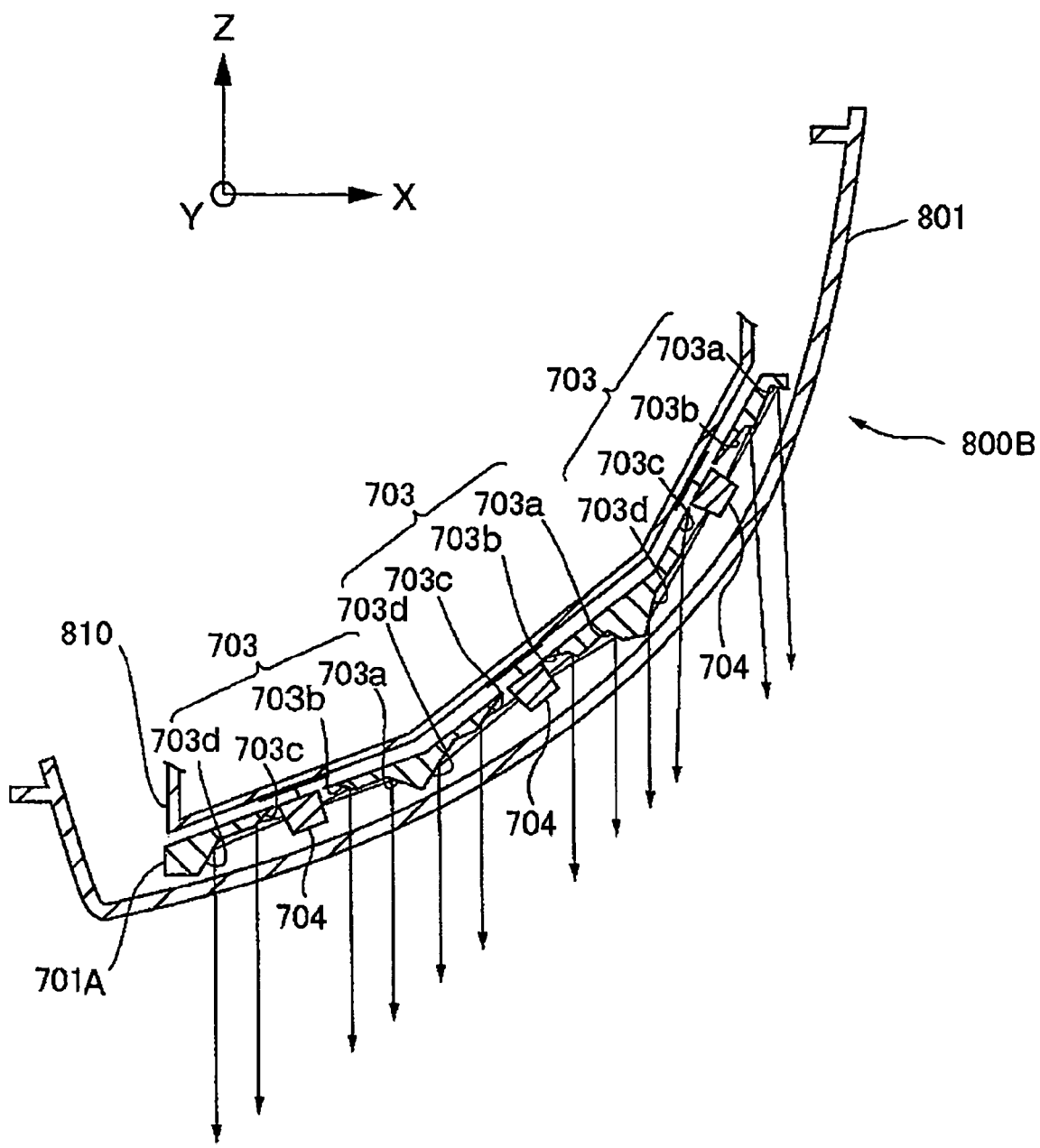
FIG. 92 is a cross sectional view showing an automobile combination lamp in embodiment 7P of the invention.

FIG. 92 is a cross sectional view showing an automobile rear combination lamp 800B in embodiment 7P of the invention.

The LED light 701A is, like embodiment 7J, composed that a second reflection mirror 703 with reflection surfaces 703a, 703b, 703c and 703d formed to radiate light with an inclination to the center axis direction of a light emitting element (not shown) in LED 704 is disposed along the inner surface of a cover 801. Although in FIG. 92 the second reflection mirrors 703 of LED light 701A are integrally formed, these may be separately formed along the inner surface of cover 801. The other composition is about the same as that in embodiment 7J, and like components are indicated by the same numerals used in embodiment 7J and its explanation is omitted.

In embodiment 7P, since the LED light 701A is disposed along the inner surface of cover 801, the low-profile rear combination lamp 800B can be offered while reducing the amount of protrusion to the body side.

Embodiment 8A

A lamp in embodiment 8A of the invention will be explained with reference to FIG. 93 to FIG. 96.

Figure 93:
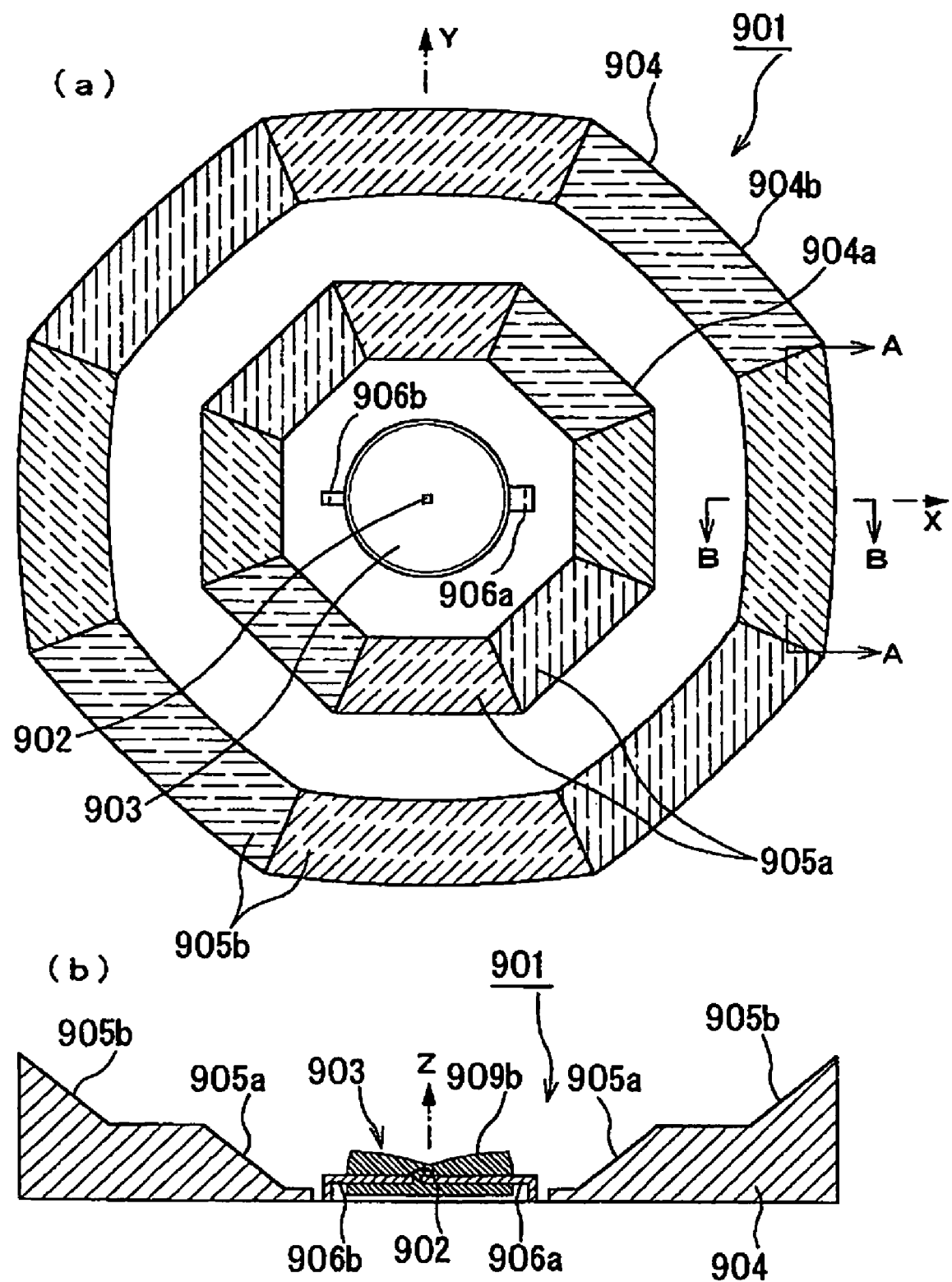
FIG. 93(*a*) is a plain view showing a lamp in embodiment 8A of the invention, and (b) is a cross sectional view thereof.

As shown in FIG. 93, the lamp 901 of embodiment 8A is composed such that an LED 903 as a light source with a light emitting element built therein is disposed at the center, and a reflector main body 904 is composed of reflectors 904a, 904b that are each composed of a plurality of segments 905a, 905b as shown by hatched regions. As shown in FIG. 93(b), the reflectors 904a, 904b have the segments 905a, 905b with a slope of about 45 degrees, and they upward reflect light being reflected in the two-dimensional direction by an optical surface 909b opposite to the emission surface of light emitting element 902 in LED 903.

Herein, two-dimensional direction means a direction from the LED 903 to the reflection surface of reflectors 904a, 904b with the segments 905a, 905b disposed around the LED 903. It is not strictly a planar direction perpendicular to the Z-axis from the LED 903 and means a direction that light from the LED 903 can be efficiently radiated to the reflection surface disposed around the LED 903.

Figure 94:
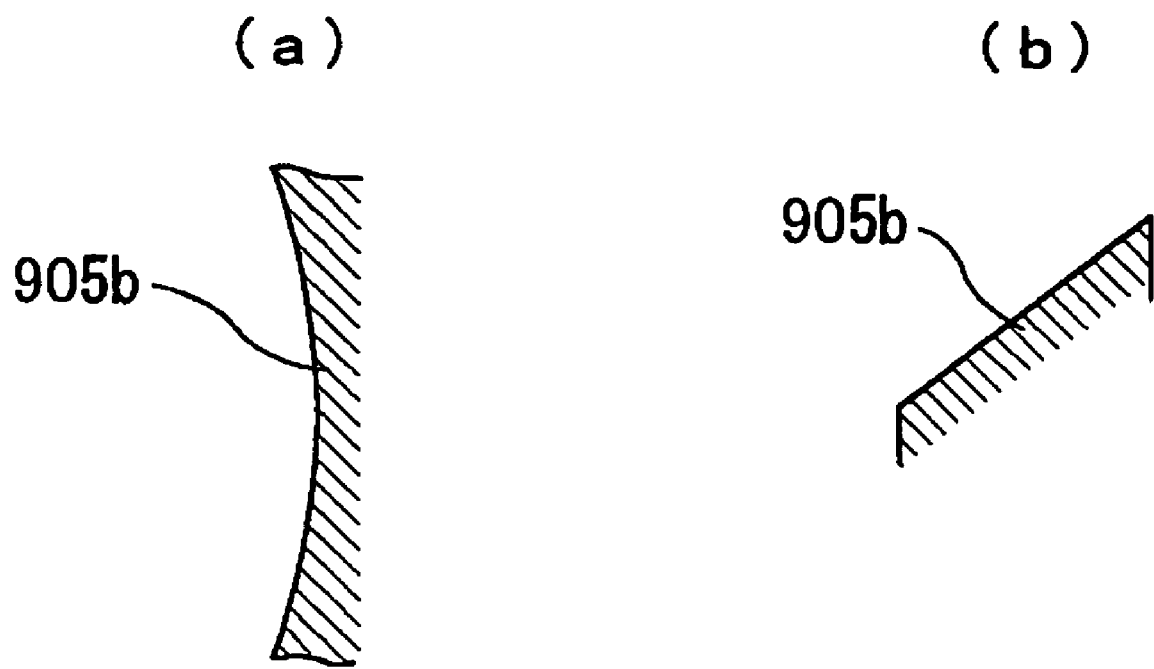
FIG. 94(*a*) is a cross sectional view cut along the line A-A to show a segment of the lamp in embodiment 8A of the invention, and (b) is a cross sectional view cut along the line B-B.

The reflector 904a at the inner circumference is close to the LED 903, the segments 905a of reflector 904a are all formed planar, and the eight segments 905a form a regular octagon. In contrast, the segments 905b of reflector 904b at the outer circumference are, as shown in FIG. 94, formed slightly concave in an A-A cross section thereof.

The composition and radiation principle of LED 903 are about the same as those of LED in embodiment 1A as shown in FIG. 12 or in embodiment 2A as shown in FIG. 26, and its explanation is omitted here.

Since the reflector 904a with a slope of about 45 degrees is around the LED 903, light reflected by the top surface 909b is nearly in parallel with the X-Y plane and light directly radiated from the side surface 910 is about in parallel with the X-Y plane, light reflected by the reflector 904a proceeds upward nearly vertically and is externally radiated at least in the range of 20 degrees from the Z-axis. Although even light represented as "parallel" in the above explanation is not perfectly parallel since the light emitting element 902 has a size, any light thereof is radiated nearly in parallel and is surely included at least in the range of 20 degrees from the Z-axis.

On the other hand, although light radiated in the two-dimensional direction from the LED 903 is also reflected by the reflector 904b at the outer circumference, since the reflector 904b is concaved in the longitudinal direction as described above, such light is upward reflected while being converged and enhanced in brightness. Thereby, although the intensity of light is attenuated in reverse proportion to the square of a distance from the light source, reflected light of the reflector 904a with a small attenuation ratio due to being not distant from the light-source LED 903 is upward reflected without being converged by the plane reflector 904a. In contrast, reflected light of the reflector 904b with a large attenuation ratio due to being distant from the light-source LED 903 is upward reflected while being converged by the concave reflector 904b. Meanwhile, light externally radiated in the Z-axis direction from the central radiation surface 909a at the center of LED 903 is directly radiated externally without being irradiated to the reflector 904 disposed around the LED 903.

Since the light emitting element is LED to covert electric energy directly into optical energy, no part thereof becomes hot like a filament of bulb. Further, since the size of light emitting element is very small, the optical control efficiency can be enhanced. Further, since the LED itself has the reflection mirror to radiate light from the light emitting element in the two-dimensional direction and this reflection mirror is molded sealing the light emitting element with transparent epoxy resin, the number of parts is decreased as compared to conventional LED's. It is made easier to conduct the positioning between the light emitting element and the reflection mirror to radiate light in the two-dimensional direction. Thus, a high precision in positioning can be obtained easily.

As a result, in viewing from the top (from a distant position in the Z-axis direction), direct light from the LED 903 and radiated light from the segments being controlled of convergence allow the entire lamp 901 to have an even brightness and a natural feel with glitter. Further, the lamp 901 can reflect external light even when it is turned off and thereby can offer a good appearance with glitter evenly on the entire surface.

Figure 95:
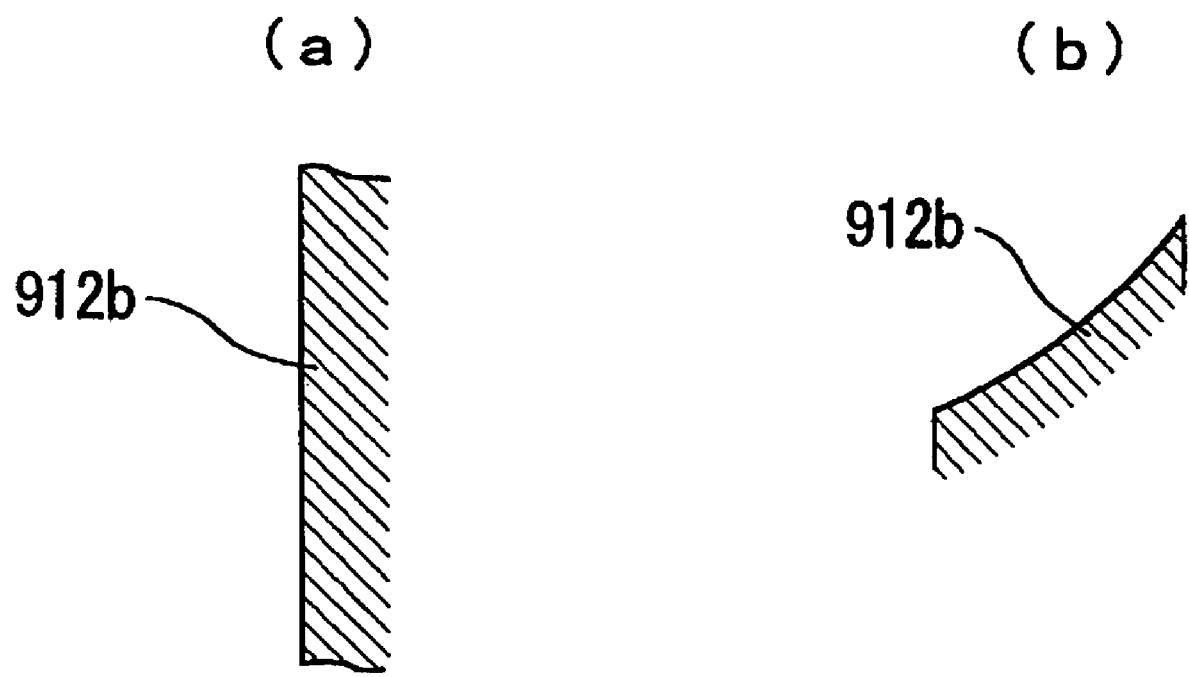
FIG. 95(*a*) is a cross sectional view cut along the line A-A to show a segment of a modification of the lamp in embodiment 8A of the invention, and (b) is a cross sectional view cut along the line B-B.

Modifications of the lamp 901 in embodiment 8A will be explained below with reference to FIG. 95 and FIG. 96. One modification in FIG. 95 is composed such that the segment 905b of reflector 904 does not have a concave surface in A-A direction and has a concave surface in B-B direction. Another modification in FIG. 96 is composed such that the segment has a concave surface in both directions. Both modifications need a convergence characteristic at the outer reflector 904b.

Alternatively, the inner segment 905a may be formed convex and the outer segment 905b may be formed planar, thereby allowing the inner reflected light to be diffused to equalize the entire brightness. This modification is suitable for the case that a wider light distribution than the lamp 901 of embodiment 8A is needed or the case that the solid angle of reflector segment to the light source is small. Further modifications are that three ring-like reflectors are provided as a convergence reflection surface or a diffusion reflection surface while changing the curvature according to a radiation density from the light source to each segment, and that the number of segments in the outer reflector is greater than that in the inner reflector. For example, the outer reflector 904b may have a higher brightness than the reflector close to the LED 903.

Thus, the lamp of this embodiment can be low-profile, highly efficient, and can have a large degree of freedom in appearance, an even brightness on the entire surface and a natural feel with glitter.

Embodiment 8B

A lamp in embodiment 8B of the invention will be explained with reference to FIG. 97.

Figure 97:
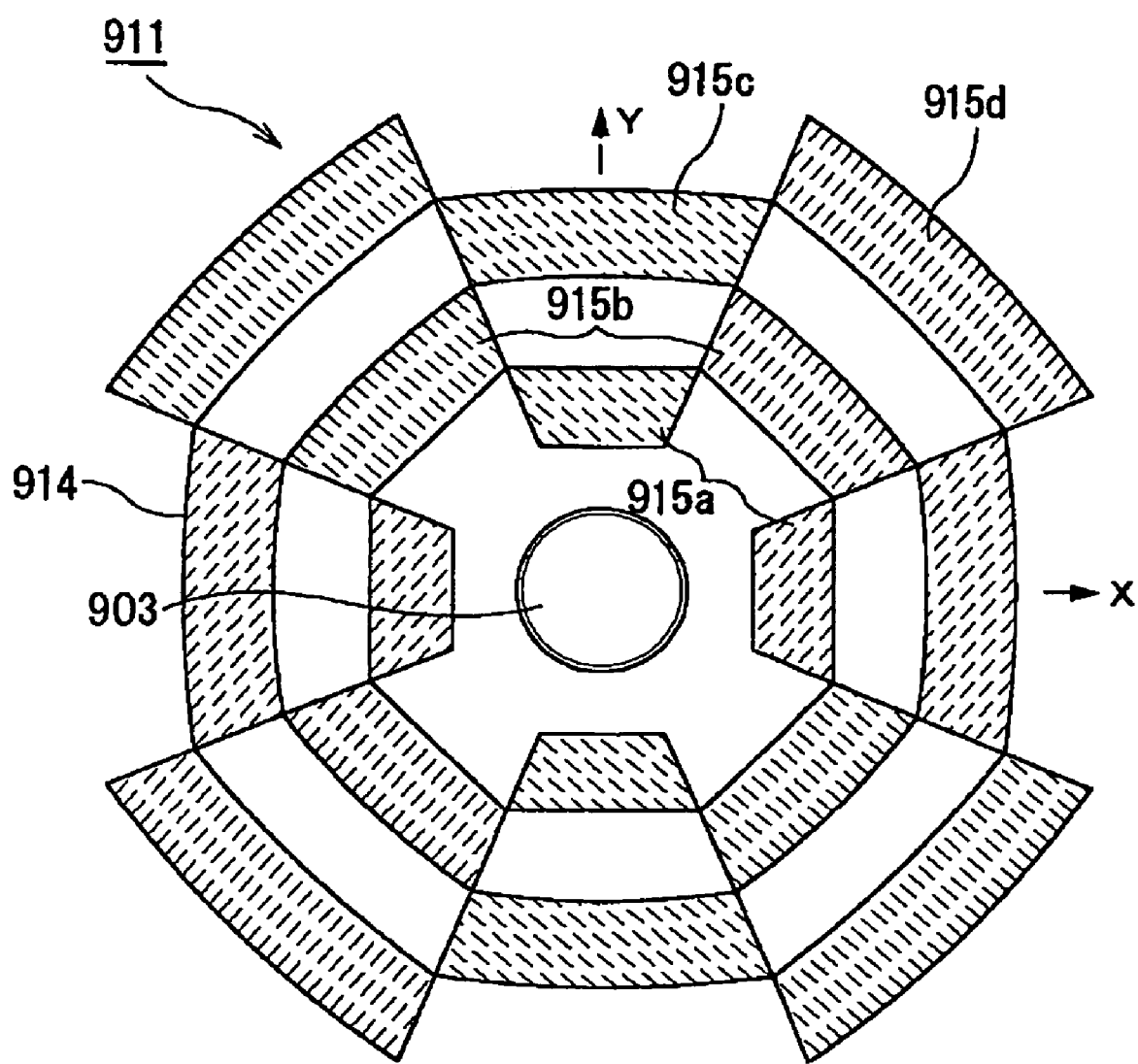
FIG. 97 is a plain view showing a lamp in embodiment 8B of the invention.

As shown in FIG. 97, the lamp 911 of embodiment 8B is composed such that the distance from the center is differentiated between laterally neighboring segments. Namely, around the LED 903 as a light source like that in embodiment 8A, segments 915a disposed at the nearest position, segments 915b alternately disposed at the next position, segments 915c alternately disposed at the next position, and segments 915d alternately disposed at the next position, thus, being step by step distant from the LED 903. By thus disposing the segments 915a, 915b, 915c and 915d of reflector, the luminescent point of lamp 911 can be further dispersed. Further, by allowing the segments 915a, 915b, 915c and 915d to have a curvature according to the radiation density from the LED 903, the entire lamp 911 can have an even brightness.

The neighboring segments need not to be perfectly alternately disposed as descried above, they may be displaced each other to some extent (e.g., about half the width of segment). Even in this case, the luminescent point of lamp 911 can be dispersed to some extent.

Embodiment 8C

A lamp in embodiment 8C of the invention will be explained with reference to FIG. 98.

Figure 98:
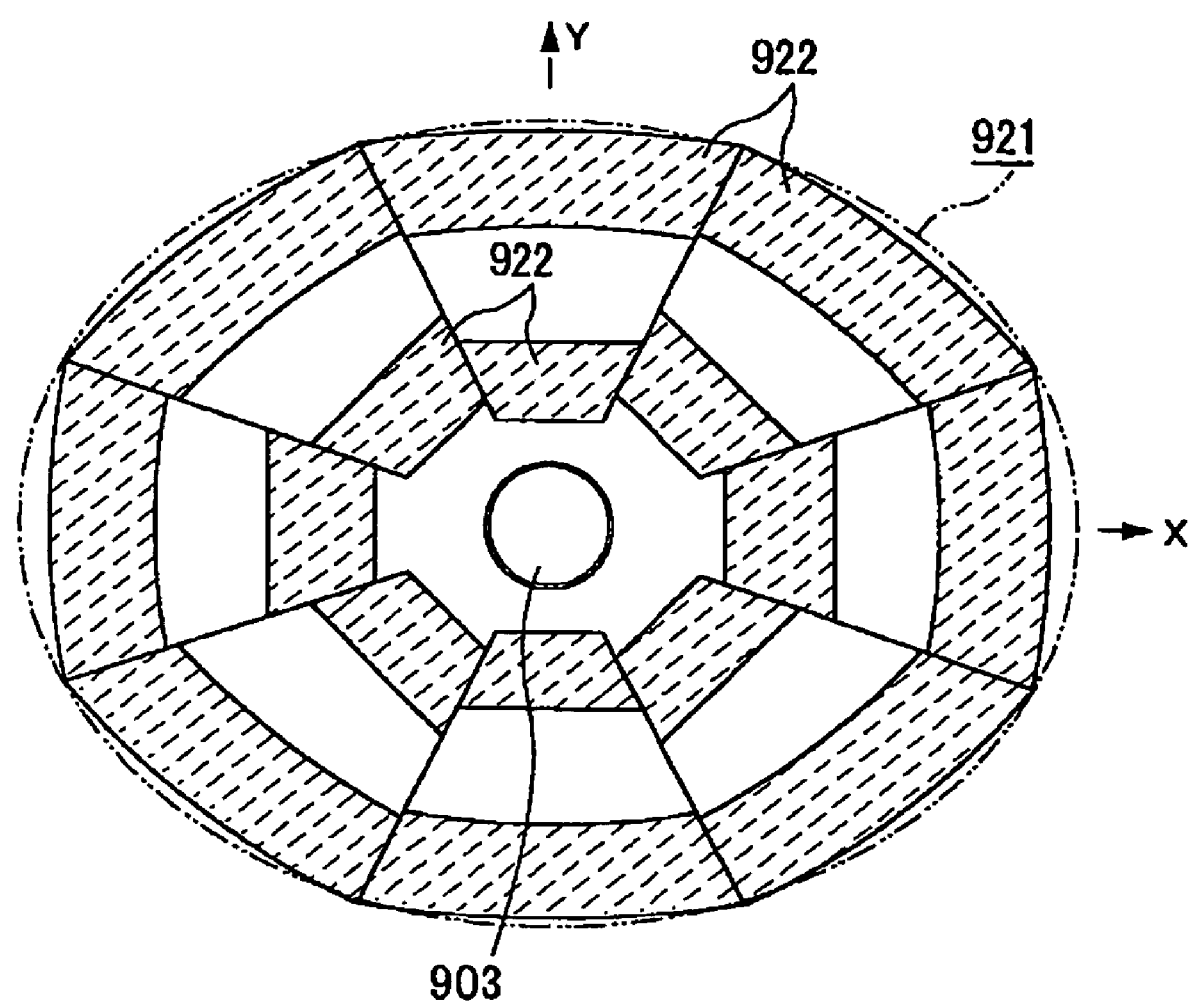
FIG. 98 is a plain view showing a lamp in embodiment 8C of the invention.

As shown in FIG. 98, the lamp 921 of embodiment 8C is composed such that a nearly elliptic radiation surface is formed by reflector segments 922 arrayed at two stages. The LED 903 as a light source like that in embodiment 8A is disposed at the center, and the segments 922 are arrayed at two stages around the LED 903 to form an ellipse. Further, by allowing the segments 922 to have a curvature according to the radiation density from the LED 903, the entire lamp 921 can have an even brightness.

Thus, the lamp of this embodiment can be low-profile, highly efficient, and can have a large degree of freedom in appearance, and can be applied to an irregular shape such as ellipse without reducing the efficiency.

Embodiment 8D

A lamp in embodiment 8D of the invention will be explained with reference to FIG. 99.

Figure 99:
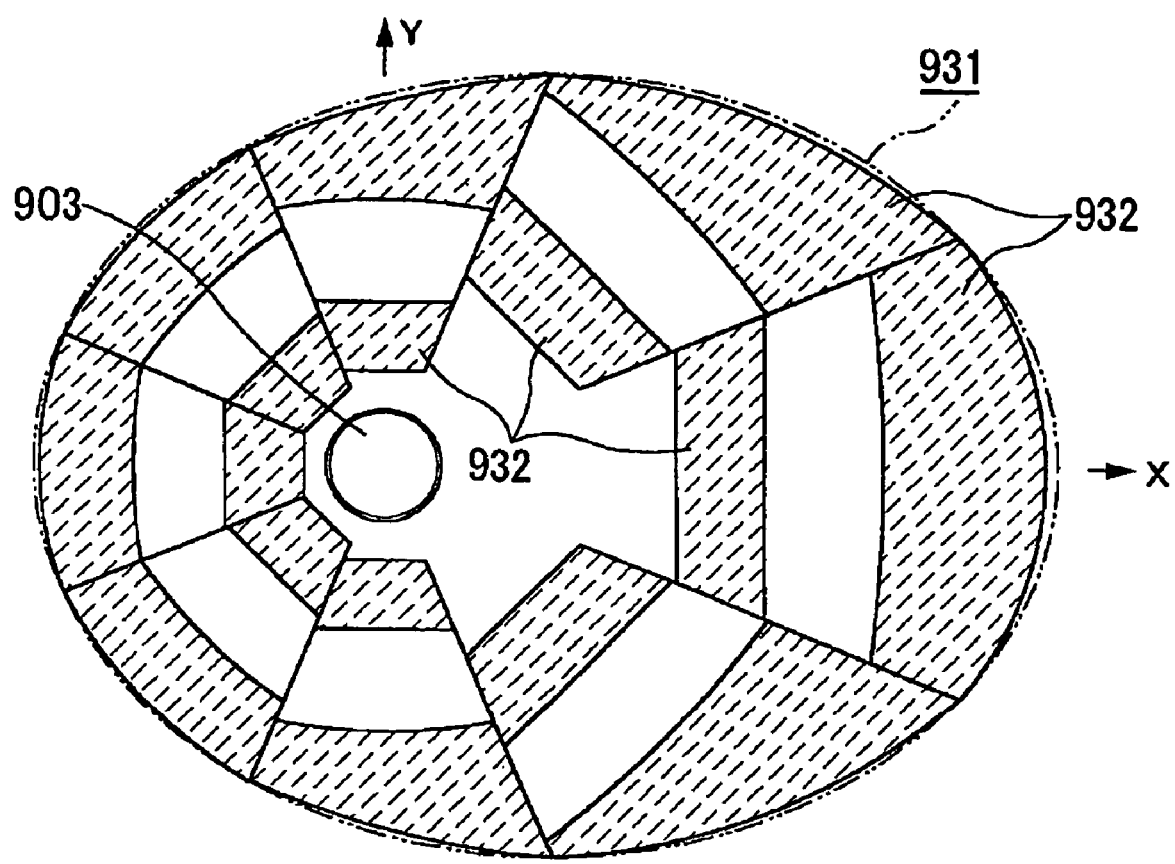
FIG. 99 is a plain view showing a lamp in embodiment 8D of the invention.

As shown in FIG. 99, the lamp 931 of embodiment 8D is composed such that an ellipse is formed by segments 932 but the position of LED 903 as a light source is displaced from the center. Thereby, although the position of each segment is also various, the entire lamp 931 can have an even brightness by allowing the segments 932 to have a curvature according to the radiation density from the LED 903. If an even radiation is given in the two-dimensional direction, the radiation density to each segment is in reverse proportion to the square of a distance from the light source to each segment. As described in earlier embodiment, in this embodiment 8D, the ratio in distance between a segment close to the light source and a segment distant therefrom is large and, therefore, a big difference between the radiation densities is generated. However, by making the segment convex, and by sequentially decreasing the curvature according to the distance and making the most distant segment planar, the brightness can be equalized.

Although in the above embodiments the brightness is equalized on the entire lamp by providing the segment with a curvature, the brightness may be not only equalized but also changed according to position. In brief, it is important that the brightness of lamp can be controlled by providing the segment with a curvature.

Embodiment 8E

A lamp in embodiment 8E of the invention will be explained with reference to FIG. 100.

Figure 100:
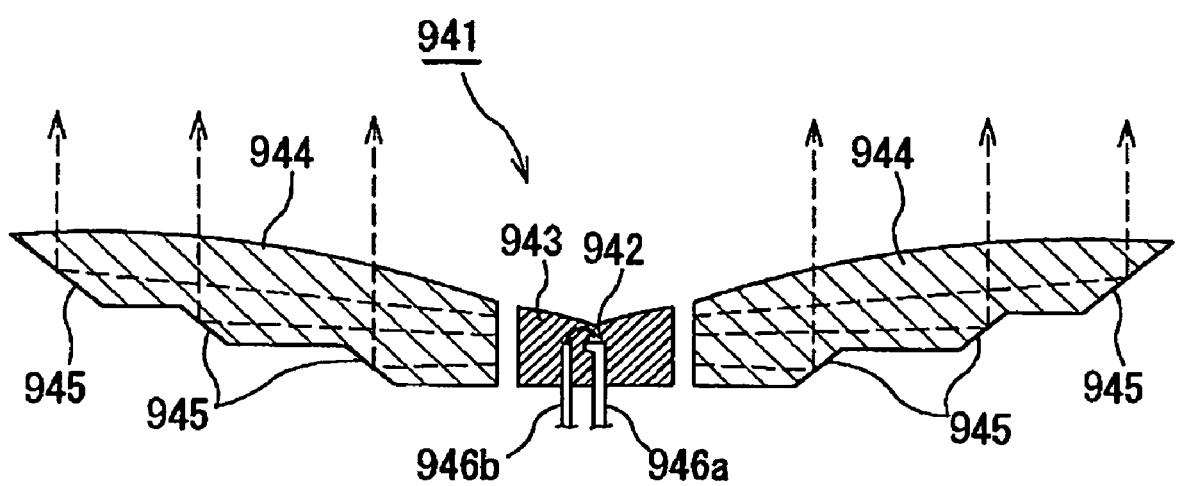
FIG. 100 is a cross sectional view showing a lamp in embodiment 8E of the invention.

As shown in FIG. 100, the lamp 941 of embodiment 8E is composed such that a disk-like transparent member 944 is disposed around an LED 943. The LED 943 is, different from the LED 903 in the above embodiments, composed such that a light emitting element 942 is mounted on the top surface of a lead 946a of a pair of leads 946a, 946b vertically disposed, the light emitting element 946 is electrically connected through a wire to the lead 946b, and these components are resin sealed into a shape like that of the LED 903. Also in the above embodiments, the LED 943 may be used instead of the LED 903.

Reflectors 945 are formed at three stages on the bottom surface of transparent member 944. The reflectors 945 are operated such that light being radiated in the two-dimensional direction from the LED 943 and then transmitted through the transparent member 944 is upward reflected by its total reflection. Each stage thereof is divided into eight segments, a segment with a high radiation density from the LED 943 being located nearby is set to have a low convergence characteristic, and a segment with a low radiation density from the LED 943 being located far is set to have a high convergence characteristic. Thereby, the lamp can have a balanced brightness and an even light radiation on the entire reflector.

Embodiment 8F

Figure 101:
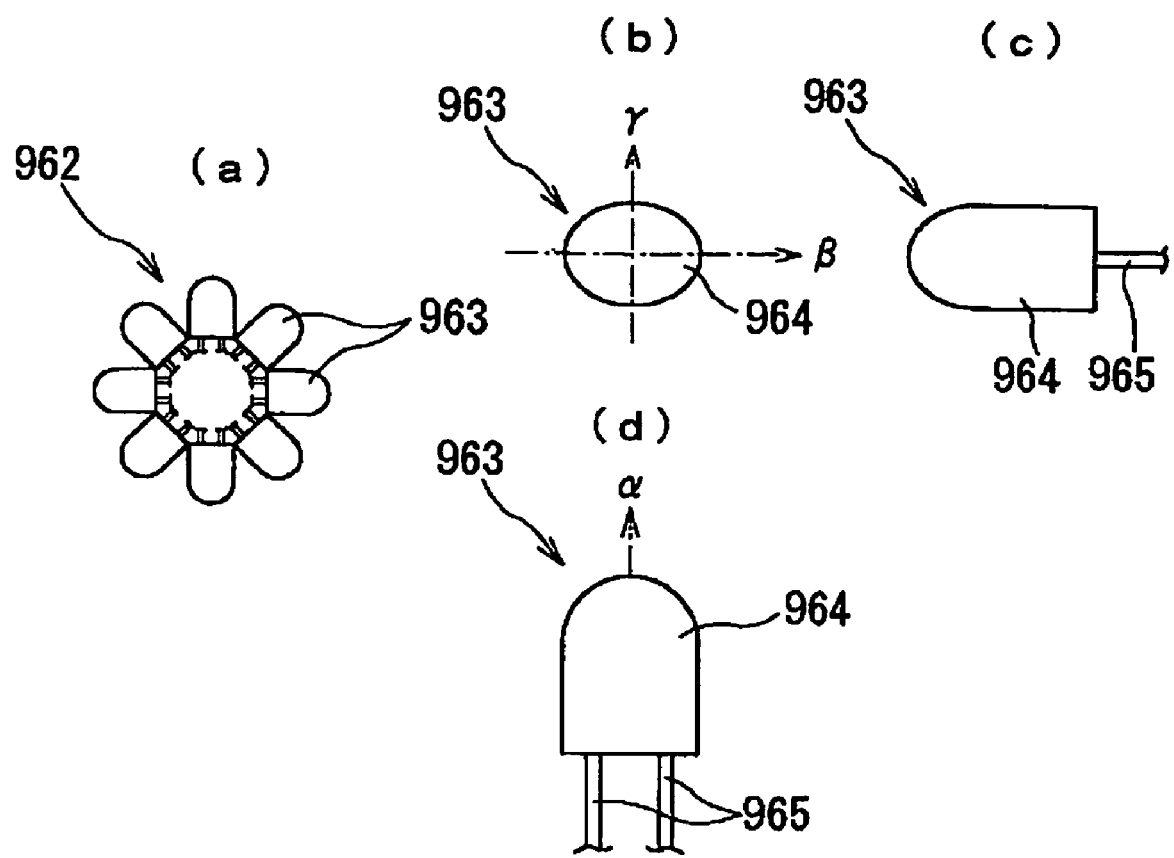
FIG. 101(*a*) is a plain view showing a radiation light source used for a lamp in embodiment 8F of the invention, (b) is a plain view showing a lens type LED to compose the radiation light source, (c) is a side view thereof, and (d) is a front view thereof.

A lamp in embodiment 8F of the invention will be explained with reference to FIG. 101.

As shown in FIG. 101(a), the lamp of embodiment 8F is composed such that, instead of the integrated type LED 903, 943, a radiation light source 962 is used that eight lens-type LED's 963 as a light source are disposed in the shape of an octagon while facing its radiation surface in the two-dimensional direction. As shown in FIGS. 101(b), (c) and (d), the lens type LED 963 has a sealing resin lens 964 that is wide in β direction and narrow in γ direction perpendicular thereto. The radiation light source 962 is composed such that the eight lens-type LED's 963 are arranged allowing its α-β plane to be located in the two-dimensional direction.

The lens-type LED 963 generate slightly diffused radiation light in β direction and nearly parallel radiation light in α direction. Thus, the radiation light source 962 can radiate light 360 degrees without interruption in the two-dimensional direction. If there is a big difference in distance to each reflector segment to be disposed around the radiation light source 962, the same effect as the above embodiments can be obtained.

Embodiment 8G

Figure 102:
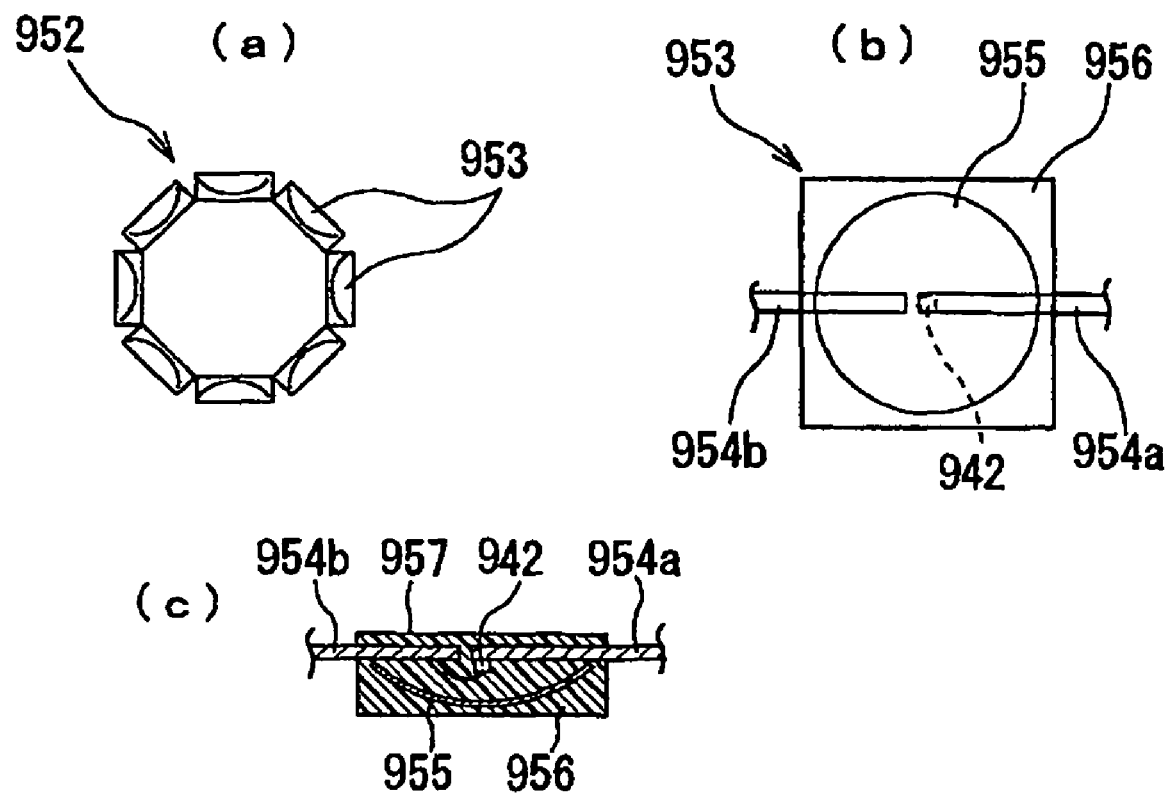
FIG. 102(*a*) is a plain view showing a radiation light source used for a lamp in embodiment 8G of the invention, (b) is a plain view showing a reflection type LED to compose the radiation light source, and (c) is a cross sectional view thereof.
Figure 103:
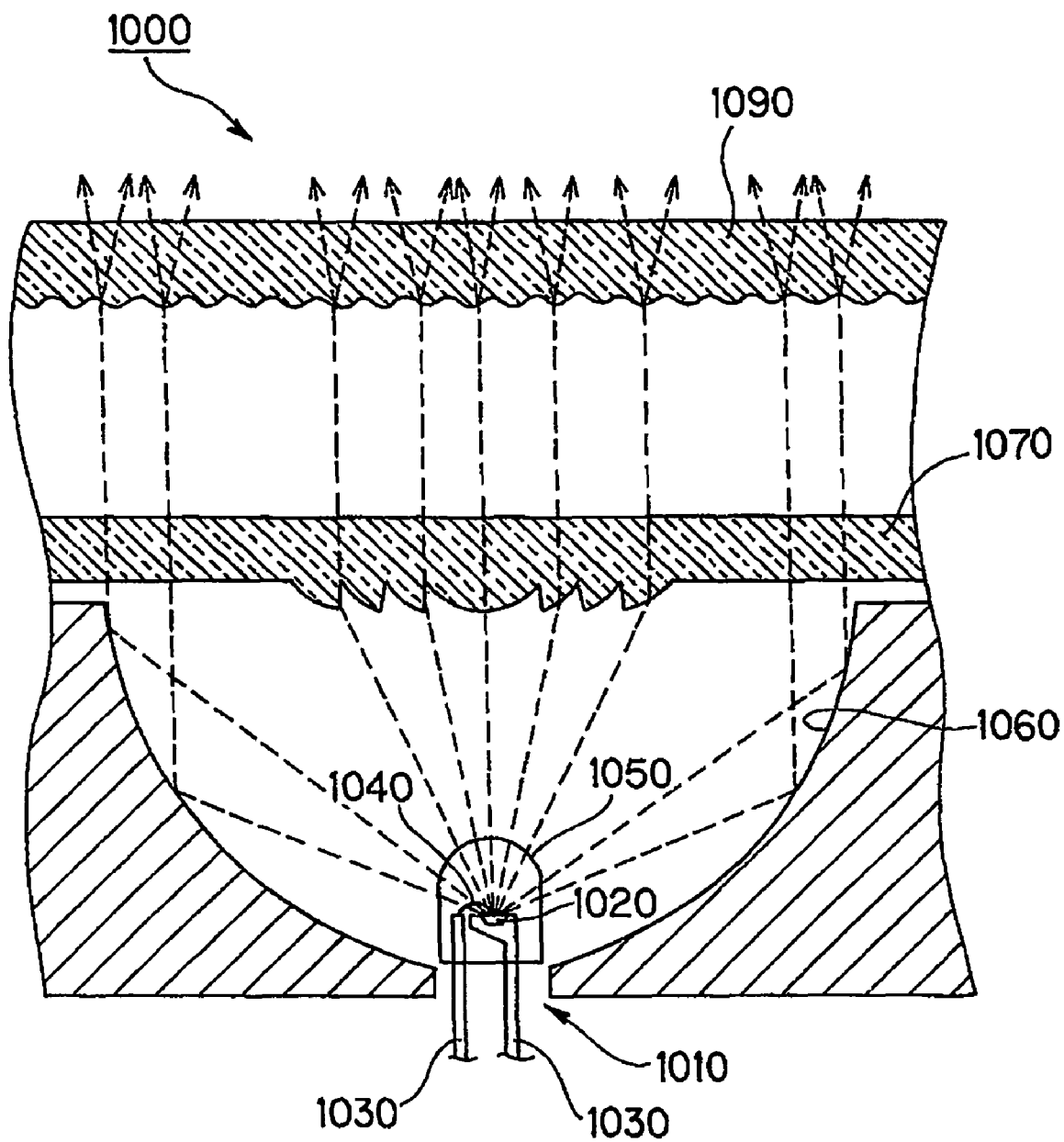
FIG. 103 is a cross sectional view showing an example of the conventional LED light.

A lamp in embodiment 8G of the invention will be explained with reference to FIG. 102.

As shown in FIG. 102(a), the lamp of embodiment 8G is composed such that, instead of the integrated type LED 903, 943, a radiation light source 952 is used that eight reflection-type LED's 953 as a light source are disposed in the shape of an octagon while facing its radiation surface in the two-dimensional direction. As shown in FIGS. 102(b) and (c), the reflection type LED 953 is composed such that a light emitting element 942 is mounted on the tip back surface of a lead 954a of a pair of leads 954a, 954b, the light emitting element 942 is, at its top terminal, electrically connected through a wire to the lead 954b, a reflection mirror 955 with a shape of paraboloid is disposed facing the emission surface of light emitting element 942, and these components are resin sealed with transparent epoxy resin 956. In operation, light emitted from the light emitting element 942 is reflected nearly in parallel with the perpendicular axis direction by the reflection mirror 955 with the shape of paraboloid, then externally radiated from a radiation surface 957. Thus, by using the reflection type structure, light emitted from the light emitting element can be more efficiently radiated in the two-dimensional direction.

When light of light emitting element 942 is reflected accurately in the perpendicular axis direction by the reflection mirror 955, portion with no radiated light may be generated between neighboring reflection type LED's 953 in the radiation light source 952. However, since, in fact, light externally radiated in an oblique direction due to the size etc. of the light emitting element 942 is generated, the radiation light source 952 can radiate light 360 degrees without interruption in the two-dimensional direction. If there is a big difference in distance to each reflector segment to be disposed around the radiation light source 962, the same effect as the above embodiments can be obtained. Although the light source is not low-profile, downsized as compared to that in the above embodiments, such a light source may be used practically.

Although the LED in the above embodiments uses a red light emitting element, whatever color light emitting element it may use. Although the transparent material to seal the light emitting element etc. in LED is transparent epoxy resin, the other material such as transparent silicon resin may be used.

The composition, shape, number, material, dimensions, connection form etc. of the other part in the lamp are not limited to those described in the above embodiments.

INDUSTRIAL APPLICABILITY

As described above, a light emitting diode (LED) of the invention comprises:
a light emitting element mounted on a power source supply means;
a sealing means of a transparent material to seal the light emitting element;
a reflection surface that is opposite to an emission surface of the light emitting element and reflects light emitted from the light emitting element in a direction orthogonal to the center axis of the light emitting element or in a direction at a large angle to the center axis; and
a side radiation surface that sideward radiates light reflected by the reflection surface in a direction orthogonal to the center axis of the light emitting element or in a direction at a large angle to the center axis.

Thus, by the transparent material, the center axis of reflection surface and side radiation surface as optical surfaces can be precisely formed while being coincided with the center axis of light emitting unit. Therefore, the potential problem of conventional LED light, where the reflection mirror is provided outside the LED with the dome section to converge light, can be solved that the structure of light source itself may cause a difference in light distribution characteristic and, in addition, a difference in light distribution characteristic may be generated due to a deviation in position between the LED and the reflection mirror provided outside the LED.

Since the light emitting unit is integrally sealed by the transparent material, a deviation in position does not occur even when being subjected to a physical shock after the manufacture. Since no interface exists between the light emitting element and reflection surface, a stain etc. does not invade and, therefore, loss of light is not generated due to the interface and stain etc. Further, since the light emitting element is directly sealed in the transparent material, the entire thickness can be decreased and the feature of LED, low-profile, can be utilized to the utmost.

By providing a central radiation surface at the center of the reflection surface to radiate light emitted from the light emitting element in a direction nearly parallel to the center axis of the light emitting element, light upward radiated from the light emitting element can be directly taken out. Therefore, the appearance can be enhanced since the center of light emission is not blacked out.

By composing such that the central radiation surface is formed in the range of 0.3 mm to 1.0 mm from the element emission surface in the center axis direction of light emitting element, the solid angle of reflection surface can be increased to enhance the optical characteristic. In addition, even when the reflection surface is close to due to the central radiation surface, the bonding space in wire bonding and the space for resin mold can be secured.

By composing such that the central radiation surface has an area smaller than the emission area of the light emitting element, when a reflection mirror is provided around the light emitting element, the reflection intensity by reflection mirror can be balanced to the radiation intensity from central radiation surface. Thus, the appearance can be enhanced.

Further, a light emitting diode (LED) of the invention comprises:
a light emitting element mounted on a power source supply means; and
a sealing means of a transparent material to seal the light emitting element;
wherein the sealing means comprises: a reflection surface that reflects light emitted from the light emitting element in a direction orthogonal to the center axis of the light emitting element or in a direction at a large angle to the center axis; and a side radiation surface that sideward radiates light reflected by the reflection surface; and the reflection surface has a shortest distance from the light emitting element of less than ½ a radius R of the reflection surface so as to form a proximity optical system.

In this composition, light from the light emitting element can be radiated not only in the center axis direction but also in the direction orthogonal to the center axis while making the LED low-profile, and, since the radiation to the direction orthogonal to the center axis increases according as the reflection surface comes close to the light emitting element, a light distribution characteristic with a wide radiation range can be obtained. Further, even when using a light source with a deviation in light distribution characteristic of light emitting element, no difference in brightness on the surface of LED light occurs since light is radiated in a wide radiation range.

Further, a light emitting diode (LED) of the invention comprises:
a light emitting element mounted on a power source supply means; and
a sealing means of a transparent material to seal the light emitting element;
wherein the sealing means comprises: a reflection surface that reflects light emitted from the light emitting element in a direction orthogonal to the center axis of the light emitting element or in a direction at a large angle to the center axis; and a side radiation surface that sideward radiates light reflected by the reflection surface; and the reflection surface is formed such that its radius R is greater than a height H from the emission surface of the light emitting element to an edge of the reflection surface in the center axis direction of the light emitting element so as to form a proximity optical system.

In this composition, light from the light emitting element can be radiated not only in the center axis direction but also in the direction orthogonal to the center axis while making the LED low-profile. Thus, a light distribution characteristic with a wide radiation range can be obtained.

By composing such that, in the LED, the light emitting element has a radiation intensity $I(\theta)$ represented by: $I(\theta) = k \cdot \cos\theta + (1-k) \cdot \sin\theta$ at an emission angle $\theta$ of emitted light to the center axis direction, where k is a constant to be determined by a radiation intensity according to the emission angle $\theta$ of the light emitting element, and $k \leq 0.8$ is satisfied, light from the light emitting element can be radiated not only in the center axis direction but also in the direction orthogonal to the center axis while making the LED low-profile. Thus, a light distribution characteristic with a wide radiation range can be obtained.

By composing such that, in the LED, the light emitting element comprises a transparent substrate to have a light transmitting property to light emitted therefrom, reflected light in the light emitting element can be externally radiated. Thus, the radiation efficiency can be enhanced.

By composing such that, in the LED, the sealing means comprises a light diffusing material to cover the light emitting element, light emitted from the light emitting element can be widely radiated due to the diffusion effect of light diffusing material.

By composing such that, in the LED, the light diffusing material may be a phosphor, the phosphor is excited by light emitted from the light emitting element and thereby excited light can be widely radiated.

Further, a light emitting diode (LED) of the invention comprises:

a light emitting element that is mounted on a power source supply means and sealed with a sealing member of a transparent material; and the sealing member that comprises a reflection surface and a side reflection surface formed thereon, the reflection surface reflecting light radiated from an emission surface of the light emitting element and the side radiation surface radiating reflected light from the reflection surface and direct light form the light emitting element;

wherein the reflection surface has a solid angle of $2\pi\{1-\cos\theta c\}$ or greater to the light emitting element, where $\theta c$ is a critical angle of the transparent material, and the side radiation surface is formed such that an incident angle of reflected light from the reflection surface and an incident angle of direct light from the light emitting element are smaller than $\theta c$ so as to externally radiate light emitted from the light emitting element.

In this composition, light reflected by the reflection surface and then proceeding nearly in parallel is passed directly through the side radiation surface and externally radiated 360 degrees around the center axis of light emitting element nearly in a planar direction. Light directly heading to the side radiation surface is externally radiated directly without being refracted by the side radiation surface. Thus, since no light to be radiated in the range of a small angle to the center axis exists, the radiation efficiency of light to be externally radiated while being controlled as primary light from the side radiation surface can be significantly enhanced.

Further, a light emitting diode (LED) of the invention comprises:

the lead frame that is protruded out of the transparent resin while being bent under its mount surface from the vicinity of a mount position of the light emitting element so as to reduce part of the lead frame sealed with the transparent resin as much as possible.

By thus bending downward the lead frame while drawing it out of the transparent resin, the embedded part is significantly reduced as compared to that in being protruded in the horizontal direction of resin since the lower part of a horizontal plane formed extending the mount surface of light emitting element in transparent resin is considerably thinner than the upper part of the horizontal plane. Thereby, since heat of light emitting element is externally radiated in a short distance, heat is not accumulated in the light emitting element and lead frame. Also, since the contact area between the lead frame and the resin decreases, a crack at the boundary of the lead frame and the resin can be prevented.

Further, the LED may comprise the lead frame that comprises part sealed with the transparent resin that has a wide area sufficient to widely conduct and disperse heat generated from the light emitting element.

Thus, heat to be conducted from the light emitting element directly to the transparent resin and heat to be conducted from the light emitting element through the lead frame to the transparent resin can be diffused over the entire lead frame with the wide area. Thereby, a crack at the boundary of the light emitting element and the lead frame and the transparent resin can be prevented that may be caused by the thermal expansion by a remaining stress of transparent resin caused by heat to be accumulated in the transparent resin.

Further, a light emitting diode (LED) of the invention comprises:

an light emitting section that comprises a two-dimensional direction reflection surface to reflect light emitted from a light emitting element embedded in a transparent material at least in a two-dimensional direction; and a reflector section that is optically connected at least around in the two-dimensional direction of the light emitting section and comprises a reflection surface formed extending from the two-dimensional direction reflection surface.

Thus, the LED has the light emitting section with a two-dimensional direction reflection surface and the reflector section being optically connected at least around there, and the reflector section has a reflection surface formed extending from the two-dimensional direction reflection surface. Therefore, the LED is about the same as the two-dimensional direction reflection LED with a size of the reflector. Since a large solid angle can be formed to the light emitting element, the LED can have high radiation efficiency. Further, since the light emitting section is in multiple arrays formed on the lead frame but can be downsized, its interval is no more than the package diameter as compared to the case of forming the same sold angle by light emitting element sealing resin and therefore the number of yield can be increased. Since the curing time of LED sealing resin is generally one hour or more, the LED can have a good mass productivity. Further, since the inner stress of LED sealing resin can be reduced as compared to the case of forming the same sold angle by light emitting element sealing resin, no stress damage to the light emitting element and no crack in the package occurs. Thus, the reliability can be enhanced. So, the two-dimensional direction radiation type LED can be obtained that has a high radiation efficiency, a good mass productivity and a high reliability.

The reflector section may be formed low-profile and additionally reflect light reaching a surface opposite to the reflection surface of light radiated from the light emitting section.

Thereby, in addition to light reflected by the reflection surface and radiated in the two-dimensional direction, light radiated from the light emitting section can be radiated in the two-dimensional direction based on total reflection at the surface opposite to the reflection surface as well. The LED can have a further enhanced high radiation efficiency. Thus, the two-dimensional direction radiation type LED can be obtained that has a higher radiation efficiency, a good mass productivity and a high reliability.

The reflector may comprise a stepwise reflection surface that is opposite to the reflection surface and, in a direction perpendicular to the two-dimensional direction, reflects light being reflected by the two-dimensional direction reflection surface and the reflection surface in the two-dimensional direction. Thereby, without the reflection member around the LED, the reflector section serves as a reflection member to reflect light in the direction perpendicular to the two-dimensional direction. Therefore, the LED can be used for a downsized lamp with a high radiation efficiency. Further, the LED can have a good mass productivity and a high reliability.

The two-dimensional direction reflection surface of the light emitting section may have a shape to be formed by rotating, around a perpendicular axis passing through the center of an emission surface of the light emitting element, part of ellipse, parabola, hyperbola or its approximated curve with a focal point at the light emitting element or its vicinity. Thereby, light reflected by the optical surface is all directed in parallel with the horizontal plane and radiated in the two-dimensional direction. Further, since the upper surface of reflector section has a shape to follow that of the optical surface, light reflected by the reflector's upper surface is all directed in parallel with the horizontal plane and radiated in the two-dimensional direction. Thus, the LED can have a high radiation efficiency in the two-dimensional direction, a good mass productivity and a high reliability.

Further, a light emitting diode of the invention may comprise:

a light source section that comprises a circular cone portion that is opposite to an emission surface of a light emitting element embedded and is formed protruding outside; and a reflection section that comprises a two-dimensional direction reflection surface that is connected at least to the circular cone portion and reflects light radiated from the light source section at least in a two-dimensional plane direction.

Thereby, light radiated from the light source section and reflected by the reflection section is radiated at least in the two-dimensional plane direction, and the entire LED serves as a two-dimensional direction radiation light source. Thus, even without the combination of light emitting section and reflector section with a two-dimensional direction reflection surface to reflect light at least in the two-dimensional plane direction, the LED can radiate light in the two-dimensional direction at a high radiation efficiency. Thus, the LED can have a high radiation efficiency in the two-dimensional direction, a good mass productivity and a high reliability.

Further, an LED light of the invention comprises:

an LED; and a reflection mirror disposed around the LED;

wherein the LED comprises: a light emitting element mounted on a power source supply means; a sealing means of a transparent material to seal the light emitting element; a reflection surface that is opposite to an emission surface of the light emitting element and reflects light emitted from the light emitting element in a direction orthogonal to the center axis of the light emitting element or in a direction at a large angle to the center axis; and a side radiation surface that sideward radiates light reflected by the reflection surface in a direction orthogonal to the center axis of the light emitting element or in a direction at a large angle to the center axis.

Thus, since light emitted from the light emitting element is evenly reflected by the reflection surface of LED and then evenly radiated in the direction nearly orthogonal to the center axis of the light emitting element, the brightness of radiated light becomes uniform without depending on position. By further reflecting light evenly emitted from the LED by the reflection mirror disposed around the LED, external radiation light with a large area can be obtained.

By providing a central radiation surface that is disposed at the center of the reflection surface and radiates light emitted from the light emitting element in a direction nearly parallel to the center axis of the light emitting element, light upward radiated from the light emitting element can be directly taken out. Therefore, the appearance can be enhanced since the center of light emission is not blacked out and uniform light is given.

Further, an LED light of the invention may comprise:

an LED that comprises: a light emitting element mounted on a power source supply means; and a sealing means of a transparent material to seal the light emitting element; wherein the sealing means comprises: a reflection surface that reflects light emitted from the light emitting element in a direction orthogonal to the center axis of the light emitting element or in a direction at a large angle to the center axis; and a side radiation surface that sideward radiates light reflected by the reflection surface; and the reflection surface has a shortest distance from the light emitting element of less than ½ a radius R of the reflection surface so as to form a proximity optical system; and a reflection mirror that reflects light radiated from the LED.

In this composition, since light emitted from the light emitting element can be radiated not only in the center axis direction but also in the direction orthogonal to the center axis, and, since the radiation to the direction orthogonal to the center axis increases according as the reflection surface comes close to the light emitting element, the LED light can have a light distribution characteristic with a wide radiation range as well as a good visibility and a novel appearance.

Further, an LED light of the invention may comprise:

an LED that comprises: a light emitting element mounted on a power source supply means; and a sealing means of a transparent material to seal the light emitting element; wherein the sealing means comprises: a reflection surface that reflects light emitted from the light emitting element in a direction orthogonal to the center axis of the light emitting element or in a direction at a large angle to the center axis; and a side radiation surface that sideward radiates light reflected by the reflection surface; and the reflection surface is formed such that its radius R is greater than a height H from the emission surface of the light emitting element to an edge of the reflection surface in the center axis direction of the light emitting element so as to form a proximity optical system; and a reflection mirror that reflects light radiated from the LED.

In this composition, since light emitted from the light emitting element can be radiated not only in the center axis direction but also in the direction orthogonal to the center axis, the LED light can have a light distribution characteristic with a wide radiation range.

The light emitting element may have a radiation intensity $I(\theta)$ represented by: $I(\theta) = k \cdot \cos\theta + (1-k) \cdot \sin\theta$ at an emission angle $\theta$ of emitted light to the center axis direction, where k is a constant to be determined by a radiation intensity according to the emission angle $\theta$ of the light emitting element, and $k \leq 0.8$ is satisfied.

Thereby, since light emitted from the light emitting element can be radiated not only in the center axis direction but also in the direction orthogonal to the center axis, the LED light can have a light distribution characteristic with a wide radiation range.

Further, an LED light of the invention may comprise:

An LED light of the invention may comprise:

an LED that comprises: a light emitting element that is mounted on a power source supply means and sealed with a sealing member of a transparent material; and the sealing member that comprises a reflection surface and a side reflection surface formed thereon, the reflection surface reflecting light radiated from an emission surface of the light emitting element and the side radiation surface radiating reflected light from the reflection surface and direct light form the light emitting element; wherein the reflection surface has a solid angle of $2\pi\{1-\cos\theta c\}$ or greater to the light emitting element, where $\theta c$ is a critical angle of the transparent material, and the side radiation surface is formed such that an incident angle of reflected light from the reflection surface and an incident angle of direct light from the light emitting element are smaller than $\theta c$ so as to externally radiate light emitted from the light emitting element; and a reflection mirror that reflects light radiated from the LED.

In this composition, since light with a high radiation efficiency of light to be externally radiated from the side radiation surface while being controlled as primary light is reflected by the reflection mirror, the radiation efficiency can be significantly enhanced due to the reflection.

Further, an LED light of the invention may comprise:

a light emitting element;

a first reflection mirror that is formed on the light emitting element and reflects light emitted from the light emitting element in the side direction; and a second reflection mirror that upward reflects light from the first reflection mirror.

In this composition, only by providing the first reflection mirror to reflect light emitted from the light emitting element in the side direction directly over the light emitting element, external radiation light with a large area can be obtained as the second reflection mirror to upward reflect this light is separated from the first reflection mirror. Also, since light reflected in the side direction is all optically controlled to be upward reflected and externally radiated, a high radiation efficiency can be obtained. Thus, the LED light can have a high radiation efficiency as well as a large radiation area by single light emitting element while utilizing the feature of LED, low-profile.

By providing a third reflection mirror that is disposed around the light emitting element and upward reflects light sideward emitted from the light emitting element, light can be also upward radiated from the periphery of light emitting element whereas, in the LED light without the third reflection mirror, light is upward radiated only directly over the light emitting element. Therefore, the appearance can be enhanced since the entire LED light further appears to radiate light.

By composing such that the first reflection mirror and the second reflection mirror is formed into one optical member, the structure can be simplified and a displacement between the first and second reflection mirrors can be prevented. The LED light can securely have a high radiation efficiency.

By composing such that the second reflection mirror is in the shape of a polygon or its similar form when viewed from upward, a region with a certain shape can be lighted based on a combination of multiple same polygons without reducing the external radiation efficiency. Therefore, it can be applied to a vehicle light etc.

By composing such that the light emitting element is mounted on a circuit board on a metal plate, the radiation property can be significantly enhanced since the light emitting element is mounted on the metal plate with a good thermal conductivity. Even when large current is flown through the light emitting element, heat saturation does not occur. Therefore, a large optical output can be obtained. Thus, the LED light can be low-profile, with high brightness and can radiate light in a large area as well as having an enhanced heat radiation property and offering a large optical output without being affected by heat saturation.

Further, a light emitting unit of the invention may comprise:

a light source that comprises: a light emitting element mounted on a power source supply means; a sealing means of a transparent material to seal the light emitting element; a first reflection surface that is opposite to an emission surface of the light emitting element and reflects light emitted from the light emitting element in a direction orthogonal to the center axis of the light emitting element or in a direction at a large angle to the center axis; and a side radiation surface that sideward radiates light reflected by the first reflection surface in a direction orthogonal to the center axis of the light emitting element or in a direction at a large angle to the center axis; and a reflector that comprises a plurality of second reflection surfaces to reflect the light radiated from the side radiation surface in a predetermined radiation direction.

In this composition, since the position precision is secured by integrally forming the light emitting element and the upper reflection surface, the positioning precision between the light source and the reflector only has to be controlled. Therefore, the trouble in assembling can be reduced and thereby the productivity can be enhanced, and a light radiation characteristic required can be easily obtained.

By composing such that, in the light emitting unit, the light source further comprises a central radiation surface that is disposed at the center of the first reflection surface and radiates light emitted from the light emitting element in a direction nearly parallel to the center axis of the light emitting element, light upward radiated from the light emitting element can be directly taken out. Therefore, the appearance can be enhanced since the center of light emission is not blacked out.

By composing such that, in the light emitting unit, the first reflection surface is formed close to the light emitting unit so as to increase a light receiving angle (solid angle) of the upper reflection surface, the optical property can be enhanced based on the increased solid angle of upper reflection surface and the bonding space in wire bonding and the space for resin mold can be secured.

By composing such that, in the light emitting unit, the light source is displaced from the center and the position of optical control surfaces neighboring in the circumference direction is different from each other in the radius direction, light can be also irradiated to the oblique reflection surface at the side surface of optical control surface. Therefore, when viewing the light emitting unit from outside the direction to be subjected to the reflection by the optical control surface, reflected light can be confirmed at the oblique reflection surface to be formed by that the position of optical control surfaces neighboring in the circumference direction is different from each other in the radius direction. Thus, the light emitting unit can have a large visual recognition angle.

By composing such that, in the light emitting unit, the reflector reflects the light, as the predetermined radiation direction, in a direction with a predetermined inclination to the center axis of the light emitting element by the plurality of second reflection surfaces, uniform light can be radiated in a direction with a predetermined inclination to the center axis of the light emitting element. The degree of freedom in positioning the light emitting unit can be enhanced, and the appearance can be enhanced.

By composing such that, in the light emitting unit, the reflector is mounted on an inclined section, the light emitting unit can be low-profile and disposed along the inclination while offering a high external radiation efficiency.

By composing such that, in the light emitting unit, the plurality of second reflection surfaces each has an optical control surface that its angle and direction are set to allow reflected light to be reflected in a same direction, light can be reflected concentrated in a predetermined oblique direction and the amount of light in this direction can be increased. Thus, the light emitting unit can be low-profile and disposed along the inclination while offering a high external radiation efficiency.

Further, a lamp of the invention comprises:
a plurality of light emitting units each of which comprises: a light source that comprises an optical system to radiate light emitted from a light emitting element in a direction orthogonal to the center axis of the light emitting element or in a direction at a large angle to the center axis; and a reflector that comprises a plurality of second reflection surfaces to, in a predetermined direction, reflect the light radiated from the light source in the direction orthogonal to the center axis of the light emitting element or in the direction at the large angle to the center axis;
wherein the plurality of light emitting units are disposed in a predetermined arrangement.

In this composition, since light can be sufficiently irradiated to the reflector, the lamp can offer a high light utilization efficiency and a novel visual effect based on the arrangement of LED lights.

By composing such that, in the lamp, the light source has a lead frame fixed on a board disposed on the back side of a housing, and its fixing position corresponds to a penetration hole of the reflection mirror, the LED can be fixed at a certain position precision to the penetration hole by attaching the board at a certain position precision.

By composing such that, in the lamp, the board is, at the fixing position, provided with a concave member into which the lead frame is inserted, the workability in assembling can be enhanced since the electrical connection and positioning of LED can be conducted simultaneously.

In the lamp, the light source may comprise: a light emitting element mounted on a power source supply means; a sealing means of a transparent material to seal the light emitting element; a first reflection surface that is opposite to an emission surface of the light emitting element and reflects light emitted from the light emitting element in a direction orthogonal to the center axis of the light emitting element or in a direction at a large angle to the center axis; and a side radiation surface that sideward radiates light reflected by the first reflection surface in a direction orthogonal to the center axis of the light emitting element or in a direction at a large angle to the center axis.

Thereby, the deviation of light radiation property in multiple light emitting units can be further reduced, and the visual effect in operation can be enhanced.

In the lamp, the light source may comprise a plurality of LED's that are arranged radially such that an intersection point of the center axes of the plurality of LED's is a point on a same plane.

Thereby, the light utilization efficiency can be enhanced since light emitted from the light emitting element is radiated along on the plane while having directivity.

In the lamp, the plurality of light emitting units may be disposed such that part of the reflector of the neighboring light emitting units is overlapped.

Thereby, a novel visual effect can be offer based on the combination of multiple light emitting units.

In the lamp, the plurality of light emitting units may include a plurality of light emitting units that are arranged at multiple stages or in multiple rows, and the light emitting units at each stage include a plurality of light emitting units arranged linearly.

Thereby, a novel visual effect can be offer based on the combination of multiple light emitting units, and a visual recognition property and a light radiation property as a lamp can be enhanced.

In the lamp, the plurality of light emitting units may be arranged through a partition plate to separate the plurality of light emitting units arranged linearly.

Thereby, light radiated from the light emitting unit in operation can be efficiently irradiated to the radiation region.

In the lamp, the plurality of light emitting units may have a light reflection finish on at least part of the circumference of the light emitting unit or the partition plate.

Thereby, even when not in operation, a visual effect by external light can be obtained. Therefore, the lamp can offer an enhanced appearance, a high light utilization efficiency and a novel visual effect.

In the lamp, the plurality of light emitting units may be disposed such that the neighboring light emitting units are arranged at different stages in the center axis direction.

Thereby, a visual effect with a depth feel can be offered regardless of in operation or not.

In the lamp, the plurality of light emitting units may be composed such that a plurality of reflection surfaces are concentric disposed around the light source.

Thereby, light to be radiated in a direction nearly orthogonal to the center axis can be efficiently reflected and radiated in a direction along the center axis.

In the lamp, the plurality of reflection surfaces may be formed nearly planar.

Thereby, the lamp can be low-profile without lowering the light radiation property.

What is claimed is:
1. A light emitting diode (LED), comprising:
a light emitting element mounted on a power source supply means and having a wide light distribution characteristic; and
a sealing means of a transparent material to seal the light emitting element,
wherein the sealing means comprises:
an upper reflection surface having a reflection mirror that reflects light emitted from the light emitting element in a direction orthogonal to a center axis of the light emitting element;
a side radiation surface that sideward radiates light reflected by the upper reflection surface; and
a central radiation surface placed at a center of the upper reflection surface, in which an increment of solid angle of the central radiation surface directly externally radiates light emitted from the light emitting element via the reflection mirror in a direction nearly parallel to the center axis, wherein the central radiation surface has a shortest distance from the light emitting element of less than ½ a radius R of the upper reflection surface to form a proximity optical system, and
wherein an upper surface of the central radiation surface is exposed to an outside of the light emitting diode.

2. The tight emitting diode according to claim 1, wherein:
the light emitting element has a radiation intensity I(θ) represented by:
I(θ)=k cos θ+(1−k)sin θ at an emission angle θ of emitted light to the center axis direction, where k is a constant to be determined by a radiation intensity according to the emission angle θ of the light emitting element, and k≦0.8 is satisfied.

3. The light emitting diode according to claim 1, wherein:
the light emitting element comprises a transparent substrate to have a light transmitting property to light emitted therefrom.

4. The light emitting diode according to claim 1, wherein:
the sealing means comprises a light diffusing material to cover the light emitting element.

5. The light emitting diode according to claim 4, wherein:
the light diffusing material comprises a phosphor.

6. The light emitting diode according to claim 1, wherein:
the reflection surface has a solid angle of 2π{1−cos θc} or greater to the light emitting element, where θc is a critical angle of the transparent material, and the side radiation surface is formed such that an incident angle of reflected light from the reflection surface and an incident angle of direct light from the light emitting element are smaller than θc so as to externally radiate light emitted from the light emitting element.

7. The light emitting diode according to claim 1, further comprising:
a lead frame to supply electric power to the light emitting element mounted thereon, wherein the sealing means seals the light emitting element and the lead frame, and the lead frame comprises a conductive material with a high thermal conductivity of 300 W/mk or more and is protruded out of the transparent resin while being bent under its mount surface from a vicinity of a mount position of the light emitting element so as to reduce a part of the lead frame sealed with the transparent resin as much as possible.

8. The light emitting diode according to claim 1, further comprising:
a lead frame to supply electric power to the light emitting element mounted thereon,
wherein the sealing means seals the light emitting element and the lead frame, and the lead frame comprises a part sealed with the transparent resin that has a wide area sufficient to widely conduct and disperse heat generated from the light emitting element and comprises a conductive material with a high thermal conductivity of 300 W/mk or more.

9. The light emitting diode according to claim 1, further comprising:
a lead frame to supply electric power to the light emitting element mounted thereon,
wherein the sealing means seals the light emitting element and the lead frame and comprises:
a first transparent resin to seal the light emitting element and a part of the lead frame; and
a second transparent resin disposed in contact with and around a side of the first transparent resin.

10. A light emitting unit, comprising:
the LED defined in claim 1; and
a reflector that comprises a plurality of second reflection surfaces to reflect a light radiated from the side radiation surface in a predetermined radiation direction.

11. A lamp, comprising:
a plurality of light emitting units each of which comprises:
the LED defined in claim 1; and
a reflector that comprises a plurality of second reflection surfaces to, in a predetermined direction, reflect a light radiated from a light source in the direction orthogonal to the center axis of the light emitting element or in a direction at a large angle to the center axis, wherein the plurality of light emitting units are disposed in a predetermined arrangement.

12. The lamp according to claim 11, wherein:
the LED has a lead frame fixed on a board disposed on a back side of a housing, and its fixing position corresponds to a penetration hole of the reflection mirror.

13. The lamp according to claim 11, wherein:
the LED comprises:
a light emitting element mounted on a power source supply means;
a sealing means of a transparent material to seal the light emitting element;
a first reflection surface that opposite to an emission surface of the light emitting element and reflects light emitted from the light emitting element in a direction orthogonal to the center axis of the light emitting element or in a direction at a large angle to the center axis, and
a side radiation surface that sideward radiates light reflected by the first reflection surface in a direction orthogonal to the center axis of the light emitting element or in a direction at a large angle to the center axis.

14. The lamp according to claim 11, wherein:
the LED comprises a plurality of LED's that are arranged radially such that an intersection point of the center axes of the plurality of LED's is a point on a same plane.

15. The lamp according to claim 11, wherein:
the plurality of light emitting units are disposed such that a part of the reflector of the neighboring light emitting units is overlapped.

16. The lamp according to claim 11, wherein:
the plurality of light emitting units include a plurality of light emitting units that are arranged at multiple stages or in multiple rows, and the light emitting units at each stage include a plurality of light emitting units arranged linearly.

17. The lamp according to claim 16, wherein:
the plurality of light emitting units are arranged through a partition plate to separate the plurality of light emitting units arranged linearly.

18. The lamp according to claim 11, wherein:
the plurality of light emitting units have a light reflection finish on at least a part of the circumference of the light emitting unit or the partition plate.

19. The lamp according to claim 11, wherein:
the plurality of light emitting units are disposed such that neighboring light emitting units are arranged at different stages in the center axis direction.

20. The lamp according to claim 11, wherein:
the plurality of light emitting units are composed such that a plurality of reflection surfaces are concentrically disposed around the LED.

21. The lamp according to claim 20, wherein:
the plurality of reflection surfaces are formed to be nearly planar.

22. The light emitting diode according to claim 1, wherein the sealing means extends up to an edge of the upper reflection surface located on an intersection of the side radiation surface with the upper reflection surface.

23. The light emitting diode according to claim 1, wherein the reflection mirror reflects light emitted from the light emitting element in the direction orthogonal to the center axis of the light emitting element within the sealing means.

24. The light emitting diode according to claim 1, wherein the central radiation surface radiates, directly to an outside of the light emitting diode, a light emitted from the light emitting element in the direction nearly parallel to the center axis.

25. A light emitting diode (LED), comprising:
a light emitting element mounted on a power source supply means and having a wide light distribution characteristic; and
a sealing means of a transparent material to seal the light emitting element,
wherein the sealing means comprises:
an upper reflection surface having a reflection mirror that reflects light emitted from the light emitting element in a direction, orthogonal to a center axis of the light emitting element;
a side radiation surface that sideward radiates light reflected by the upper reflection surface; and
a central radiation surface placed at a center of the upper reflection surface, in which an increment of solid angle of the central radiation surface directly externally radiates light emitted from the light emitting element in a direction nearly parallel to the center axis,
wherein the upper reflection surface is formed such that its radius R is greater than a height H from an emission surface of the light emitting element to an edge of the upper reflection surface in the center axis direction of the light emitting element so as to form a proximity optical system, and
wherein an upper surface of the central radiation surface is exposed to an outside of the light emitting diode.

26. The light emitting diode according to claim 25, wherein:
the light emitting element has a radiation intensity $I(\theta)$ represented by:
$I(\theta) = k \cos\theta + (1-k)\sin\theta$ at an emission angle $\theta$ of emitted light to the center axis direction, where k is a constant to be determined by a radiation intensity according to the emission angle $\theta$ of the light emitting element, and $k \leq 0.8$ is satisfied.

27. The light emitting diode according to claim 25, wherein:
the light emitting element comprises a transparent substrate to have a light transmitting property to light emitted therefrom.

28. The light emitting diode according to claim 25, wherein:
the sealing means comprises a light diffusing material to cover the light emitting element.

29. The light emitting diode according to claim 25, wherein:
the reflection surface has a solid angle of $2\pi\{1-\cos\theta c\}$ or greater to the light emitting element, where $\theta c$ is a critical angle of the transparent material, and the side radiation surface is formed such that an incident angle of reflected light from the reflection surface and an incident angle of direct light from the light emitting element are smaller than $\theta c$ so as to externally radiate light emitted from the light emitting element.

30. The light emitting diode according to claim 25, further comprising:
a lead frame to supply electric power to the light emitting element mounted thereon,
wherein the sealing means seals the light emitting element and the lead frame, and the lead frame comprises a conductive material with a high thermal conductivity of 300 W/mk or more and is protruded out of the transparent resin while being bent under its mount surface from a vicinity of a mount position of the light emitting element so as to reduce a part of the lead frame sealed with the transparent resin as much as possible.

31. The light emitting diode according to claim 25, further comprising:
a lead frame to supply electric power to the light emitting element mounted thereon,
wherein the sealing means seals the light emitting element and the lead frame, and the lead frame comprises a part sealed with the transparent resin that has a wide area sufficient to widely conduct and disperse heat generated from the light emitting element and comprises a conductive material with a high thermal conductivity of 300 W/mk or more.

32. The light emitting diode according to claim 25, further comprising:
a lead frame to supply electric power to the light emitting element mounted thereon,
wherein the sealing means seals the light emitting element and the lead frame and comprises:
a first transparent resin to seal the light emitting element and a part of the lead frame; and
a second transparent resin disposed in contact with and around a side of the first transparent resin.

33. A light emitting unit, comprising:
the LED defined in claim 25; and
a reflector that comprises a plurality of second reflection surfaces to reflect a light radiated from the side radiation surface in a predetermined radiation direction.

34. A lamp, comprising: a
plurality of light emitting units each of which comprises:
the LED defined in claim 25, and
a reflector that comprises a plurality of second reflection surfaces to, in a predetermined direction, reflect a light radiated from a light source in the direction orthogonal to the center axis of the light emitting element or in a direction at a large angle to the center axis, wherein the plurality of light emitting units are disposed in a predetermined arrangement.

35. The light emitting diode according to claim 25, wherein the sealing means extends up to the edge of the upper reflection surface such that the side radiation surface intersects with the upper reflection surface at the edge of the upper reflection surface.

36. The light emitting diode according to claim 25, wherein the reflection mirror reflects light emitted from the light emitting element in the direction orthogonal to the center axis of the light emitting element within the sealing means.

37. The light emitting diode according to claim 25, wherein the central radiation surface radiates, directly to an outside of the light emitting diode, the light emitted from the light emitting element in the direction nearly parallel to the center axis.

38. A light emitting diode, comprising:

a light emitting element mounted on a power source supply means and having a wide light distribution characteristic; and a sealing means of a transparent material to seal the light emitting element, the sealing means comprising:

an upper reflection surface having a reflection mirror that reflects light emitted from the light emitting element in a direction orthogonal to a center axis of the light emitting element within the sealing means;

a side radiation surface that sideward radiates light reflected by the upper reflection surface; and a central radiation surface placed at a center of the upper reflection surface, in which an increment of solid angle of a central radiation surface directly externally radiates light emitted from the light emitting element via the reflection mirror in a direction nearly parallel to the center axis, wherein the sealing means extends up to an edge of the upper reflection surface located on an intersection of the side radiation surface with the upper reflection surface, and wherein an upper surface of the central radiation surface is exposed to an outside of the light emitting diode.

39. The light emitting diode according to claim 38, wherein the central radiation surface has a shortest distance from the light emitting element of less than ½ a radius R of the upper reflection surface to form a proximity optical system.

40. The light emitting diode according to claim 38, wherein the central radiation surface radiates, directly to an outside of the light emitting diode, the light emitted from the light emitting element in the direction nearly parallel to the center axis.

* * * * *